US012398319B2

(12) United States Patent
Ji et al.

(10) Patent No.: US 12,398,319 B2
(45) Date of Patent: Aug. 26, 2025

(54) TETRADENTATE ORGANIC ELECTROLUMINESCENT MATERIALS AND DEVICES

(71) Applicant: Universal Display Corporation, Ewing, NJ (US)

(72) Inventors: Zhiqiang Ji, Hillsborough, NJ (US); Lichang Zeng, Lawrenceville, NJ (US); Jui-Yi Tsai, Newtown, PA (US); Chun Lin, Yardley, PA (US); Chuanjun Xia, Lawrenceville, NJ (US); Alexey Borisovich Dyatkin, Ambler, PA (US); Walter Yeager, Yardley, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 18/545,338

(22) Filed: Dec. 19, 2023

(65) Prior Publication Data

US 2024/0373738 A1 Nov. 7, 2024

Related U.S. Application Data

(60) Continuation of application No. 18/069,016, filed on Dec. 20, 2022, now Pat. No. 11,903,306, which is a (Continued)

(51) Int. Cl.
*C09K 11/06* (2006.01)
*C07F 15/00* (2006.01)
(Continued)

(52) U.S. Cl.
CPC .......... *C09K 11/06* (2013.01); *C07F 15/0033* (2013.01); *C09K 11/025* (2013.01);
(Continued)

(58) Field of Classification Search
CPC ............ H01L 51/0085; H01L 51/0054; H01L 51/0067; H01L 51/0074; H01L 51/0087;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 100445294 12/2008
CN 102898476 1/2013
(Continued)

OTHER PUBLICATIONS

Jurow, Matthew J. et al., "Understanding and predicting the orientation of heteroleptic phosphors in organic light-emitting materials" Nature Materials, vol. 15, Jan. 2016, pp. 85-91.
(Continued)

*Primary Examiner* — Caleb E Henry
(74) *Attorney, Agent, or Firm* — DUANE MORRIS LLP

(57) ABSTRACT

New organometallic complexes having bis- or tris-heteroleptic ligands and large aspect ratio in one direction and their use in OLEDs to enhance the efficiency is disclosed. Such compounds can have a structure of Formula III,
(Continued)

Formula III

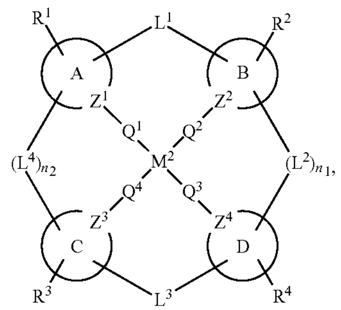

where rings A, B, C, and D are ring; $L^1$ and $L^3$ each a direct bond or a linking group; $n_1$ and $n_2$ are 0 or 1; if $n_1$ or $n_2$ is 1, then $L^2$ or $L^4$ is a direct bond or a linking group, and if $n_1$ or $n_2$ is 0, $L^2$ or $L^4$ is not present; $Q^1$, $Q^2$, $Q^3$ and $Q^4$ are a direct bond or oxygen; ring A is trans to ring D, ring B is trans to ring C in a square-planar coordination configuration; $M^2$ is Pt, and the compound comprises at least one Pt-carbene bond.

20 Claims, 2 Drawing Sheets

Related U.S. Application Data continuation of application No. 17/075,989, filed on Oct. 21, 2020, now Pat. No. 11,588,121, which is a division of application No. 15/619,170, filed on Jun. 9, 2017, now Pat. No. 10,862,054.

(60) Provisional application No. 62/516,329, filed on Jun. 7, 2017, provisional application No. 62/352,139, filed on Jun. 20, 2016, provisional application No. 62/450,848, filed on Jan. 26, 2017, provisional application No. 62/479,795, filed on Mar. 31, 2017, provisional application No. 62/480,746, filed on Apr. 3, 2017.

(51) Int. Cl.

| | |
|---|---|
| ***C09K 11/02*** | (2006.01) |
| ***H10K 50/11*** | (2023.01) |
| ***H10K 50/81*** | (2023.01) |
| ***H10K 50/82*** | (2023.01) |
| ***H10K 85/30*** | (2023.01) |
| ***H10K 85/60*** | (2023.01) |
| ***H10K 101/00*** | (2023.01) |
| ***H10K 101/10*** | (2023.01) |

(52) U.S. Cl.

CPC ......... *H10K 85/342* (2023.02); *H10K 85/346* (2023.02); *H10K 85/622* (2023.02); *H10K 85/654* (2023.02); *H10K 85/6576* (2023.02); *C09K 2211/1029* (2013.01); *C09K 2211/185* (2013.01); *H10K 50/11* (2023.02); *H10K 50/81* (2023.02); *H10K 50/82* (2023.02); *H10K 2101/10* (2023.02); *H10K 2101/90* (2023.02)

(58) Field of Classification Search

CPC ............. H01L 51/5016; H01L 51/5206; H01L 51/5221; H01L 2251/5384; H01L 51/5024; H01L 51/502; C07F 15/0033; C07F 15/0086; C09K 11/025; C09K 11/06; C09K 2211/1029; C09K 2211/185; C09K 2211/1007; C09K 2211/1011; C09K 2211/1088; C09K 2211/1092; H10K 85/342; H10K 85/346; H10K 85/622; H10K 85/654; H10K 85/6576; H10K 50/11; H10K 50/81; H10K 50/82; H10K 2101/10; H10K 2101/90; H10K 50/12; H10K 85/40; H10K 85/626; H10K 85/6572; Y02E 10/549; C07B 2200/05

See application file for complete search history.

(56) References Cited

U.S. PATENT DOCUMENTS

| | | | | |
|---|---|---|---|---|
| 5,247,190 | A | 9/1993 | Friend et al. | |
| 5,703,436 | A | 12/1997 | Forrest et al. | |
| 5,707,745 | A | 1/1998 | Forrest et al. | |
| 5,718,842 | A | 2/1998 | Papkovsky | |
| 5,834,893 | A | 11/1998 | Bulovic et al. | |
| 5,844,363 | A | 12/1998 | Gu et al. | |
| 6,013,982 | A | 1/2000 | Thompson et al. | |
| 6,087,196 | A | 7/2000 | Sturm et al. | |
| 6,091,195 | A | 7/2000 | Forrest et al. | |
| 6,097,147 | A | 8/2000 | Baldo et al. | |
| 6,294,398 | B1 | 9/2001 | Kim et al. | |
| 6,303,238 | B1 | 10/2001 | Thompson | |
| 6,337,102 | B1 | 1/2002 | Forrest et al. | |
| 6,468,819 | B1 | 10/2002 | Kim et al. | |
| 6,528,187 | B1 | 3/2003 | Okada | |
| 6,687,266 | B1 | 2/2004 | Ma et al. | |
| 6,835,469 | B2 | 12/2004 | Kwong et al. | |
| 6,921,915 | B2 | 7/2005 | Takiguchi et al. | |
| 7,087,321 | B2 | 8/2006 | Kwong et al. | |
| 7,090,928 | B2 | 8/2006 | Thompson et al. | |
| 7,154,114 | B2 | 12/2006 | Brooks et al. | |
| 7,250,226 | B2 | 7/2007 | Tokito et al. | |
| 7,279,704 | B2 | 10/2007 | Walters et al. | |
| 7,332,232 | B2 | 2/2008 | Ma et al. | |
| 7,338,722 | B2 | 3/2008 | Thompson et al. | |
| 7,393,599 | B2 | 7/2008 | Thompson et al. | |
| 7,396,598 | B2 | 7/2008 | Takeuchi et al. | |
| 7,431,968 | B1 | 10/2008 | Shtein et al. | |
| 7,442,797 | B2 | 10/2008 | Itoh et al. | |
| 7,445,855 | B2 | 11/2008 | Mackenzie et al. | |
| 7,534,505 | B2 | 5/2009 | Lin et al. | |
| 7,989,090 | B2 | 8/2011 | Thompson | |
| 9,847,496 | B2 * | 12/2017 | Xia | H10K 85/342 |
| 9,935,277 | B2 * | 4/2018 | Xia | H10K 85/346 |
| 10,135,008 | B2 | 11/2018 | Lin | |
| 10,355,227 | B2 | 7/2019 | Ma | |
| 10,374,173 | B2 | 8/2019 | Xia et al. | |
| 11,515,494 | B2 * | 11/2022 | Lin | C07F 15/0033 |
| 11,839,142 | B2 * | 12/2023 | Lin | H10K 85/342 |
| 2002/0034656 | A1 | 3/2002 | Thompson et al. | |
| 2002/0134984 | A1 | 9/2002 | Igarashi | |
| 2002/0158242 | A1 | 10/2002 | Son et al. | |
| 2003/0034722 | A1 | 2/2003 | Tsuboyama | |
| 2003/0138657 | A1 | 7/2003 | Li et al. | |
| 2003/0152802 | A1 | 8/2003 | Tsuboyama et al. | |
| 2003/0162053 | A1 | 8/2003 | Marks et al. | |
| 2003/0175553 | A1 | 9/2003 | Thompson et al. | |
| 2003/0230980 | A1 | 12/2003 | Forrest et al. | |
| 2004/0036077 | A1 | 2/2004 | Ise | |
| 2004/0137267 | A1 | 7/2004 | Igarashi et al. | |
| 2004/0137268 | A1 | 7/2004 | Igarashi et al. | |
| 2004/0174116 | A1 | 9/2004 | Lu et al. | |
| 2005/0025993 | A1 | 2/2005 | Thompson et al. | |
| 2005/0112407 | A1 | 5/2005 | Ogasawara et al. | |
| 2005/0238919 | A1 | 10/2005 | Ogasawara | |
| 2005/0244673 | A1 | 11/2005 | Satoh et al. | |
| 2005/0260441 | A1 | 11/2005 | Thompson et al. | |
| 2005/0260449 | A1 | 11/2005 | Walters et al. | |
| 2006/0008670 | A1 | 1/2006 | Lin et al. | |
| 2006/0202194 | A1 | 9/2006 | Jeong et al. | |
| 2006/0240279 | A1 | 10/2006 | Adamovich et al. | |
| 2006/0251923 | A1 | 11/2006 | Lin et al. | |
| 2006/0263635 | A1 | 11/2006 | Ise | |

(56) References Cited

U.S. PATENT DOCUMENTS

| | | | |
|---|---|---|---|
| 2006/0280965 A1 | 12/2006 | Kwong et al. | |
| 2007/0190359 A1 | 8/2007 | Knowles et al. | |
| 2007/0228940 A1 | 10/2007 | Hashimoto | |
| 2007/0278938 A1 | 12/2007 | Yabunouchi et al. | |
| 2008/0001530 A1 | 1/2008 | Ise | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0153103 A1 | 6/2008 | Yam | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0219407 A1 | 9/2010 | Kamatani | |
| 2011/0049496 A1 | 3/2011 | Fukuzaki | |
| 2011/0315933 A1 | 12/2011 | Stoessel | |
| 2012/0292600 A1* | 11/2012 | Kottas | C09K 11/06 546/4 |
| 2013/0200349 A1 | 8/2013 | Soga | |
| 2013/0328018 A1 | 12/2013 | Xia et al. | |
| 2013/0328019 A1 | 12/2013 | Xia et al. | |
| 2014/0125221 A1* | 5/2014 | Thompson | C09K 11/06 313/504 |
| 2014/0197386 A1 | 7/2014 | Kim et al. | |
| 2014/0306206 A1 | 10/2014 | Watanabe et al. | |
| 2014/0364611 A1 | 12/2014 | Mak | |
| 2015/0069334 A1 | 3/2015 | Xia et al. | |
| 2015/0194616 A1 | 7/2015 | Li | |
| 2015/0295197 A1 | 10/2015 | Adamovich | |
| 2015/0380666 A1 | 12/2015 | Szigethy | |
| 2016/0343960 A1 | 11/2016 | Yamada | |
| 2016/0380216 A1* | 12/2016 | Tsai | C07F 15/0033 257/40 |
| 2017/0084849 A1 | 3/2017 | Tsai | |
| 2017/0288157 A1* | 10/2017 | Joseph | C07F 15/0033 |
| 2017/0365800 A1 | 12/2017 | Tsai | |
| 2017/0365801 A1 | 12/2017 | Margulies | |
| 2018/0013075 A1* | 1/2018 | Wolohan | H10K 50/11 |
| 2018/0108848 A1* | 4/2018 | Su | H10K 85/615 |
| 2018/0212165 A1* | 7/2018 | Ji | C09K 11/06 |
| 2018/0230173 A1* | 8/2018 | Ji | C07F 15/0086 |
| 2018/0240975 A1 | 8/2018 | Krestel | |
| 2018/0337351 A1* | 11/2018 | Feldman | H10K 85/342 |
| 2018/0375035 A1* | 12/2018 | Ji | H10K 85/346 |
| 2019/0341561 A1* | 11/2019 | Tsai | C07F 15/0033 |
| 2019/0341562 A1* | 11/2019 | Lin | C07F 15/0086 |
| 2019/0372026 A1* | 12/2019 | Ji | C07F 15/0033 |
| 2020/0098999 A1* | 3/2020 | Boudreault | H10K 85/342 |
| 2023/0114221 A1* | 4/2023 | Lin | C07F 15/0033 428/690 |
| 2024/0147832 A1* | 5/2024 | Lin | H10K 85/342 |

FOREIGN PATENT DOCUMENTS

| | | |
|---|---|---|
| EP | 0650955 | 5/1995 |
| EP | 1725079 | 11/2006 |
| EP | 2034538 | 3/2009 |
| EP | 2551274 | 12/2015 |
| EP | 3205658 | 8/2017 |
| JP | 200511610 | 1/2005 |
| JP | 2007123392 | 5/2007 |
| JP | 2007254297 | 10/2007 |
| JP | 2008074939 | 4/2008 |
| JP | 2009266943 | 11/2009 |
| JP | 2010084003 | 4/2010 |
| JP | 2012525405 | 10/2012 |
| JP | 2015173199 | 10/2015 |
| JP | 2018084189 | 7/2019 |
| KR | 20150030511 | 3/2015 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005/097942 | 10/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2014/033050 | 3/2014 |
| WO | 2014/112450 | 7/2014 |
| WO | 2014/112657 | 7/2014 |

OTHER PUBLICATIONS

Graf, A. et al., "Correlating the transition dipole moment orientation of phosphorescent emitter molecules in OLEDs with basic material properties" J. Mater. Chem. C., 2014, 2, 10298-10304.

Kim, Kwon-Hyeon et al., "Phosphorescent dye-based supramolecules for high-efficiency organic light-emitting diodes" Nature Communications, 2014, 5, 4769, 1-8.

Office Action issued Dec. 2, 2020 for corresponding Chinese Patent Application No. 201710471188.1.

Wang, B., et al., "Strongly phosphorescent platinum(ii) complexes supported by tetradentate benzazole-containing ligands," J. Mater. Chem C., 2015, vol. 3, pp. 8212-8218.

Huang, Y., et al., "Bi-substituted Effect on Phenylisoquinoline Iridium(III) Complexes," Organometallics, 2005, vol. 24, pp. 6230-6238.

Communication pursuant to Article 94(3) EPC issued on Apr. 2, 2020 in corresponding European Patent Application No. 17176681.9.

Choi, Gyeongshin et al., "Hemilabile N-Xylyl-N'-methylperimidine Carbene Iridium Complexes as Catalysts for C—H Activation and Dehydrogenative Silylation: Dual Role of N-Xylyl Moiety for ortho-C—H Bond Activation and Reductive Bong Cleavage" J. Am. Chem. Soc. 2013, 135, 13149-13161.

(56) References Cited

OTHER PUBLICATIONS

Tordera, Daniel et al., "Stable Green Electroluminescence from an Iridium Tris-Heteroleptic Ionic Complex" Chem. Mater. 2012, 24, 1896-1903.
Baranoff, Etienne et al., "Acid-Induced Degradation of Phosphorescent Dopants for OLEDs and Its Application to the Synthesis of Tris-heteroleptic Iridium(III) Bis-cyclometalated Complexes" Inorg. Chem, 2012, 51, 215-224.
Lepeltier, Marc et al., "Tris-cyclometalated Iridium(III) Complexes with Three Different Ligands: a New Example with 2-(2,4-Difluorophenyl)pyridine-Based Complex" Helvetica Chimica Acta—vol. 97 (2014), 939-956.
Park, Gui Youn et al., "Iridium Complexes Containing Three Different Ligands as White OLED Dopants" Molecular Crystals and Liquid Crystals, vol. 462, pp. 179-188, 2007.
Felici, Marco et al., "Cationic Heteroleptic Cyclometalated Iridium(lil) Complexes Containing Phenyl-Triazole and Triazole-Pyridine Clicked Ligands" Molecules 2010, 15, 2039-2059.
Kim, Kwon-Hyeon et al., "Design of Heteroleptic Ir Complexes with Horizontal Emitting Dipoles for Highly Efficient Organic Light-Emitting Diodes with an External Quantum Efficiency of 38%", Chem. Mater. 2016, 28, pp. 7505-7510.
Kim, Kwon-Hyeon et al., "Highly Efficient Organic Light-Emitting Diodes with Phosphorescent Emitters Having High Quantum Yield and Horizontal Orientation of Transition Dipole Moments", Adv. Mater. 2014, 26, pp. 3844-3847.
Jia-Ling Liao et al.: "Ir(III)-Based Phosphors with Bipyrazolate Ancillaries; Rational Design, Photophysics, and Applications in Organic Light-Emitting Diodes" Inorganic Chemistry, vol. 54, No. 22, Nov. 16, 2015 (Nov. 16, 2015), pp. 10811-10821.
European Search Report issued Oct. 26, 2017 for corresponding EP Application No. 17176668.6.
Burke, Christopher S. and Keyes, Tia E. An Efficient Route to Asymmetrically Diconjugated tris(heteroleptic) Complexes of Ru(II), RSC Advances, vol. 6, Jan. 1, 2013, pp. 40869-40877.
Xu, Xianbin et al., "Trifunctional IRIII ppy-type asymmetric phosphorescent emitters with ambiopolar features for highly efficient electroluminescent devices" Chem, Commun., 2014, 50, pp. 2473-2476.
Xu, Xianbin et al., "tris-Heteroleptic Cyclometalated Iridium(III) Complexes with Ambipolar or Electron Injection/Transport Features for Highly Efficient Electrophosphorescent Devices" Chem. Asian J. 2015, 10, pp. 252-262.
Extended European Search Report issued Apr. 11, 2018 for corresponding EP Application No. 17176681.9.
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter, " Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2, N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).

(56) References Cited

OTHER PUBLICATIONS

Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Edkins, Robert M. "The synthesis and photophysics of tris-heteroleptic cyclometalated iridium complexes", Dalton Transactions, vol. 40, No. 38, Oct. 2011, pp. 9672-9678.
Plummer, Edward A. et al., "Electrophosphorescent Devices Based on Cationic Complexes: Control of Switch-on Voltage and Efficiency Through Modification of Charge Injection and Charge Transport", Adv. Funct. Mater. 2005, vol. 15, No. 2, Feb. 2005, pp. 281-289.
European Search Report issued on Oct. 26, 2017 for corresponding European Patent Application No. 17176695.9.
Hohenleutner, A. et al., "Rapid Combinatorial Synthesis and Chromatography Based Screening of Phosphorescent Iridium Complexes for Solution Processing", Adv. Funct. Mater., 2012, 22, 3406-3413.
CAS Registry Nos. 1957131-53-1, Registry (STN)[online], 2016, Search Date Jan. 6, 2021.
Notice of Reasons for Rejection issued on Jan. 26, 2021 for corresponding Japanese Patent Application No. 2017-119909.

* cited by examiner

TETRADENTATE ORGANIC ELECTROLUMINESCENT MATERIALS AND DEVICES

CROSS-REFERENCE TO RELATED APPLICATIONS

This application is a continuation of U.S. application Ser. No. 18/069,016, filed Dec. 20, 2022, which is a continuation of U.S. application Ser. No. 17/075,989, filed Oct. 21, 2020, now U.S. Pat. No. 11,588,121, which is a divisional of U.S. application Ser. No. 15/619,170, filed Jun. 9, 2017, now U.S. Pat. No. 10,862,054, which claims priority under 35 U.S.C. § 119(e)(1) to U.S. Provisional Application Ser. No. 62/516,329, filed Jun. 7, 2017, U.S. Provisional Application Ser. No. 62/352,139, filed Jun. 20, 2016, U.S. Provisional Application Ser. No. 62/450,848, filed Jan. 26, 2017, U.S. Provisional Application Ser. No. 62/479,795, filed Mar. 31, 2017, and U.S. Provisional Application Ser. No. 62/480,746, filed Apr. 3, 2017, the entire contents of which are incorporated herein by reference.

FIELD

The present disclosure relates to compounds for use as phosphorescent emitters, and devices, such as organic light emitting diodes, including the same. More specifically, this disclosure relates to organometallic complexes having large aspect ratio in one direction and their use in OLEDs to enhance the efficiency.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

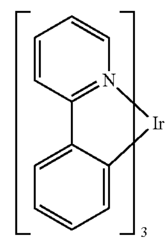

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound comprising.

According to another aspect, an OLED is disclosed. The OLED comprises: an anode; a cathode; and an organic layer, disposed between the anode and the cathode, comprising the compound having Formula I.

According to another aspect, a consumer product comprising an OLED is disclosed, where the OLED comprises: an anode; a cathode; and an organic layer, disposed between the anode and the cathode, comprising the compound having Formula I.

A formulation comprising the compound having Formula I is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
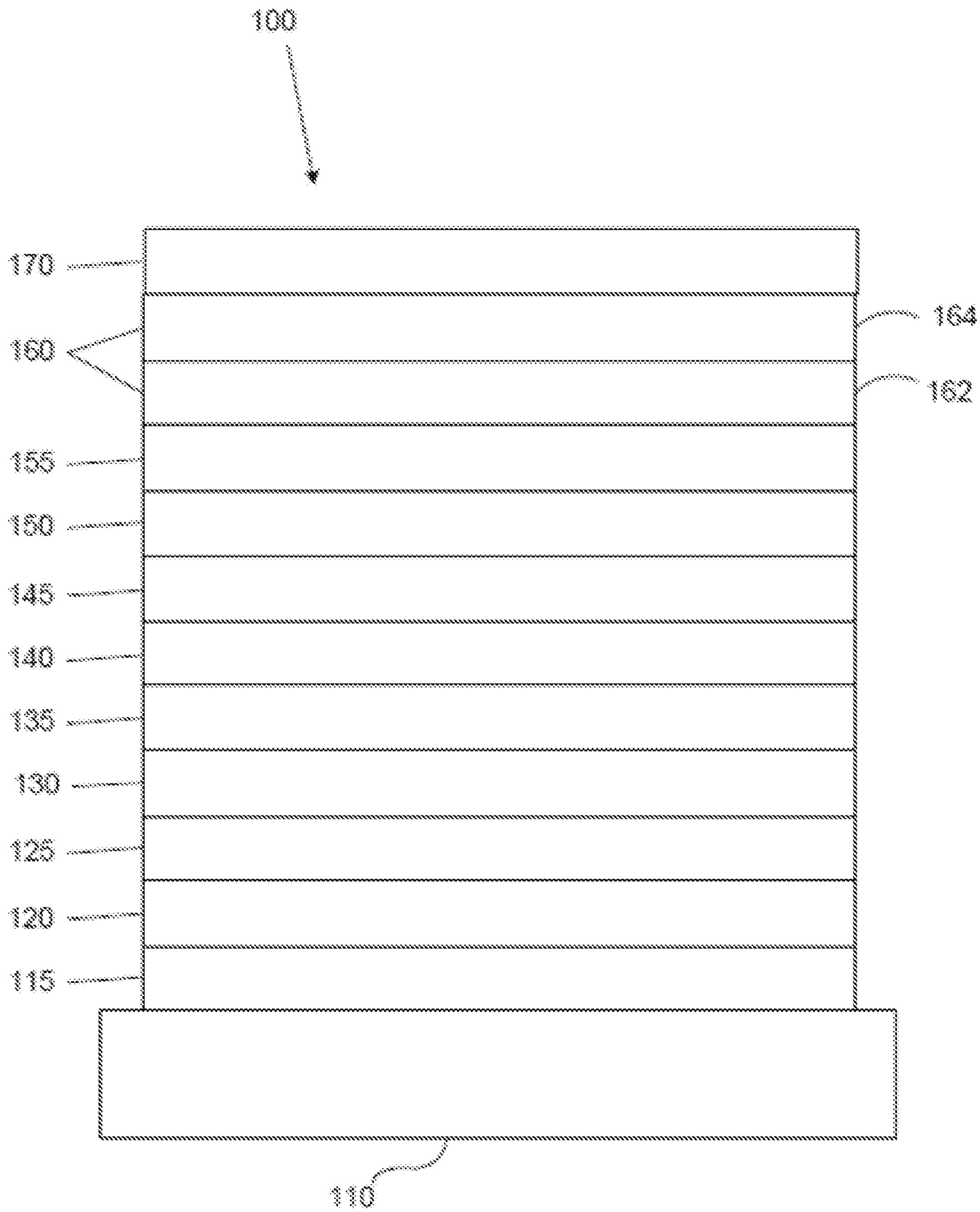
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
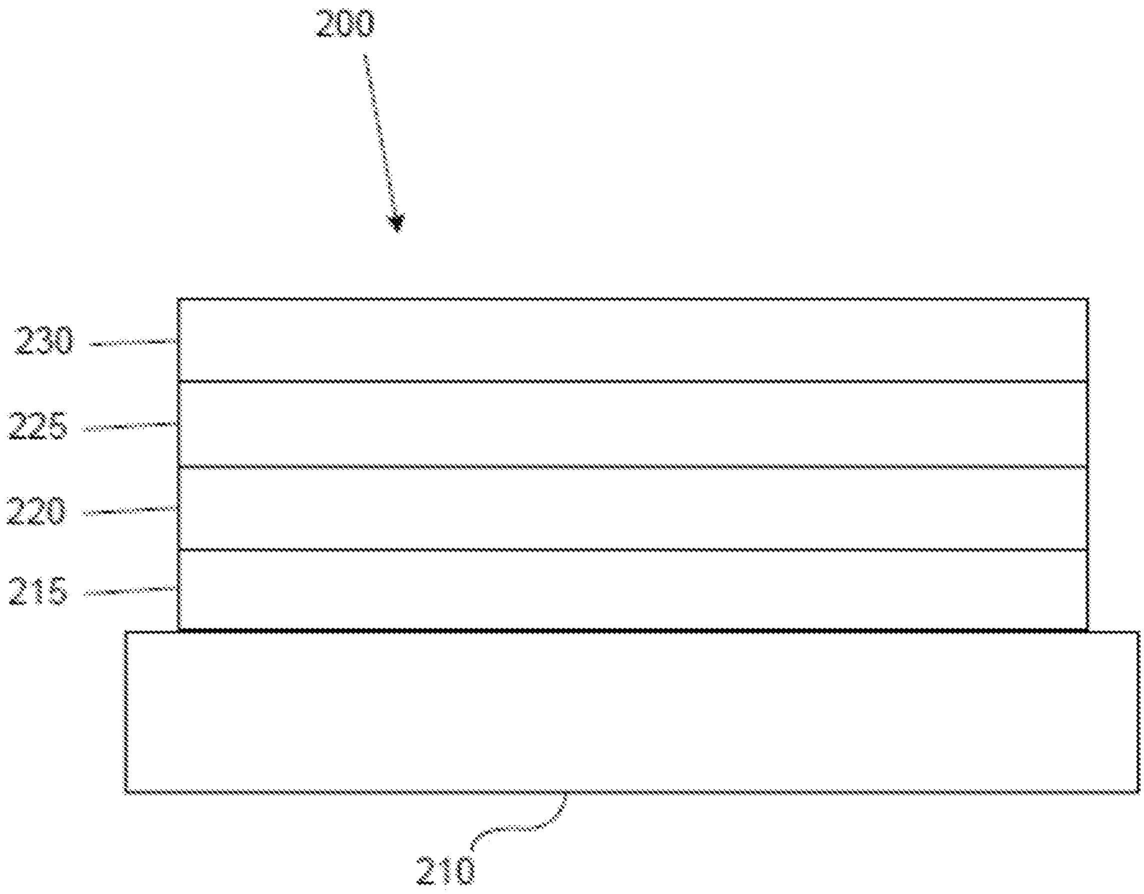
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In this disclosure, organometallic complexes based on Ir, Os, Rh, Ru, Re, Pt, or Pd having bis- or tris-heteroleptic ligands and large aspect ratio in one direction are provided. The inventors have found that incorporating such compounds in OLEDs enhance the device efficiency. The ligands are arranged in such a way that the length of the molecule in one direction is longer than in any other directions thus resulting in a large aspect ratio. These compounds with large aspect ratio when applied as emitters in PhOLED devices show enhanced external quantum efficiencies (EQEs) because they preferentially orient themselves in horizontal orientation to the plane of the substrate (i.e. parallel to the substrate) and therefore result in maximizing light extraction from the emitter compounds. The horizontal orientation maximizes the surface area of the light emitting molecules facing the light emitting façade of the device. Some examples of the organometallic compounds disclosed herein have three different bidentate cyclometalated ligands coordinating to an iridium metal center. Some other examples of the organometallic compounds have two different bidentate cyclometalated ligands coordinating to a platinum metal center.

According to an aspect of the present disclosure, a compound having a formula selected from the group consisting of:

Formula I

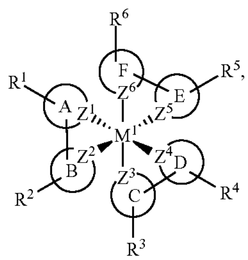

Formula II

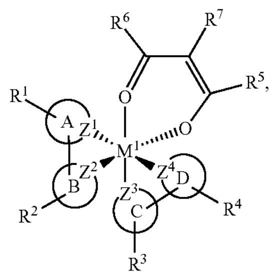

and

Formula III

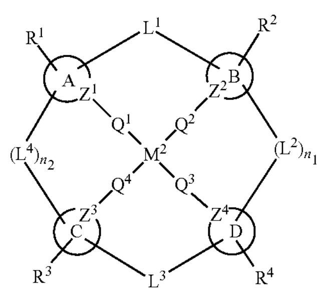

is disclosed, wherein rings A, B, C, D, E, and F are each a 5 or 6-membered carbocyclic or heterocyclic ring;

wherein in Formula I: A-B, C-D, and E-F form three bidentate ligands coordinated to metal $M^1$; wherein A-B, C-D, and E-F are different from each other; wherein ring A is trans to ring D, ring B is trans to ring E, and ring C is trans to ring F in a octahedral coordination configuration;

wherein in Formula II: A-B, C-D, and one acetylacetonate ligand form three bidentate ligands coordinated to metal $M^1$; wherein A-B, and C-D are different from each other; wherein ring A is trans to ring D, ring B is trans to oxygen atom, and ring C is trans to oxygen atom in a octahedral coordination configuration;

wherein in Formula III: $L^1$ and $L^3$ each independently selected from the group consisting of a direct bond, BR, NR, PR, O, S, Se, C═O, S═O, $SO_2$, CRR', SiRR', GeRR', alkyl, and combinations thereof; $n_1$, $n_2$ each independently is 0 or 1; when $n_1$ or $n_2$ is 1, $L^2$ or $L^4$ is selected from the group consisting of a direct bond, BR, NR, PR, O, S, Se, C═O, S═O, $SO_2$, CRR', SiRR', GeRR', alkyl, and combinations thereof; when $n_1$ or $n_2$ is 0, $L^2$ or $L^4$ is not present; $Q^1$, $Q^2$, $Q^3$ and $Q^4$ each independently selected from the group consisting of direct bond and oxygen; and when any of $Z^1$, $Z^2$, $Z^3$ and $Z^4$ is nitrogen, the $Q^1$, $Q^2$, $Q^3$ and $Q^4$ attached thereto is a direct bond;

ring A is trans to ring D, ring B is trans to ring C in a square-planar coordination configuration;

wherein $R^1$, $R^2$, $R^3$, $R^4$, $R^3$, $R^6$, and $R^7$ each represents mono to the maximum possible number of substitution, or no substitution;

wherein $Z^1$, $Z^2$, $Z^3$, $Z^4$, $Z^5$ and $Z^6$ are each independently selected from the group consisting of carbon and nitrogen;

wherein $M^1$ is a metal selected from the group consisting of Ir, Os, Rh, Ru, and Re; $M^2$ is a metal selected from the group consisting of Pt and Pd;

wherein a first distance is the distance between the atom in $R^1$ that is the farthest away from $M^1$ to the atom in $R^4$ that is the farthest away from $M^1$;

wherein a second distance is the distance between the atom in $R^2$ that is the farthest away from $M^1$ to the atom in $R^3$ that is the farthest away from $M^1$;

wherein a third distance is the distance between the atom in $R^3$ that is the farthest away from $M^1$ to the atom in $R^6$ that is the farthest away from $M^1$;

wherein a fourth distance is the distance between the atom in $R^1$ that is the farthest away from $M^2$ to the atom in $R^4$ that is the farthest atom away from $M^2$;

wherein a fifth distance is the distance between the atom in $R^2$ that is the farthest atom away from $M^2$ to the atom in $R^3$ that is the farthest atom away from $M^2$ in $R^3$;

wherein the first distance is longer than the second distance and the third distance each by at least 1.5 Å;

wherein the fourth distance is longer than the fifth distance by at least 1.5 Å;

wherein R, R', $R^1$, $R^2$, $R^3$, $R^4$, $R^3$, $R^6$, and $R^7$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfonyl, sulfonyl, phosphino, and combinations thereof; and wherein any two substituents among R, R', $R^1$, $R^2$, $R^3$, $R^4$, $R^3$, $R^6$, and $R^7$ are optionally joined or fused into a ring. 1.5 Å mentioned above is the distance of a C—C bond (i.e., adding a methyl group) from calculation.

In other words, the above description defines the relationship between the molecular long axes defined by different pairs of substituent groups in each of the complexes represented by Formula I, Formula II, and Formula III. Each of the pairs of substituent groups identified above are substituent groups positioned substantially opposite from each other relative to the coordinating metal $M^1$ or $M^2$. The two end points of each of the molecular long axes defined are the atoms in each of the paired substituents that are the farthest away from the corresponding coordinating metal.

In some embodiments of the compound, any two substituents within each substituent groups R, R', $R^1$, $R^2$, $R^3$, $R^4$, $R^3$, $R^6$, and $R^7$, when they are more than mono substitution, are optionally joined or fused into a ring.

In some embodiments of the compound, $M^1$ is Ir, $M^2$ is Pt.

In some embodiments of the compound, rings A, B, C, D, E, and F are each independently selected from the group consisting of phenyl, pyridine, and imidazole. In some embodiments of the compound, rings A, C, and E in Formula I and III, and rings A and D in Formula II are phenyl.

In some embodiments of the compound, rings B, D, and F in Formula I and III, and rings B and C in Formula II are selected from the group consisting of pyridine, pyrimidine, imidazole, and pyrazole.

In some embodiments of the compound, $R^1$, $R^2$, $R^3$, $R^4$, $R^3$, $R^6$, and $R^7$ are each independently selected from the group consisting of hydrogen, deuterium, halide, alkyl, cycloalkyl, silyl, aryl, heteroaryl, and combinations thereof.

In some embodiments of the compound, the first distance is longer than the second distance and the third distance each by at least 4.3 Å, and the fourth distance is longer than the fifth distance by at least 4.3 Å. The value 4.3 Å is representative of the diameter of a phenyl ring. Thus, the first distance in the compound is longer than the second distance and the third distance by at least a phenyl substitution and the fourth distance is longer than the fifth distance by at least a phenyl substitution.

In some embodiments of the compound, the first distance is longer than the second distance and the third distance each by at least 5.9 Å, and the fourth distance is longer than the fifth distance by at least 5.9 Å. The value 5.9 Å is representative of the distance spanning a para-tolyl group.

In some embodiments of the compound, at least one of the rings A, B, C, D, E, and F is fused by another 5- or 6-membered ring. The another 5- or 6-membered ring can be an aromatic ring or a non-aromatic ring. The aromatic ring can be a phenyl ring.

In some embodiments where the compound is of Formula I, at least one of (i), (ii), and (iii) is true, wherein (i) one $R^1$ connects to one $R^2$, (ii) one $R^3$ connects to one $R^4$, (iii) one $R^3$ connects to one $R^6$. In some embodiments where the compound is of Formula II, at least one of (i) and (ii) is true, wherein (i) one $R^1$ connects to one $R^2$, (ii) one $R^3$ connects to one $R^4$.

In some embodiments, the first distance is longer than the second distance and the third distance each by at least 3.0 Å, and the fourth distance is longer than the fifth distance by at least 3.0 Å. The value 3.0 Å is representative of the distance spanning two methyl groups.

The following Table 1 lists the maximum linear length for various substituent groups defined along their long axis. This maximum linear length is defined as the distance between the two atoms that are the farthest aprt along the long axis of the particular substituent group. The listed values can be used to estimate the difference in length between two molecular long axes defined above in connection with the structures of Formulas I, II, and III depending on the substitutent group that is the differential between two molecular long axes being compared. For example, if the difference in length between two molecular long axes is the result of one molecular long axis being longer than the other by an extra phenyl substituent group, the fourth entry in Table 1 below provides that the difference in length between the two molecular long axes will be at least 4.3 Å (an extra C—C bond is required to make the connection). Any two or more of the following fragments can be linked together, and its distance can be calculated by simply adding up these numbers plus the total length of the single C—C bond distance used to connect them.

TABLE 1

| The difference between two directions | Longest Distance of the difference (Å) |
|---|---|
| C—C | 1.5 |
| 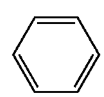 | 2.9 |
| 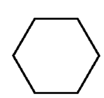 | 3.0 |
| 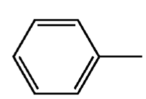 | 4.3 |
| 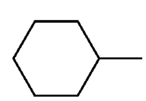 | 4.4 |
| 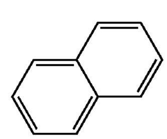 | 5.2 |

TABLE 1-continued
| The difference between two directions | Longest Distance of the difference (Å) |
|---|---|
| 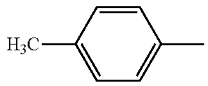 | 5.9 |
| 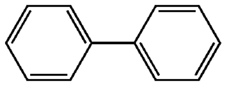 [SMILES: c1ccc(-c2ccccc2)cc1] | 7.3 |
| 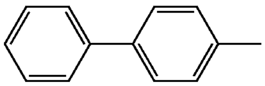 | 8.8 |
| 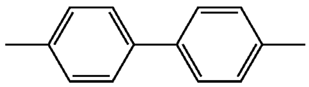 | 10.3 |
| two C—C | 3.0 |
| 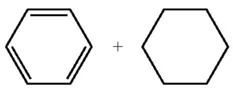 | 7.3 |
| 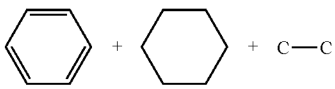 | 8.8 |
| 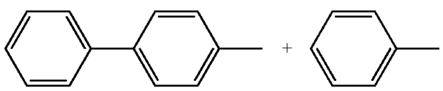 | 13.1 |
| 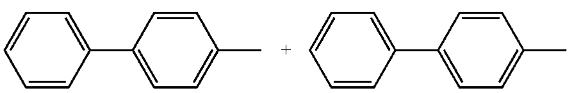 | 17.6 |
| 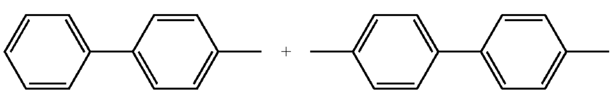 | 19.1 |
In some embodiments of the compound, the bidentate ligand A-B, C-D, and E-F are each independently selected from the group consisting of:
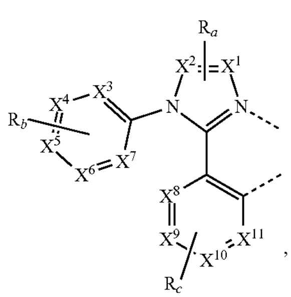
-continued
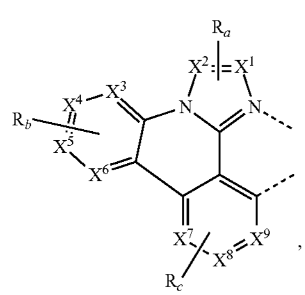

-continued
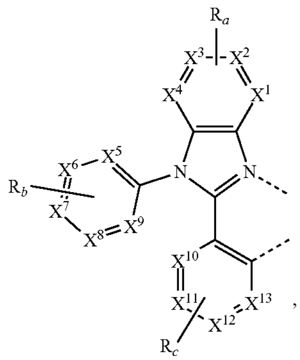
,
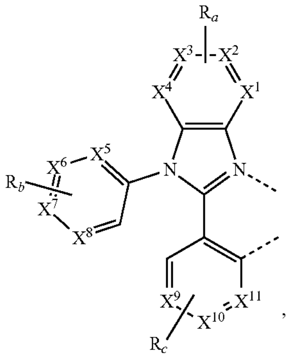
,
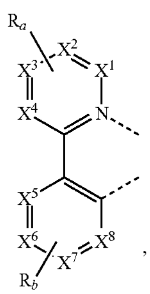
,
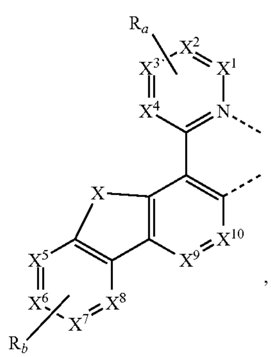
,
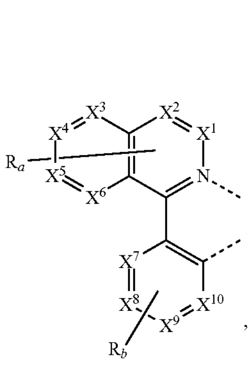
,
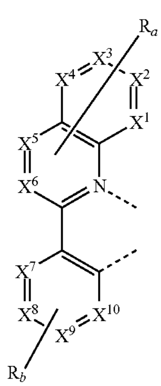
,
-continued
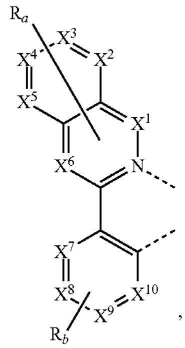
,
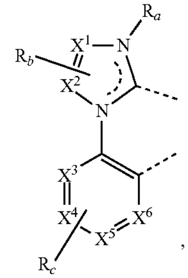
,
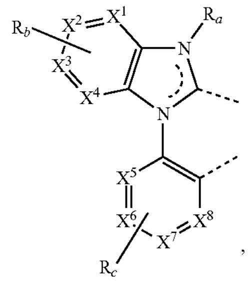
,
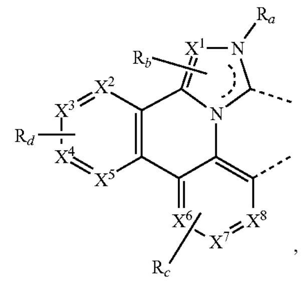
,
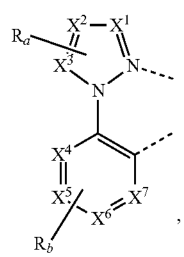
,
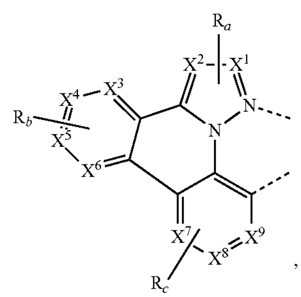
,
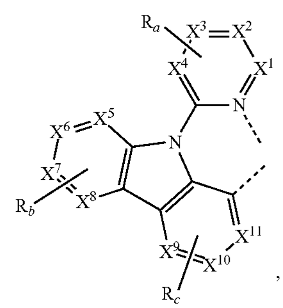
,
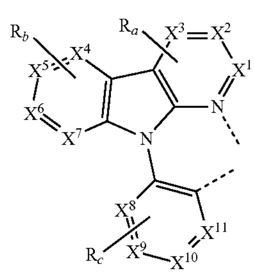
, and

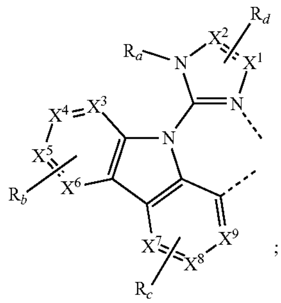

;

wherein each $X^1$ to $X^{13}$ are independently selected from the group consisting of carbon and nitrogen; wherein X is selected from the group consisting of BR', NR', PR', O, S, Se, C=O, S=O, $SO_2$, CR'R", SiR'R", and GeR'R";

wherein R' and R" are optionally fused or joined to form a ring;

wherein $R_a$, $R_b$, $R_c$, and $R_d$ each represents from mono substitution to the maximum possible number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfonyl, sulfonyl, phosphino, and combinations thereof; and wherein any two substitutents among $R_a$, $R_b$, $R_c$, and $R_d$ are optionally fused or joined to form a ring. In some embodiments of the compound, the bidentate ligand A-B, C-D, and E-F are each independently selected from the group consisting of:

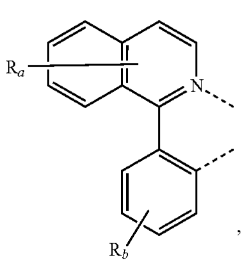

,

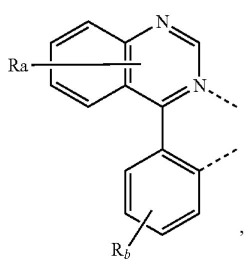

,

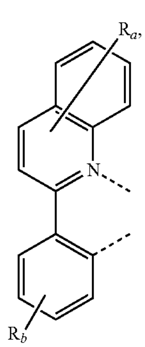

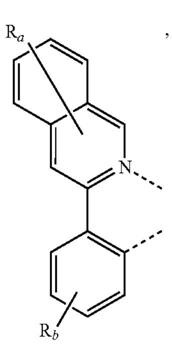

,

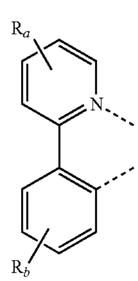

,

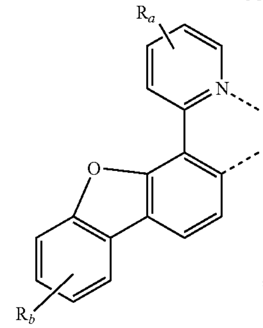

,

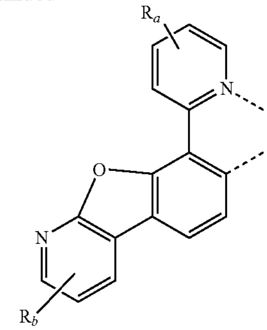

,

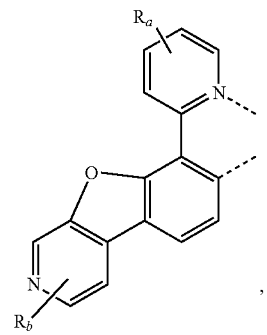

,

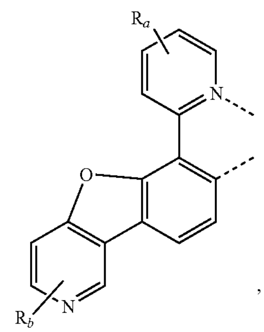

,

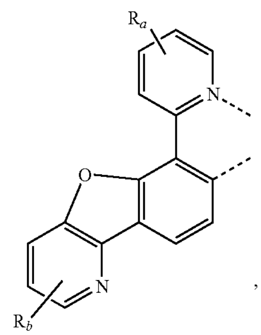

,

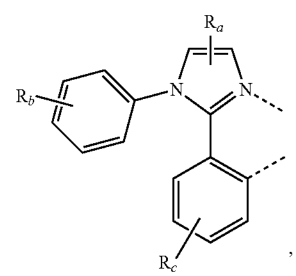

,

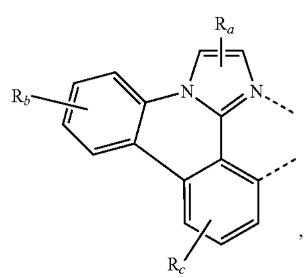

,

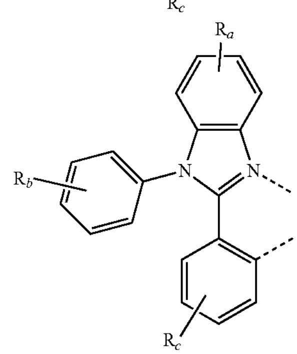

,

-continued
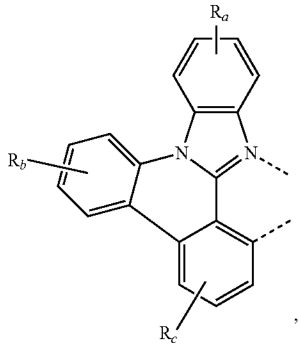
,
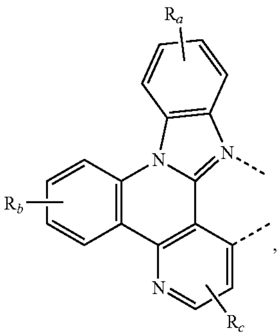
,
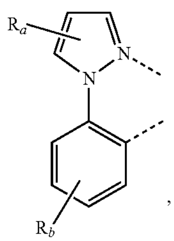
,
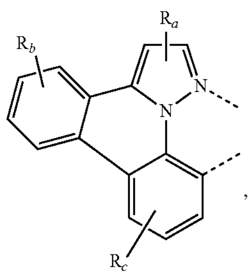
,
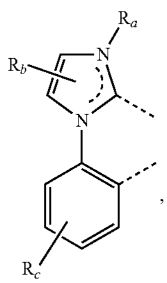
,
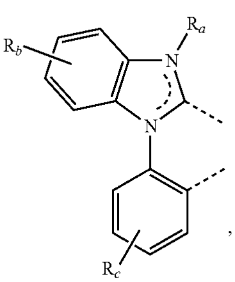
,
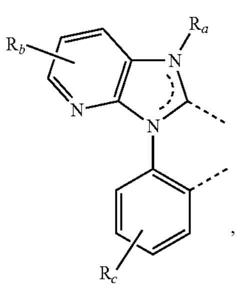
,
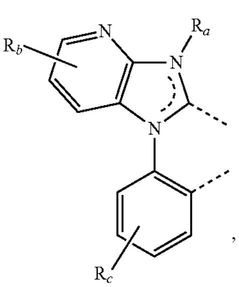
,
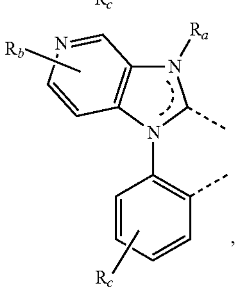
,
-continued
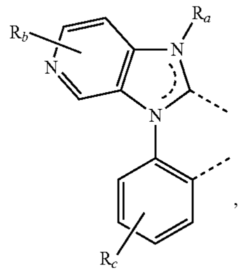
,
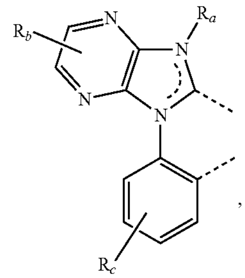
,
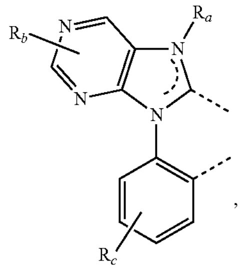
,
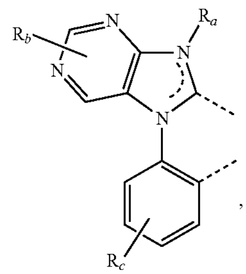
,
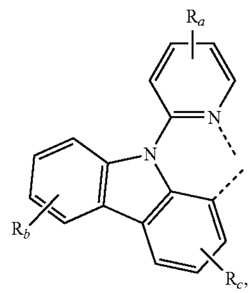
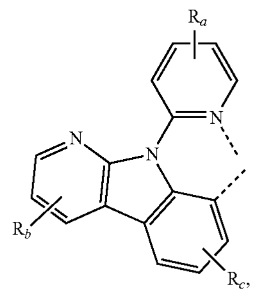
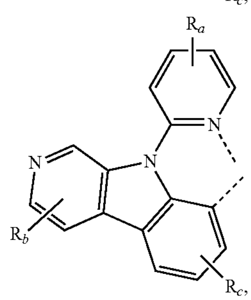
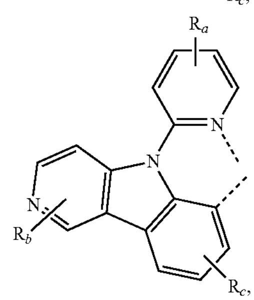
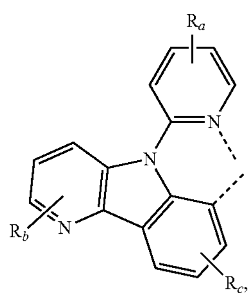
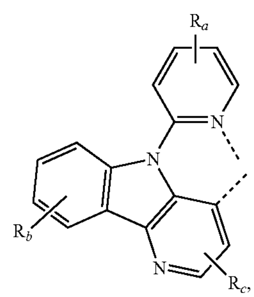
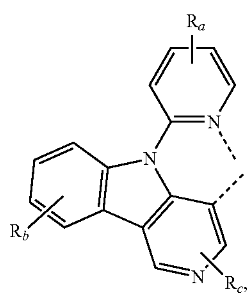
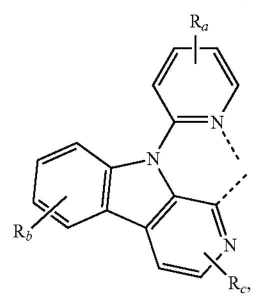

-continued

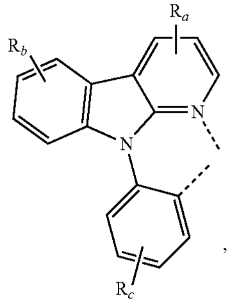, 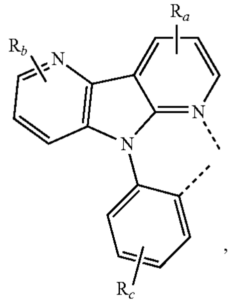,

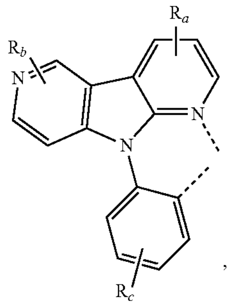, 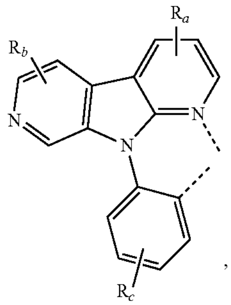,

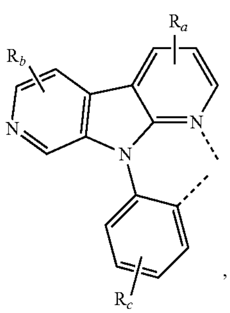, 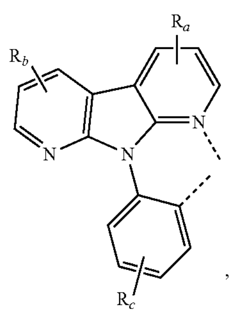,

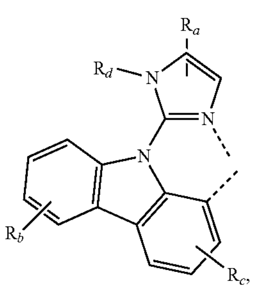 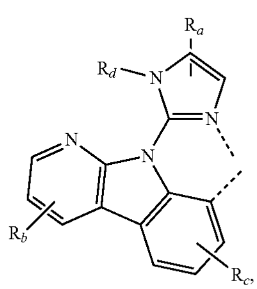

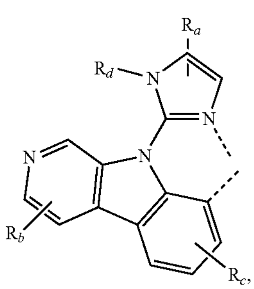 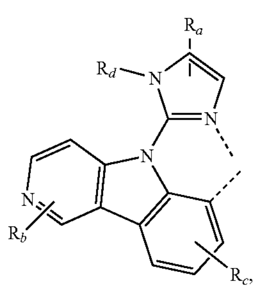

-continued

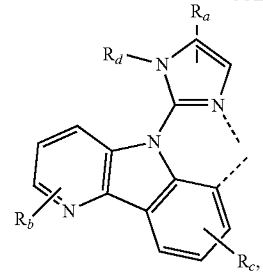 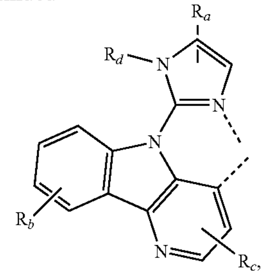

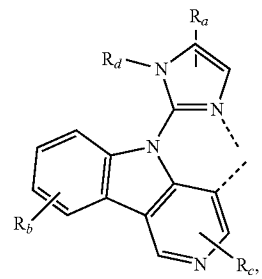 and 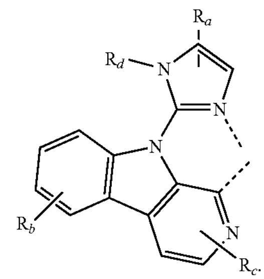

In some embodiments of the compound, $n_1$ is 1 and $n_2$ is 0. In some embodiments, $n_1$ is 1 and $n_2$ is 1. In some embodiments, $n_1$ is 0 and $n_2$ is 0.

In some embodiments of the compound, each of $Q^1$, $Q^2$, $Q^3$, and $Q^4$ is a direct bond. In some embodiments, one of Q, $Q^2$, $Q^3$, and $Q^4$ is oxygen, the remaining three of $Q^1$, $Q^2$, $Q^3$, and $Q^4$ are direct bonds. In some embodiments, two of $Q^1$, $Q^2$, $Q^3$, and $Q^4$ are oxygen, and the remaining two of $Q^1$, $Q^2$, $Q^3$, and $Q^4$ are direct bonds.

In some embodiments of the compound, two of $Z^1$, $Z^2$, $Z^3$, $Z^4$ are carbon atoms, and the remaining two of $Z^1$, $Z^2$, $Z^3$, $Z^4$ are nitrogen atoms. In some embodiments, three of $Z^1$, $Z^2$, $Z^3$, $Z^4$ are carbon atoms, and the remaining one of $Z^1$, $Z^2$, $Z^3$, $Z^4$ is a nitrogen atom. In some embodiments, each of $Z^1$, $Z^2$, $Z^3$, $Z^4$ is a carbon atom.

In some embodiments where each of $Q^1$, $Q^2$, $Q^3$, and $Q^4$ is a direct bond, the compound is in cis configuration. In some embodiments, the compound has at least one Pt-carbene or Ir-carbene bond.

In some embodiments of the compound, the compound of Formula III is selected from the group consisting of:

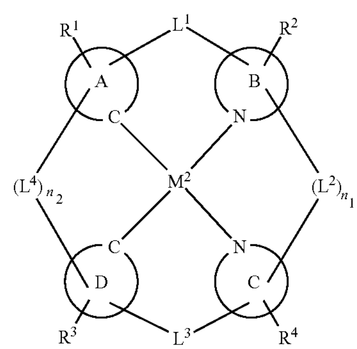,

-continued
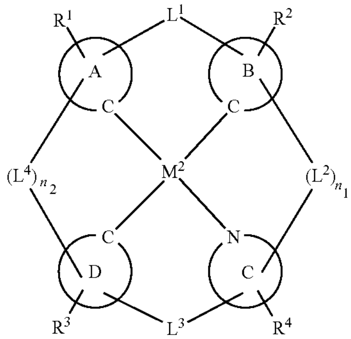
,
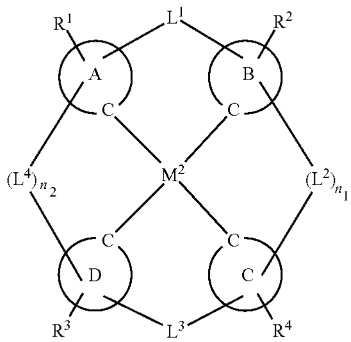
,
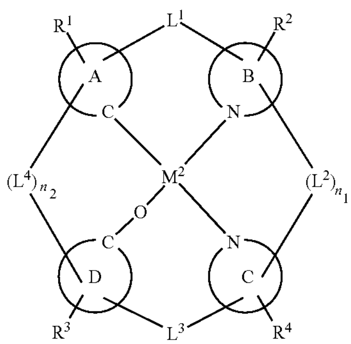
,
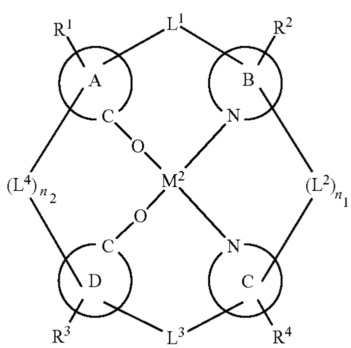
,
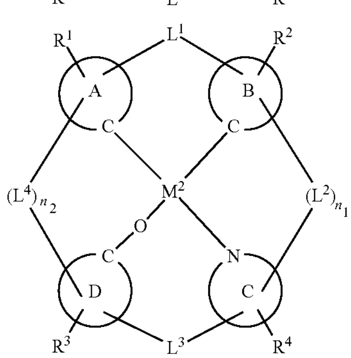
,
-continued
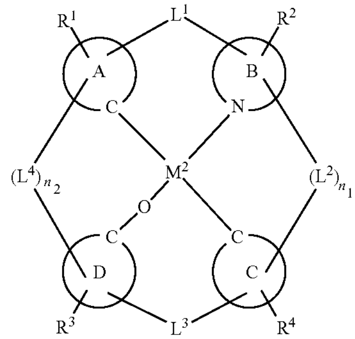
, and
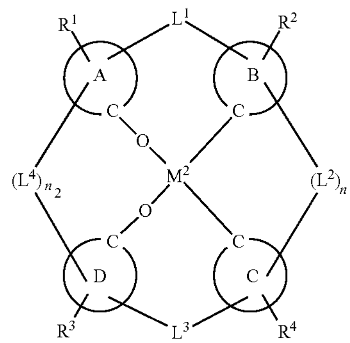
.
In some embodiments of the compound, the compound is selected from the group consisting of:
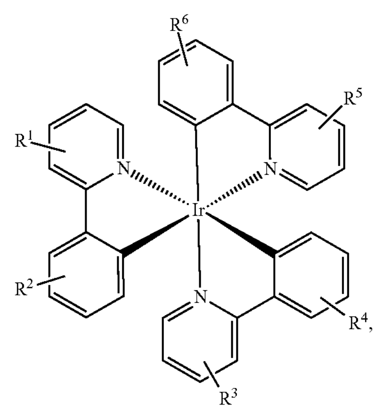
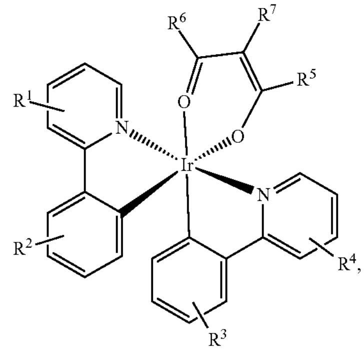

-continued
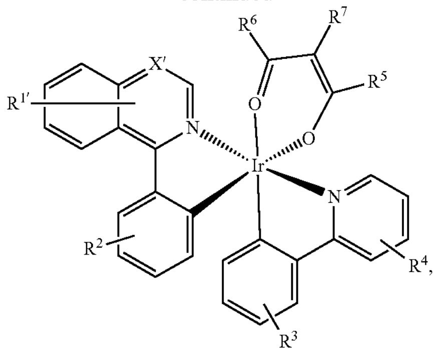
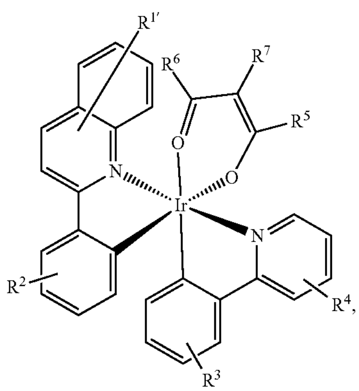
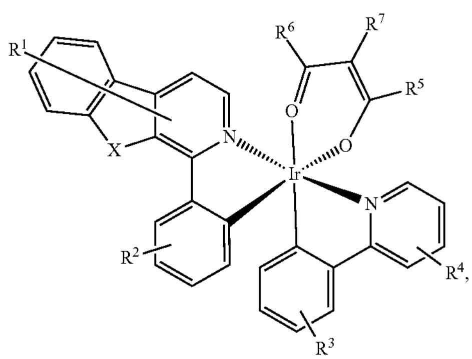
X = S, O, NR, $CR_2$
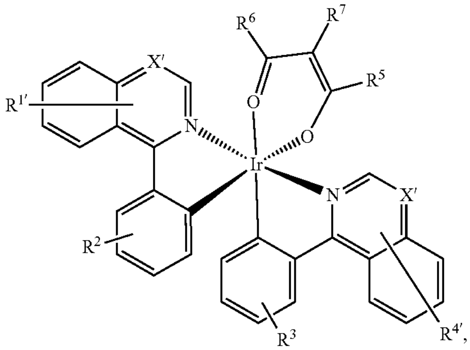
-continued
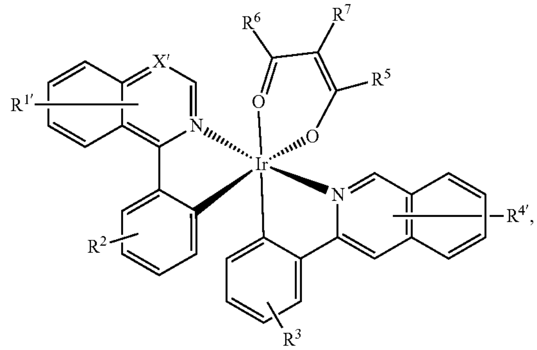
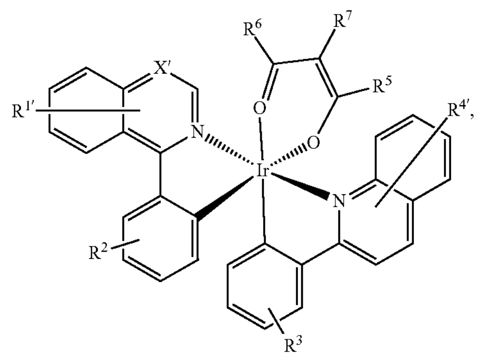
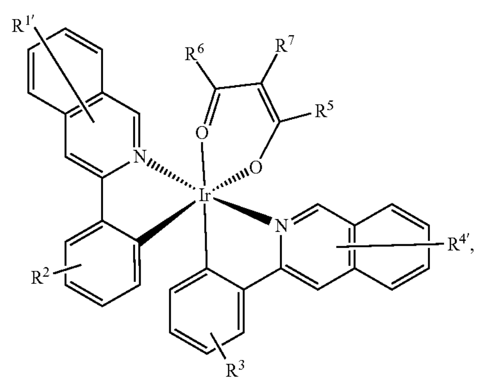
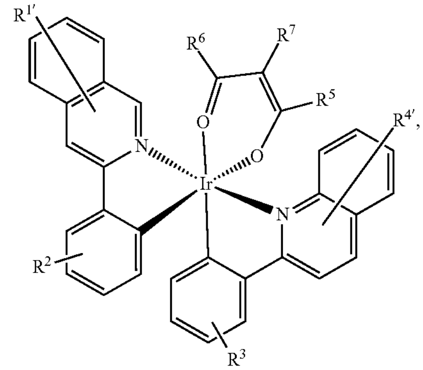

-continued
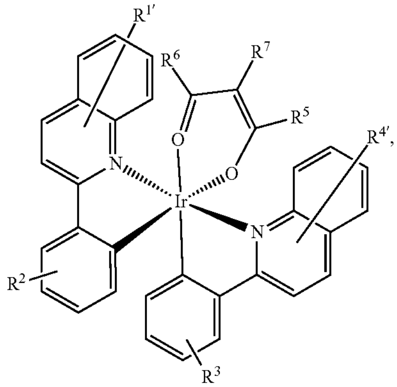
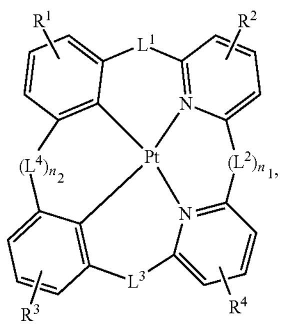
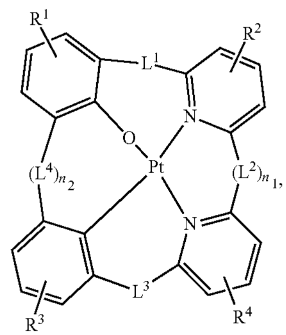
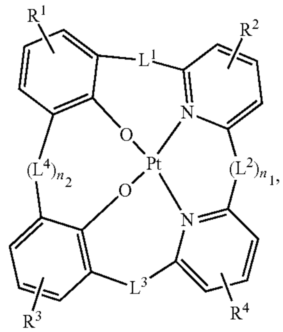
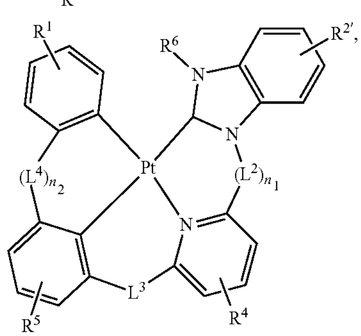
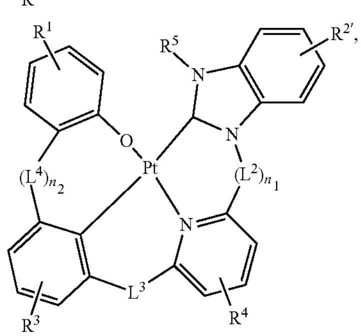
-continued
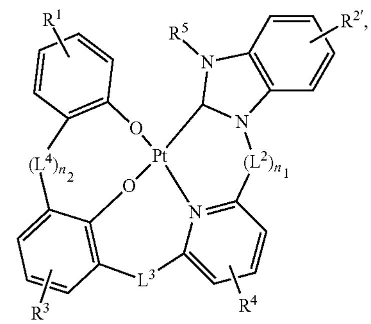
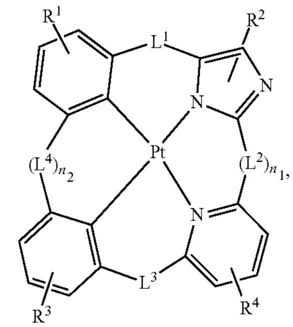
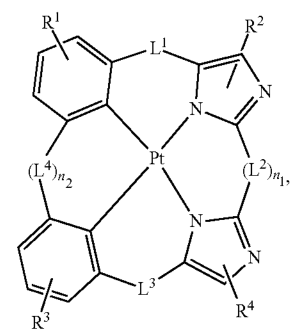
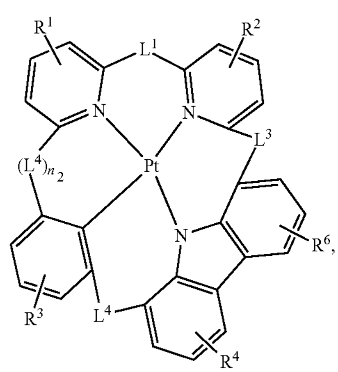
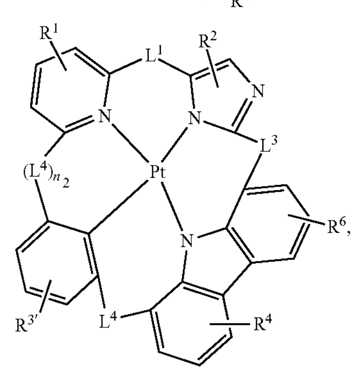

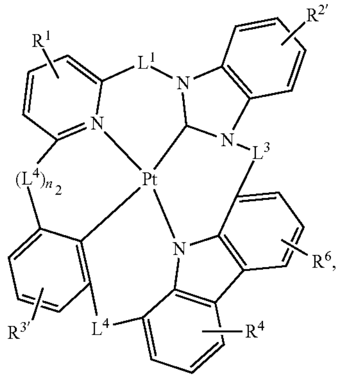
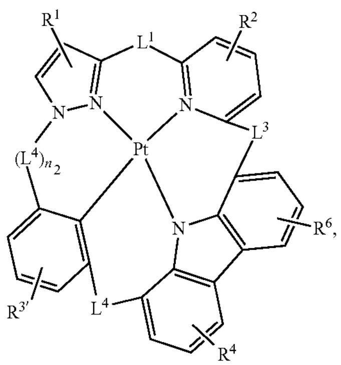
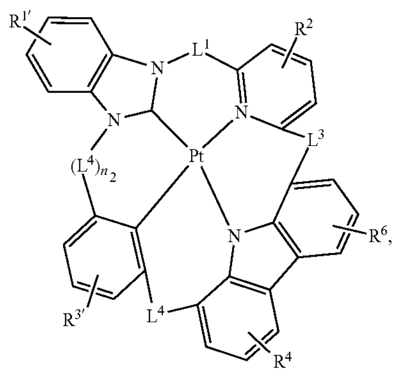
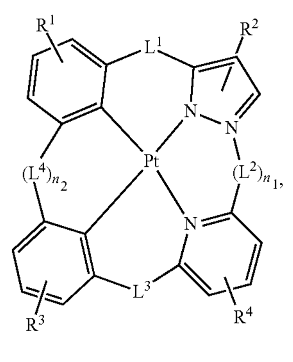
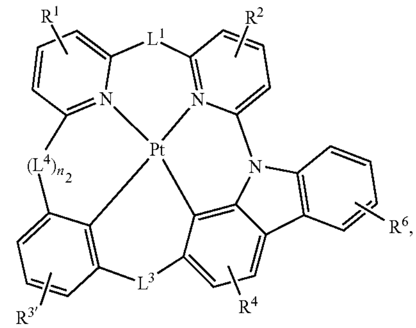
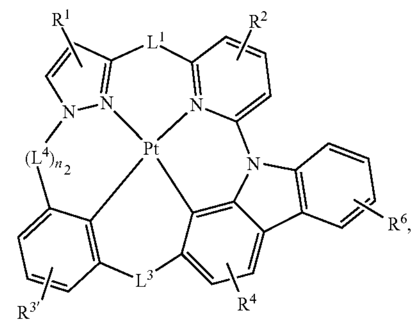
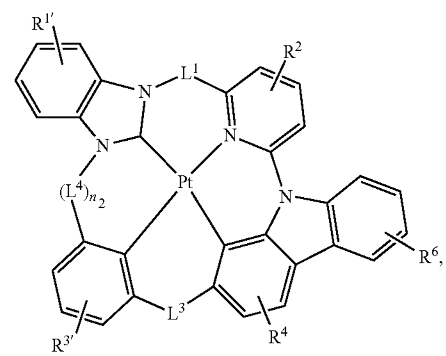
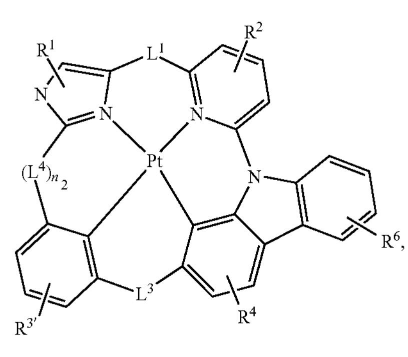

-continued

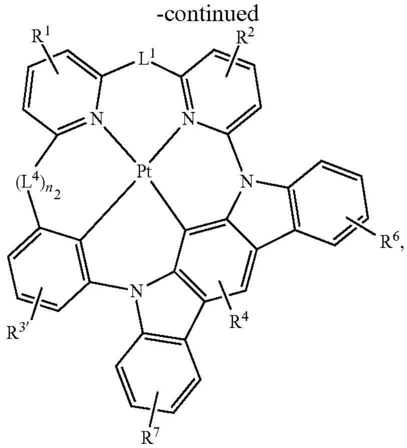

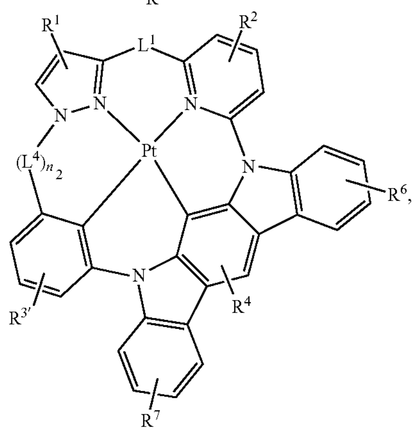

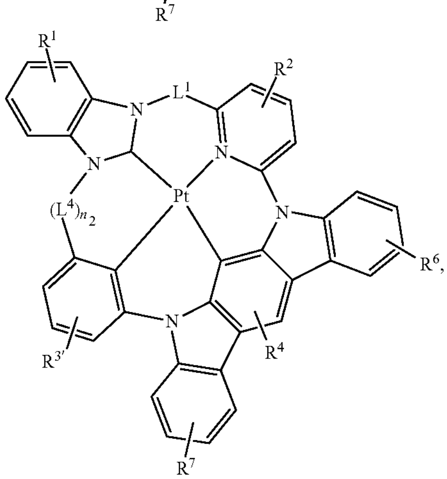

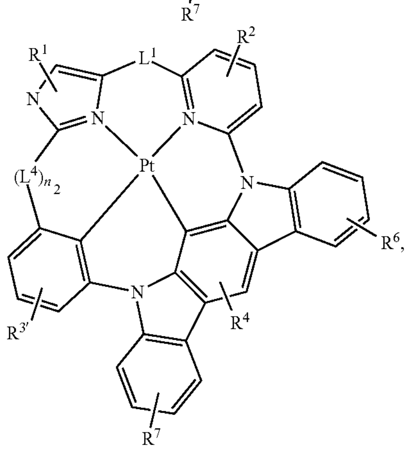

and

-continued

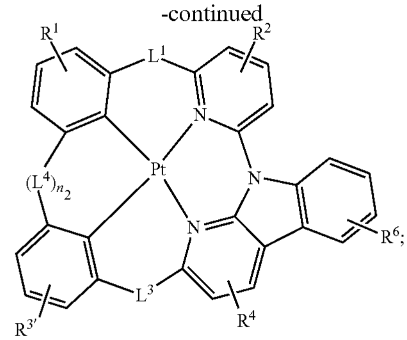

wherein X is selected from the group consisting of O, Se, and Se;

wherein X' is carbon or nitrogen;

wherein $R^{1'}$, $R^{2'}$, $R^{3'}$, and $R^{4'}$ each represents mono to the maximum possible number of substitution, or no substitution;

wherein each $R^{1'}$, $R^{2'}$, $R^{3'}$, and $R^{4'}$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfonyl, sulfonyl, phosphino, and combinations thereof; and wherein any two substituents among R, R', $R^1$, $R^2$, $R^3$, $R^4$, $R^3$, $R^6$, and $R^7$ are optionally joined or fused into a ring. In some embodiments of the compound, at least one $R^1$ is para to N coordinated to Ir, and at least one $R^4$ is para to carbon coordinated to Ir. In some other embodiments of the compound, at least one of $R^1$ and $R^{1'}$ and at least one $R^4$ and $R^{4'}$ is selected from the group consisting of:

Substituent 1

----$CH_3$,

Substituent 2

----$CD_3$,

Substituent 3

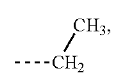

Substituent 4

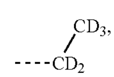

Substituent 5

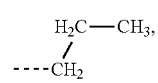

Substituent 6

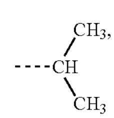

Substituent 7

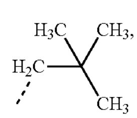

Substituent 8

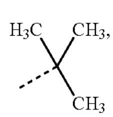

-continued

Substituent 9

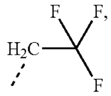

Substituent 10

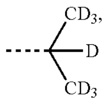

Substituent 11

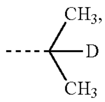

Substituent 12

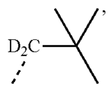

Substituent 13

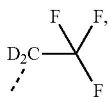

Substituent 14

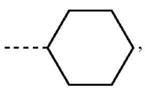

Substituent 15

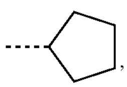

Substituent 16

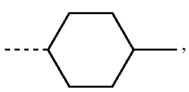

Substituent 17

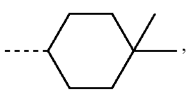

Substituent 18

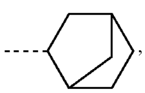

Substituent 19

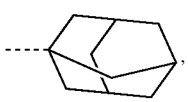

Substituent 20

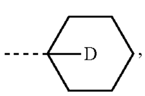

Substituent 21

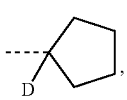

Substituent 22

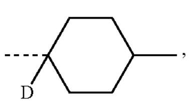

Substituent 23

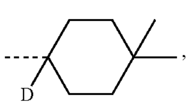

-continued

Substituent 24

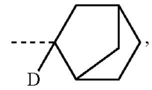

Substituent 25

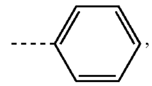

Substituent 26

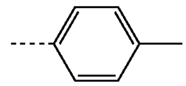

Substituent 27

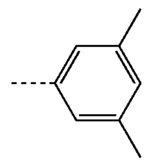

Substituent 28

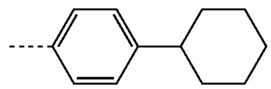

Substituent 29

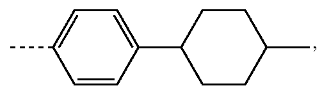

Substituent 30

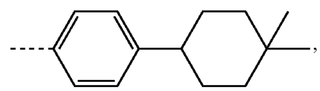

Substituent 31

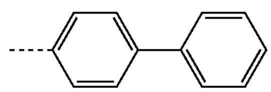

Substituent 32

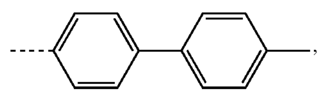

Substituent 33

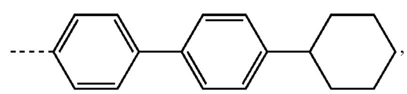

Substituent 34

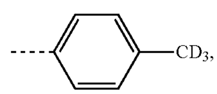

Substituent 35

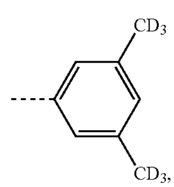

Substituent 36

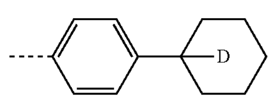

Substituent 37

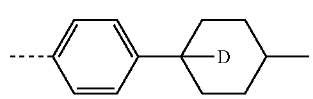

-continued
Substituent 38
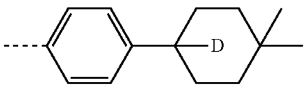
Substituent 39
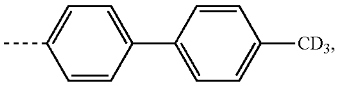
Substituent 40
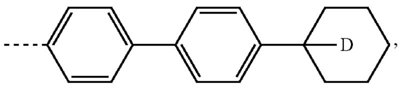
Substituent 41
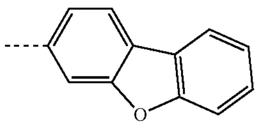
Substituent 42
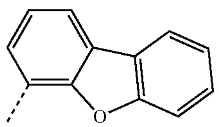
Substituent 43
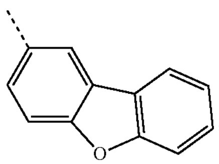
Substituent 44
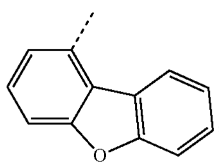
Substituent 45
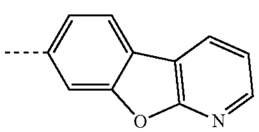
Substituent 46
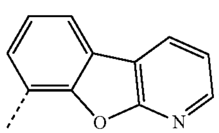
Substituent 47
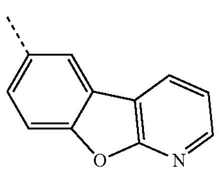
Substituent 48
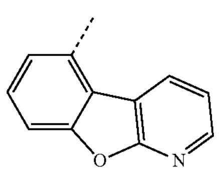
-continued
Substituent 49
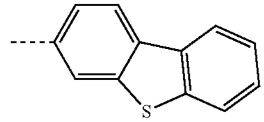
Substituent 50
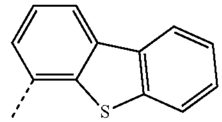
Substituent 51
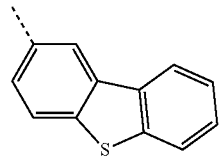
Substituent 52
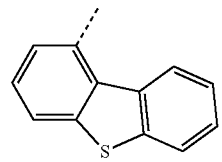
Substituent 53
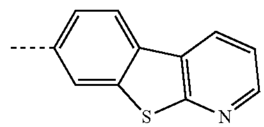
Substituent 54
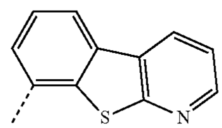
Substituent 55
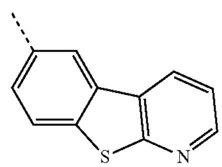
Substituent 56
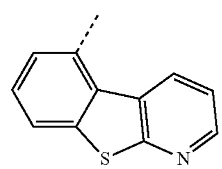
Substituent 57
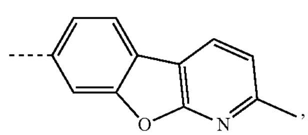
Substituent 58
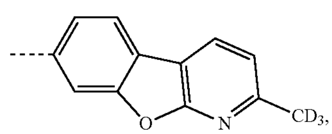
Substituent 59
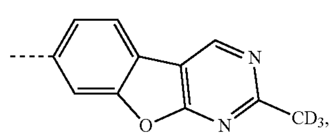

-continued
Substituent 60
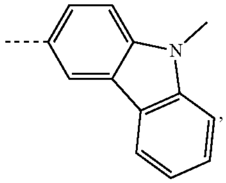
Substituent 61
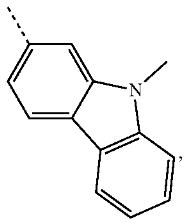
Substituent 62
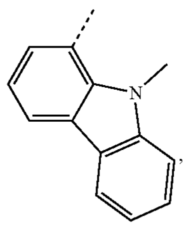
Substituent 63
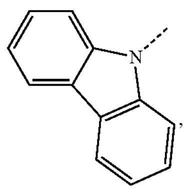
Substituent 64
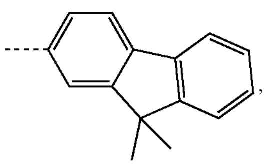
Substituent 65
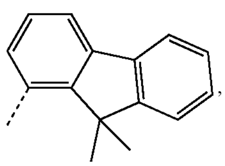
Substituent 66
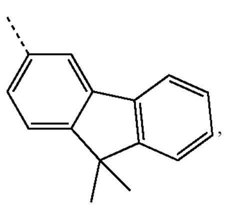
Substituent 67
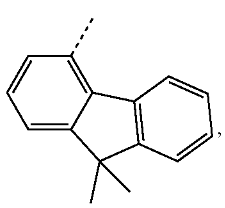
-continued
Substituent 68
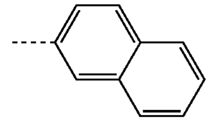
Substituent 69
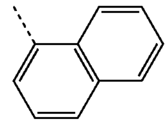
Substituent 70
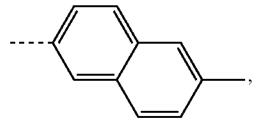
Substituent 71
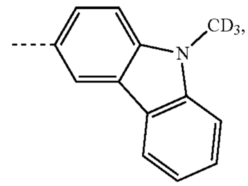
Substituent 72
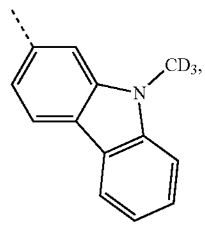
Substituent 73
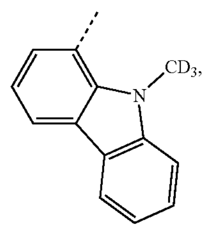
Substituent 74
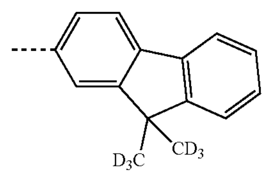
Substituent 75
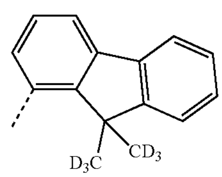
Substituent 76
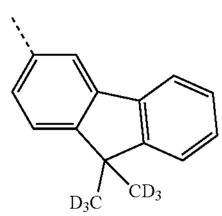

-continued
Substituent 77
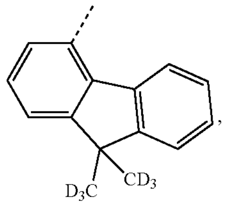
Substituent 78
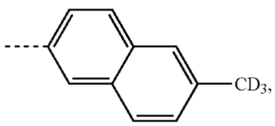
Substituent 79
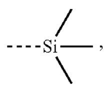
Substituent 80
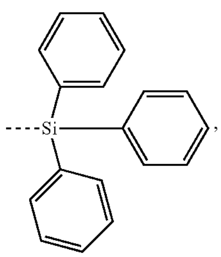
Substituent 81
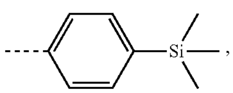
Substituent 82
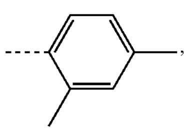
Substituent 83
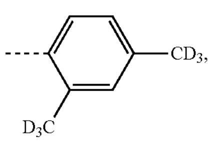
Substituent 84
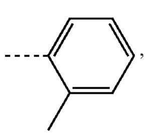
Substituent 85
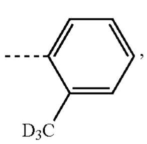
Substituent 86
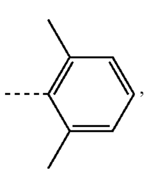
-continued
Substituent 87
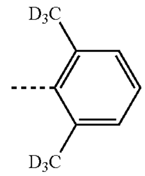
Substituent 88
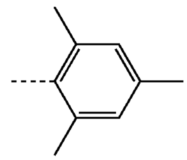
Substituent 89
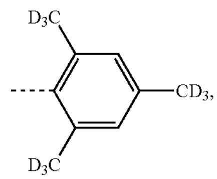
Substituent 90
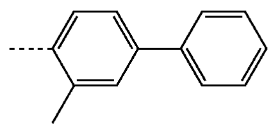
Substituent 91
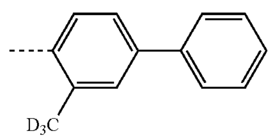
Substituent 92
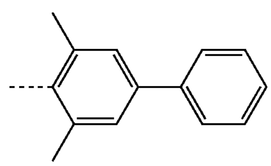
Substituent 93
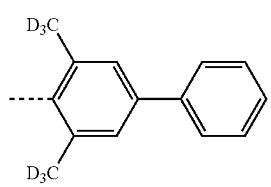
Substituent 94
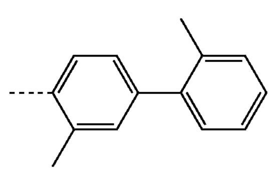
Substituent 95
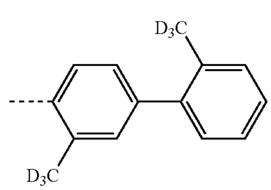

-continued
Substituent 96
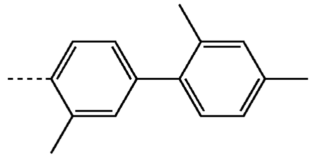
Substituent 97
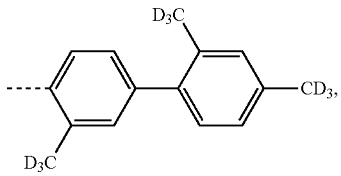
Substituent 98
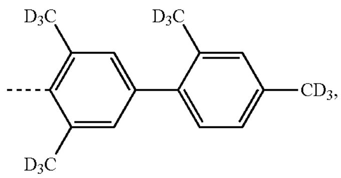
Substituent 99
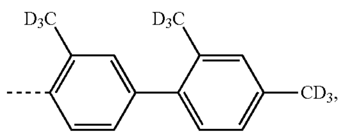
Substituent 100
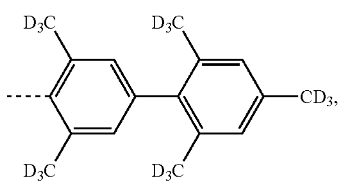
-continued
Substituent 101
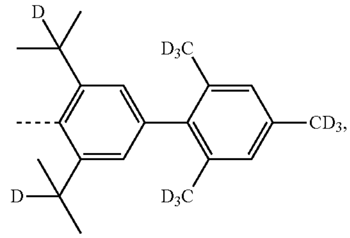
Substituent 102
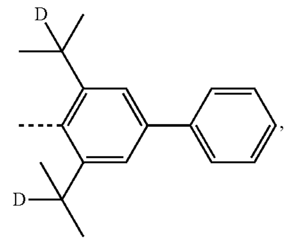
Substituent 103
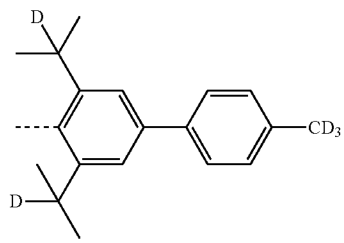
and
Substituent 104
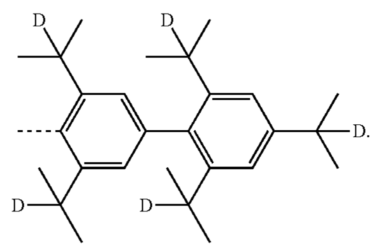
In some embodiments of the compound, the compound is selected from the group consisting of:
Compound 1
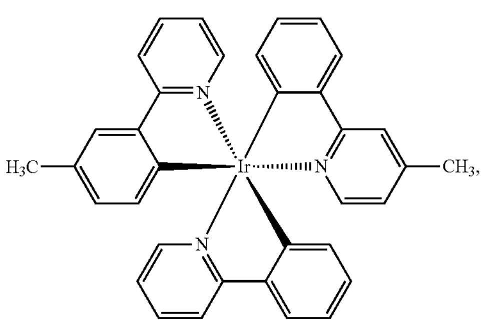
Compound 2
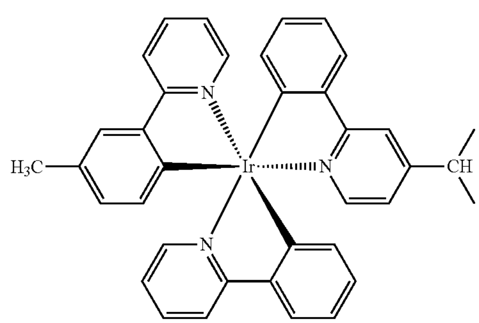

-continued
Compound 3
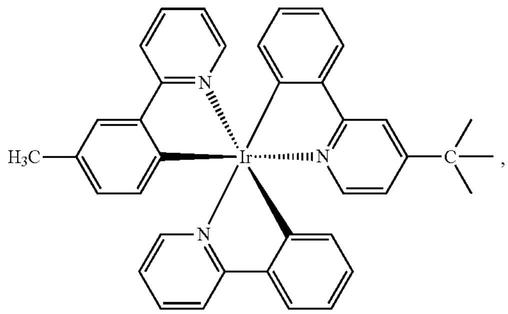
Compound 4
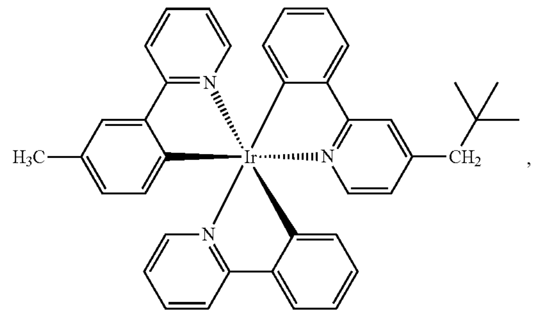
Compound 5
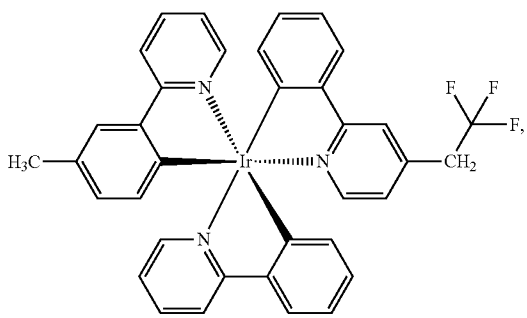
Compound 6
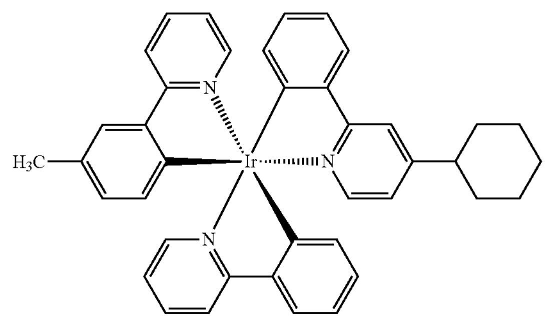
Compound 7
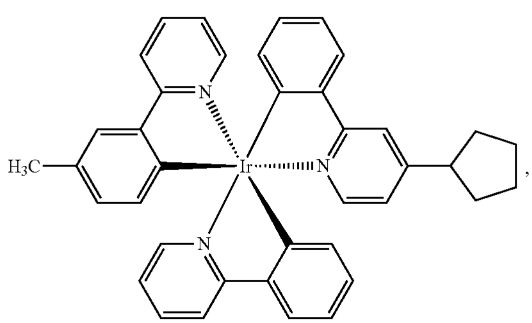
Compound 8
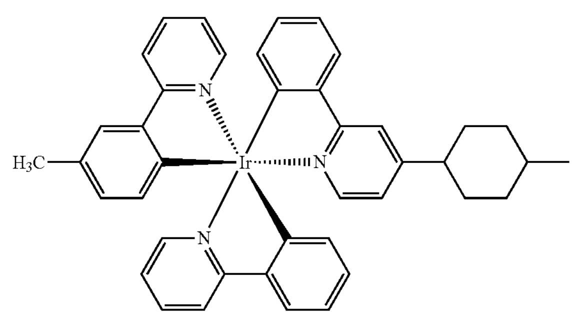
Compound 9
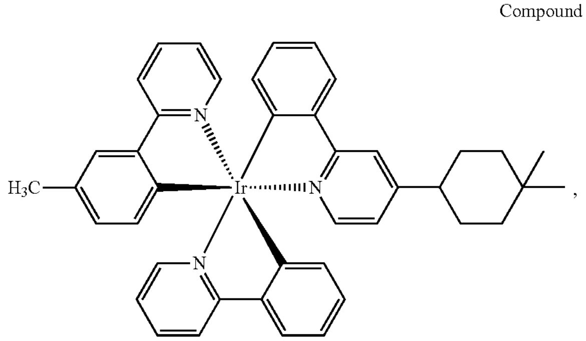
Compound 10
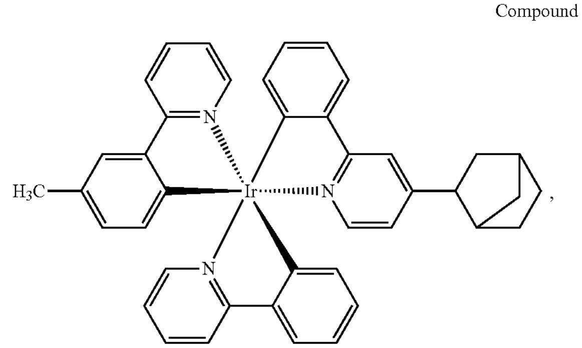

-continued
Compound 11
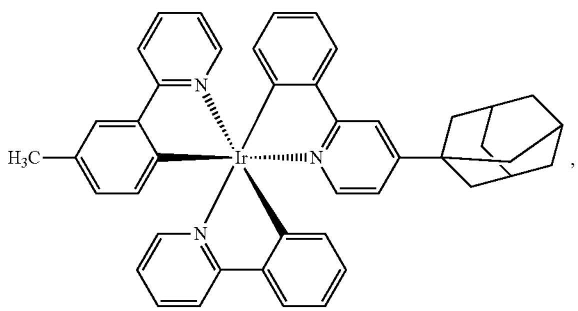
Compound 12
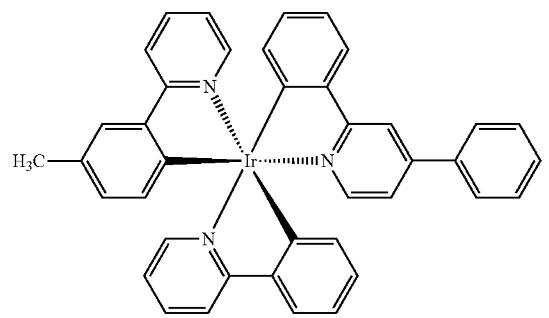
Compound 13
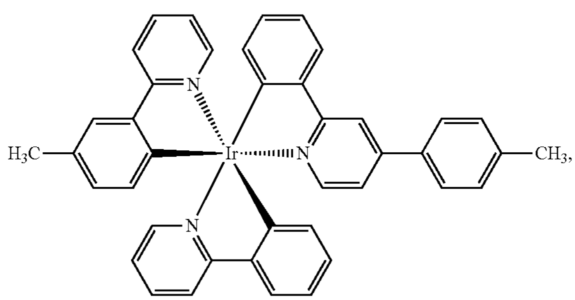
Compound 14
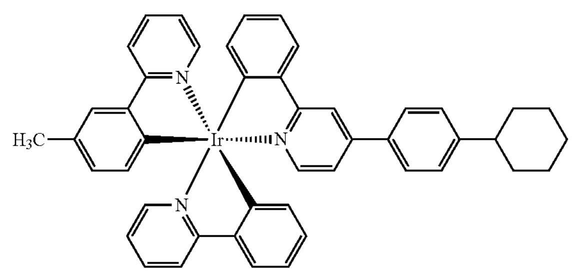
Compound 15
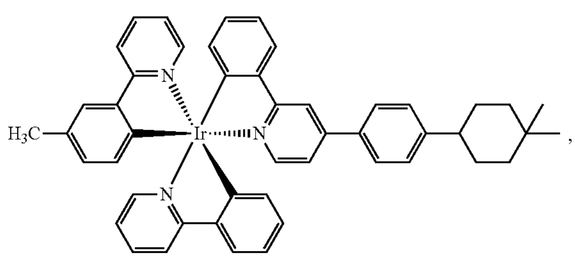
Compound 16
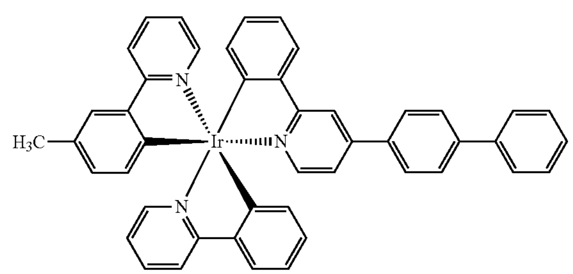
Compound 17
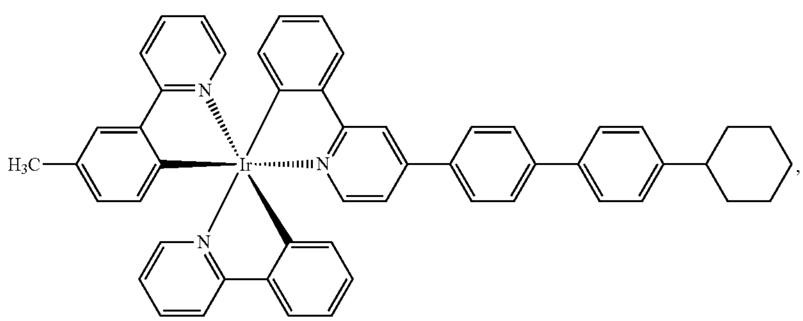
Compound 18
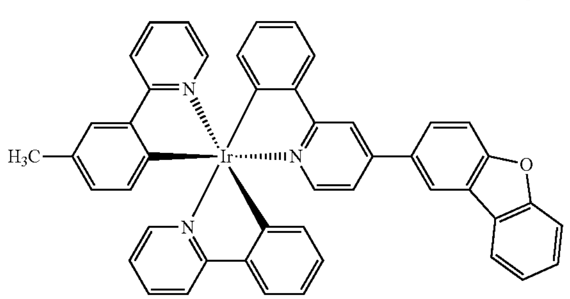
Compound 19
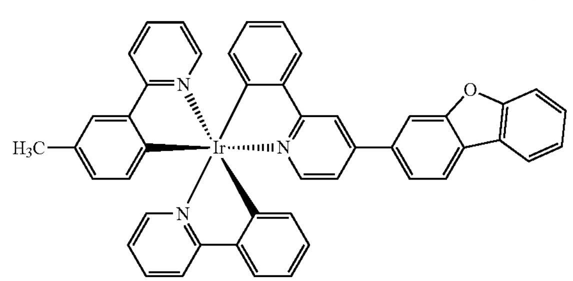

-continued
Compound 20
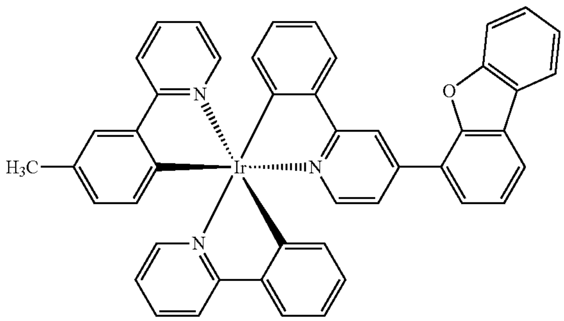
,
Compound 21
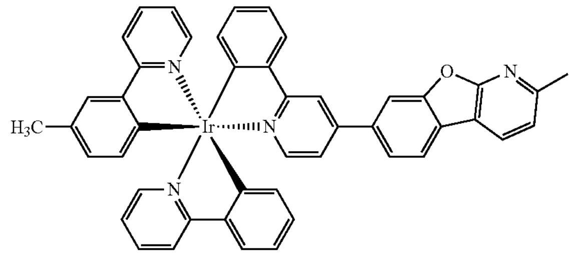
,
Compound 22
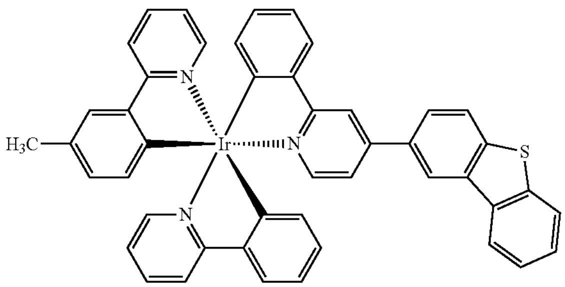
,
Compound 23
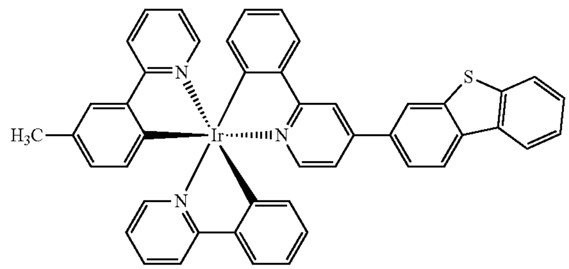
,
Compound 24
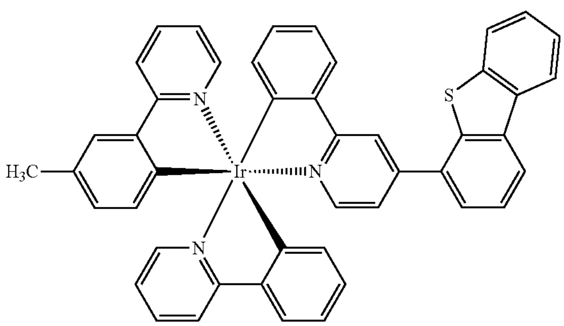
,
Compound 25
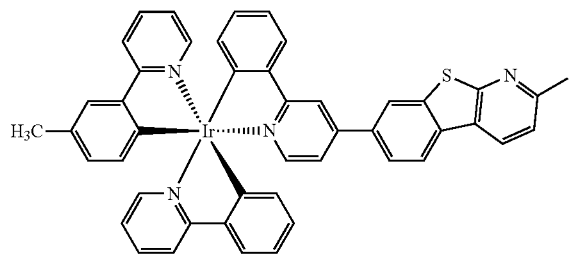
,
Compound 26
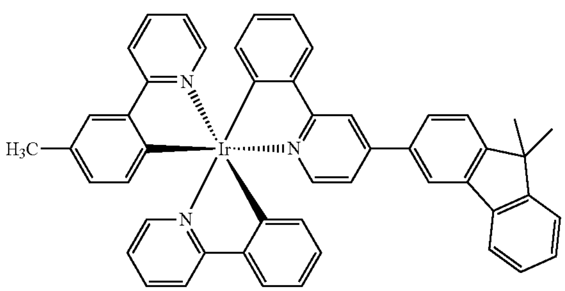
,
Compound 27
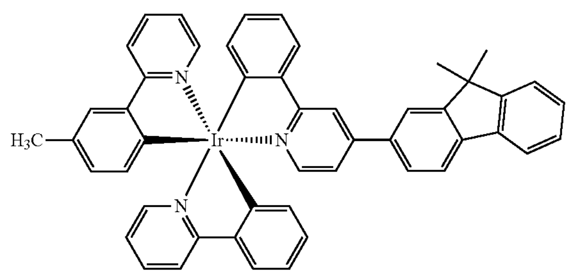
,
Compound 28
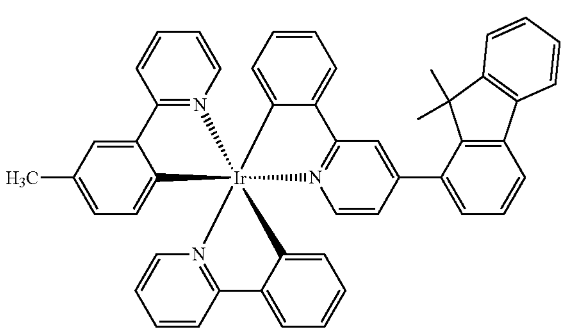
,
Compound 29
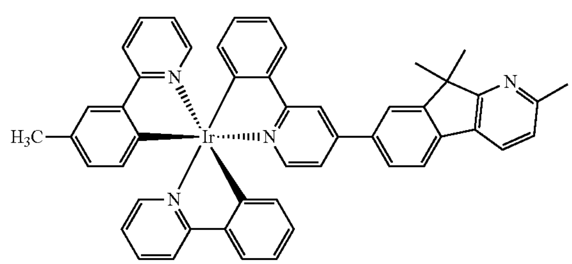
, -continued
Compound 30
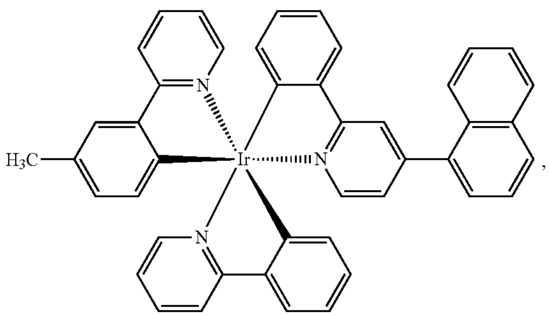
Compound 31
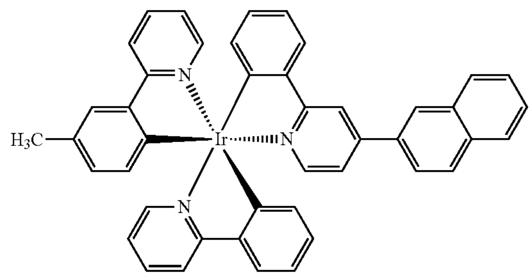
Compound 32
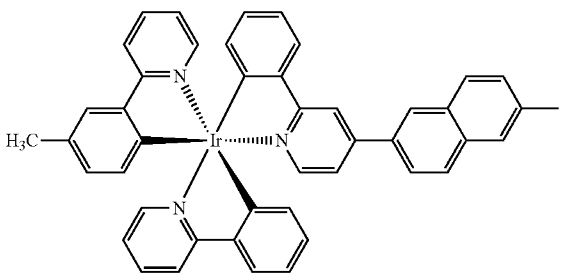
Compound 33
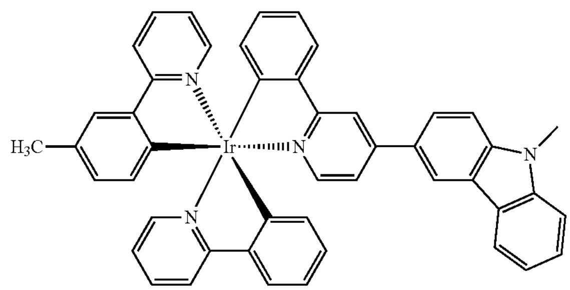
Compound 34
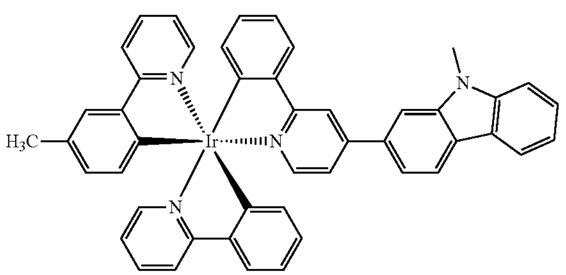
Compound 35
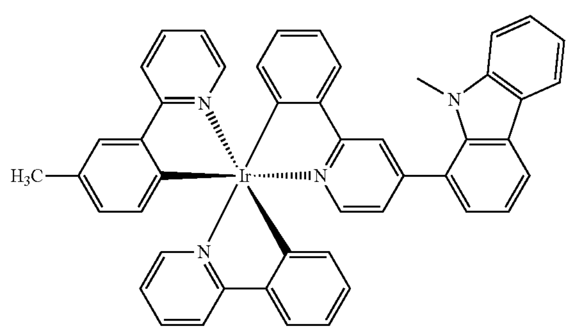
Compound 36
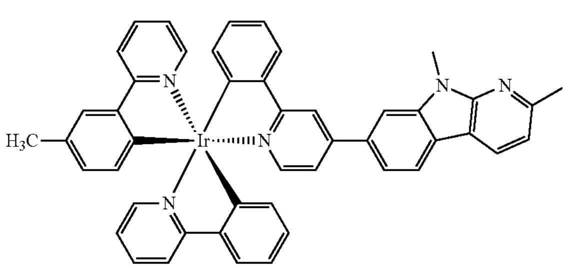
Compound 37
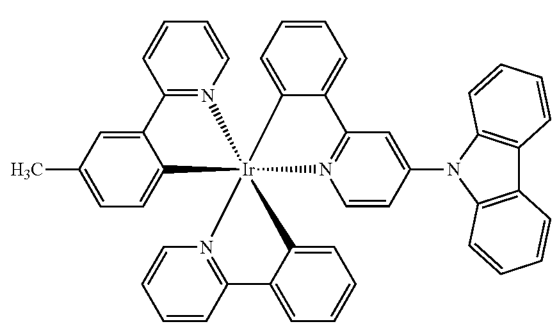

-continued
Compound 38
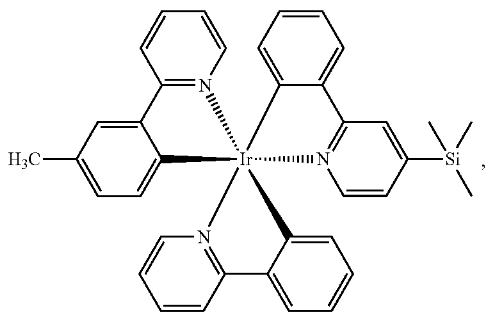
Compound 39
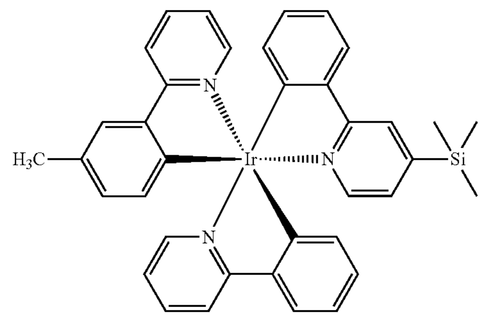
Compound 40
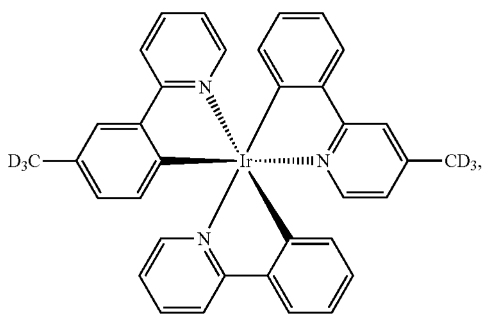
Compound 41
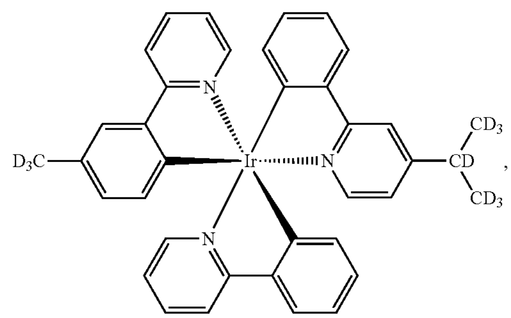
Compound 42
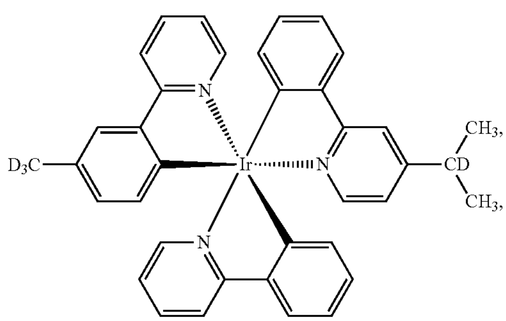
Compound 43
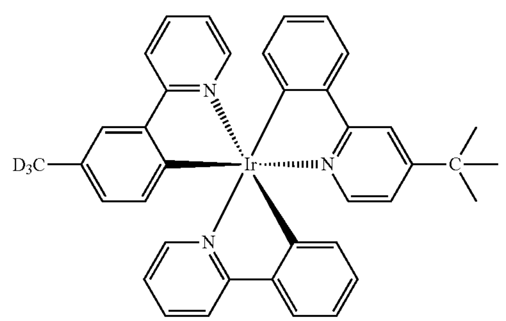
Compound 44
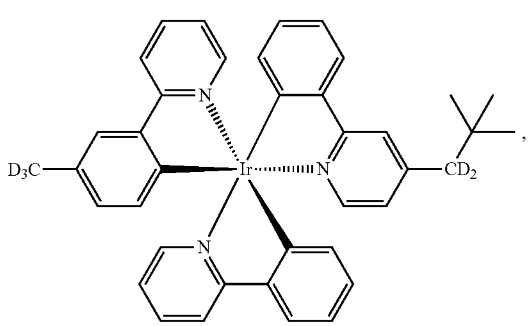
Compound 45
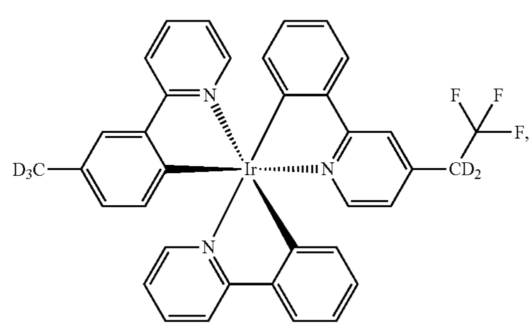

-continued
Compound 46
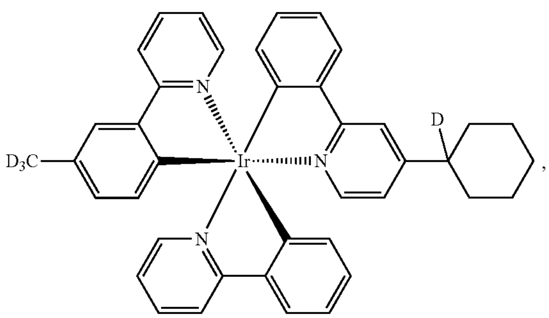
Compound 47
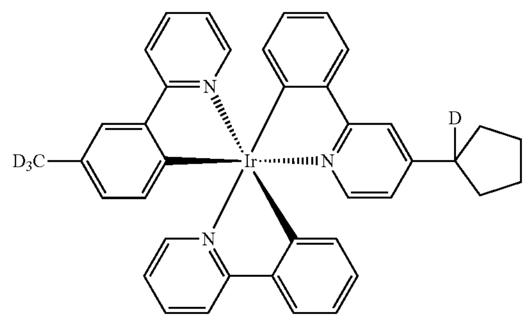
Compound 48
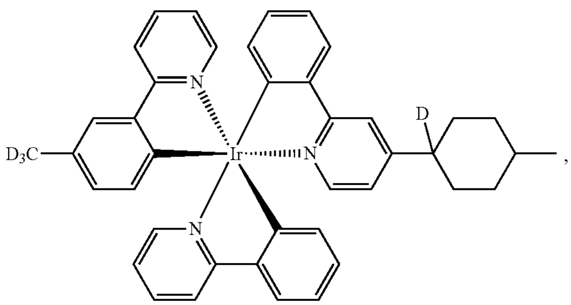
Compound 49
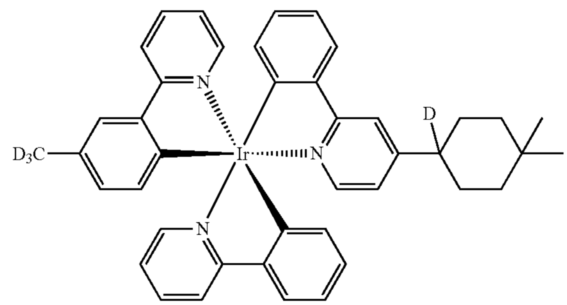
Compound 50
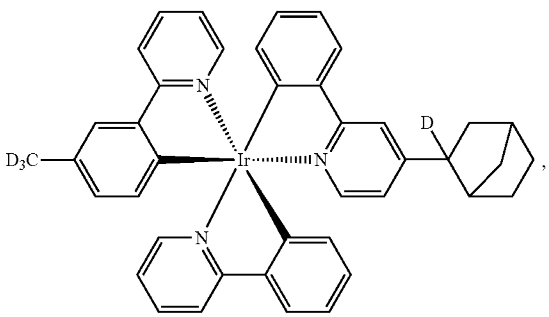
Compound 51
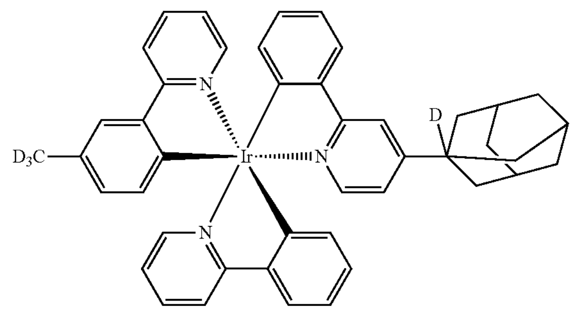
Compound 52
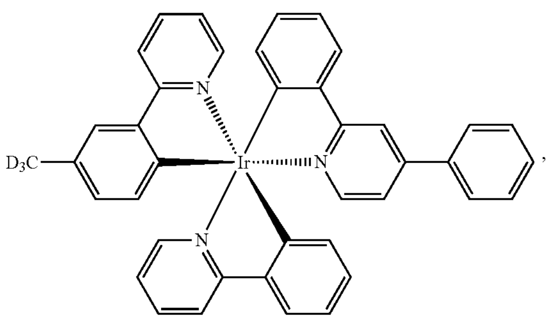
Compound 53
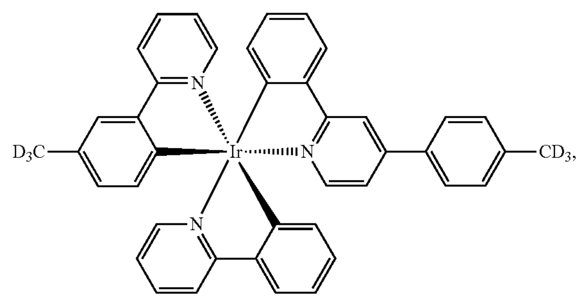
Compound 54
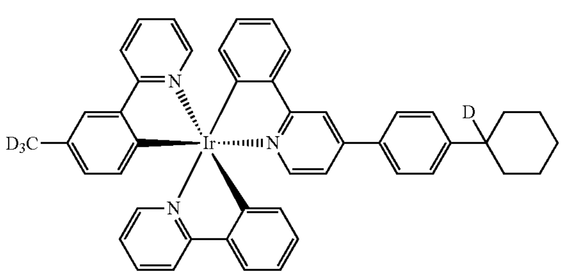
Compound 55
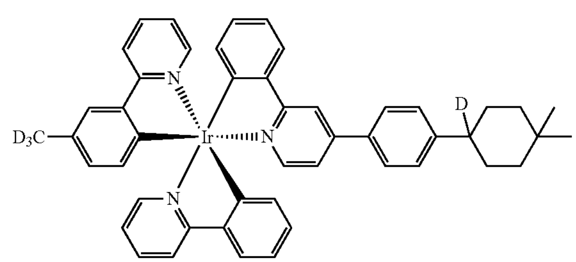

-continued
Compound 56
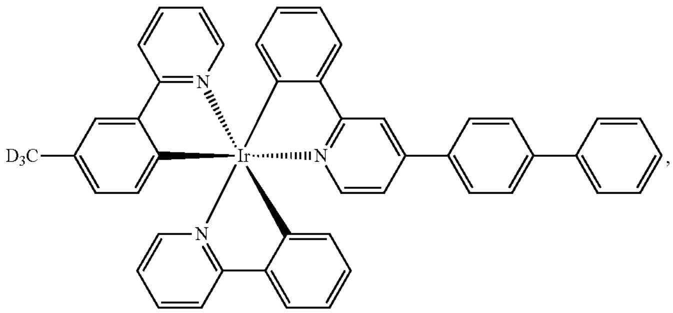
Compound 57
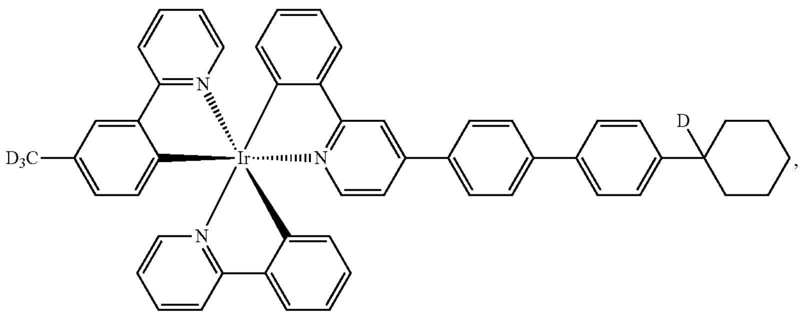
Compound 58
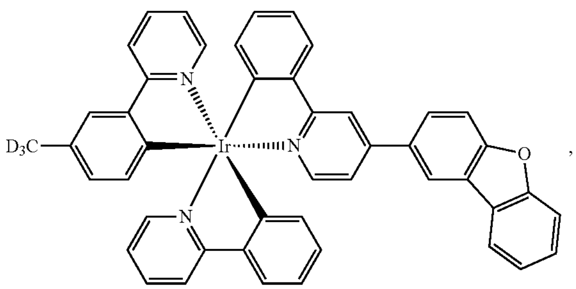
Compound 59
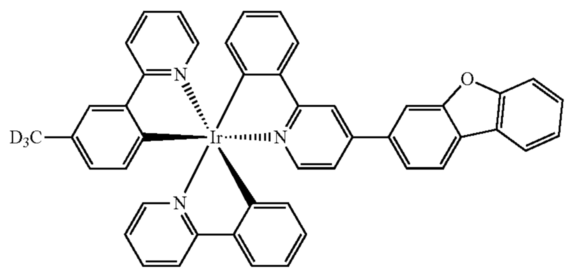
Compound 60
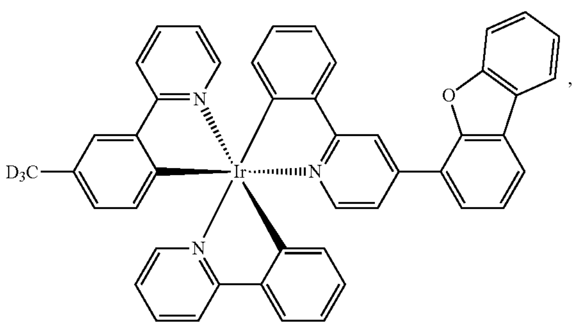
Compound 61
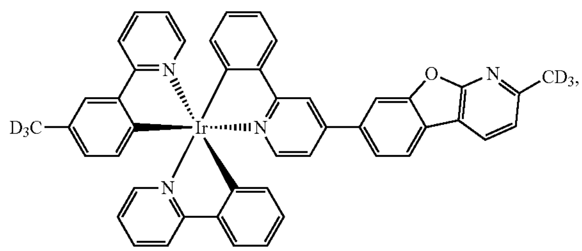
Compound 62
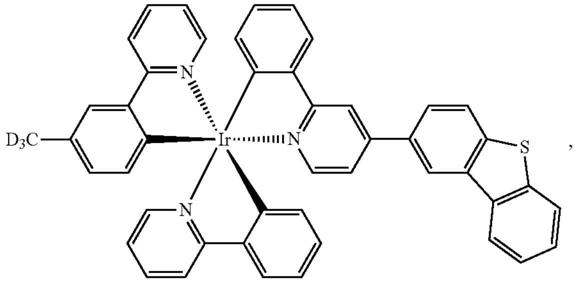
Compound 63
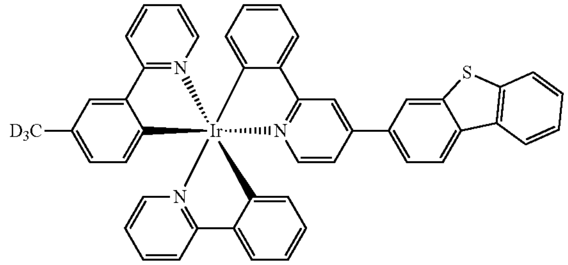

-continued
Compound 64
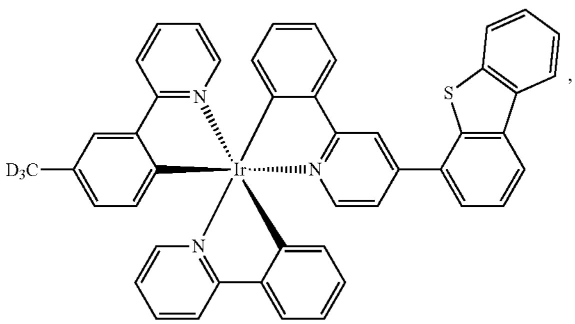
Compound 65
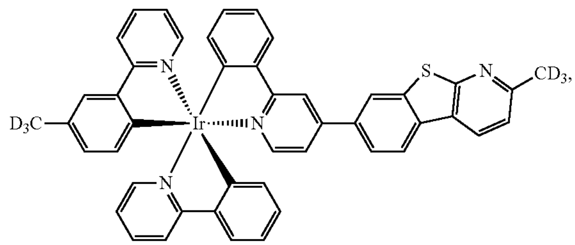
Compound 66
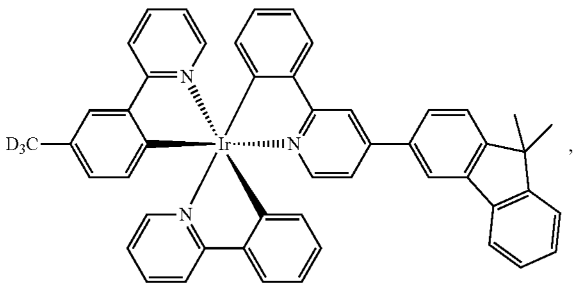
Compound 67
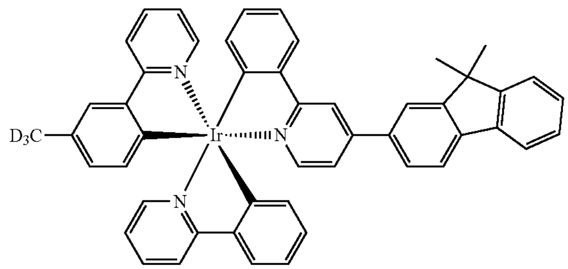
Compound 68
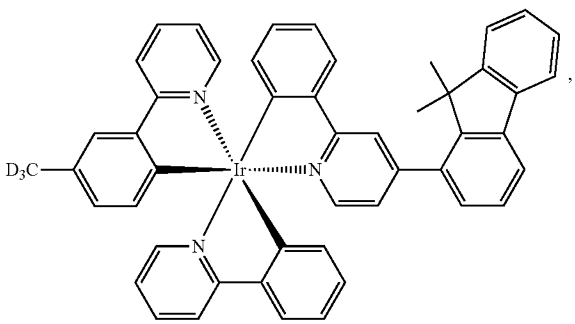
Compound 69
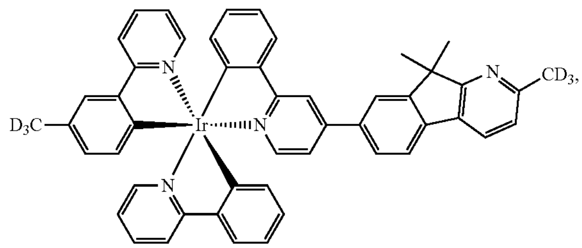
Compound 70
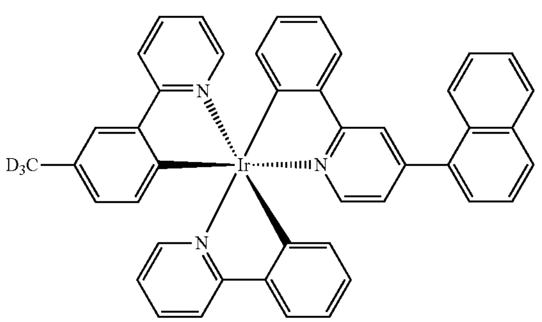
Compound 71
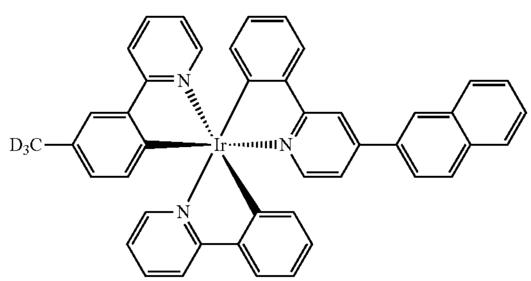
Compound 72
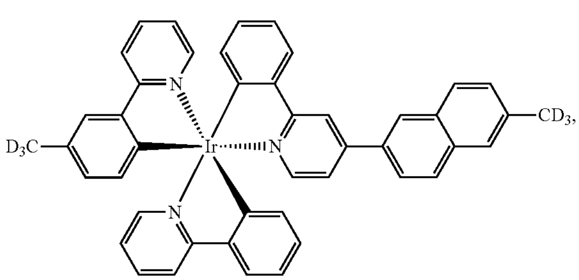
Compound 73
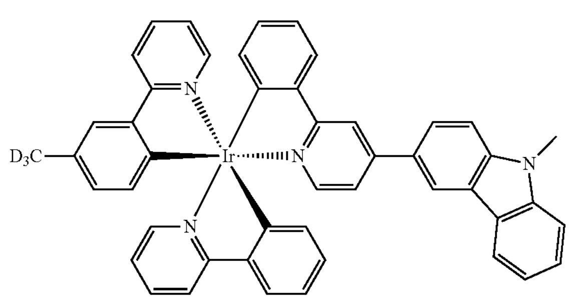

-continued
Compound 74
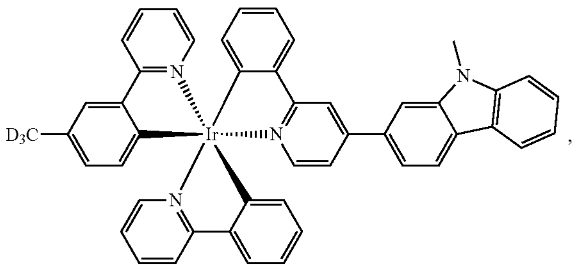
Compound 75
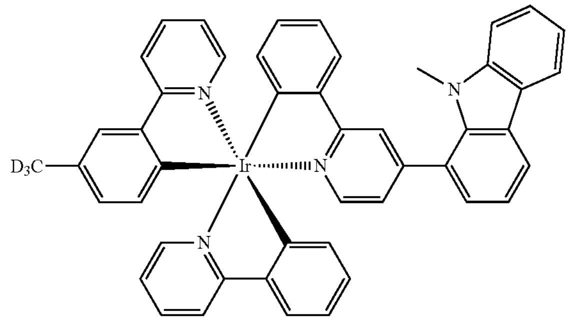
Compound 76
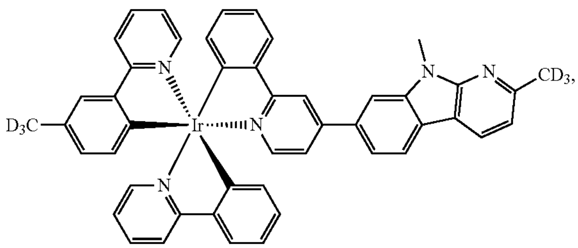
Compound 77
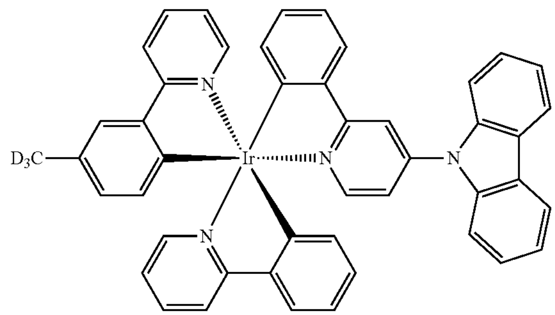
Compound 78
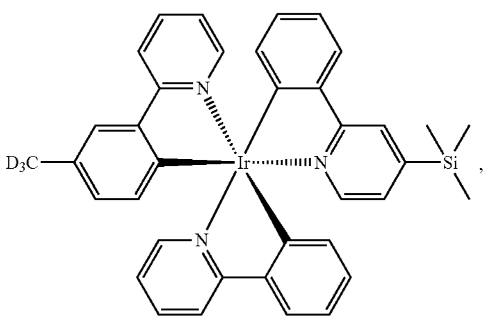
Compound 79
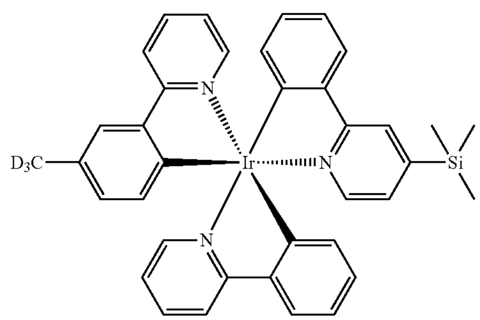
Compound 80
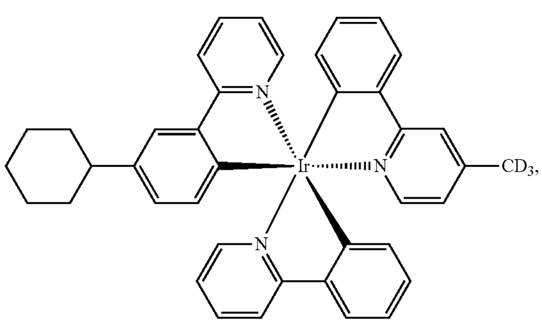
Compound 81
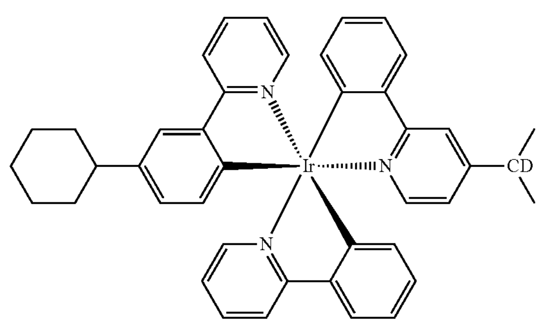

-continued
Compound 82
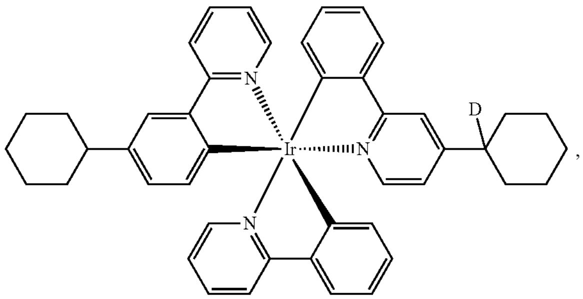
Compound 83
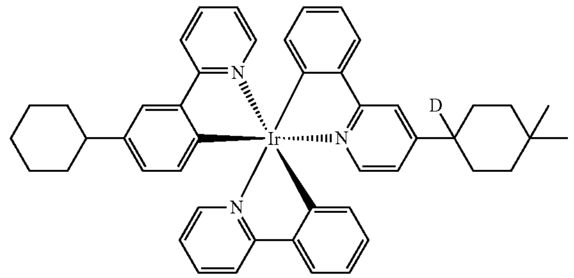
Compound 84
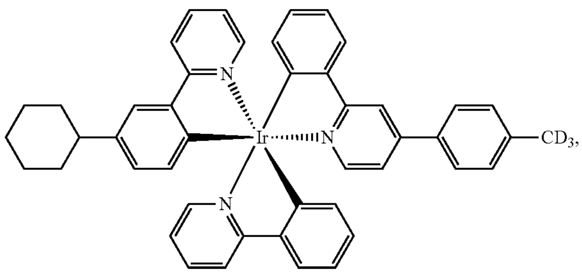
Compound 85
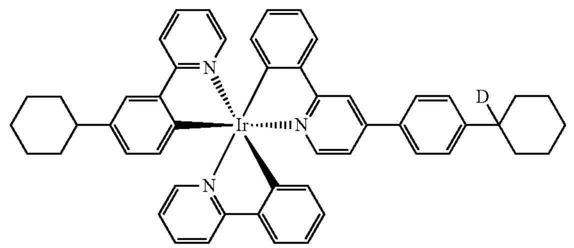
Compound 86
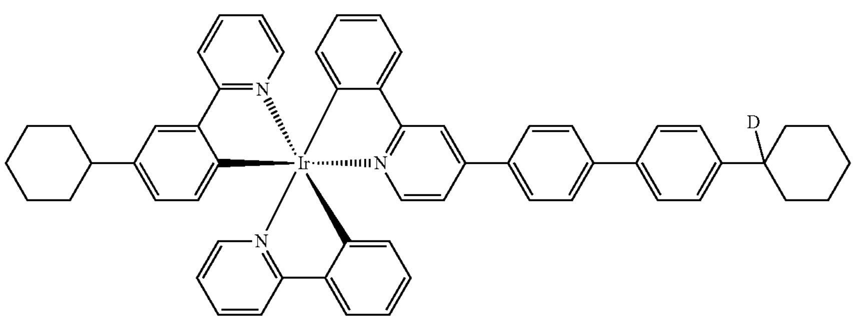
Compound 87
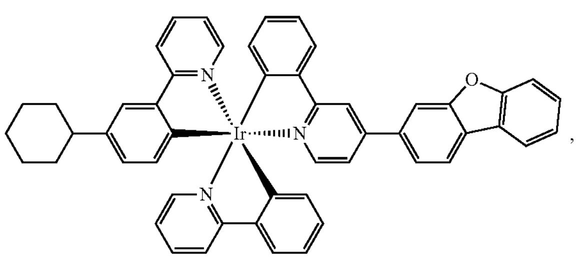
Compound 88
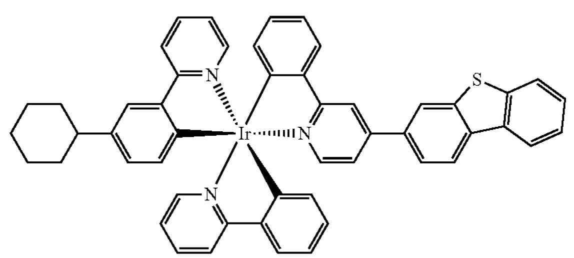
Compound 89
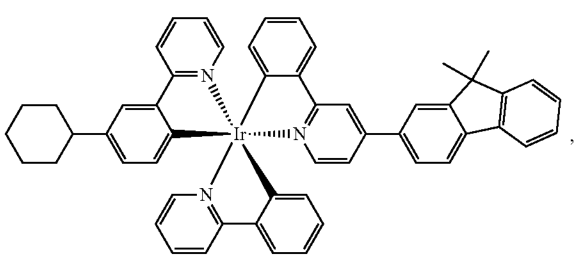
Compound 90
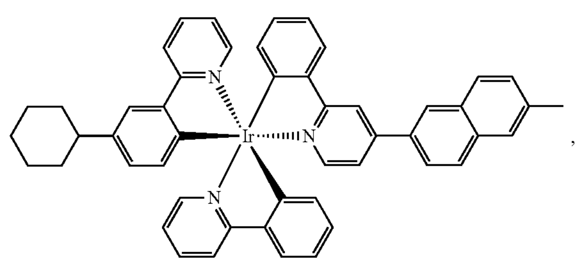

-continued
Compound 91
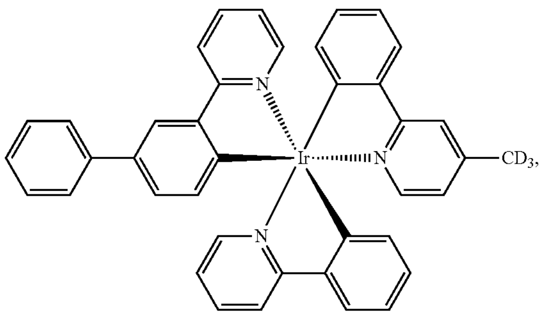
Compound 92
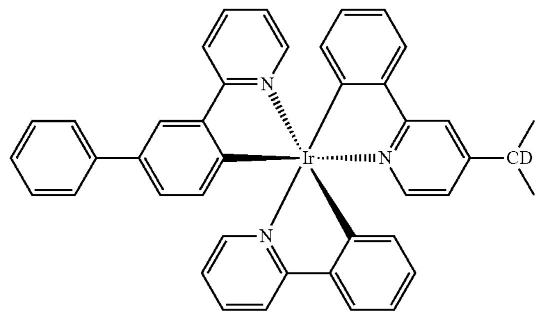
Compound 93
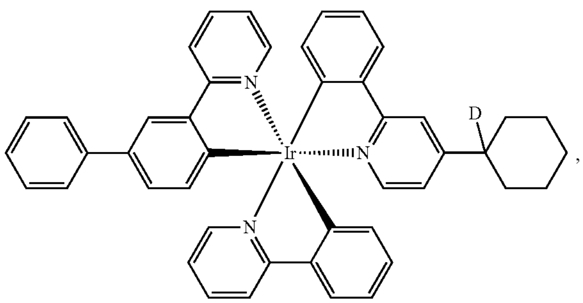
Compound 94
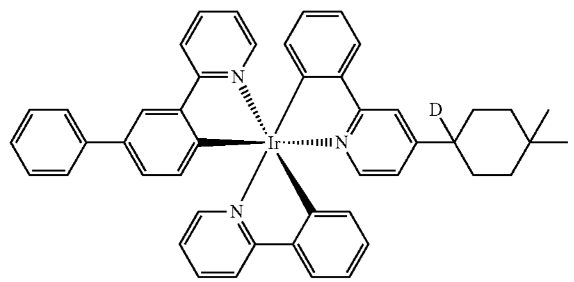
Compound 95
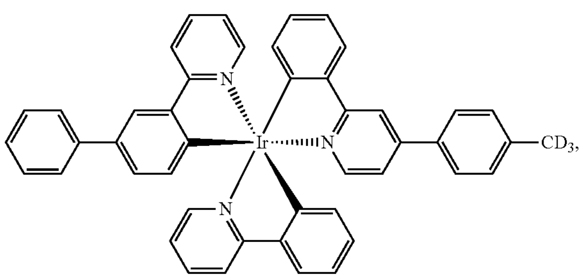
Compound 96
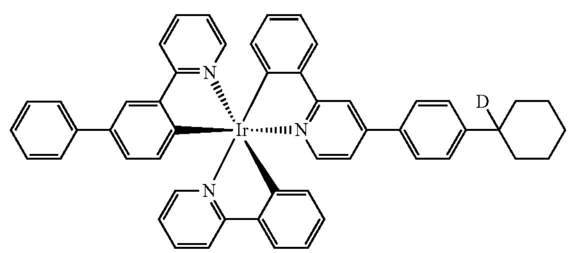
Compound 97
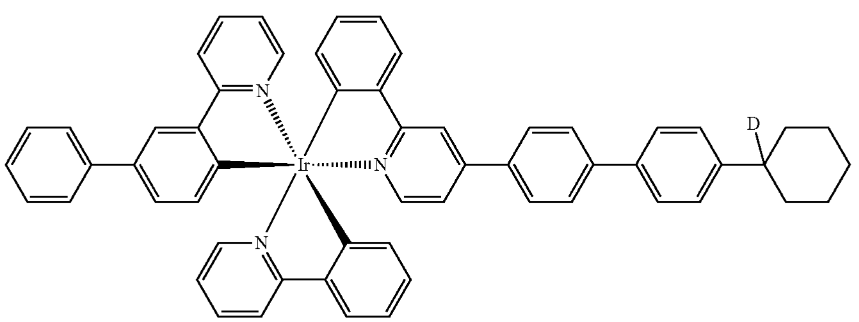
Compound 98
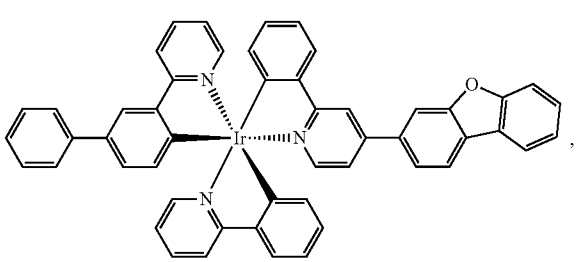
Compound 99
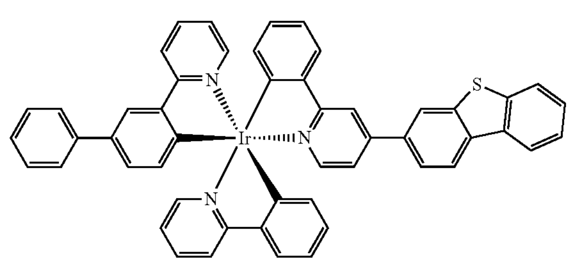

-continued
Compound 100
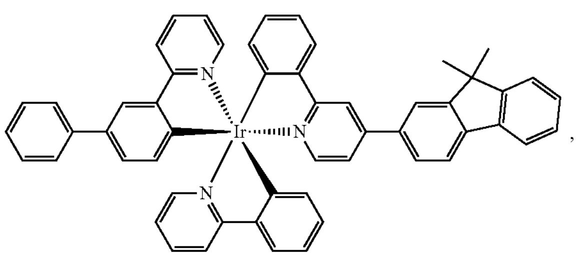
Compound 101
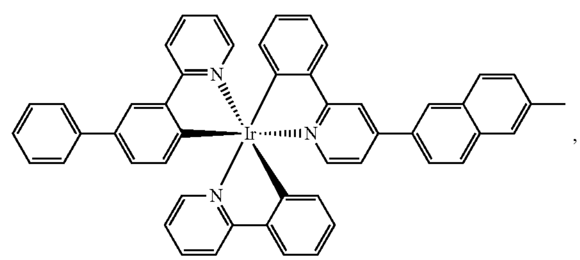
Compound 102
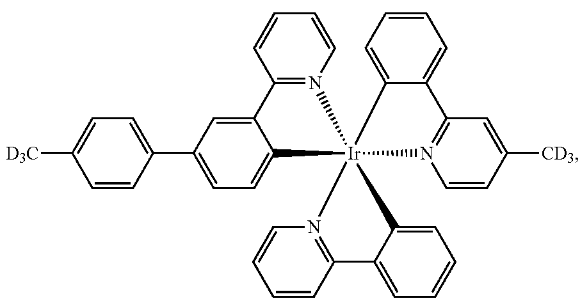
Compound 103
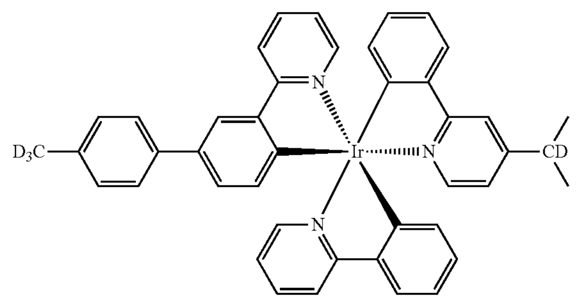
Compound 104
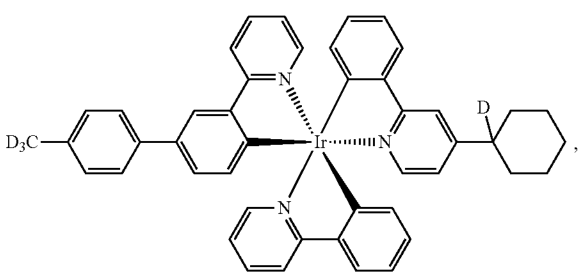
Compound 105
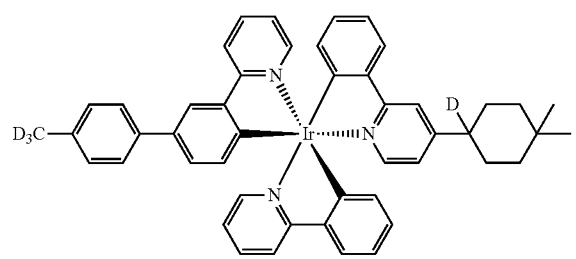
Compound 106
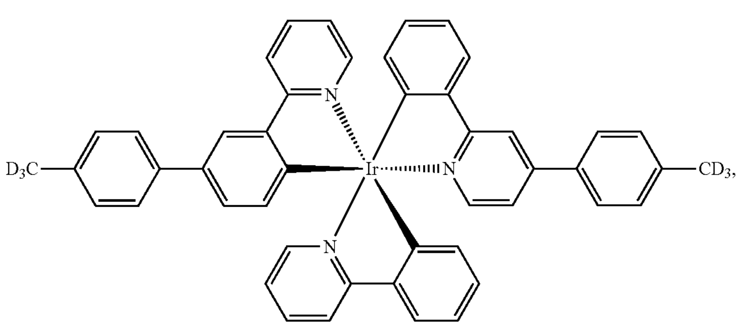
Compound 107
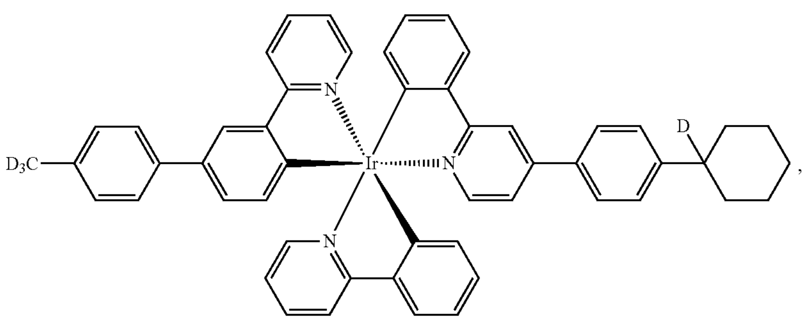

-continued
Compound 108
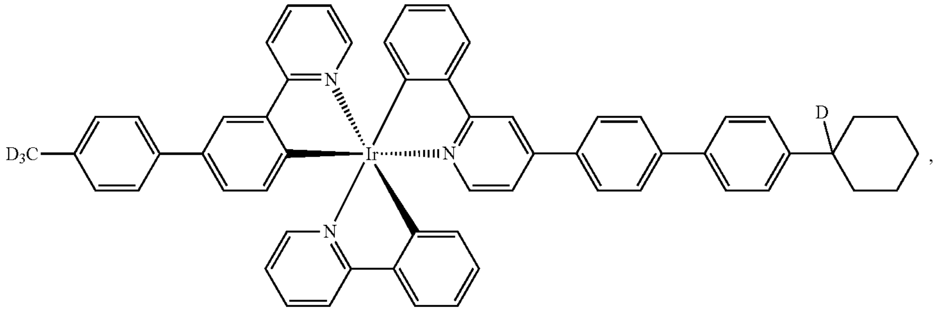
,
Compound 109
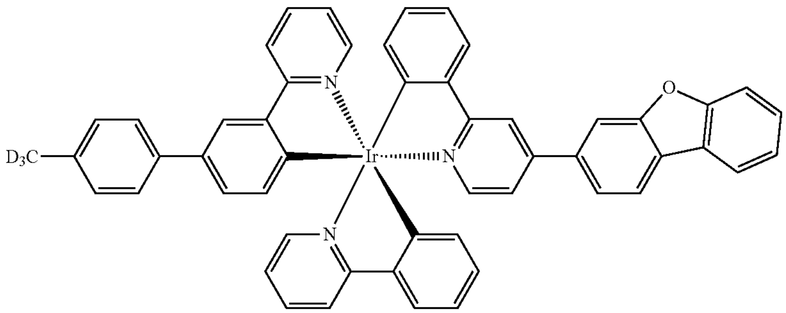
,
Compound 110
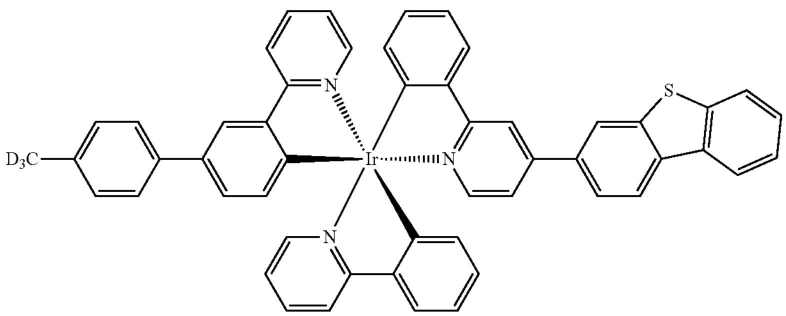
,
Compound 111
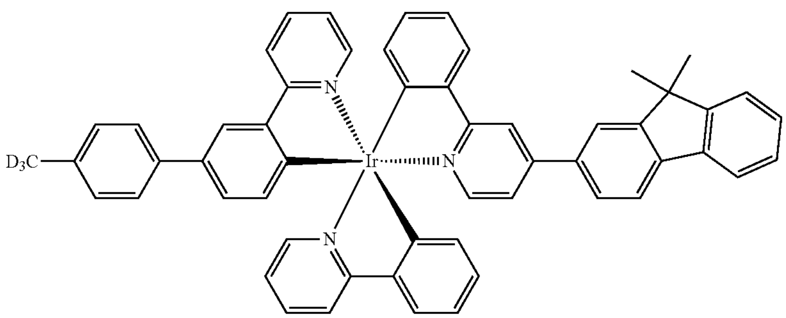
,
Compound 112
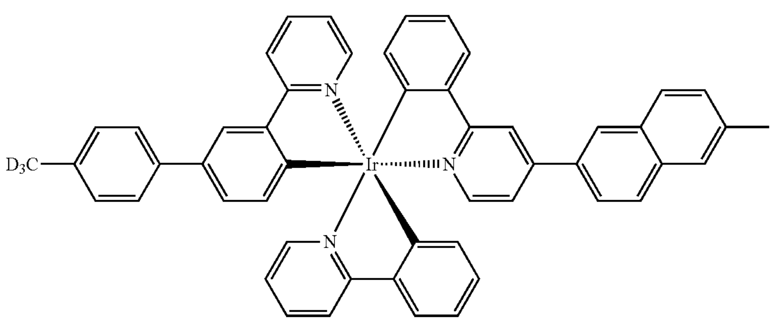
, -continued
Compound 113
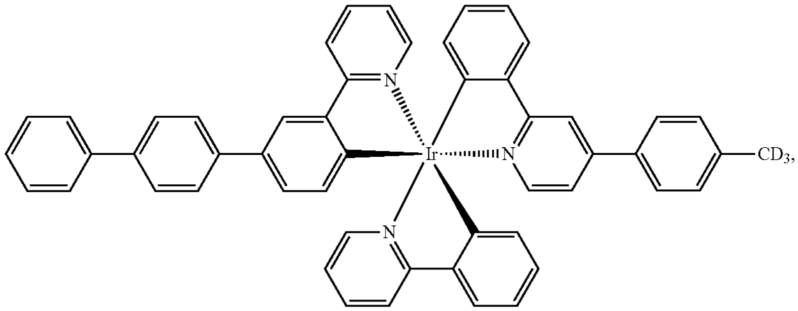
Compound 114
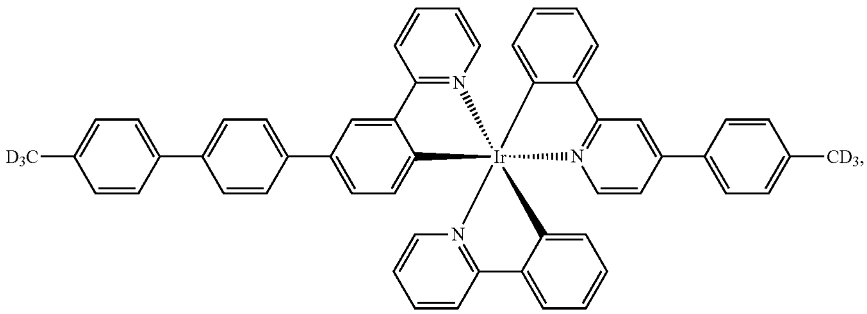
Compound 115
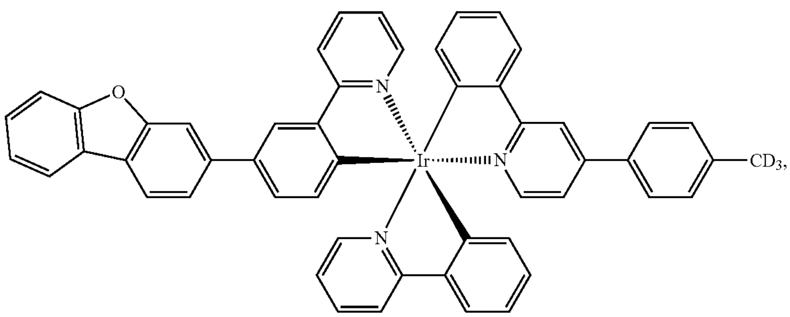
Compound 116
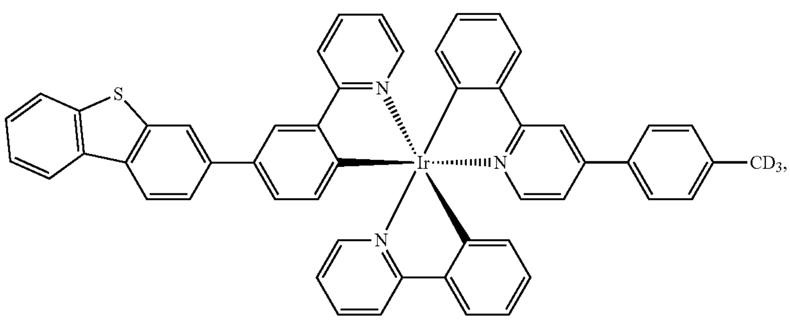
Compound 117
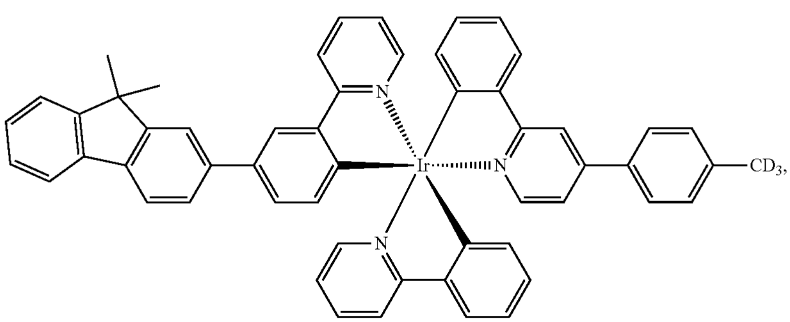

-continued
Compound 118
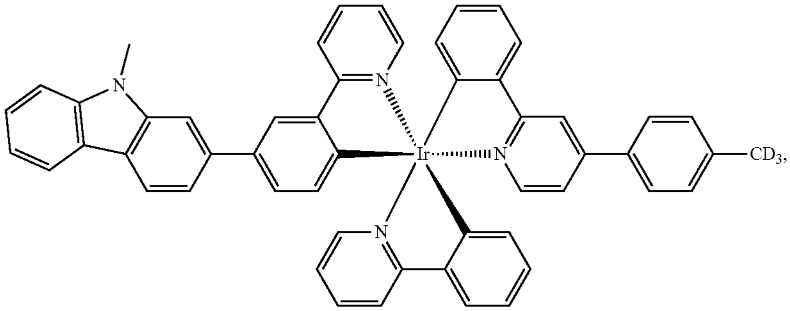
Compound 119
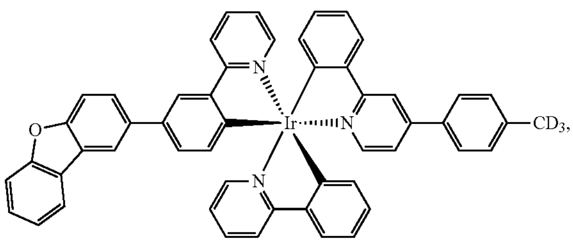
Compound 120
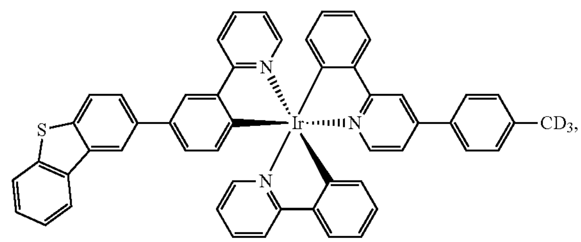
Compound 121
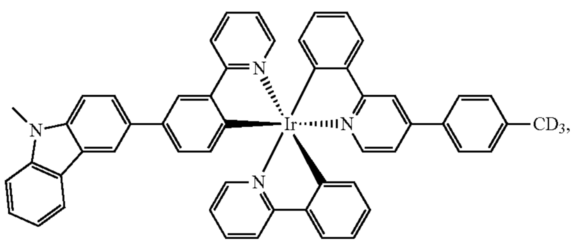
Compound 122
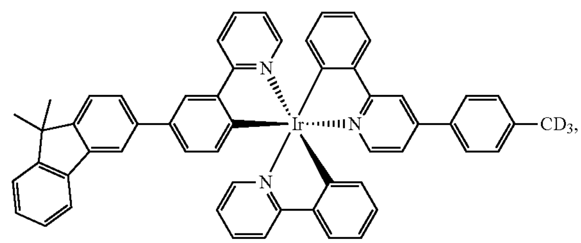
Compound 123
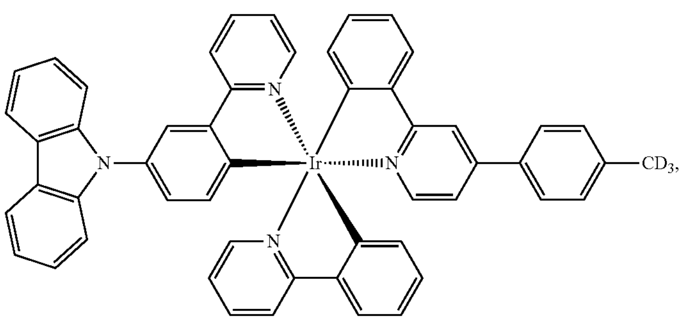
Compound 124
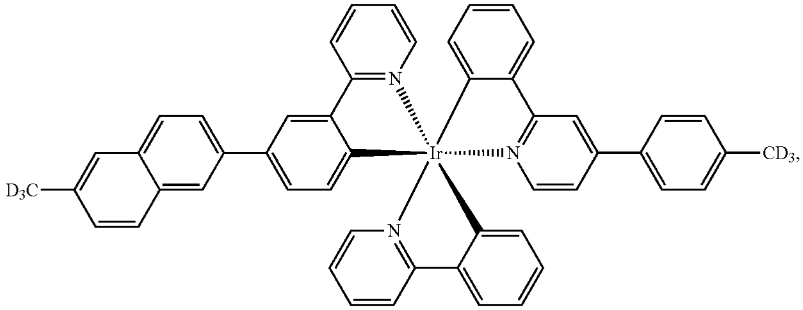

-continued
Compound 125
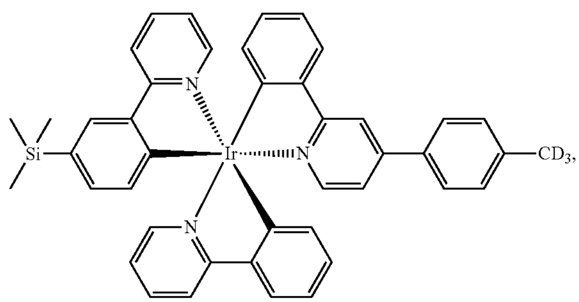
Compound 126
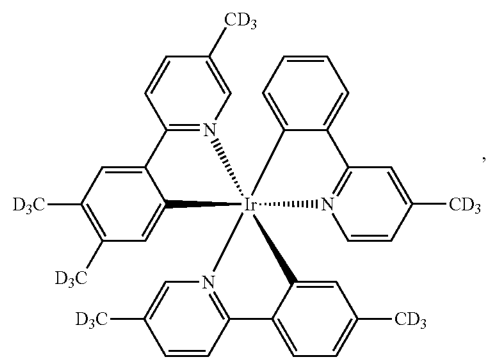
Compound 127
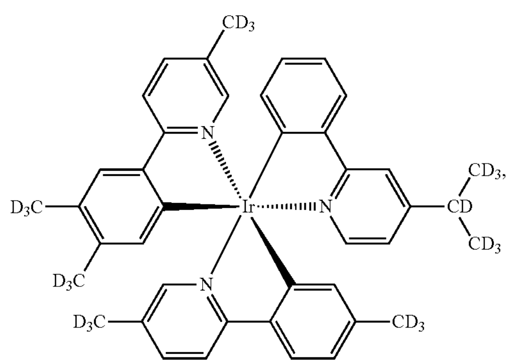
Compound 128
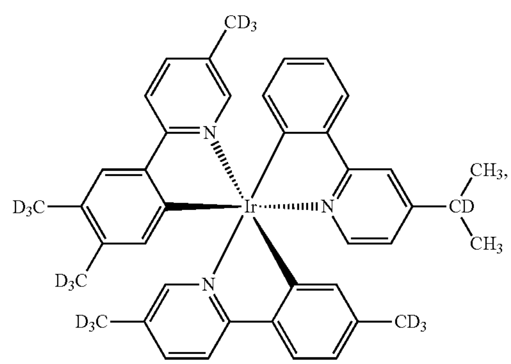
Compound 129
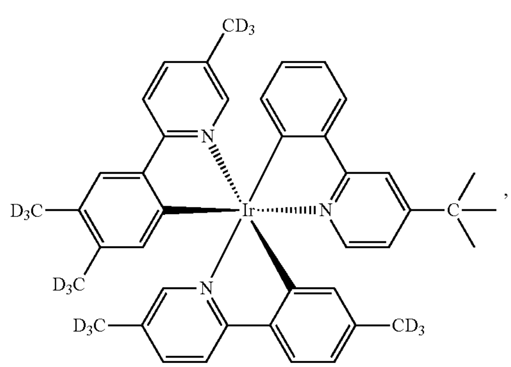
Compound 130
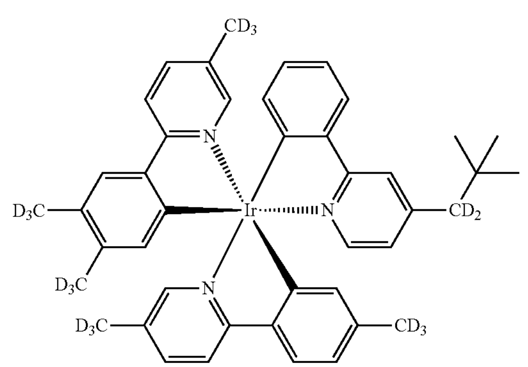
Compound 131
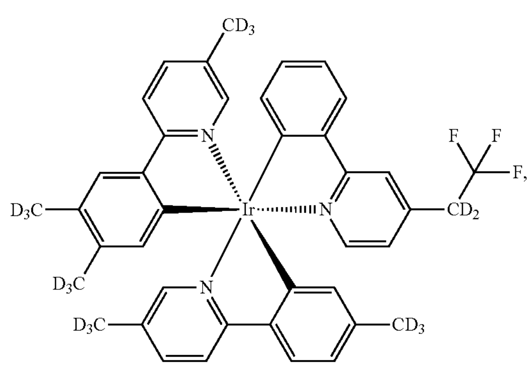
Compound 132
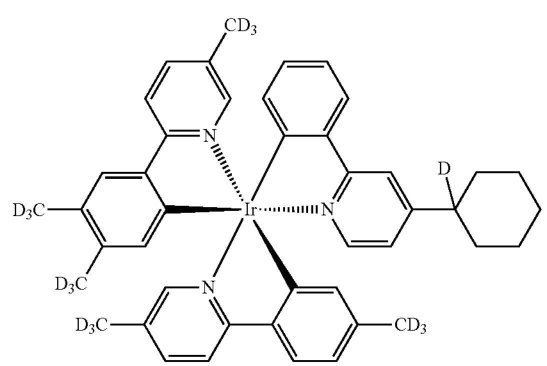

-continued
Compound 133
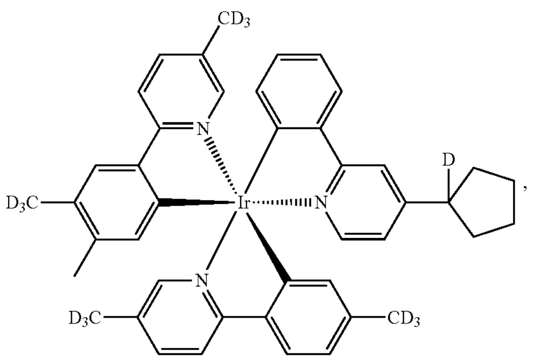
Compound 134
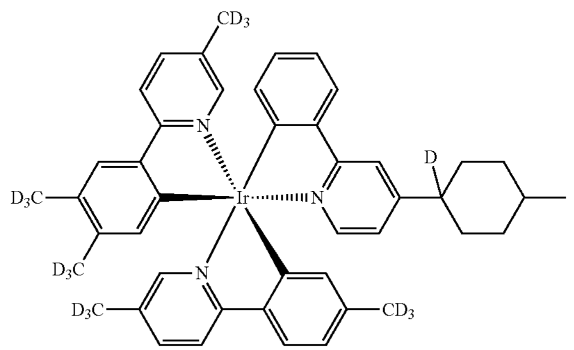
Compound 135
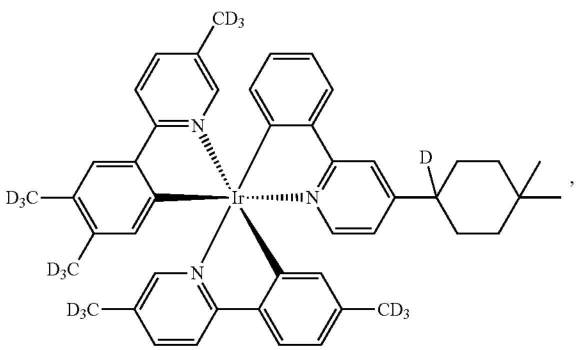
Compound 136
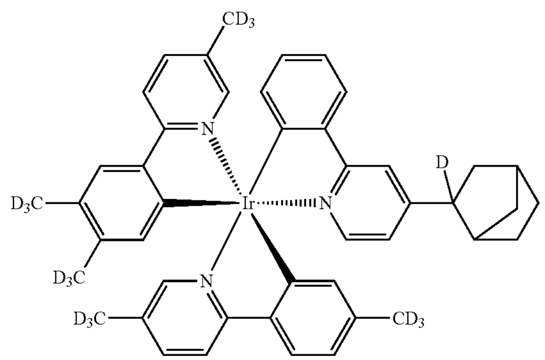
Compound 137
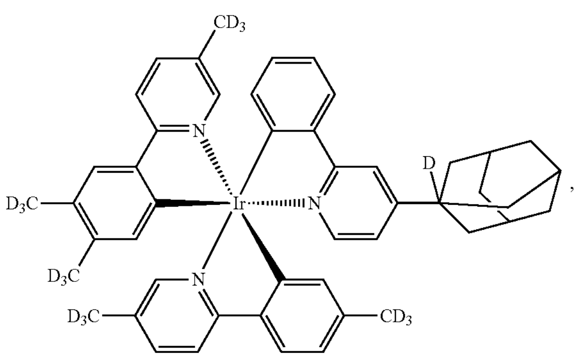
Compound 138
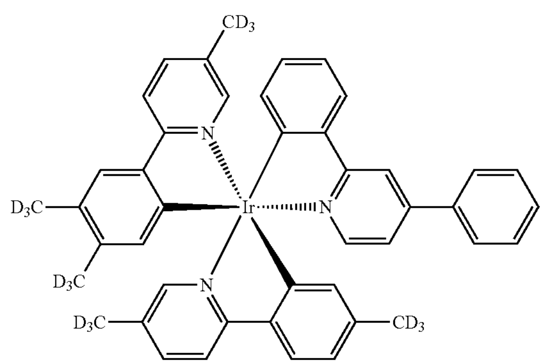
Compound 139
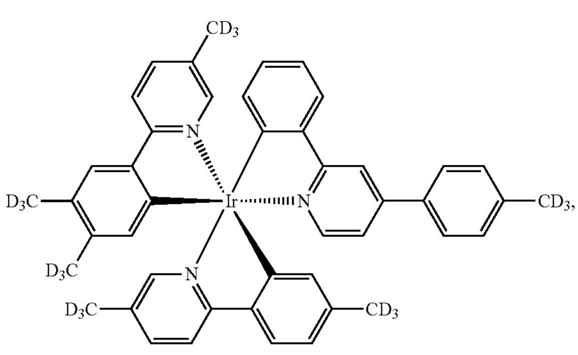
Compound 140
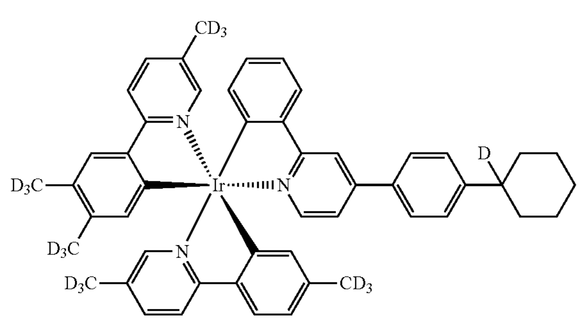

-continued
Compound 141
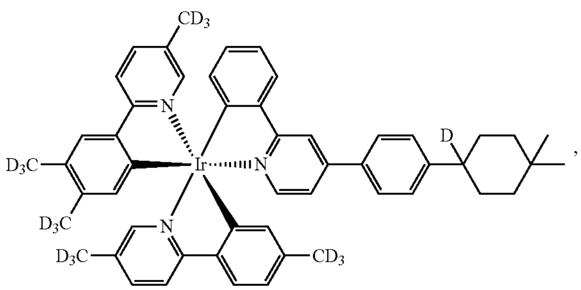
Compound 142
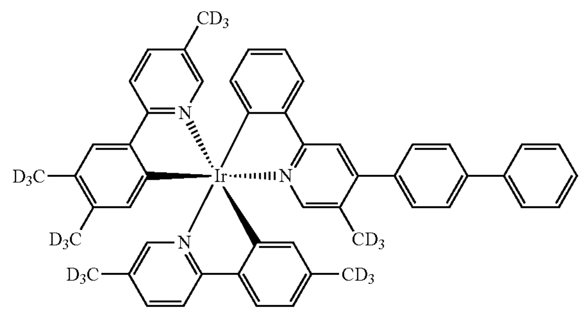
Compound 143
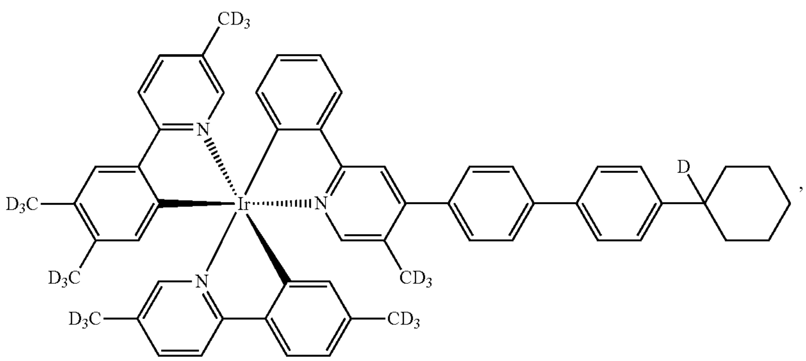
Compound 144
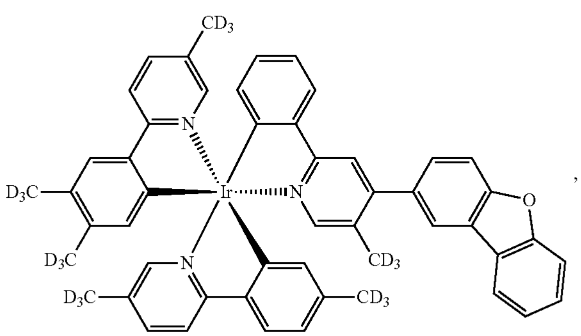
Compound 145
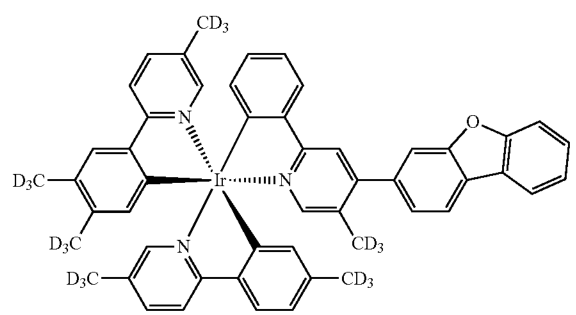
Compound 146
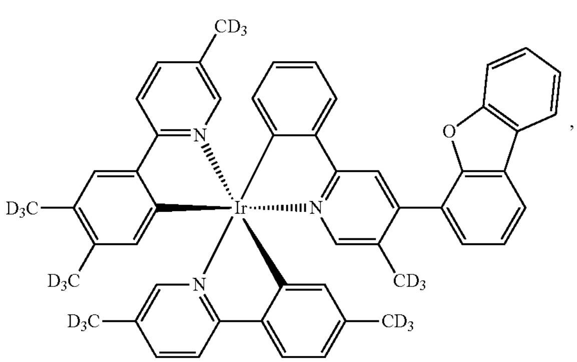
Compound 147
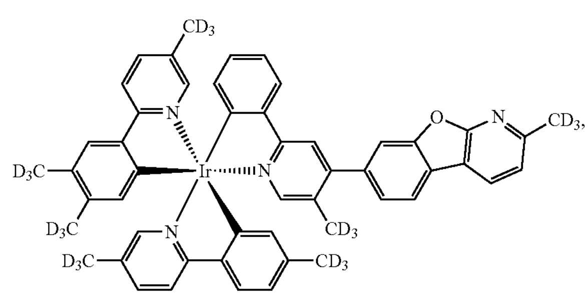

-continued
Compound 148
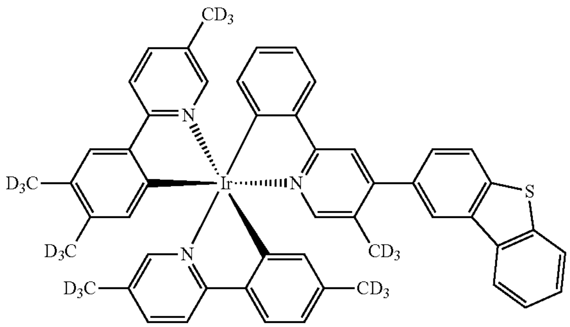
,
Compound 149
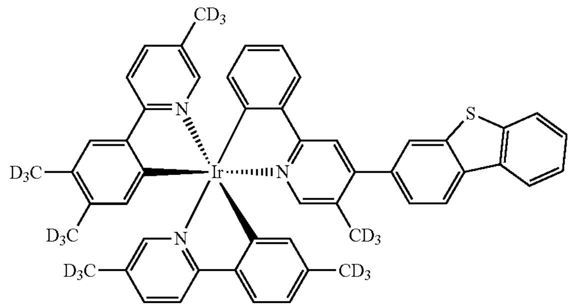
,
Compound 150
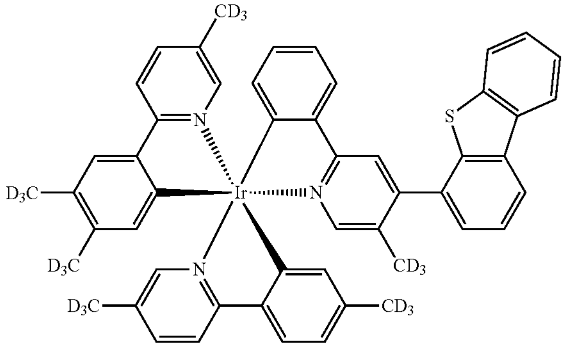
,
Compound 151
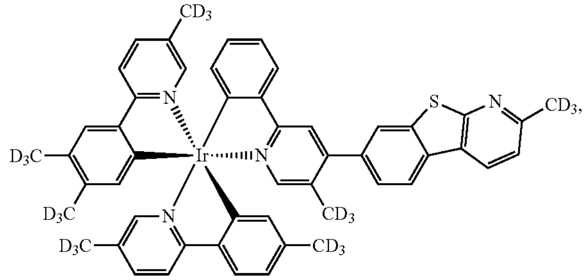
Compound 152
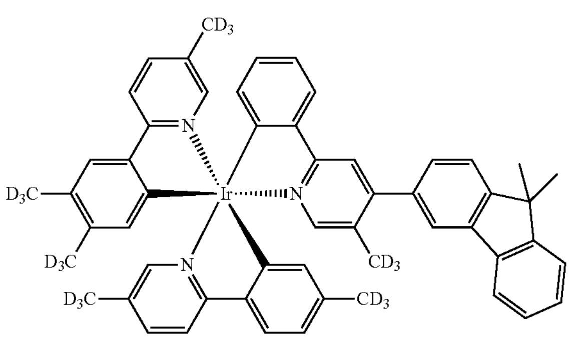
,
Compound 153
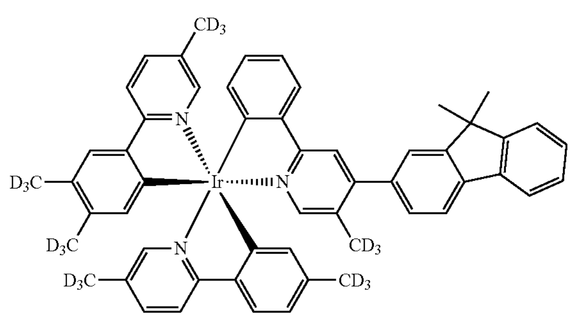
,
Compound 154
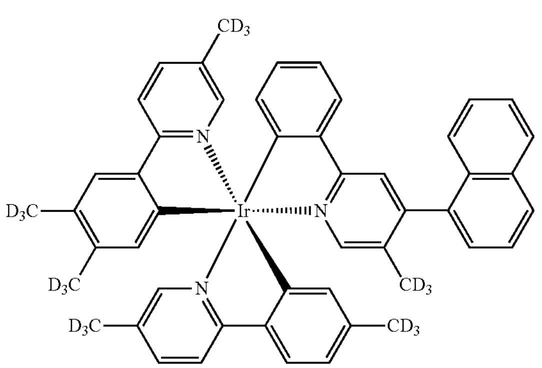
,
Compound 155
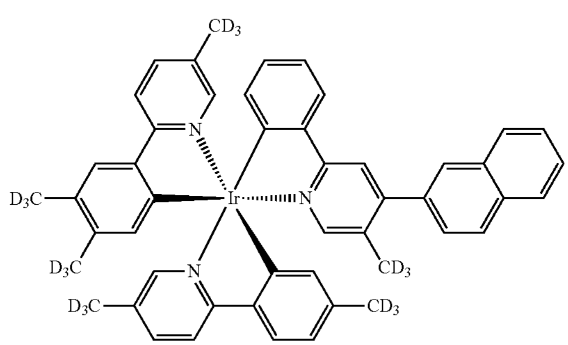
, -continued
Compound 156
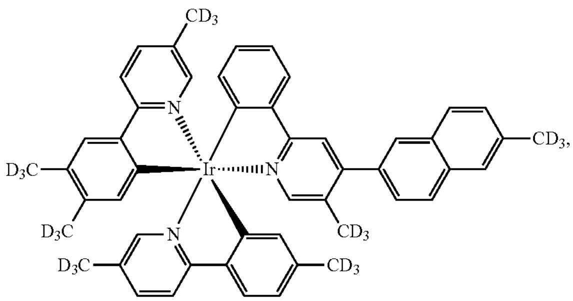
Compound 157
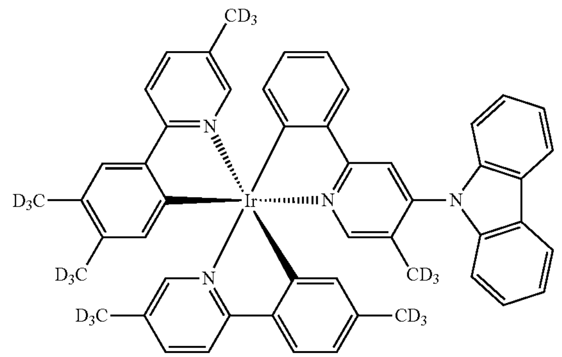
Compound 158
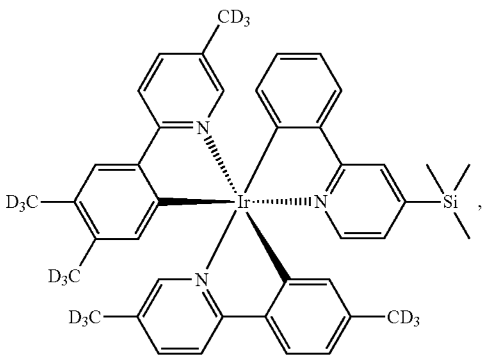
Compound 159
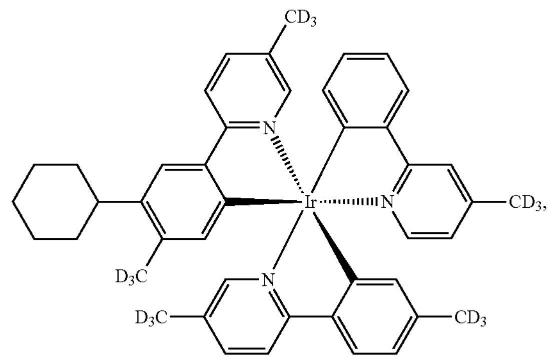
Compound 160
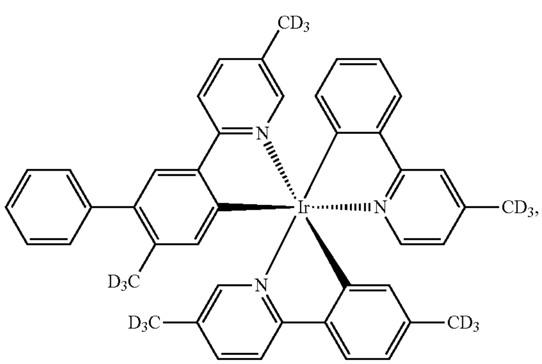
Compound 161
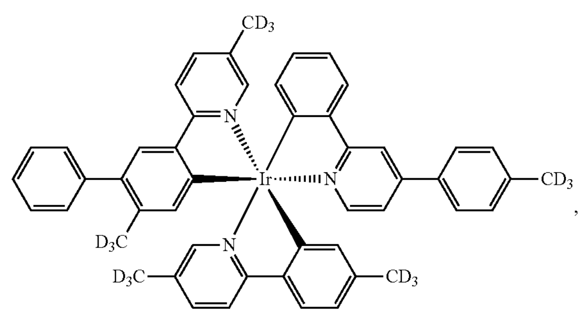
Compound 162
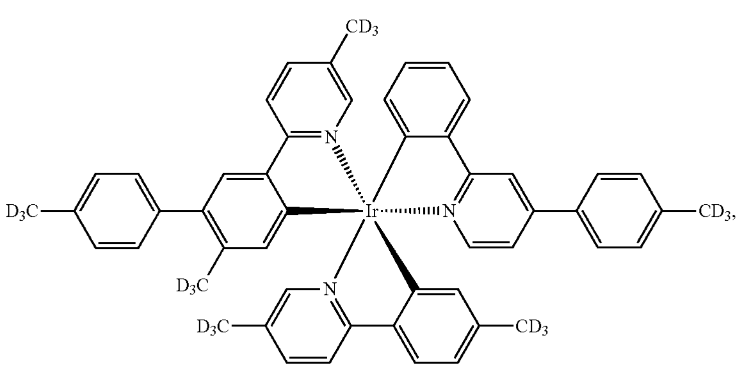

-continued
Compound 163
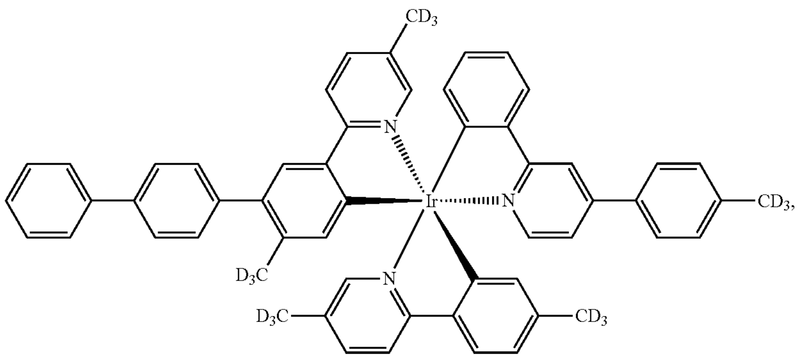
Compound 164
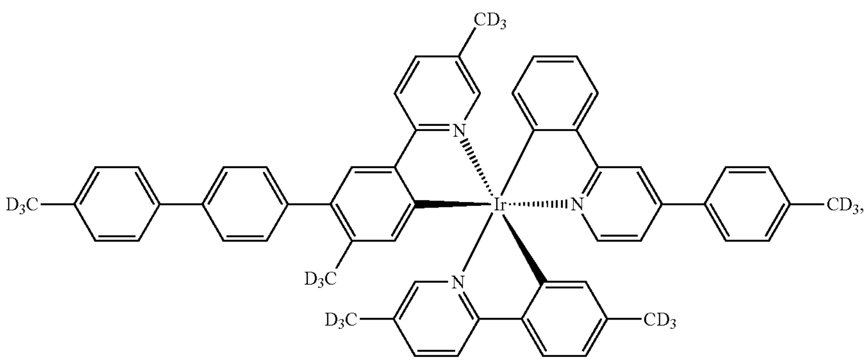
Compound 165
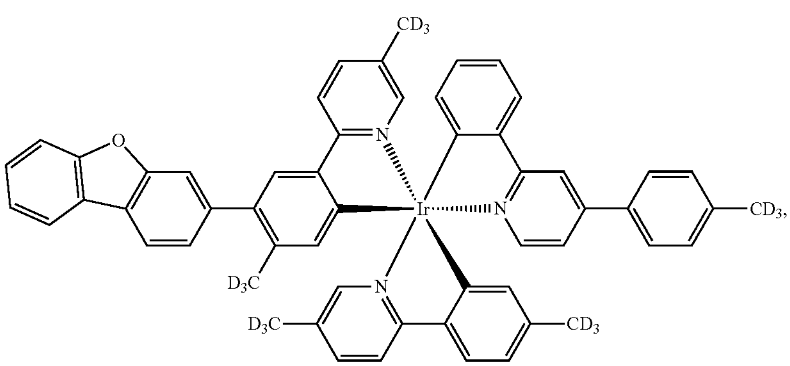
Compound 166
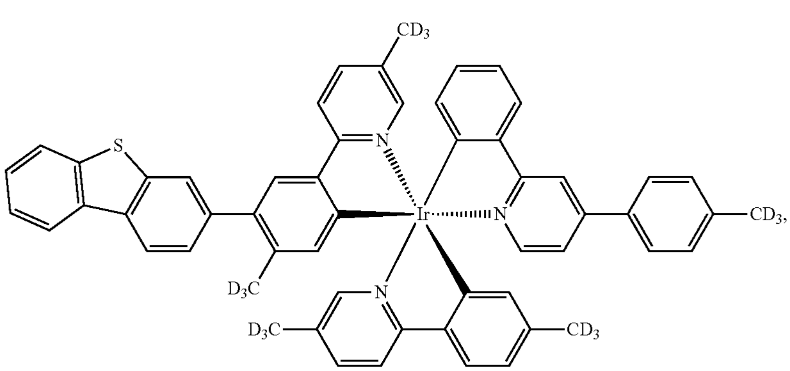

-continued
Compound 167
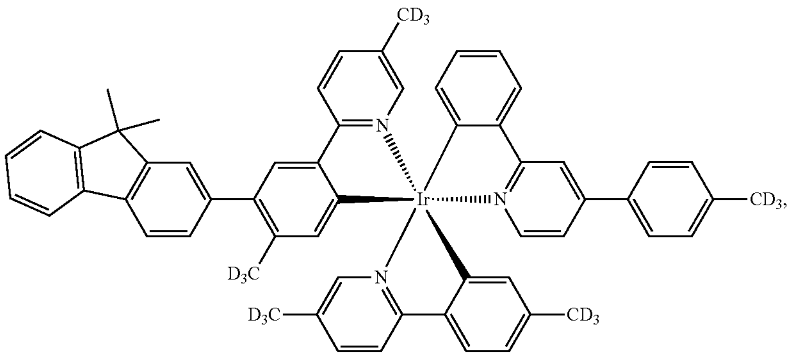
Compound 168
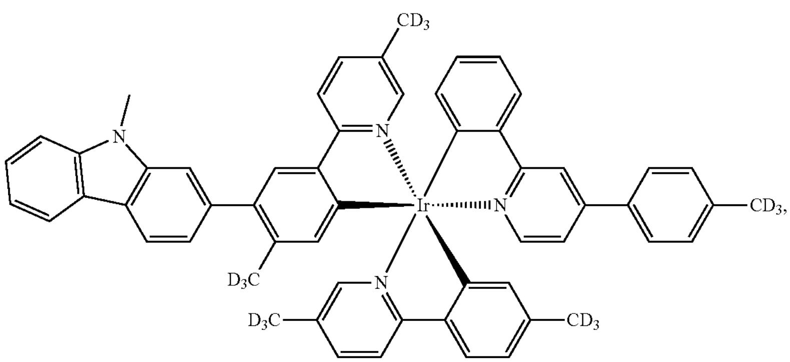
Compound 169
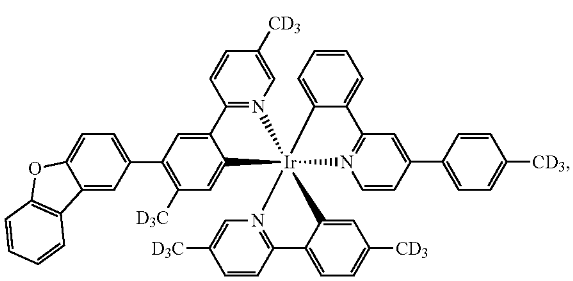
Compound 170
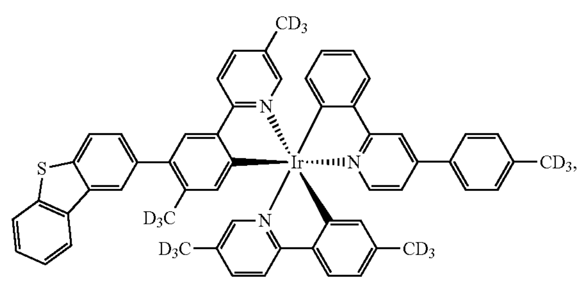
Compound 171
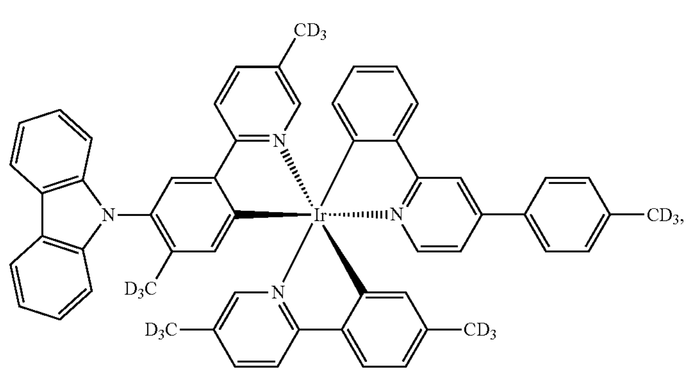

-continued
Compound 172
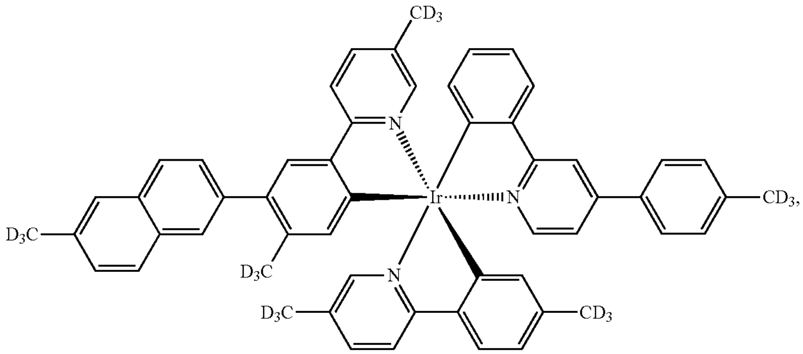
Compound 173
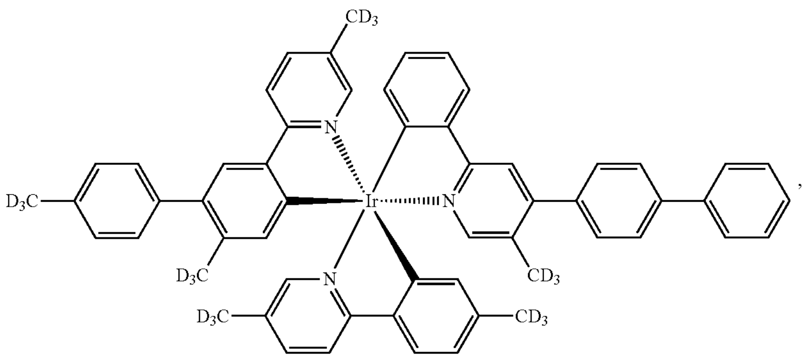
Compound 174
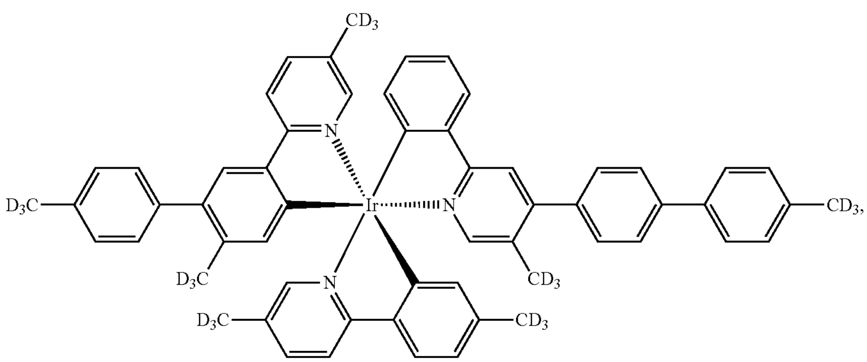
Compound 175
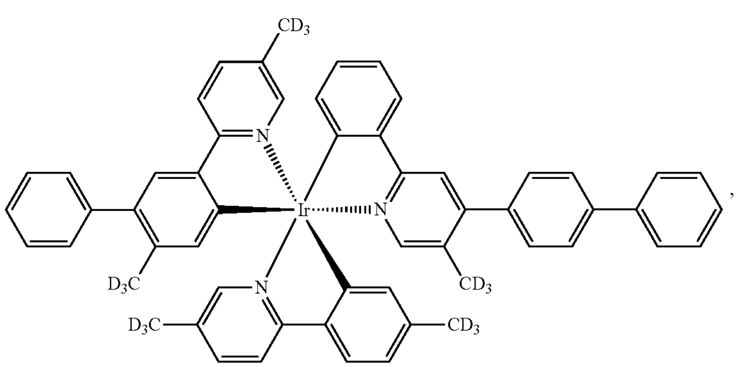

-continued
Compound 176
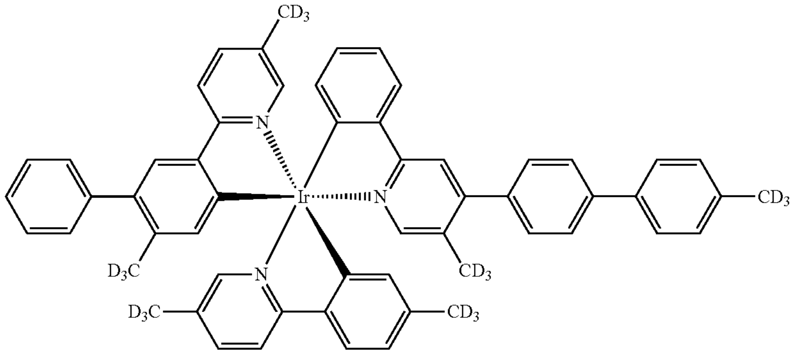
Compound 177
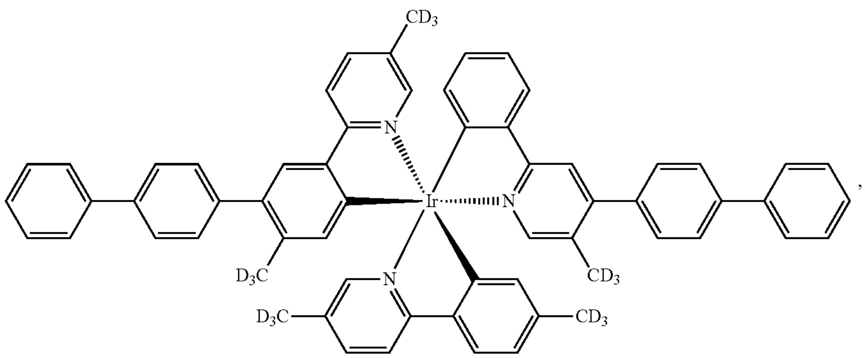
Compound 178
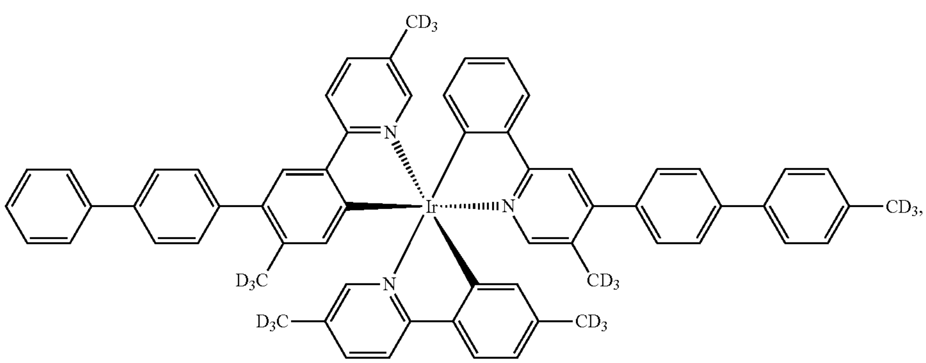
Compound 179
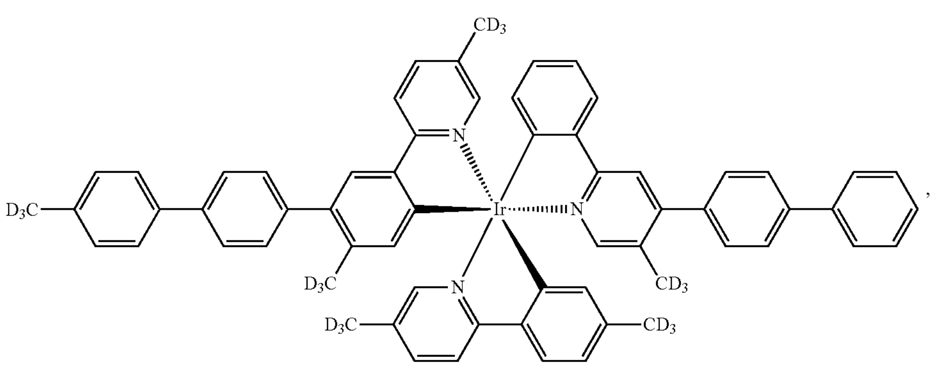

-continued
Compound 180
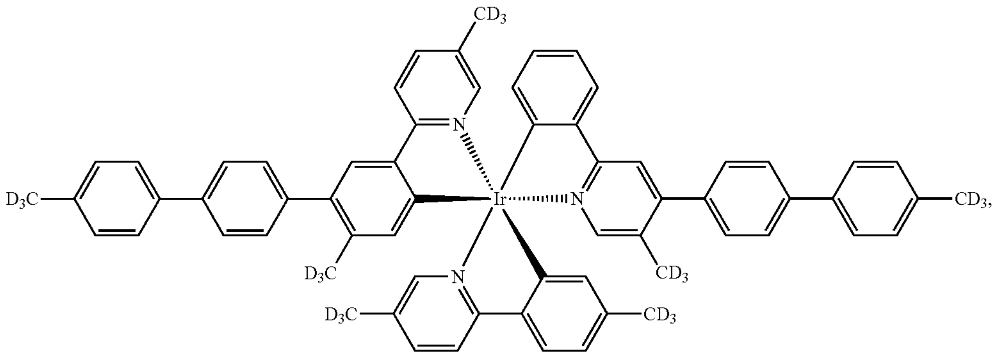
Compound 181
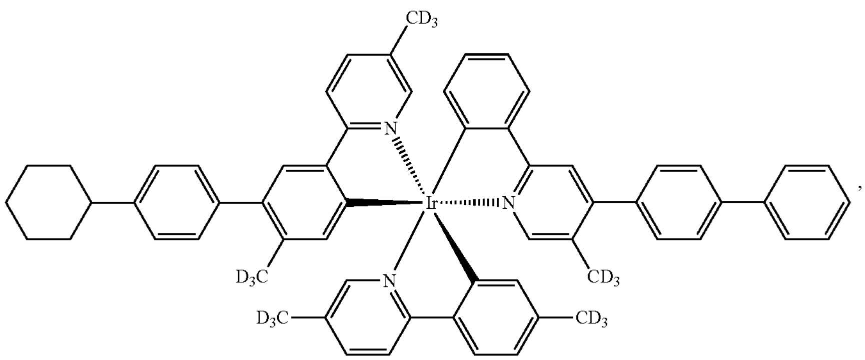
Compound 182
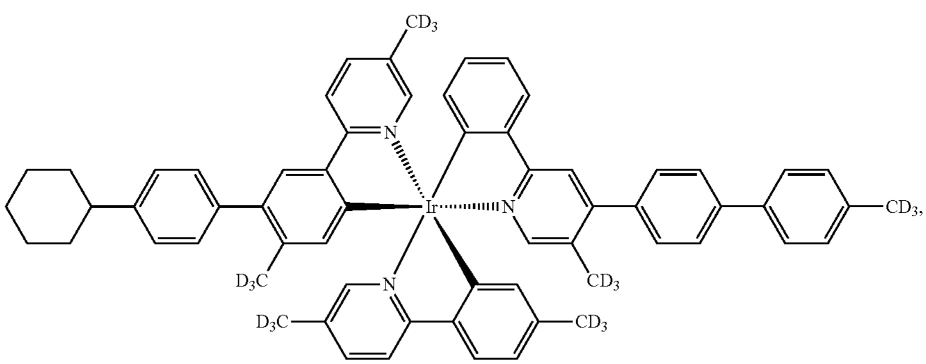
Compound 183
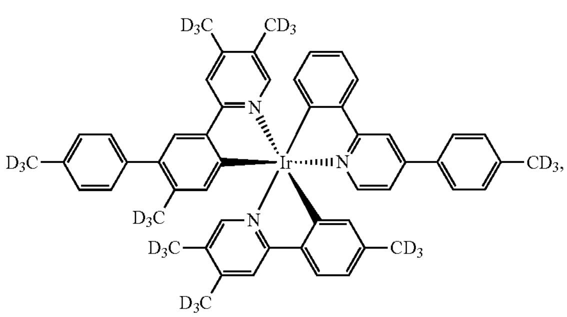
Compound 184
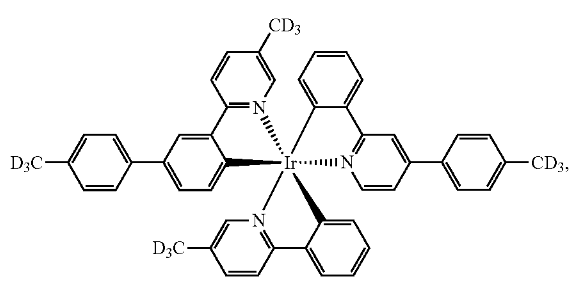

-continued
Compound 185
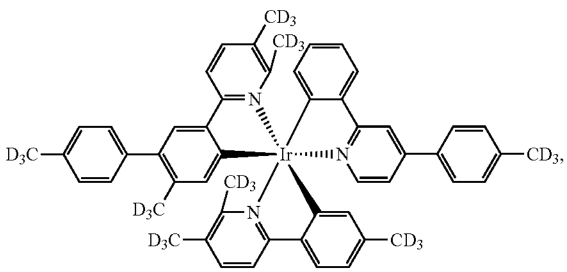
Compound 186
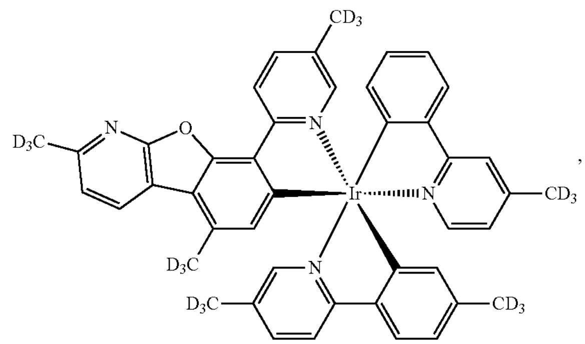
Compound 187
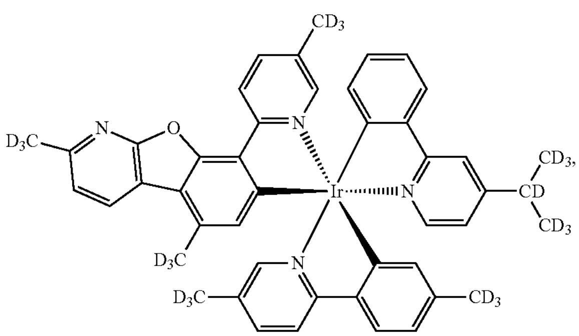
Compound 188
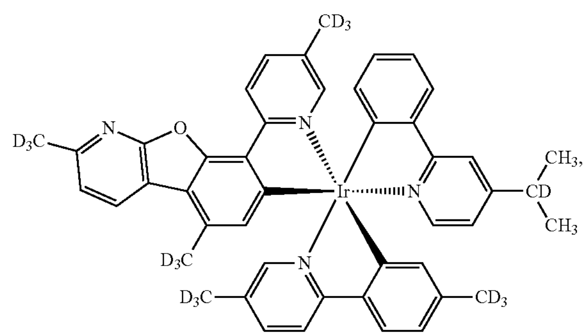
Compound 189
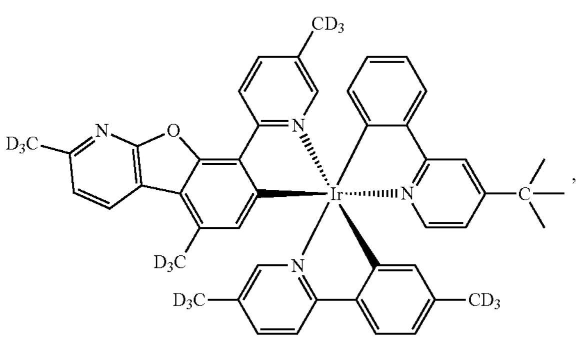
Compound 190
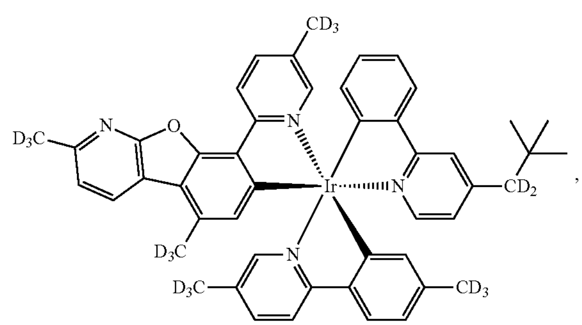
Compound 191
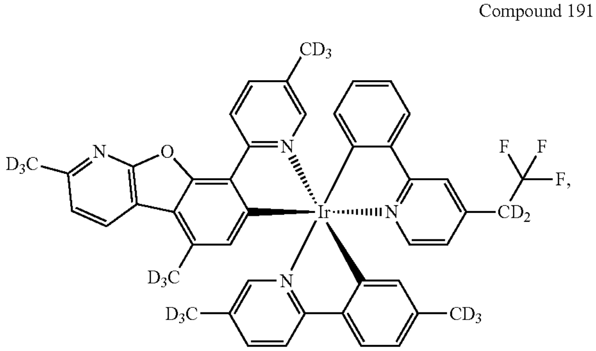
Compound 192
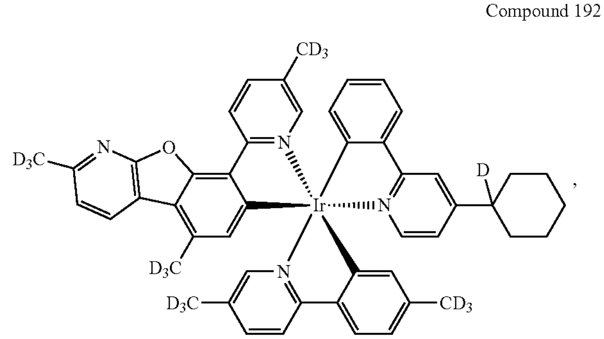

-continued
Compound 193
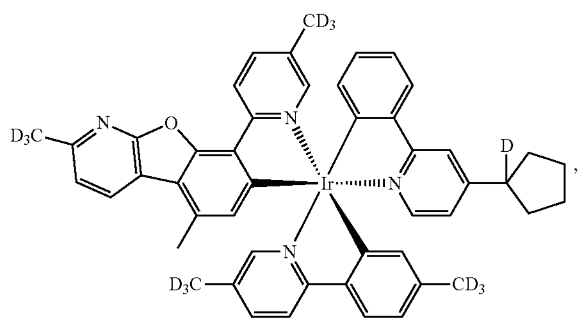
Compound 194
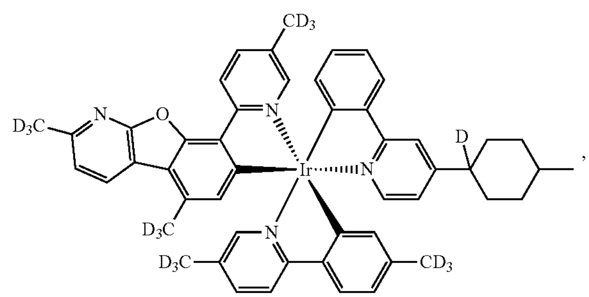
Compound 195
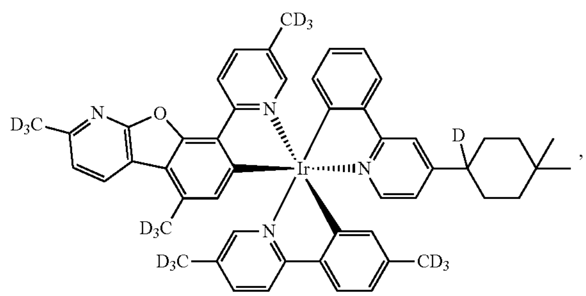
Compound 196
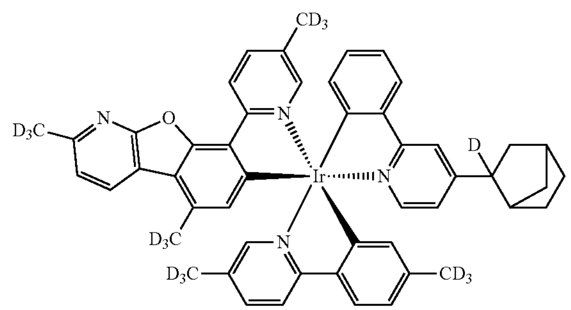
Compound 197
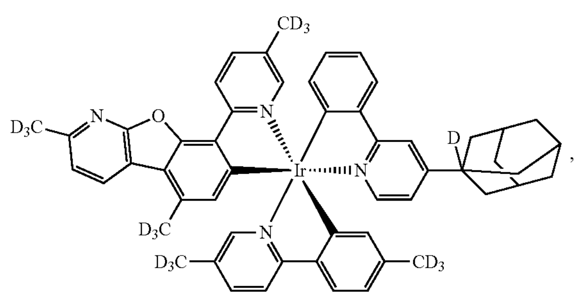
Compound 198
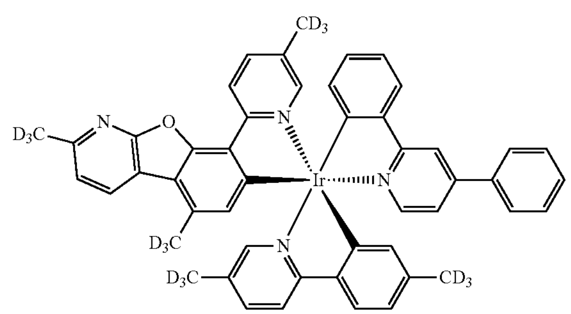
Compound 199
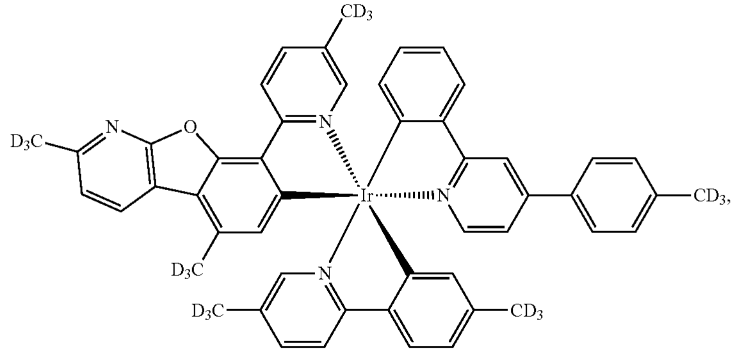

-continued
Compound 200
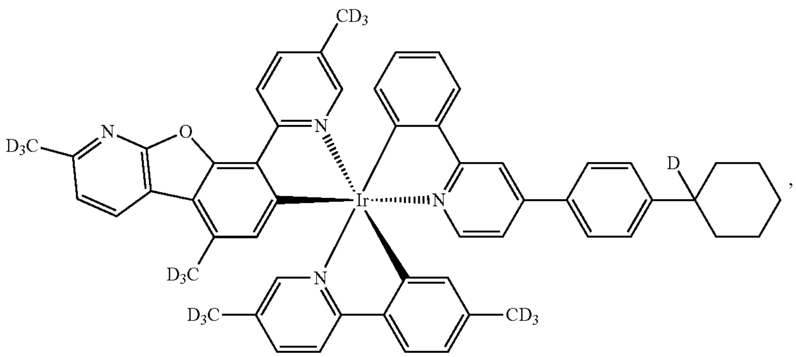
Compound 201
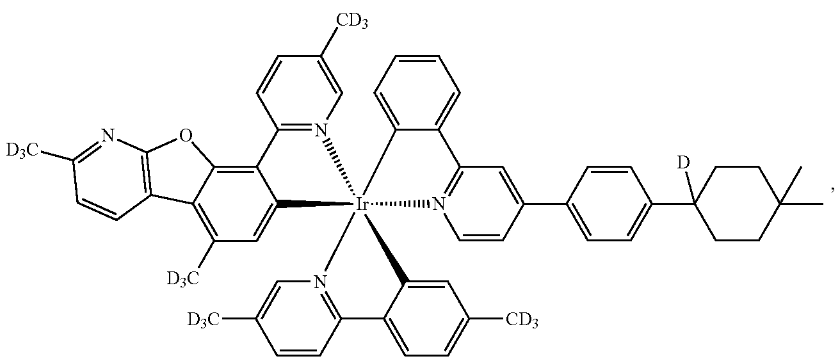
Compound 202
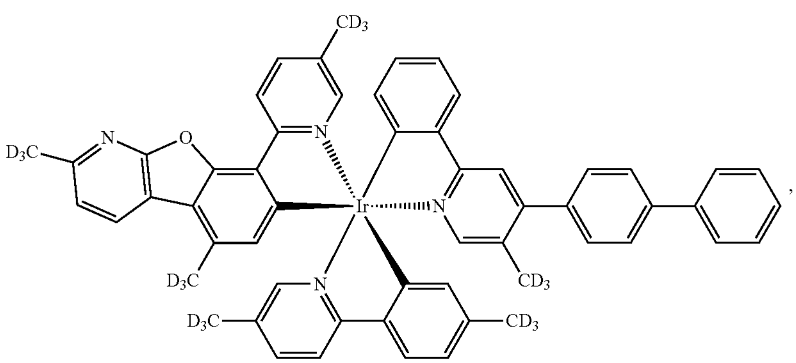
Compound 203
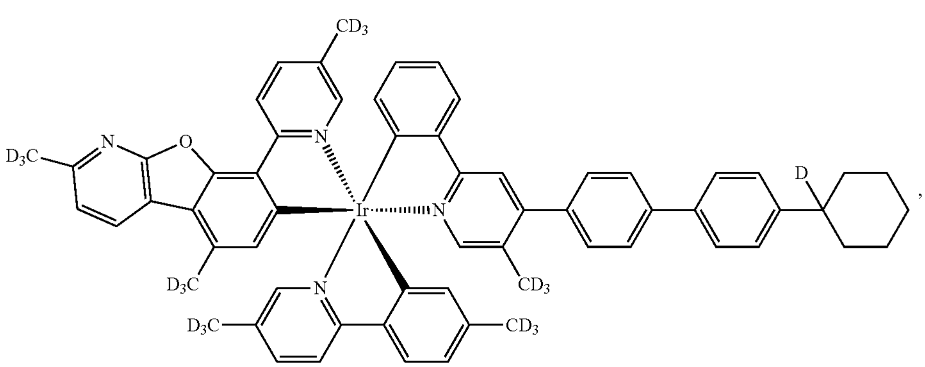

-continued
Compound 204
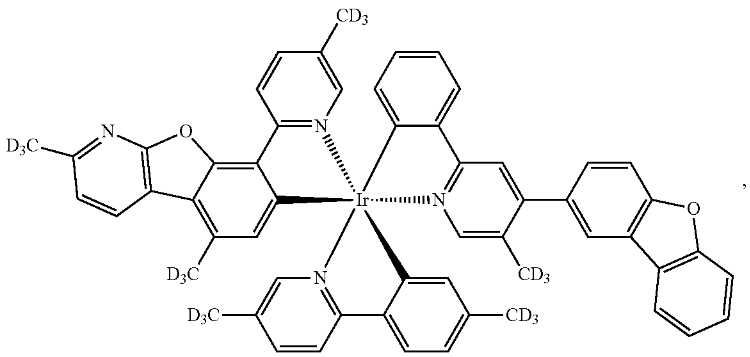
,
Compound 205
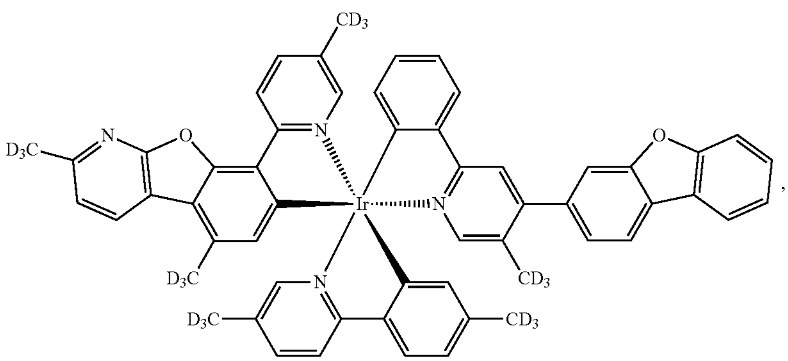
,
Compound 206
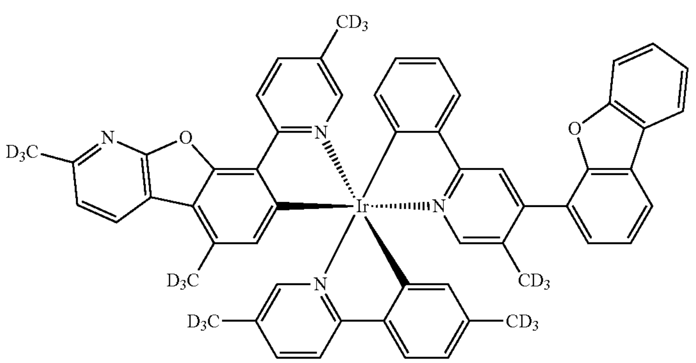
,
Compound 207
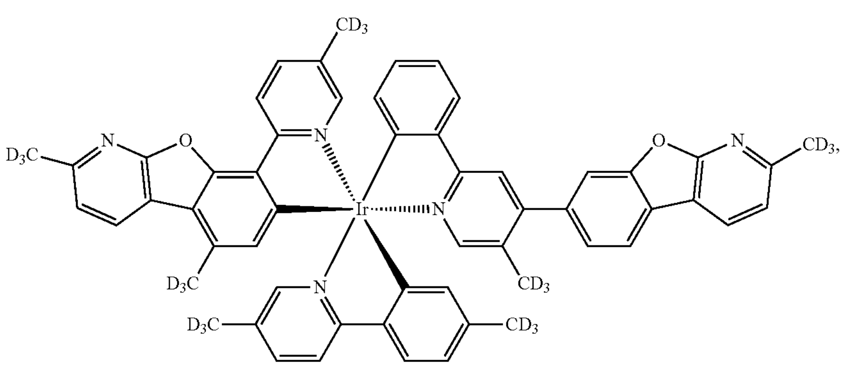

-continued
Compound 208
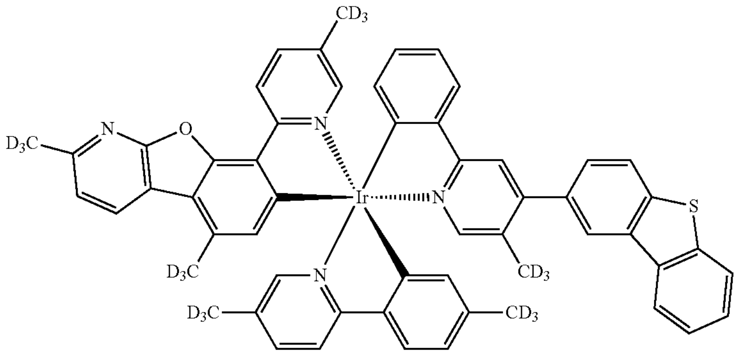
,
Compound 209
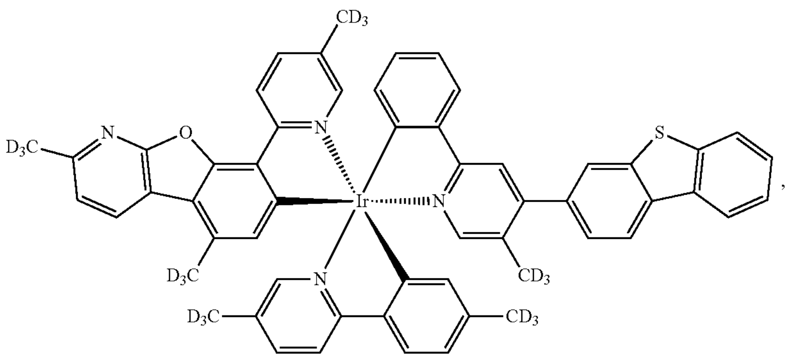
,
Compound 210
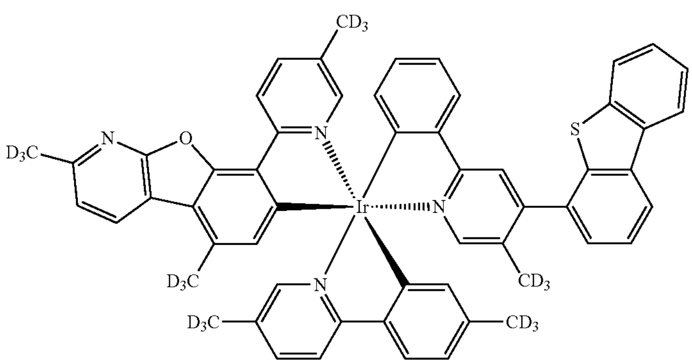
,
Compound 211
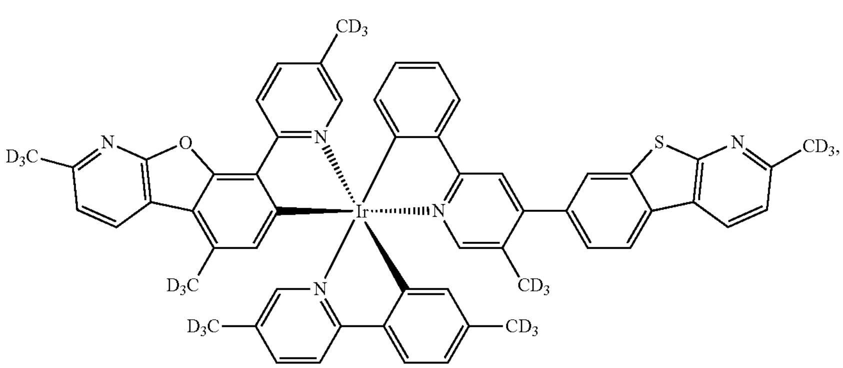
, -continued
Compound 212
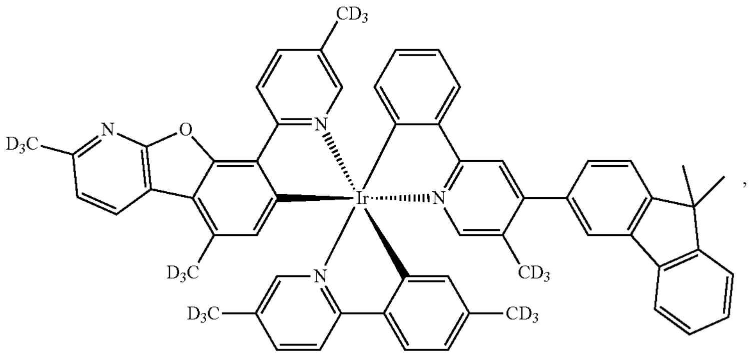
Compound 213
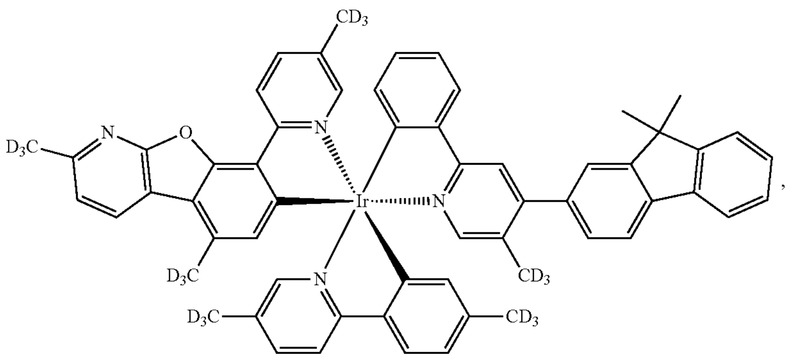
Compound 214
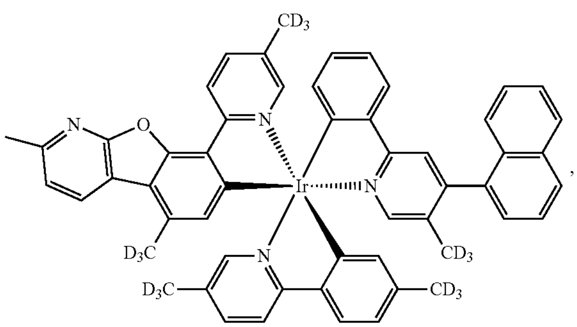
Compound 215
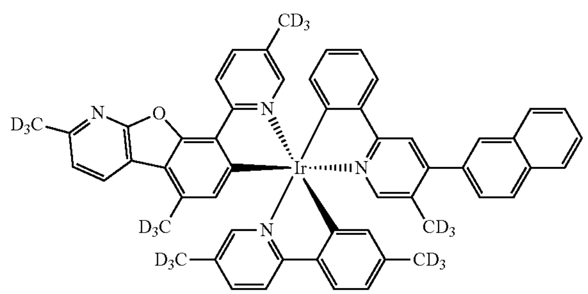
Compound 216
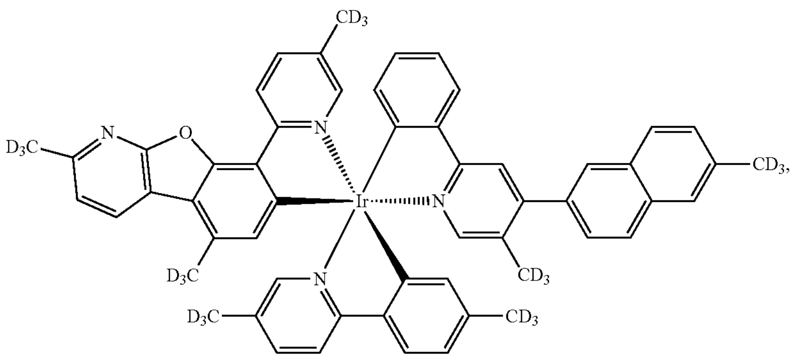

-continued
Compound 217
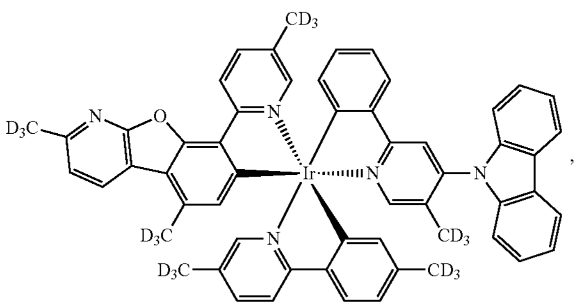
Compound 218
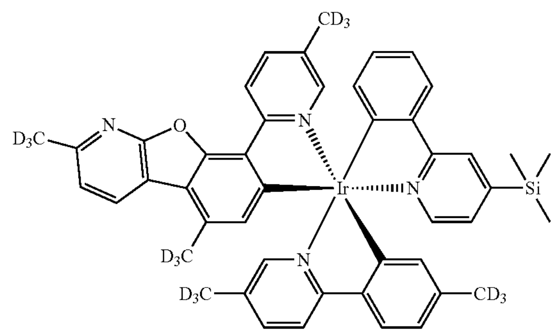
Compound 219
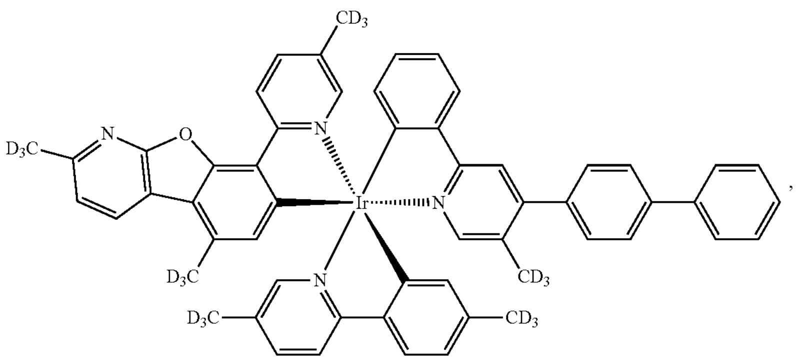
Compound 220
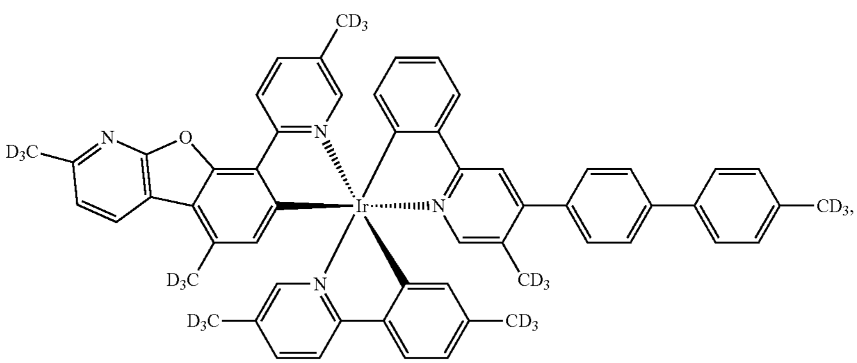
Compound 221
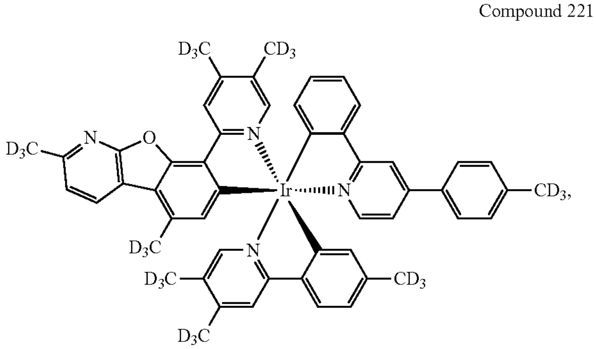
Compound 222
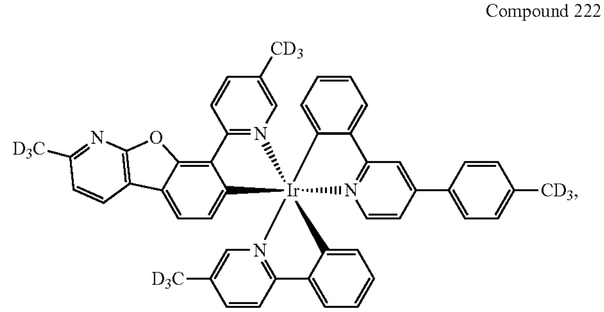

-continued
Compound 223
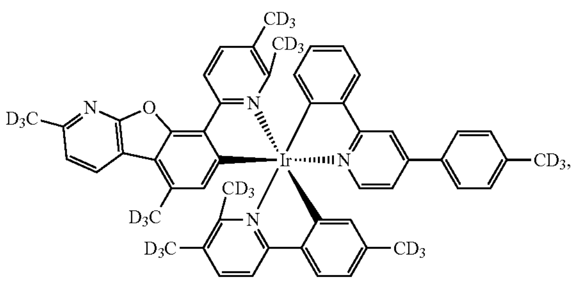
Compound 224
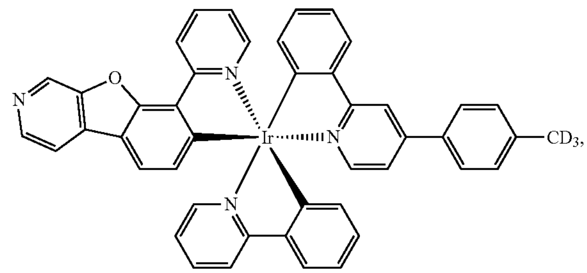
Compound 225
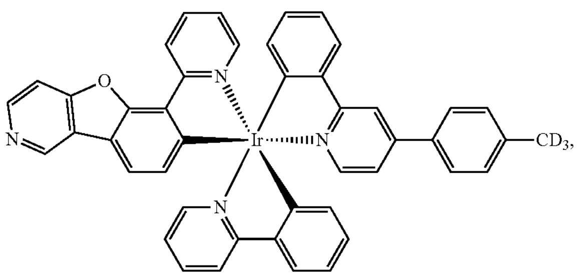
Compound 226
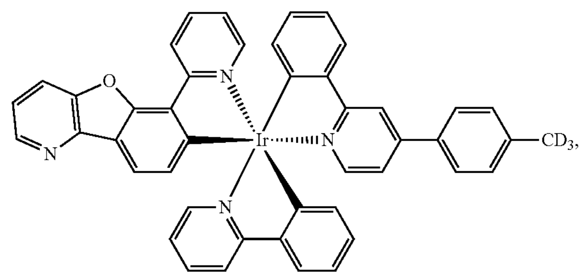
Compound 227
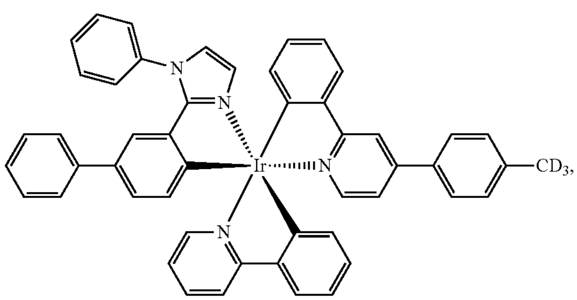
Compound 228
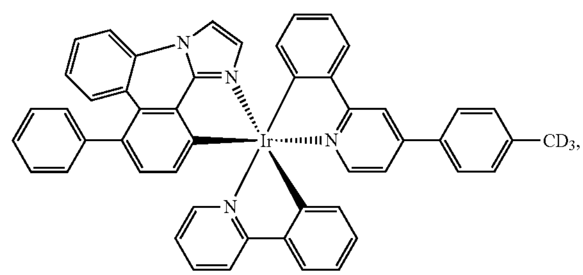
Compound 229
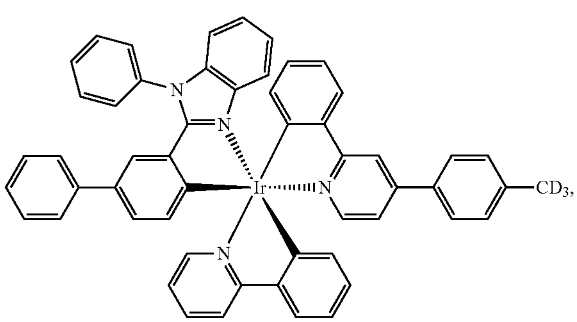
Compound 230
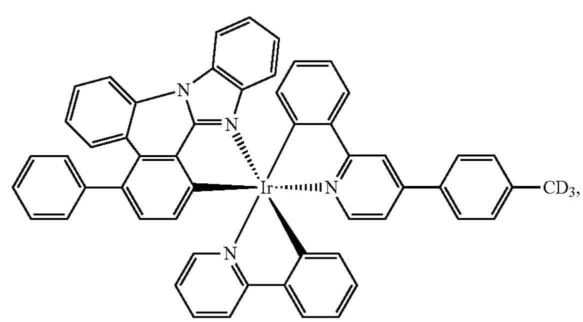
Compound 231
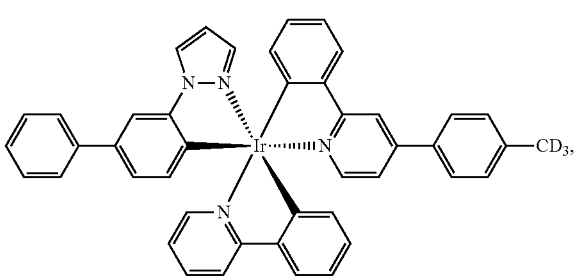
Compound 232
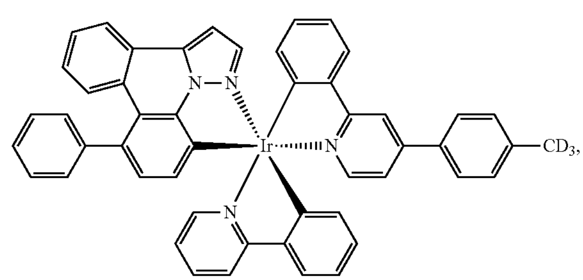

-continued
Compound 233
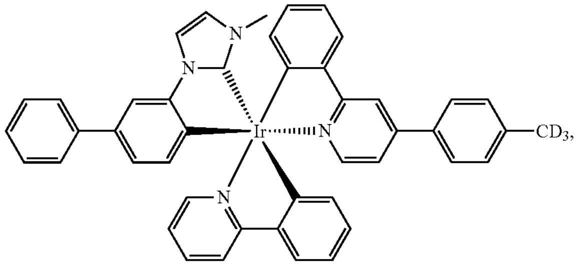
Compound 234
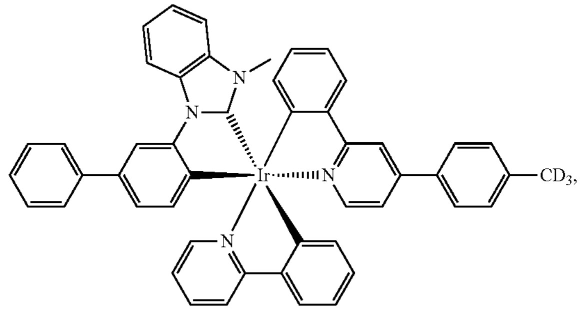
Compound 235
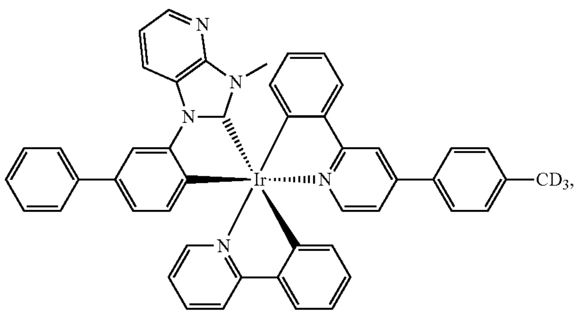
Compound 236
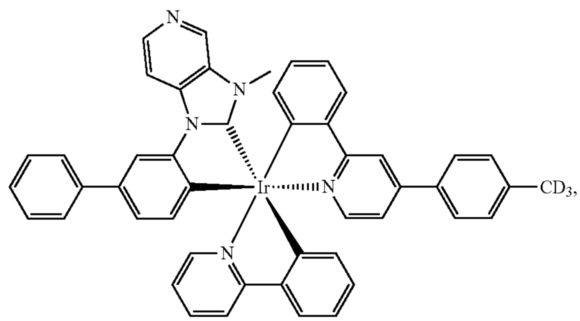
Compound 237
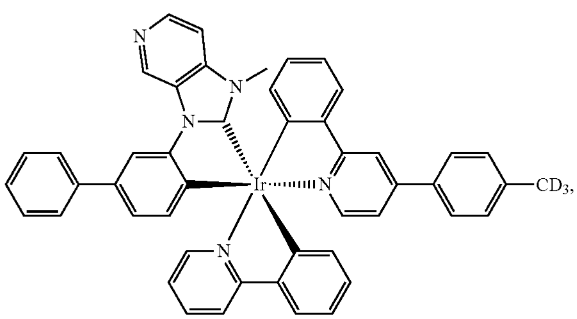
Compound 238
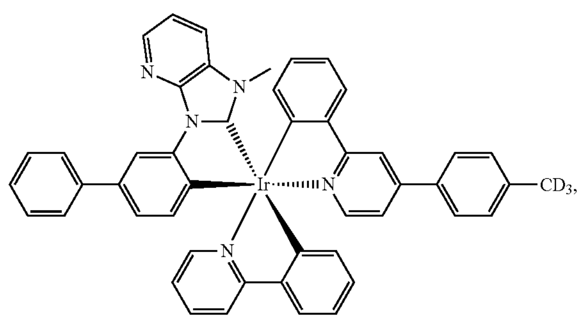
Compound 239
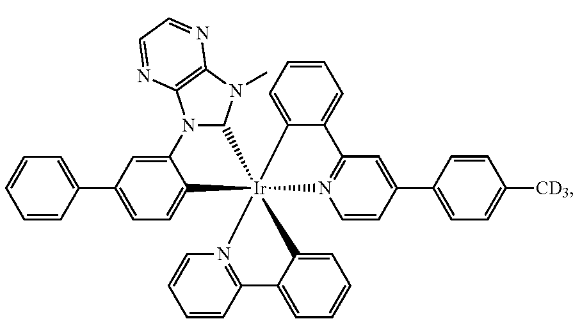
Compound 240
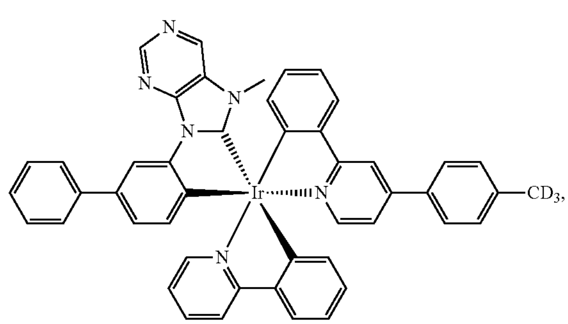

-continued
Compound 241
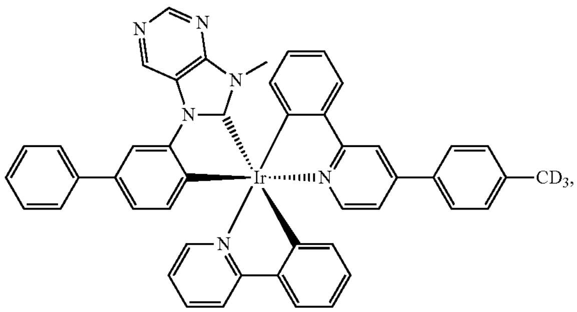
Compound 242
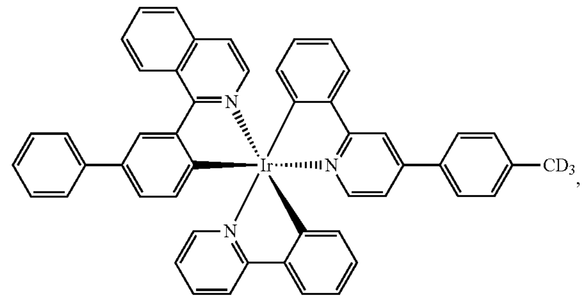
Compound 243
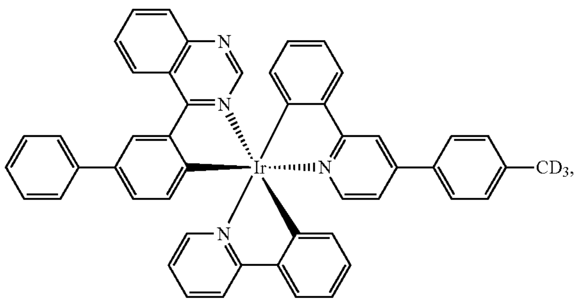
Compound 244
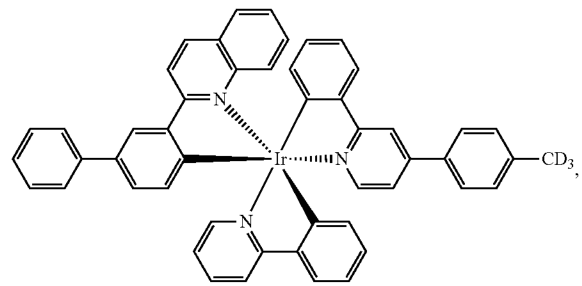
Compound 245
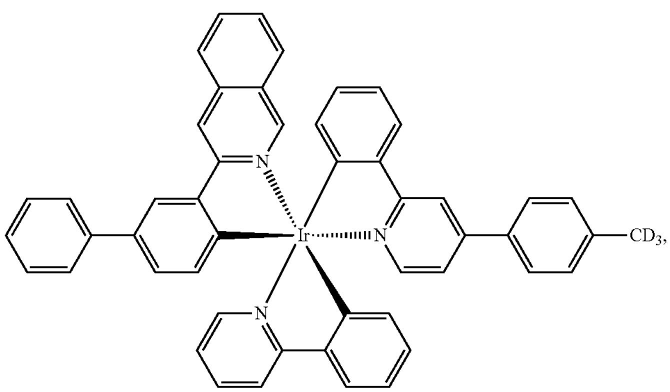
Compound 246
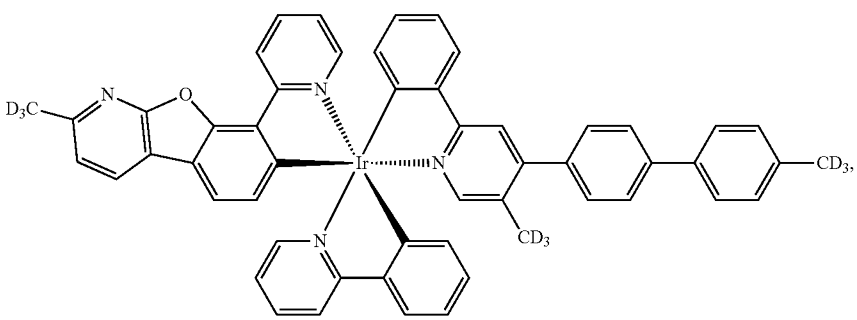
Compound 247
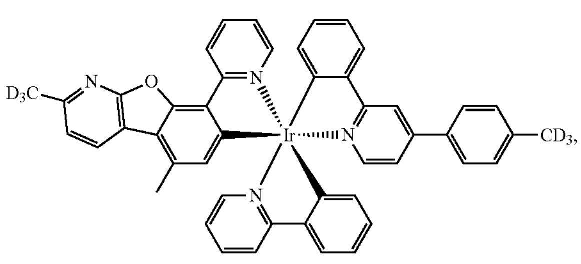
Compound 248
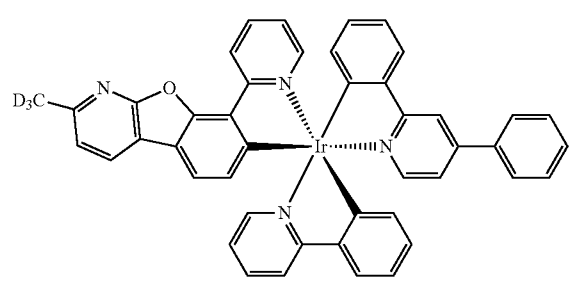

-continued
Compound 249
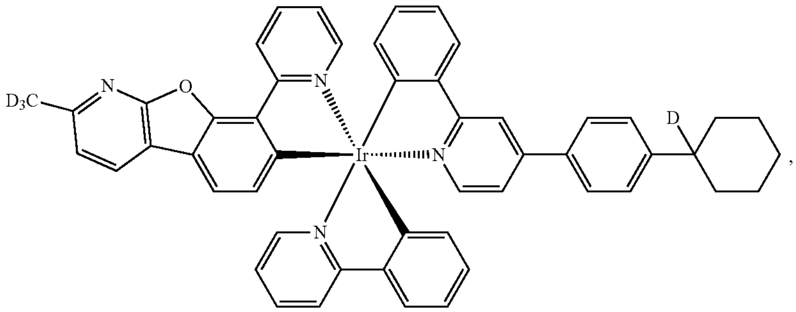
Compound 250
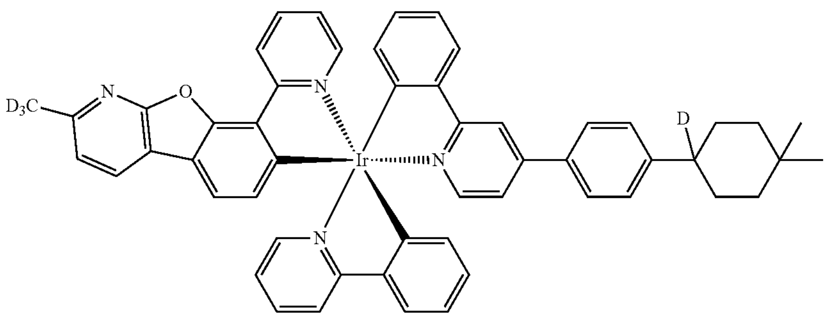
Compound 251
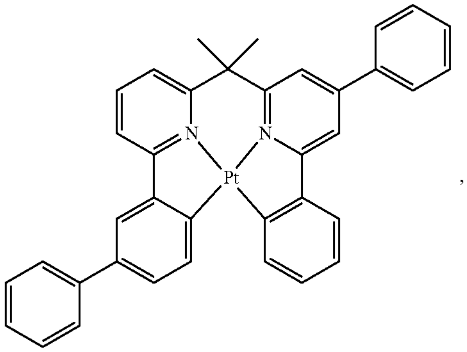
Compound 252
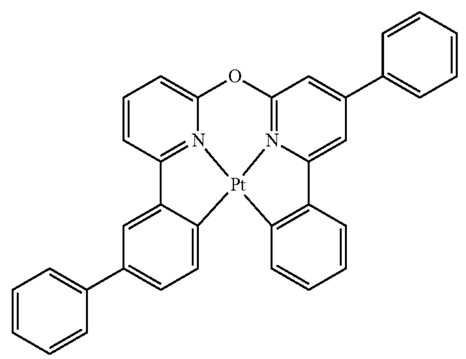
Compound 253
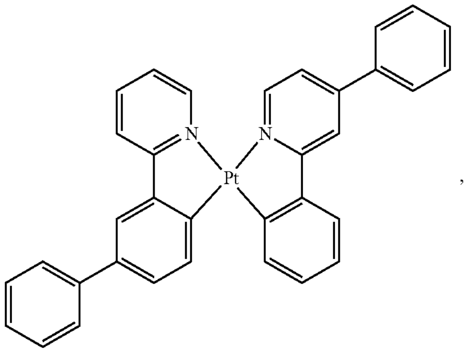
Compound 254
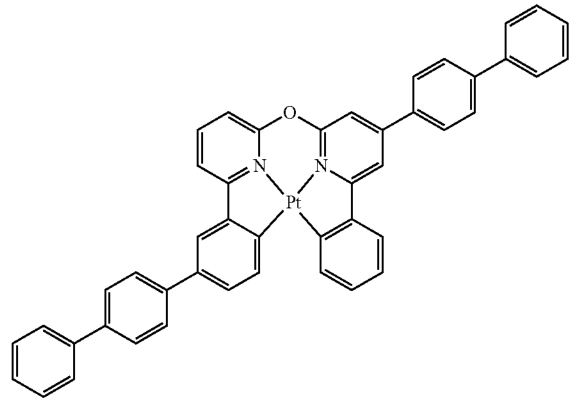

-continued
Compound 255
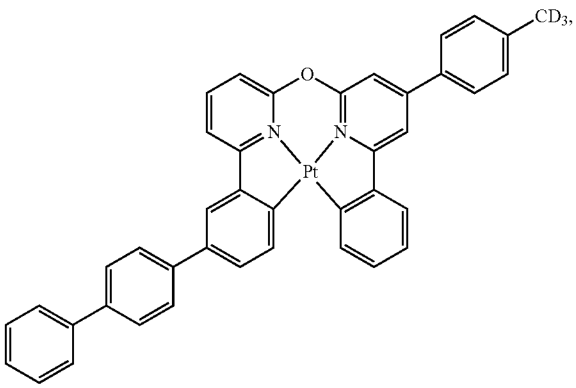
Compound 256
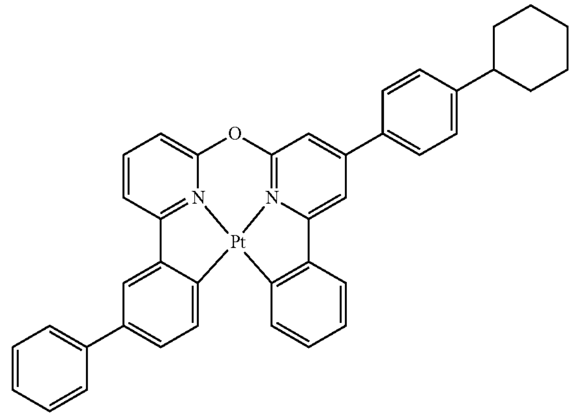
,
Compound 257
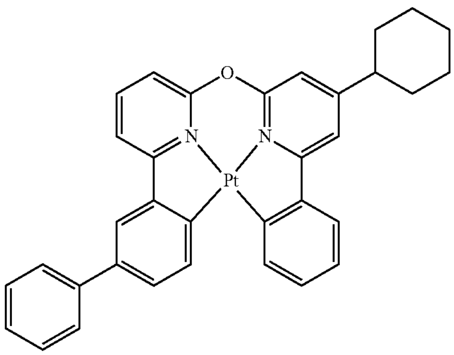
,
Compound 258
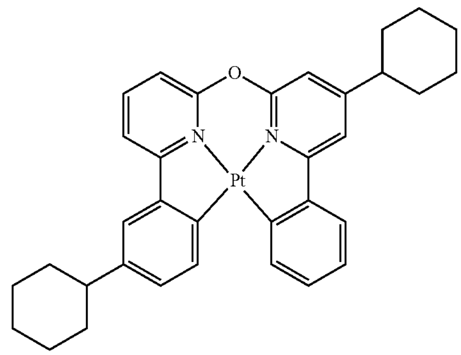
,
Compound 259
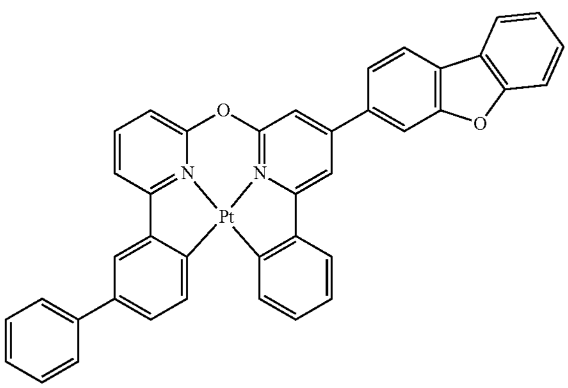
,
Compound 260
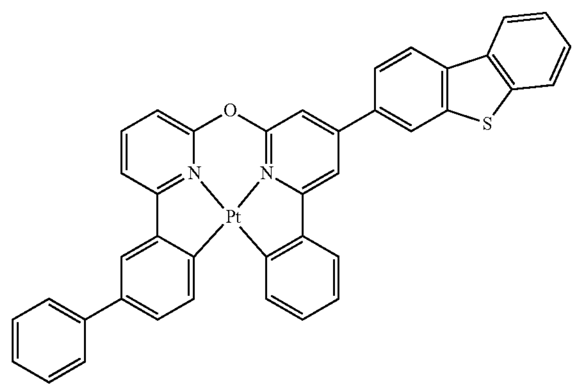
,
Compound 261
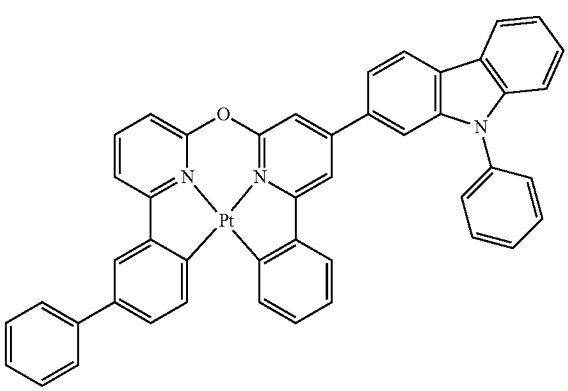
,
Compound 262
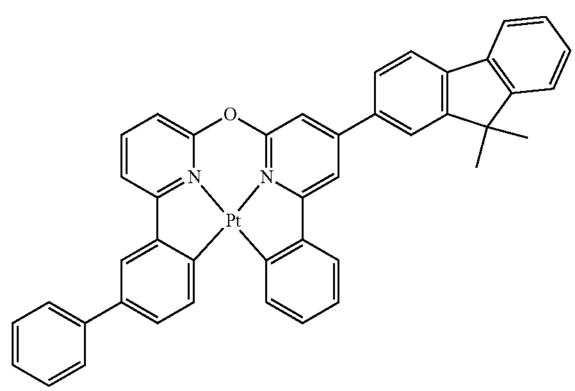
, -continued
Compound 263
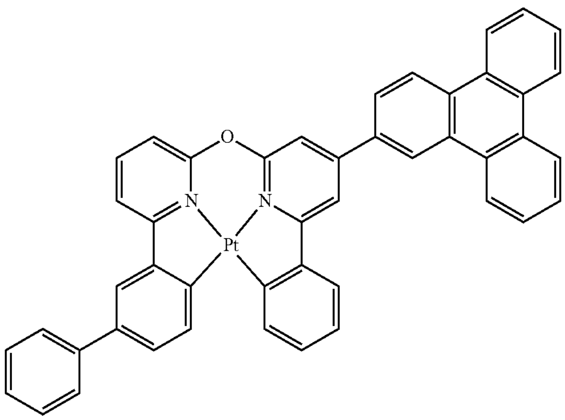
,
Compound 264
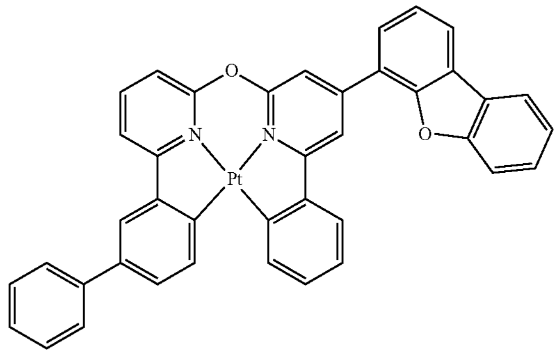
,
Compound 265
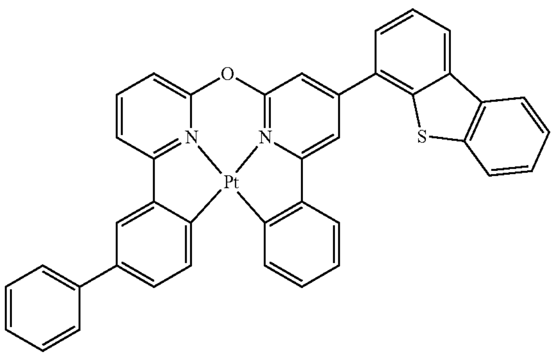
,
Compound 266
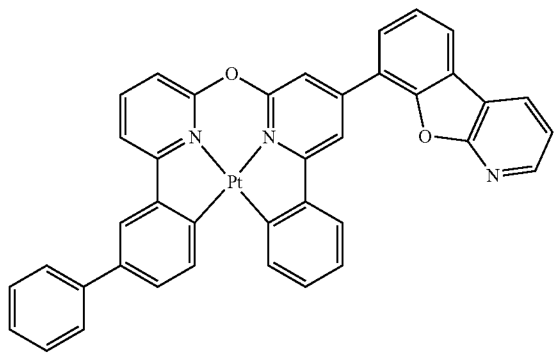
,
Compound 267
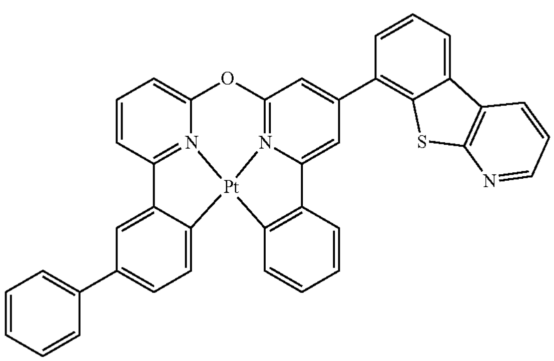
,
Compound 268
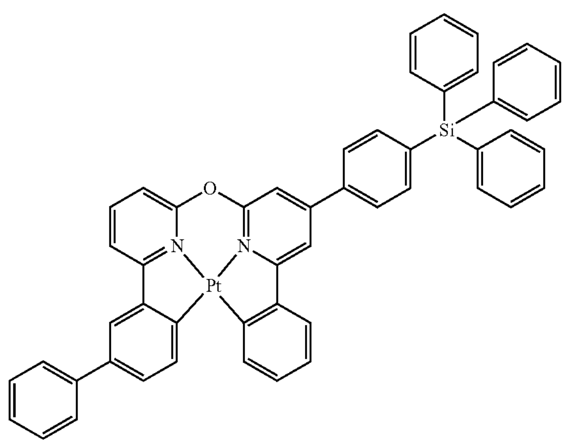
, -continued
Compound 269
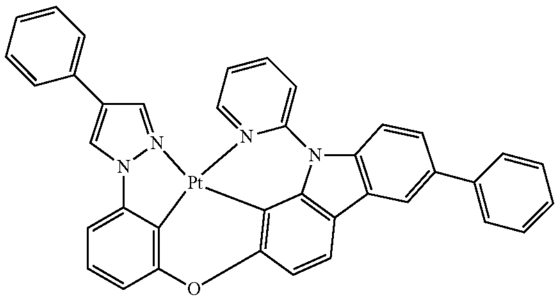
,
Compound 270
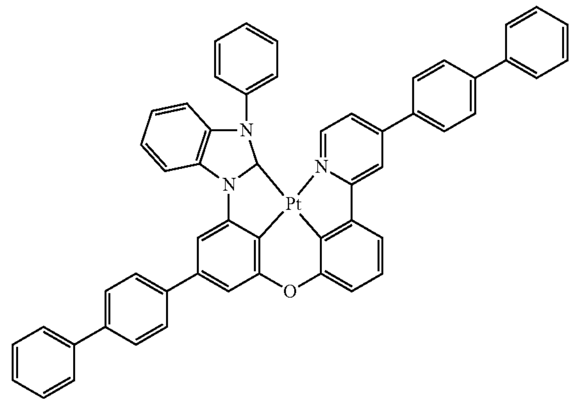
,
Compound 271
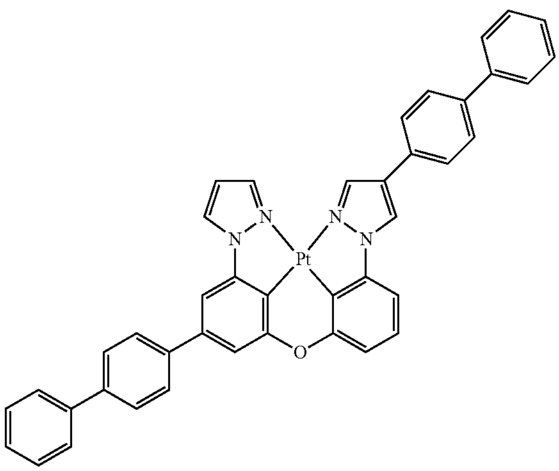
,
Compound 272
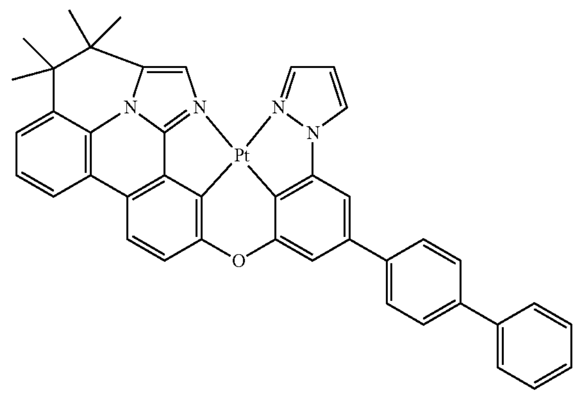
,
Compound 273
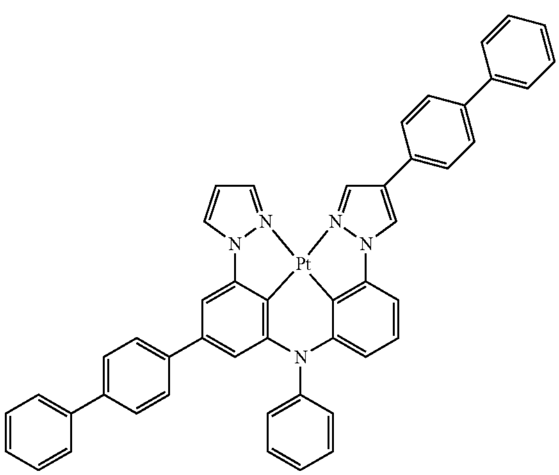
,
Compound 274
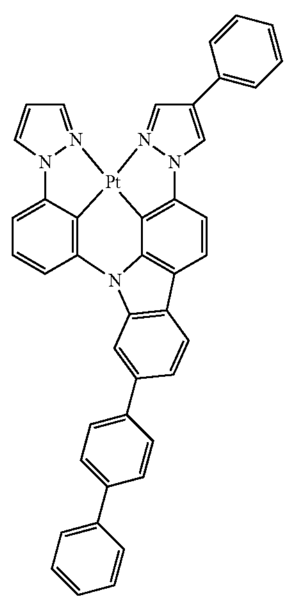
, -continued
Compound 275
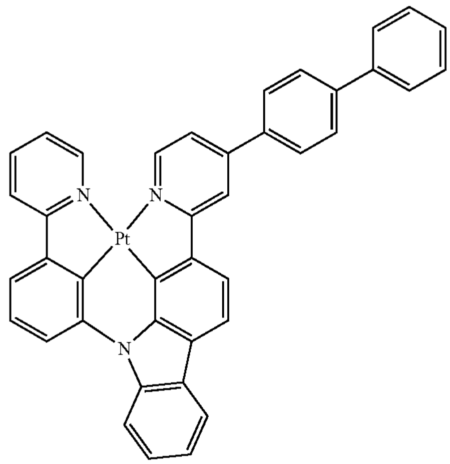
,
Compound 276
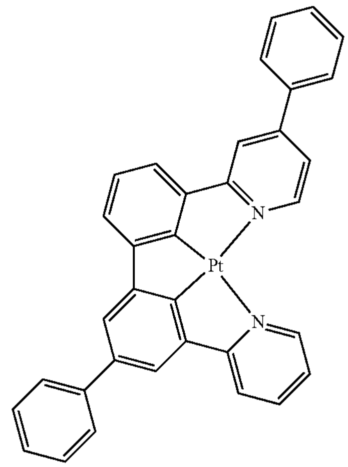
,
Compound 277
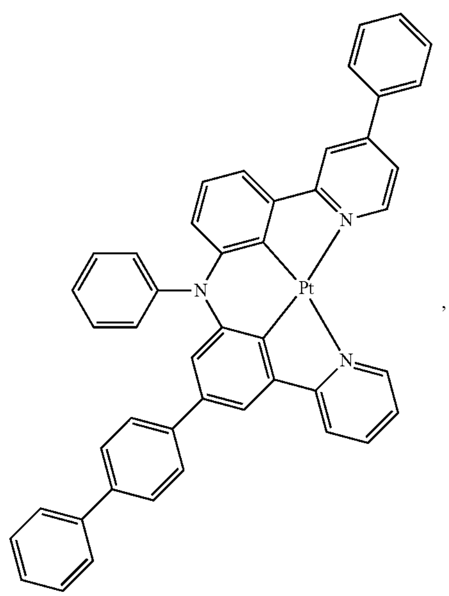
,
Compound 278
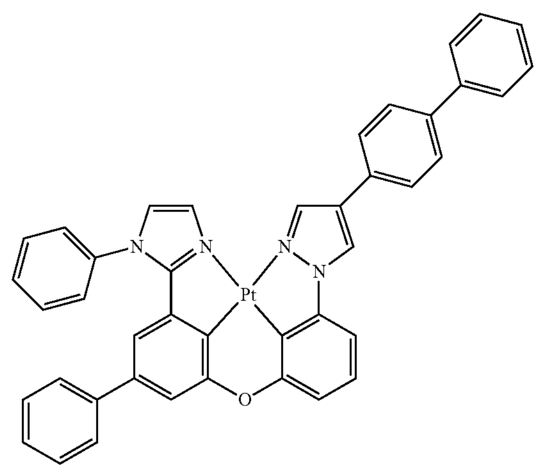
, -continued
Compound 279
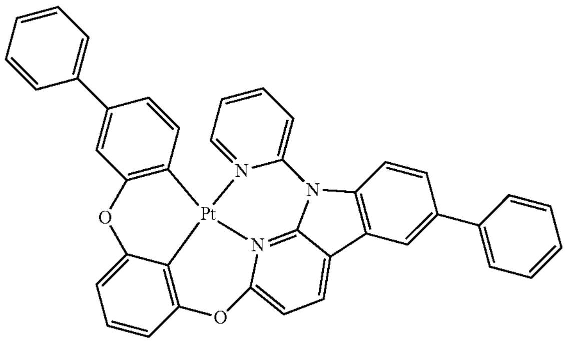
,
Compound 280
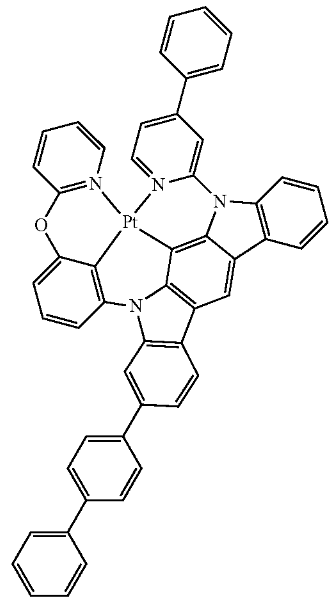
,
Compound 281
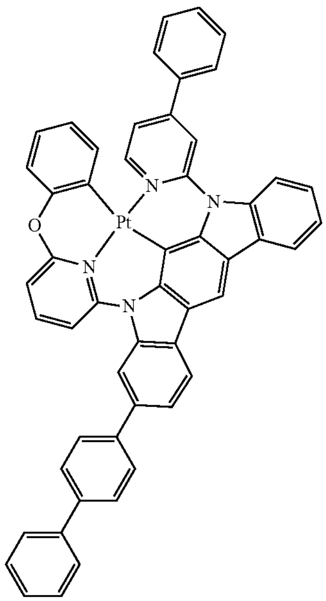
,
Compound 282
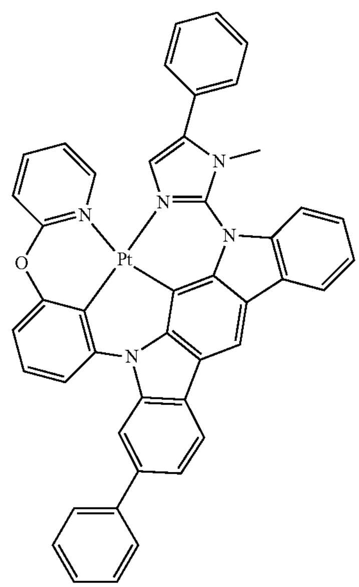
, -continued
Compound 283
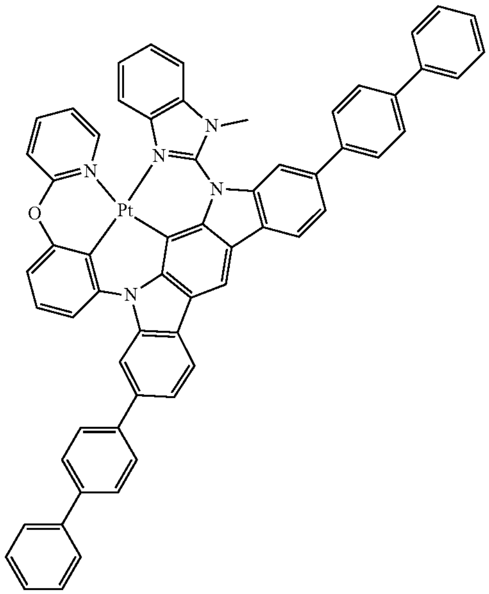
,
Compound 284
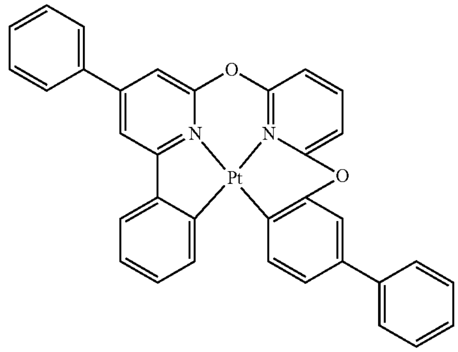
,
Compound 285
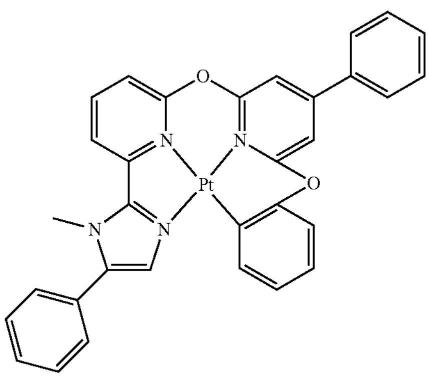
,
Compound 286
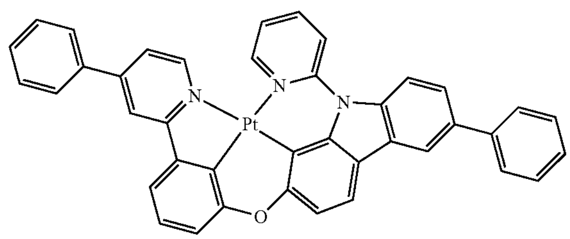
,
Compound 287
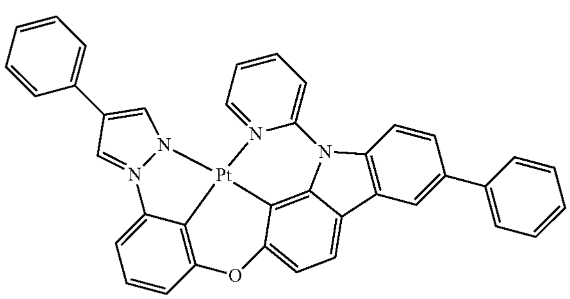
,
Compound 288
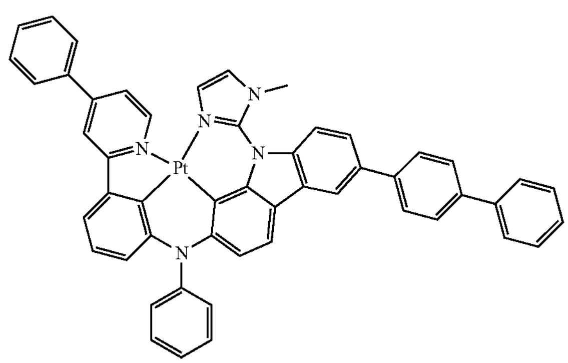
, -continued
Compound 289
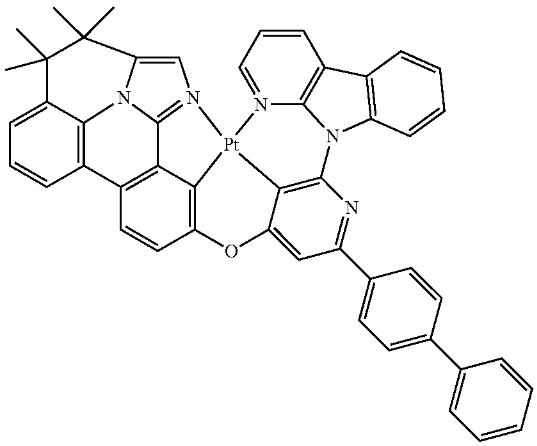
,
Compound 290
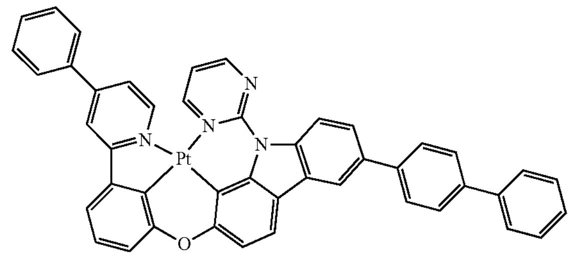
,
Compound 291
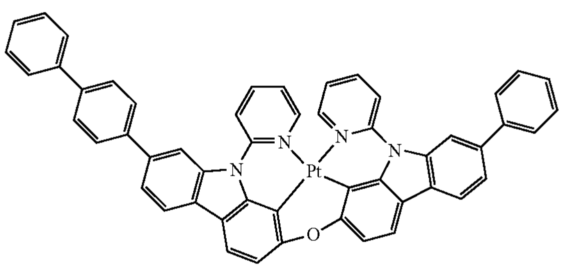
,
Compound 292
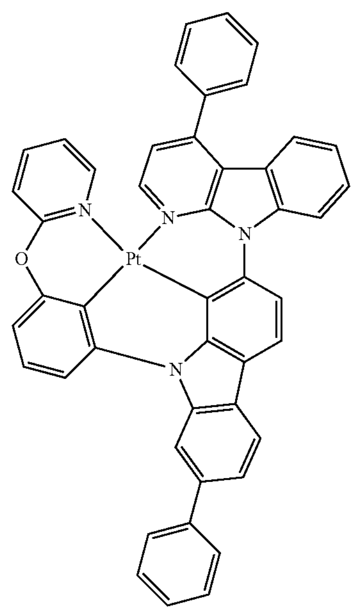
,
Compound 106
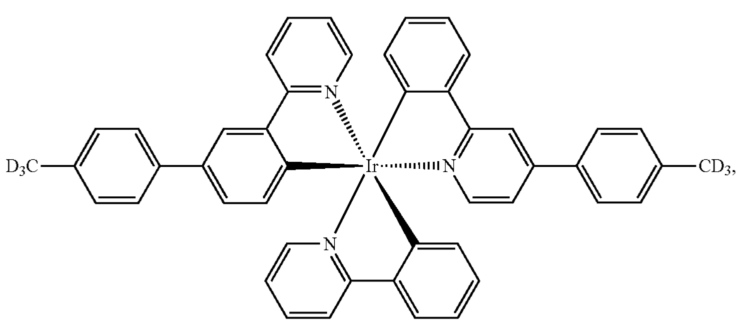

-continued
Compound 107
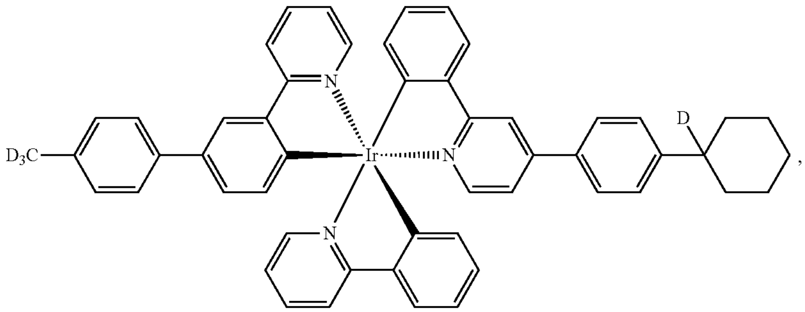
Compound 108
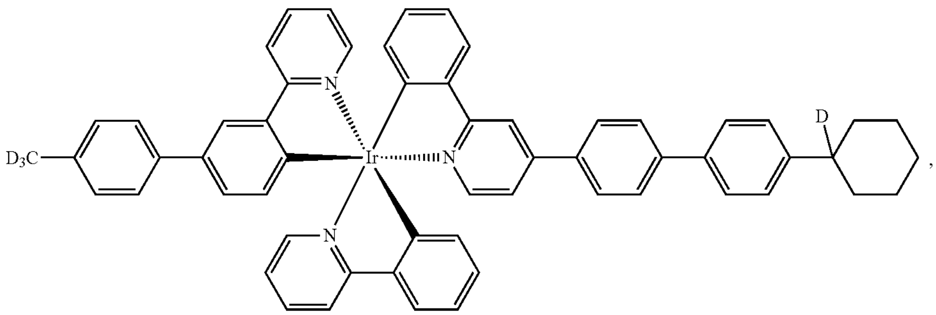
Compound 109
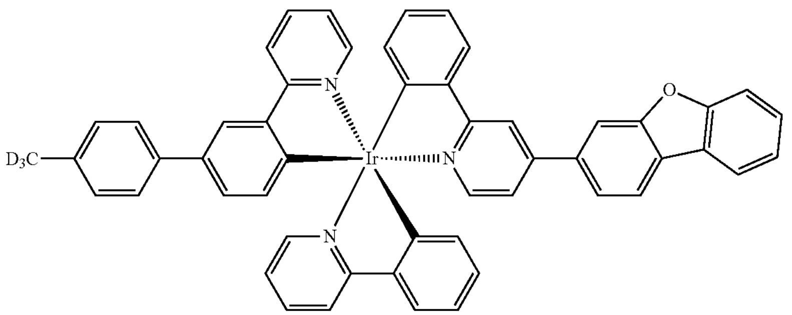
Compound 110
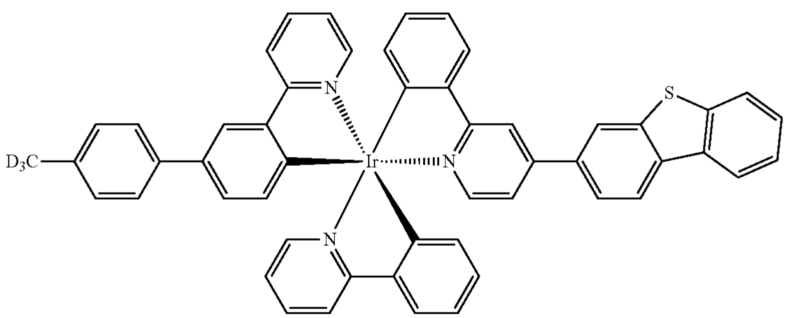
Compound 111
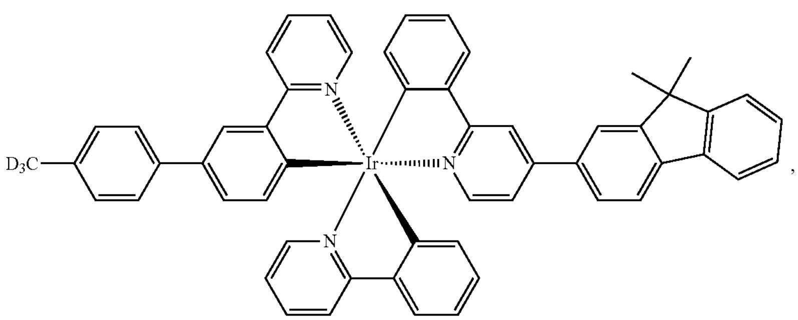

-continued
Compound 112
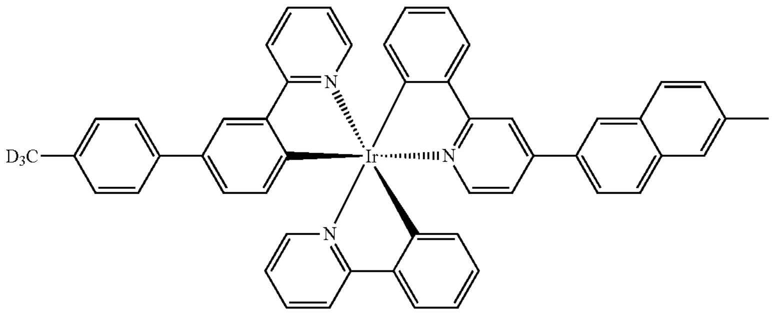
Compound 113
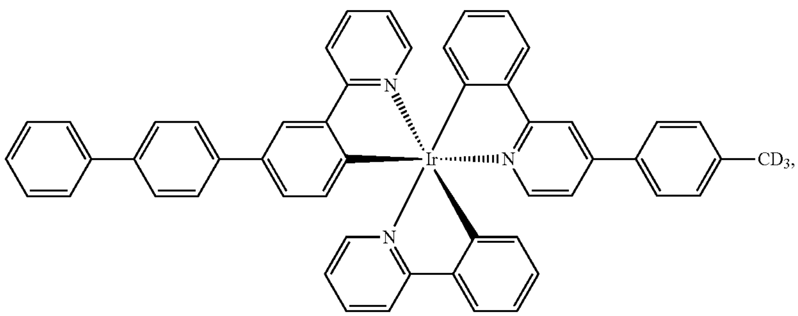
Compound 114
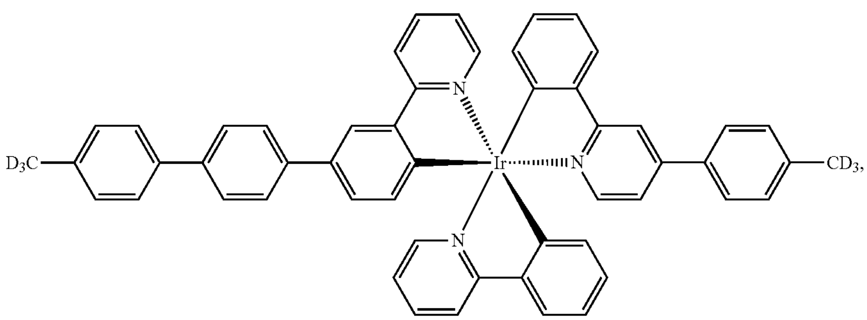
Compound 115
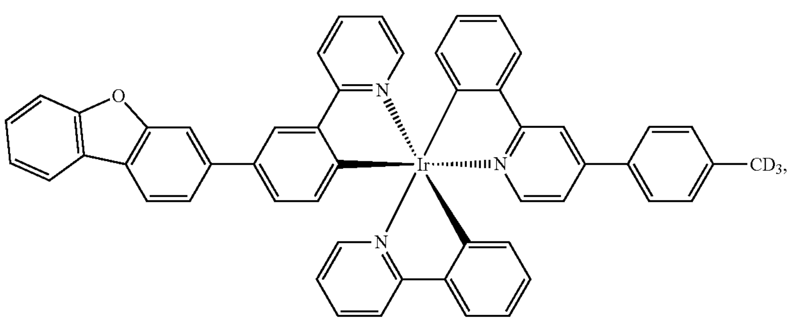
Compound 116
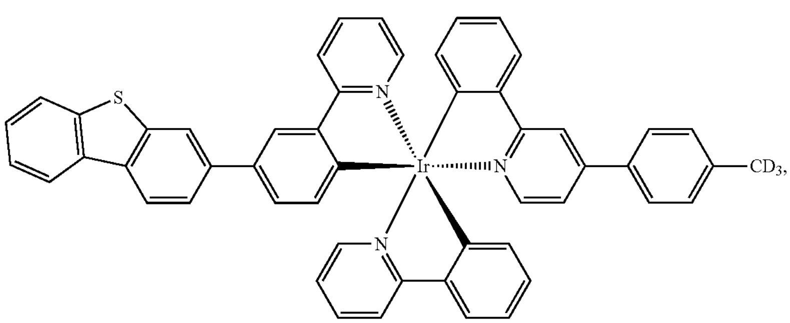

-continued
Compound 117
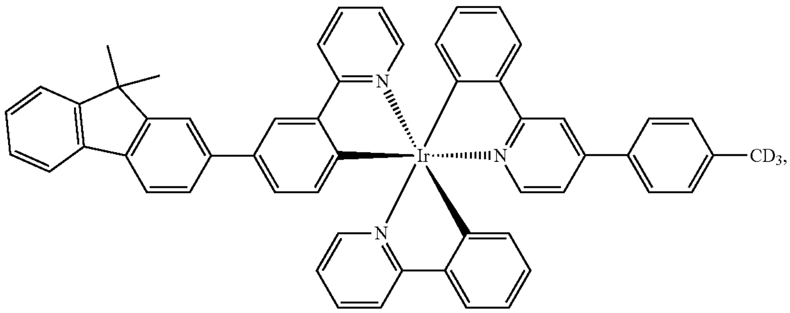
Compound 118
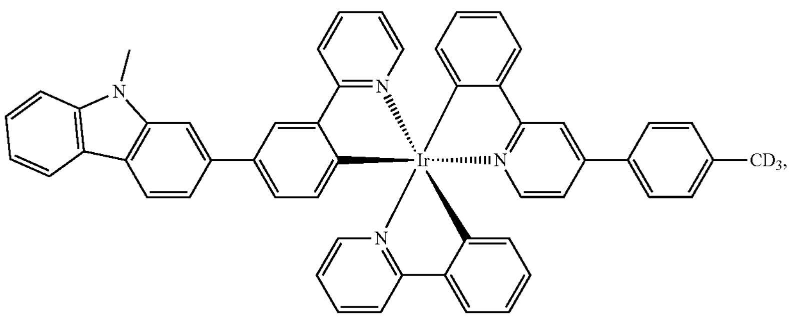
Compound 119
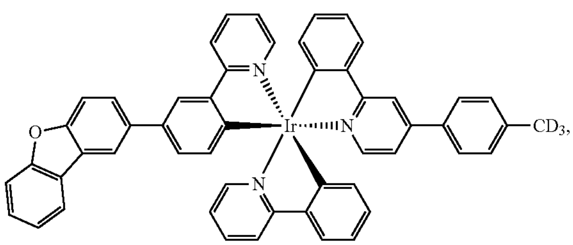
Compound 120
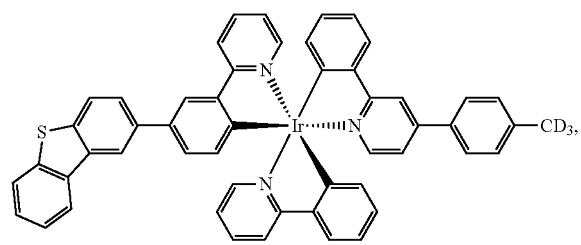
Compound 121
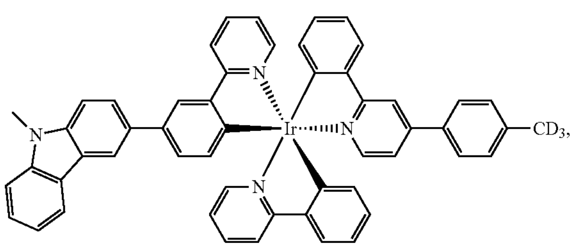
Compound 122
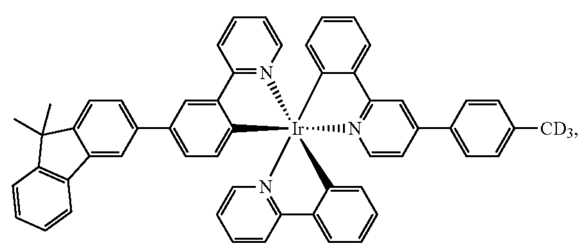
Compound 123
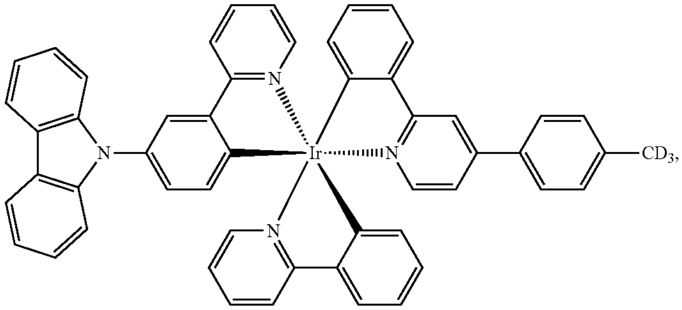

-continued
Compound 124
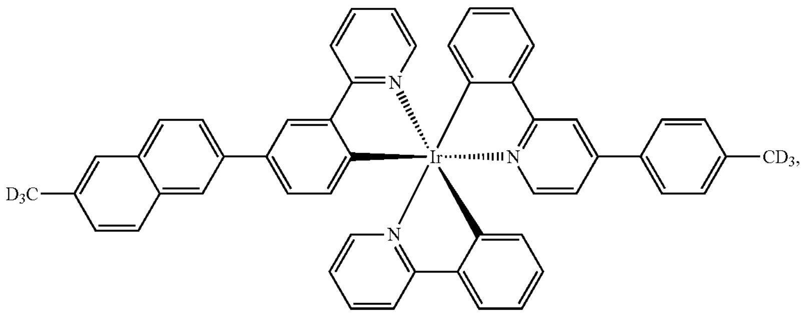
Compound 125
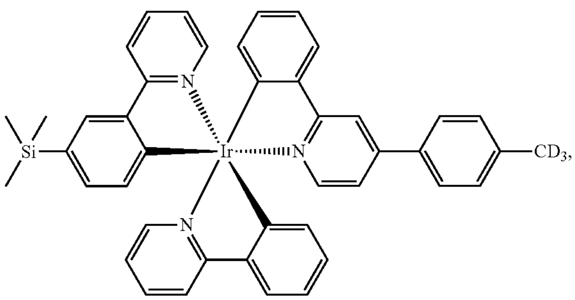
Compound 126
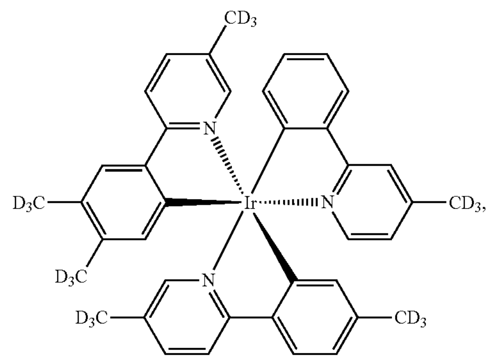
Compound 127
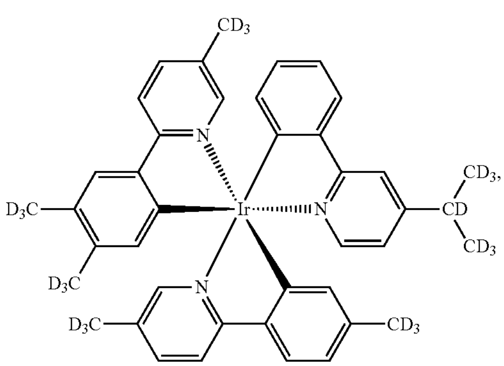
Compound 128
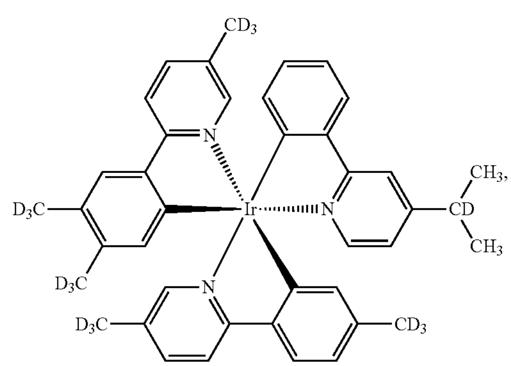
Compound 129
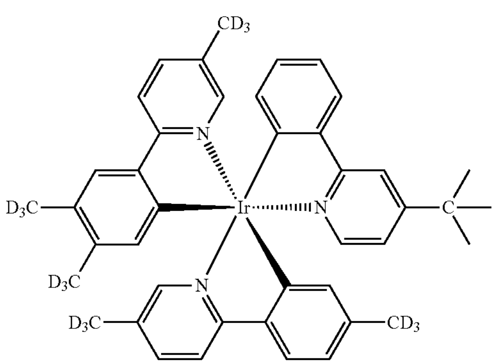
Compound 130
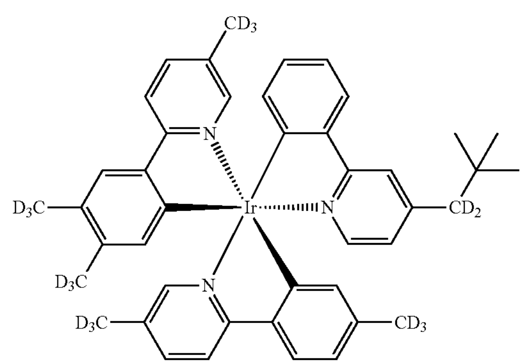

-continued
Compound 131
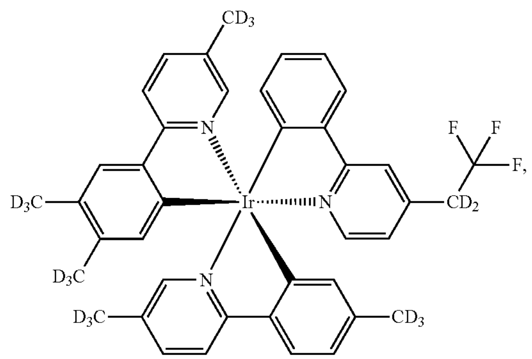
Compound 132
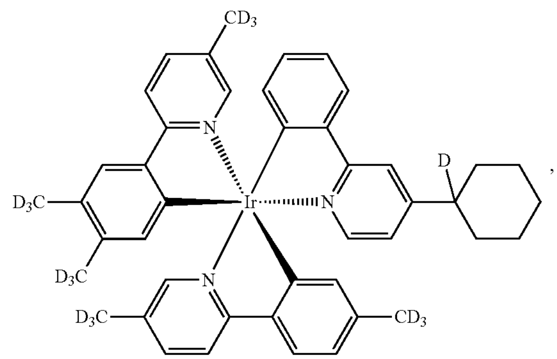
Compound 133
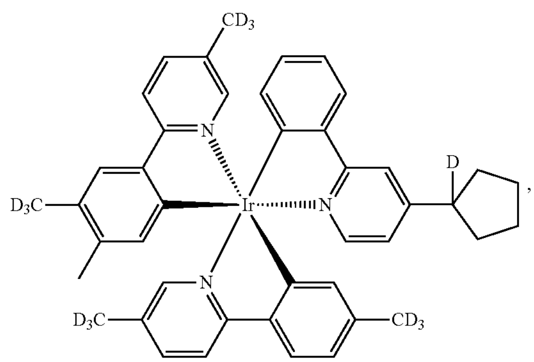
Compound 134
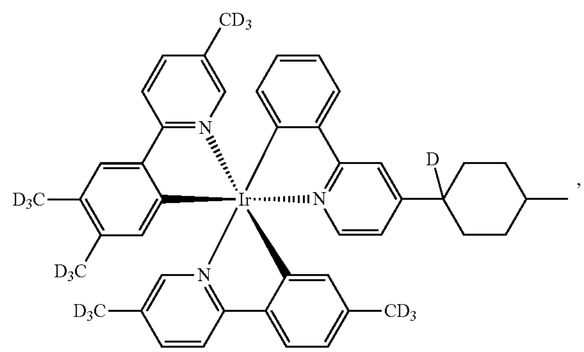
Compound 135
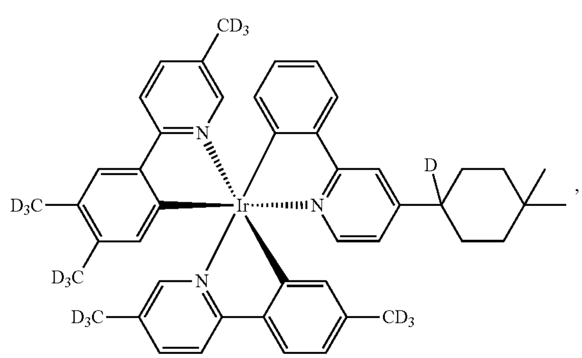
Compound 136
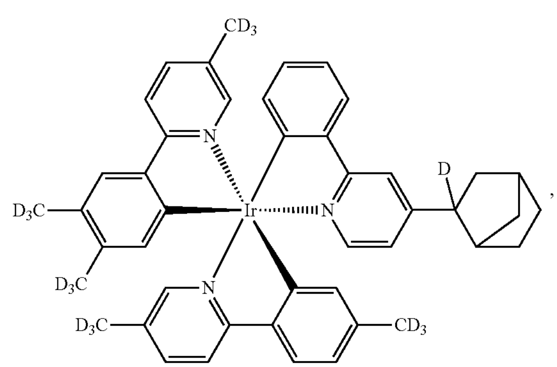
Compound 137
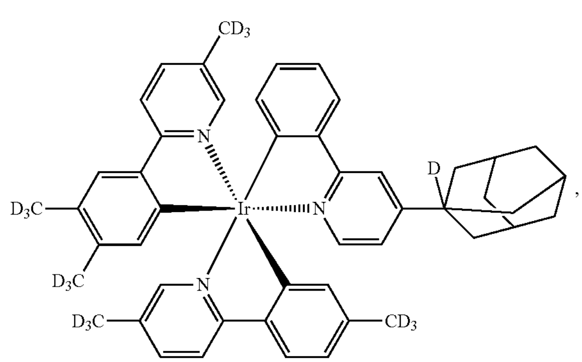
Compound 138
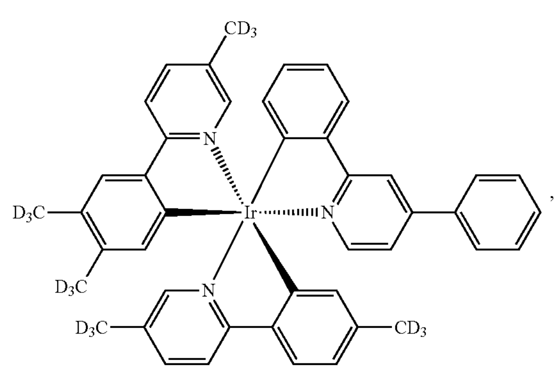

-continued
Compound 139
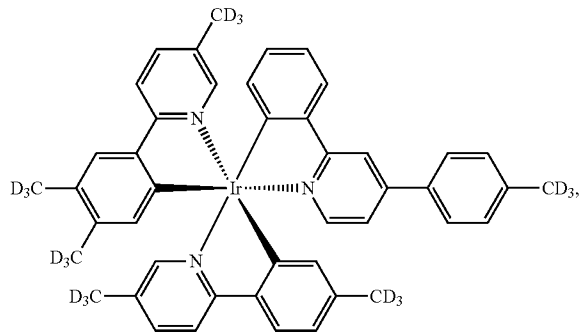
Compound 140
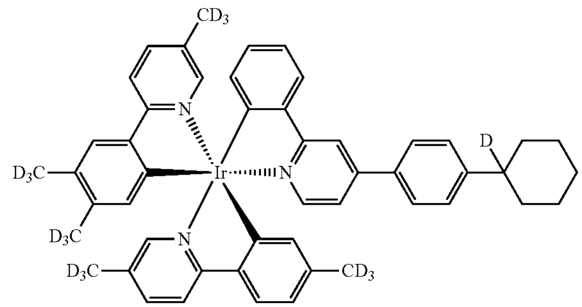
Compound 141
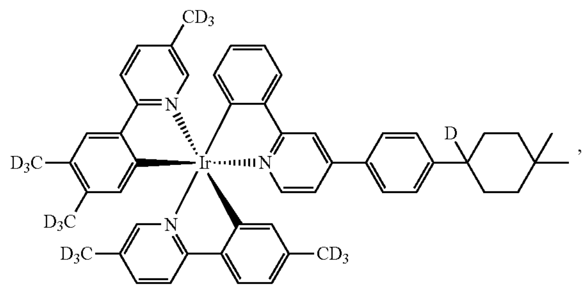
Compound 142
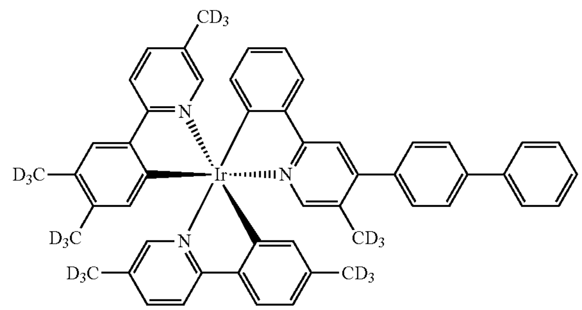
Compound 143
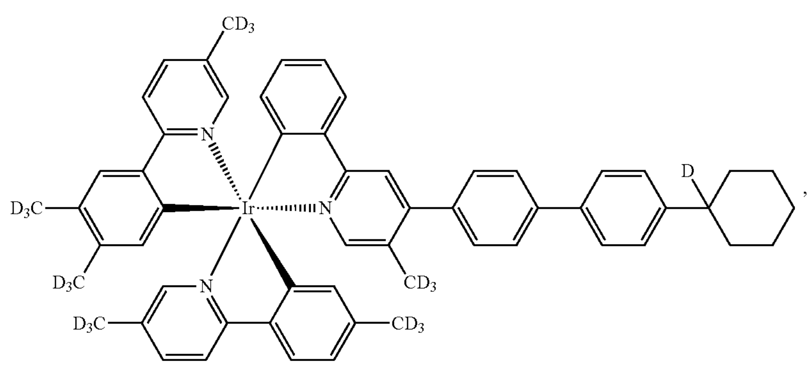
Compound 144
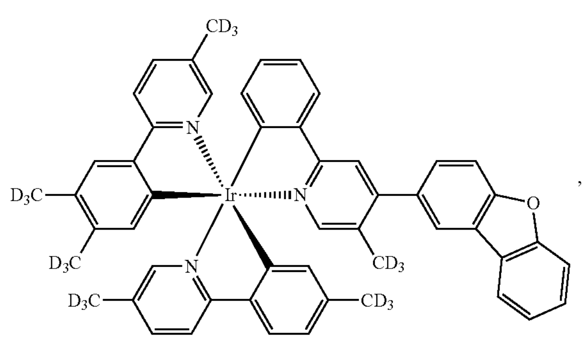
Compound 145
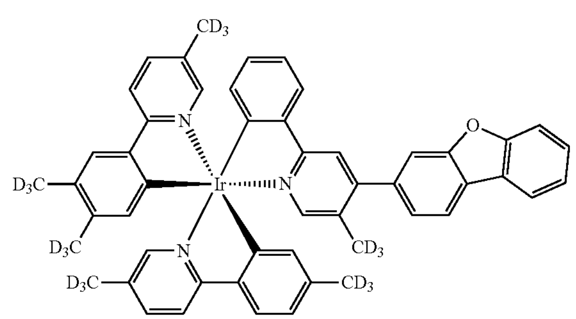

-continued
Compound 146
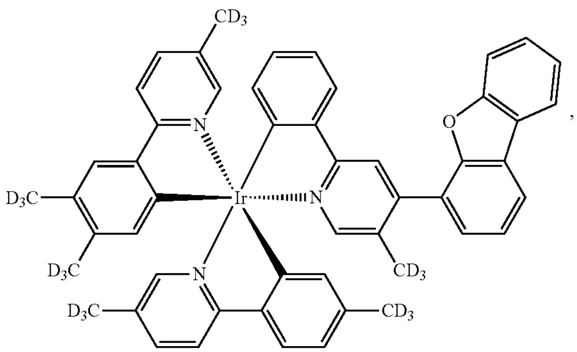
Compound 147
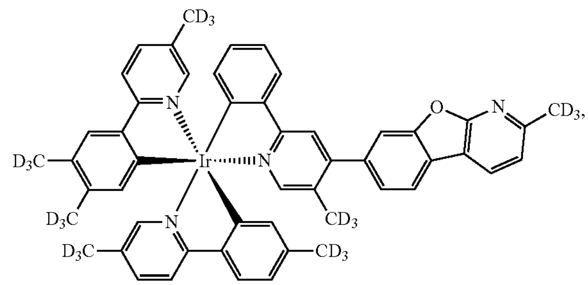
Compound 148
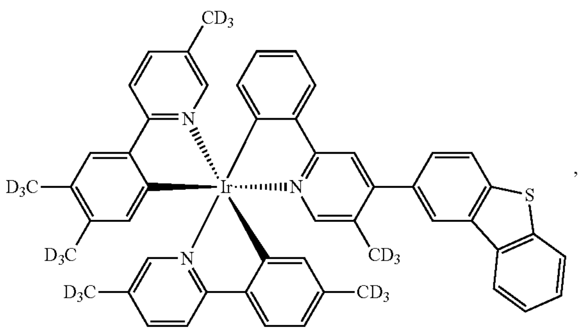
Compound 149
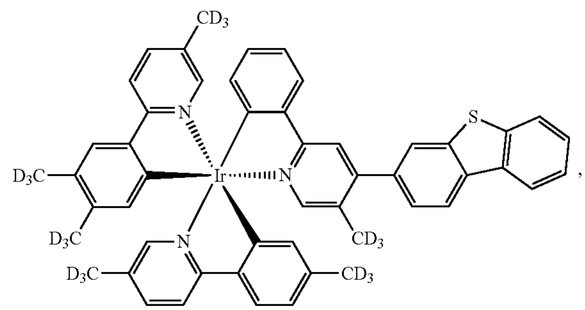
Compound 150
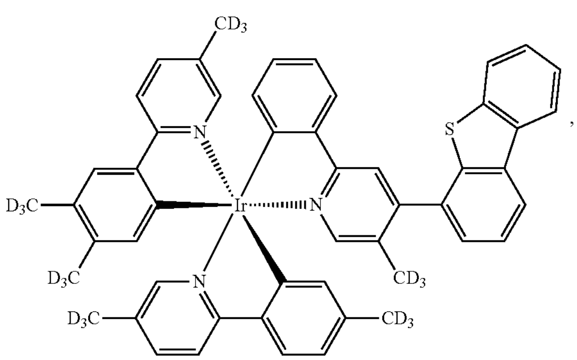
Compound 151
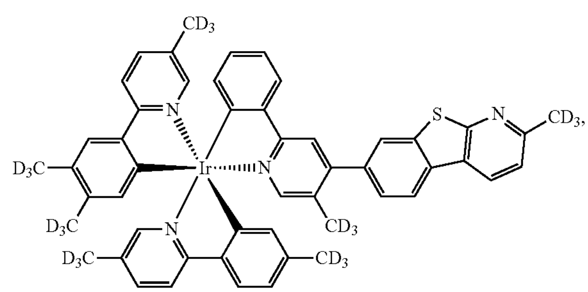
Compound 152
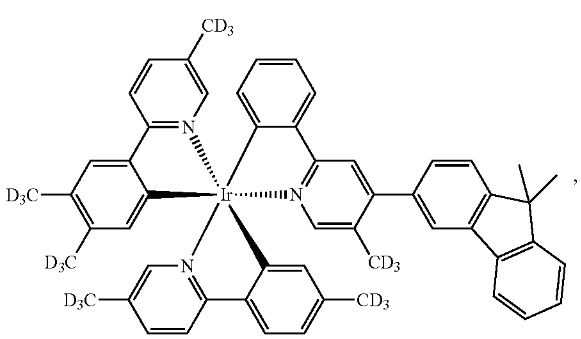
Compound 153
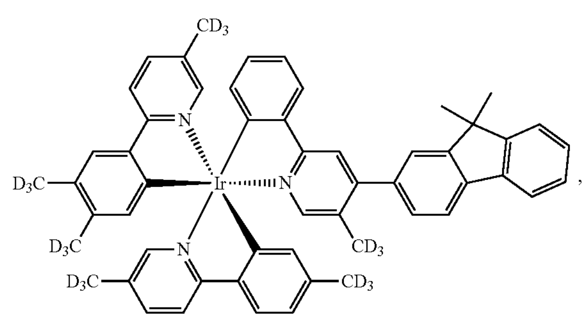

-continued
Compound 154
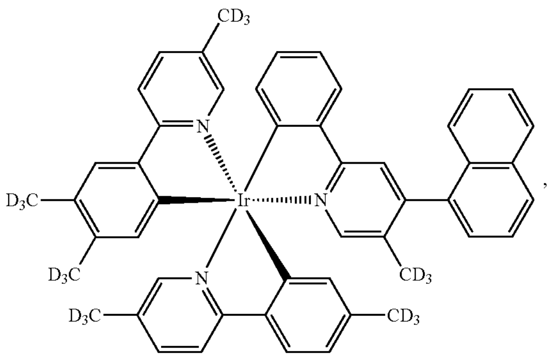
Compound 155
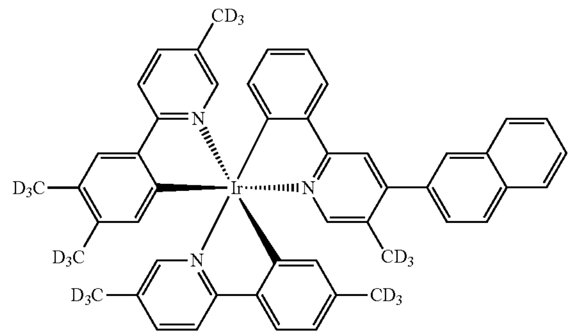
Compound 156
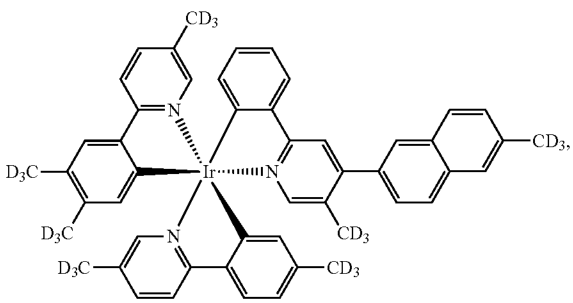
Compound 157
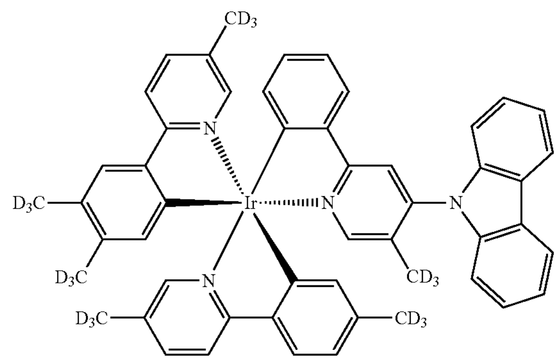
Compound 158
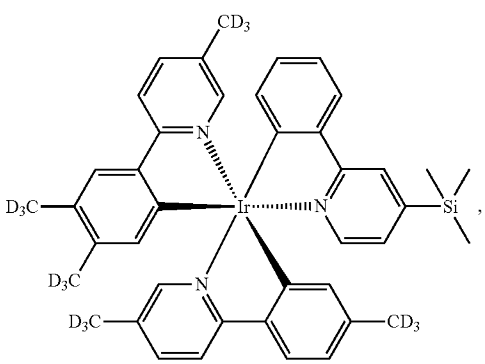
Compound 159
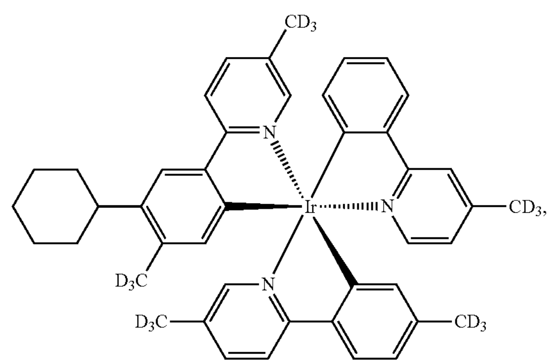
Compound 160
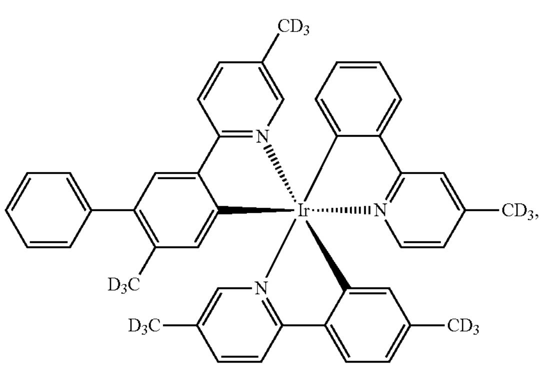
Compound 161
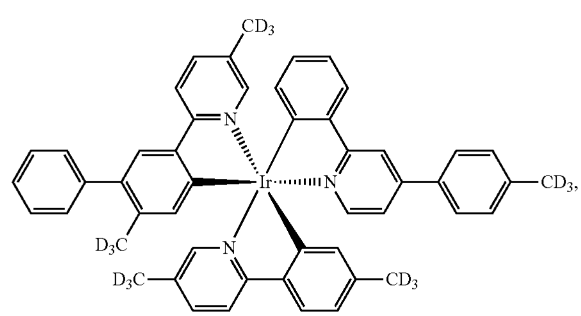

-continued
Compound 162
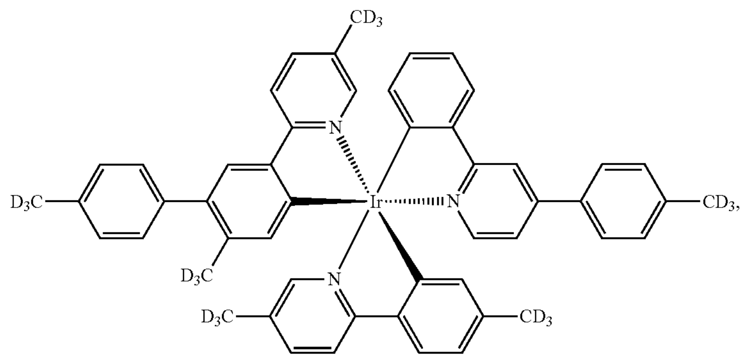
Compound 163
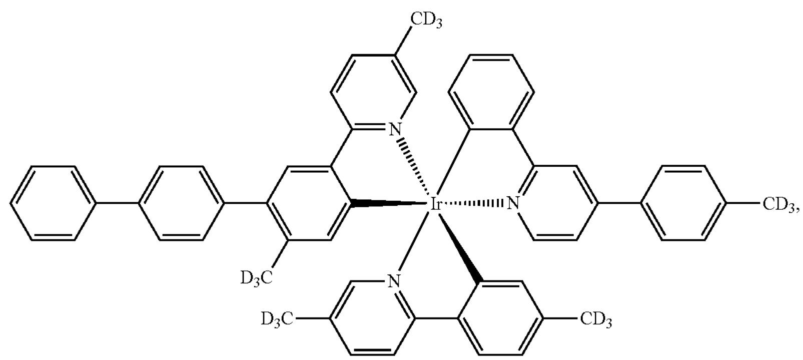
Compound 164
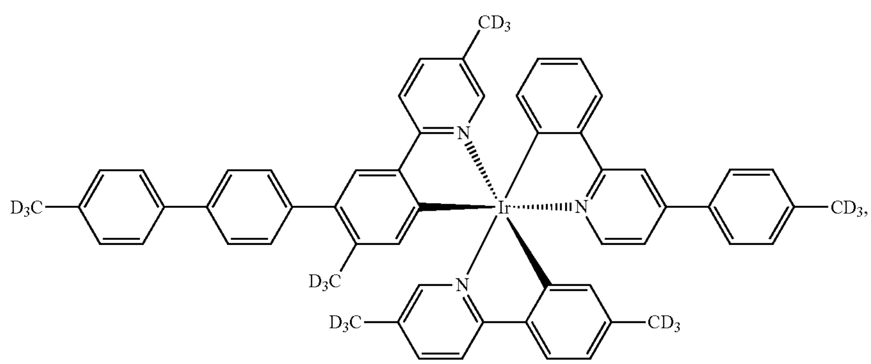
Compound 165
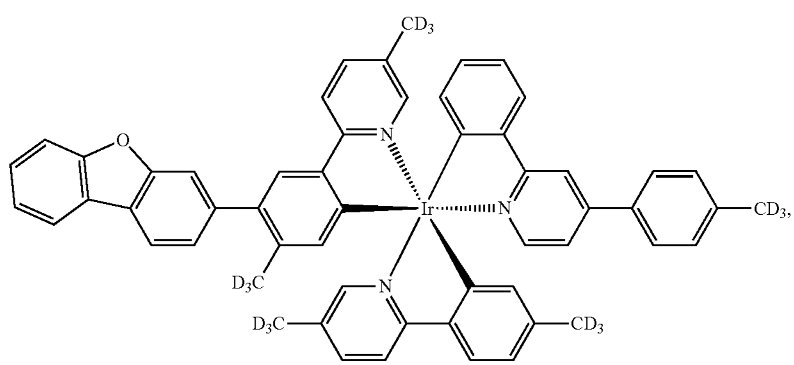

-continued
Compound 166
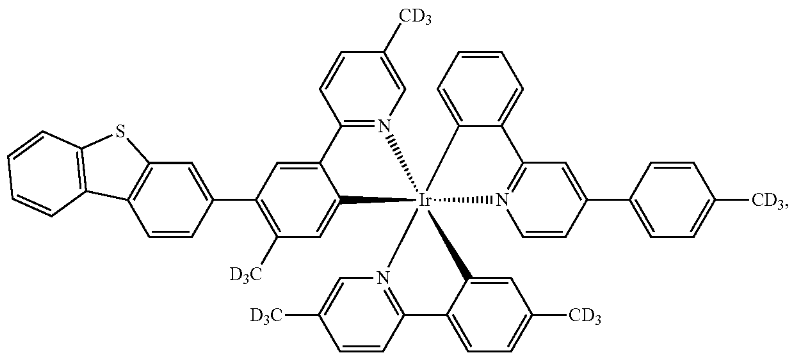
Compound 167
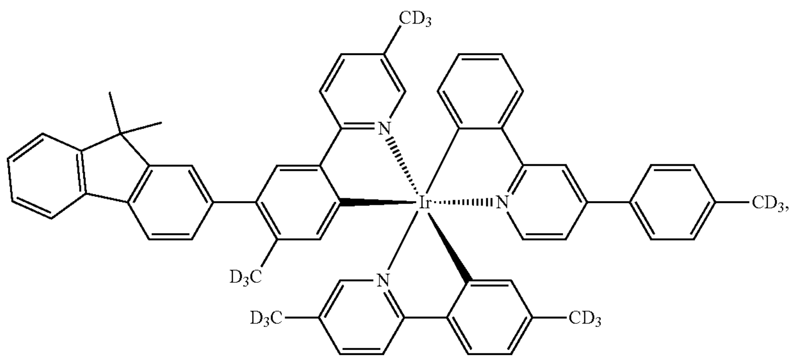
Compound 168
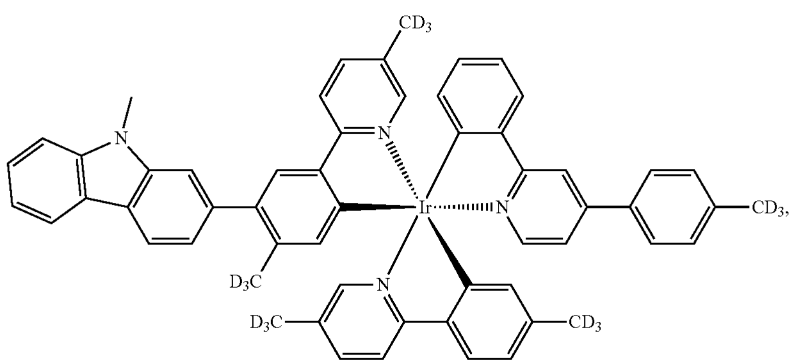
Compound 169
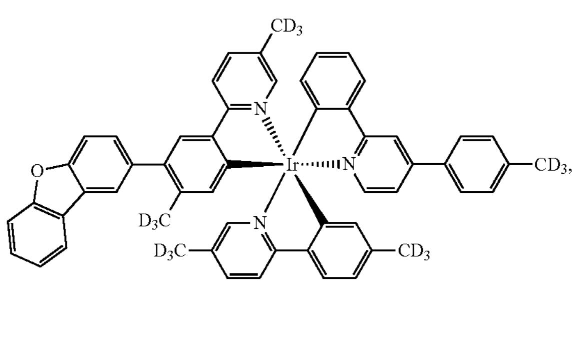
Compound 170
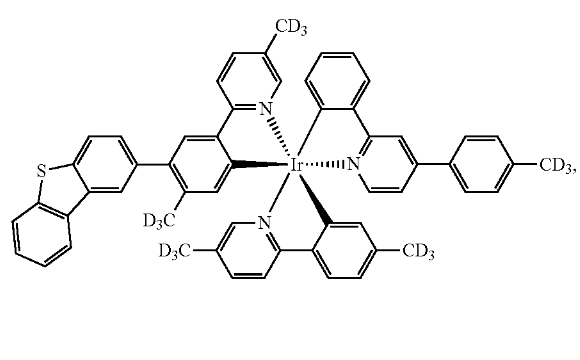

-continued
Compound 171
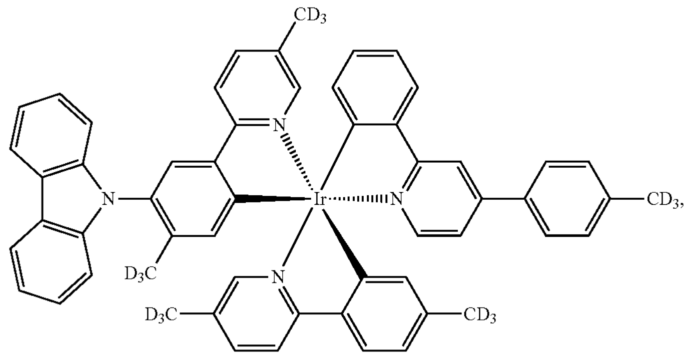
Compound 172
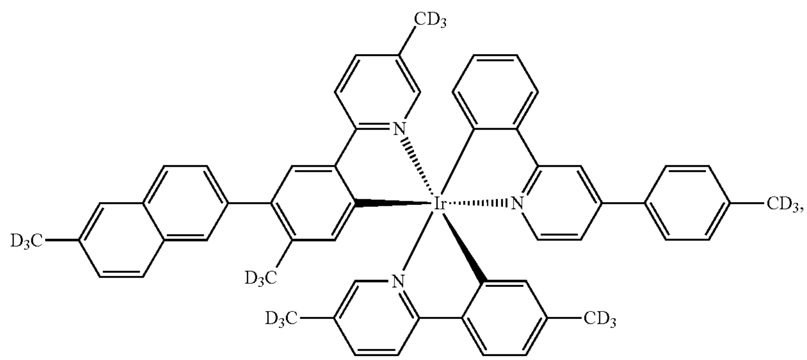
Compound 173
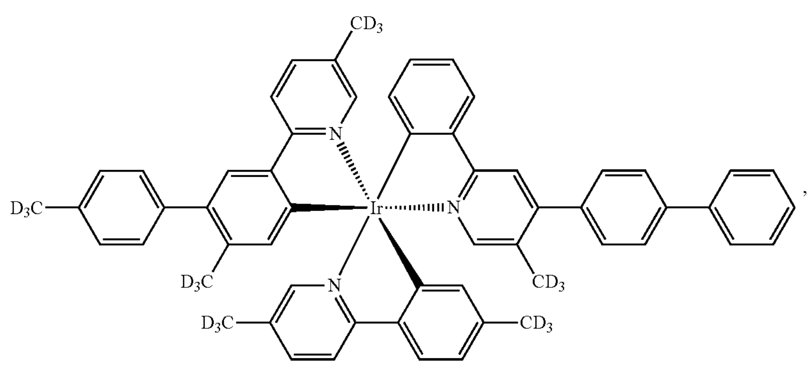
Compound 174
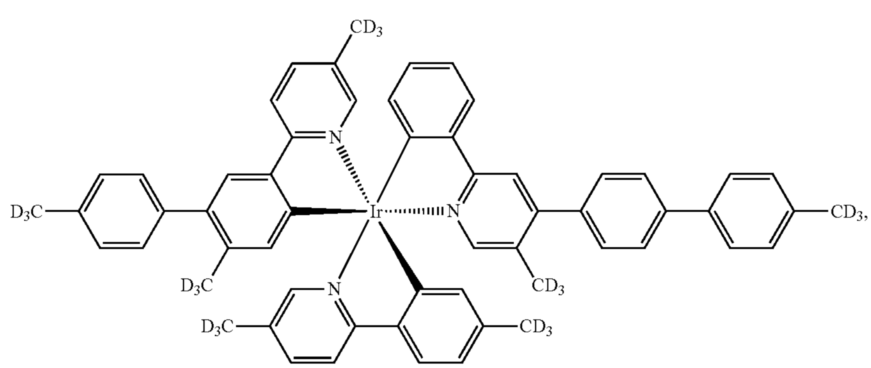

-continued
Compound 175
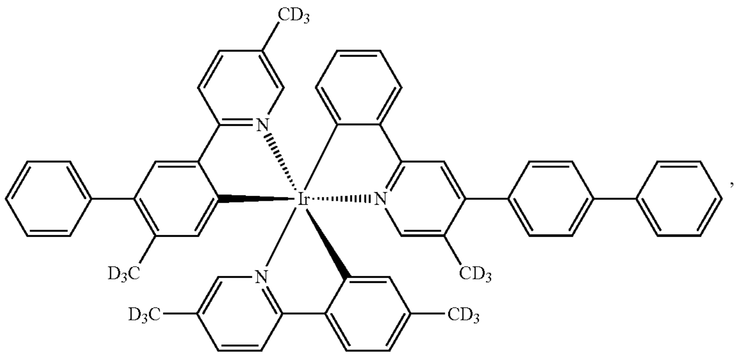
Compound 176
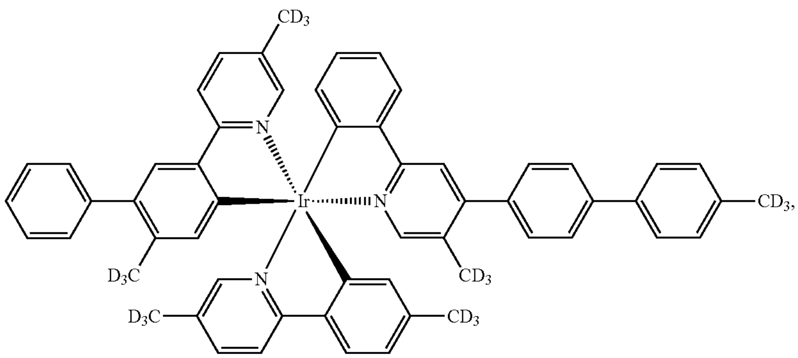
Compound 177
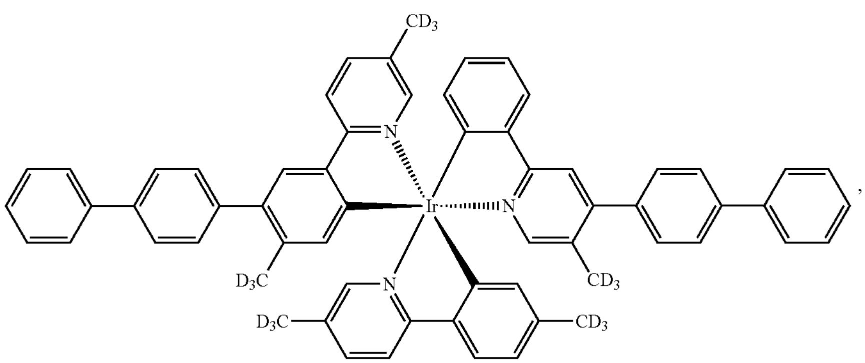
Compound 178
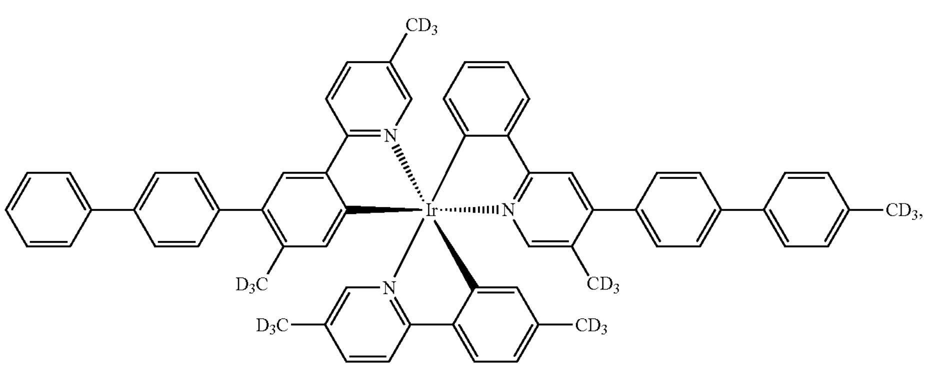

-continued
Compound 179
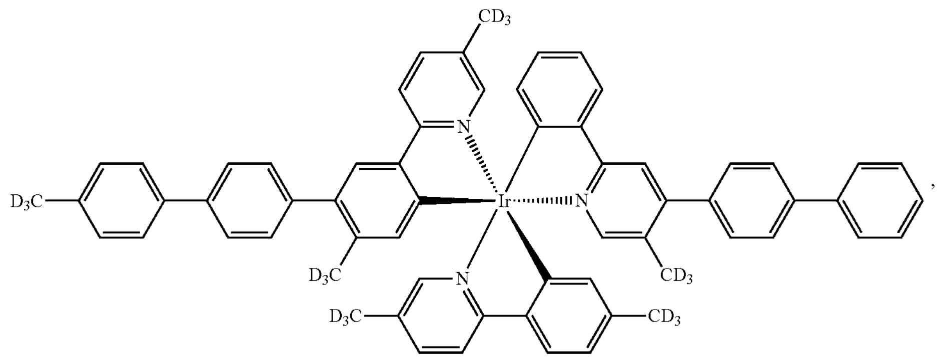
Compound 180
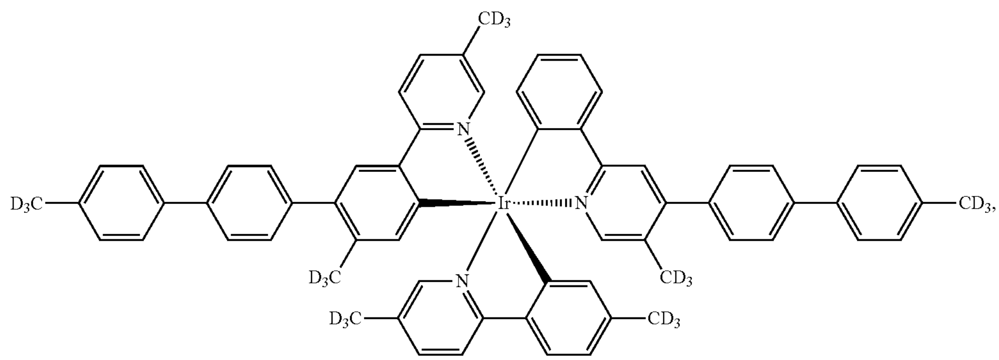
Compound 181
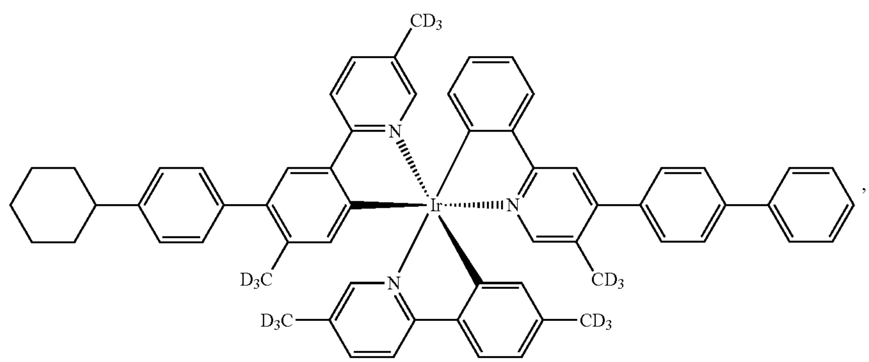
Compound 182
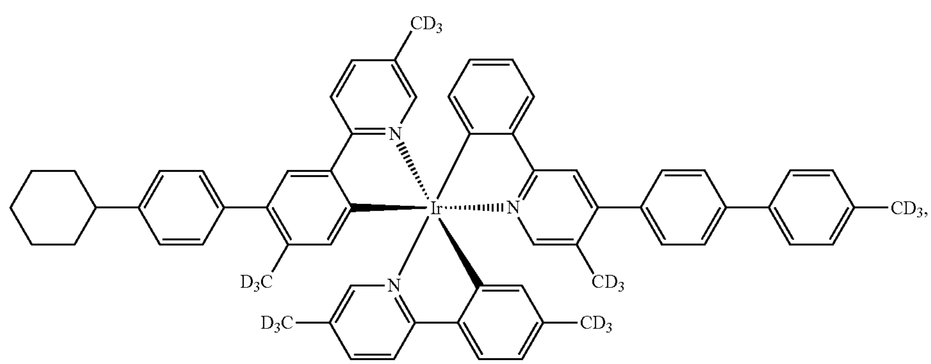

-continued
Compound 183
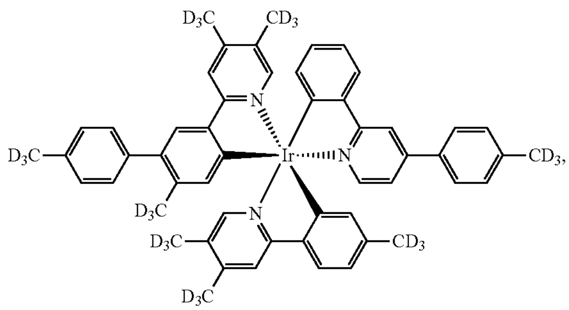
Compound 184
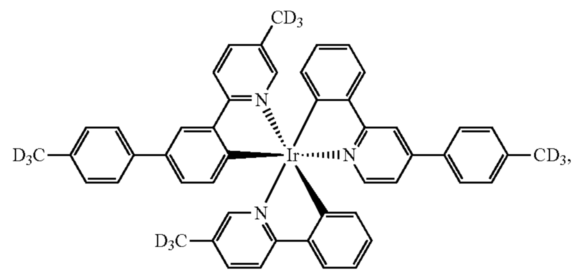
Compound 185
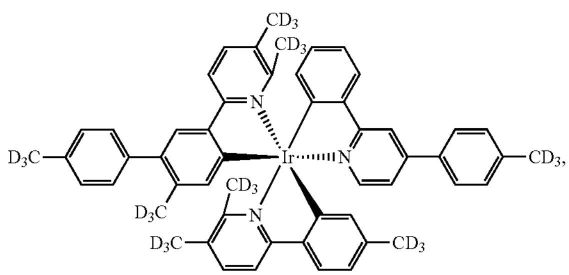
Compound 186
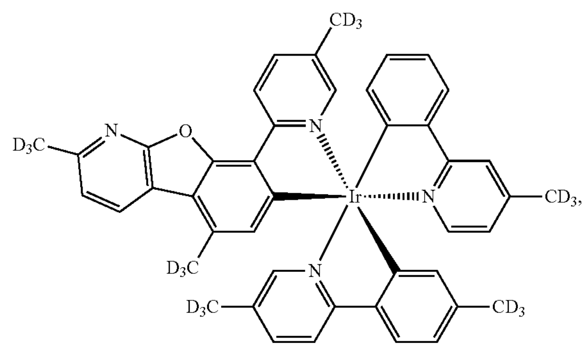
Compound 187
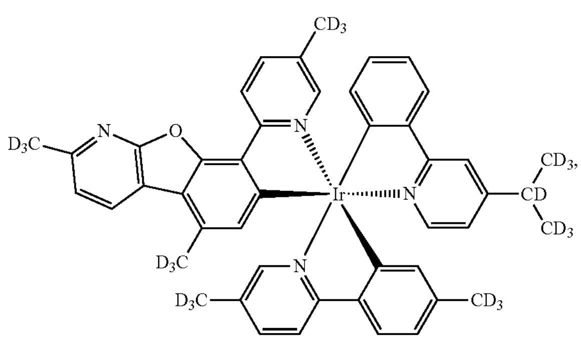
Compound 188
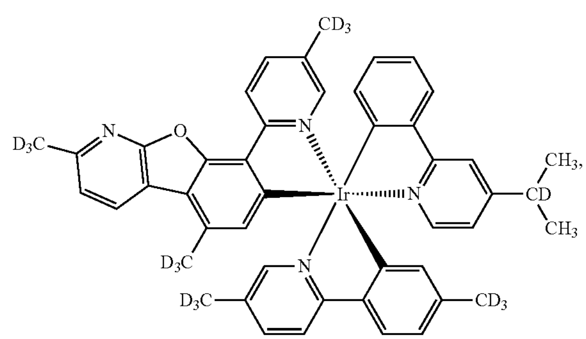
Compound 189
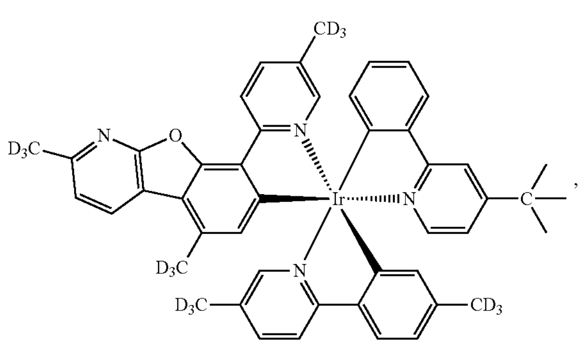
Compound 190
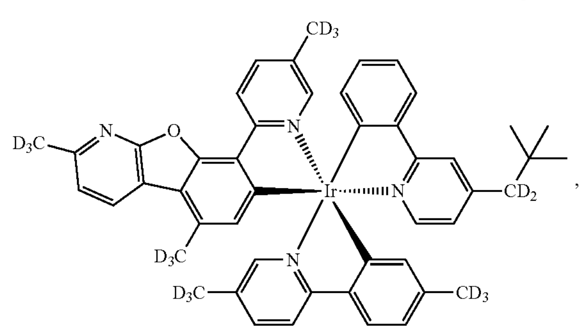

-continued
Compound 191
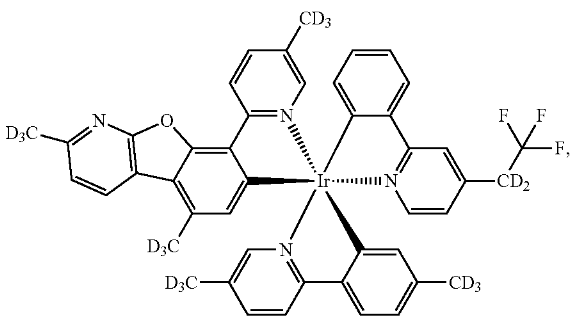
Compound 192
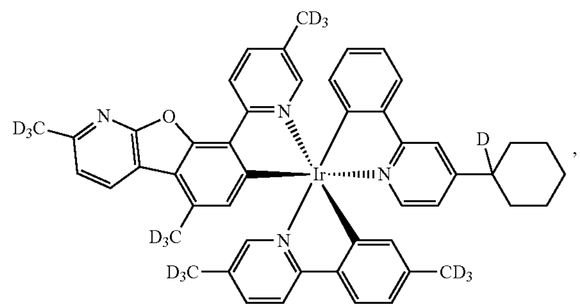
Compound 193
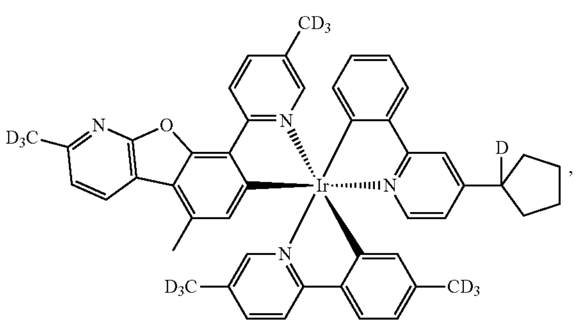
Compound 194
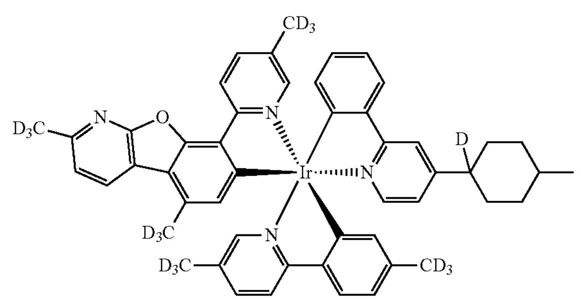
Compound 195
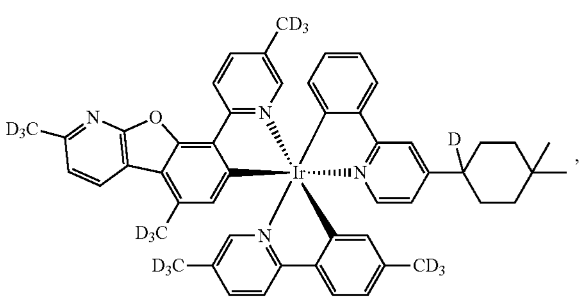
Compound 196
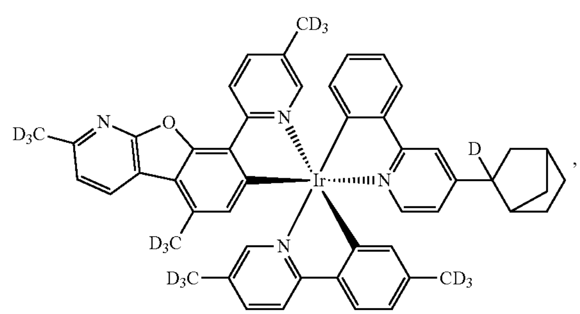
Compound 197
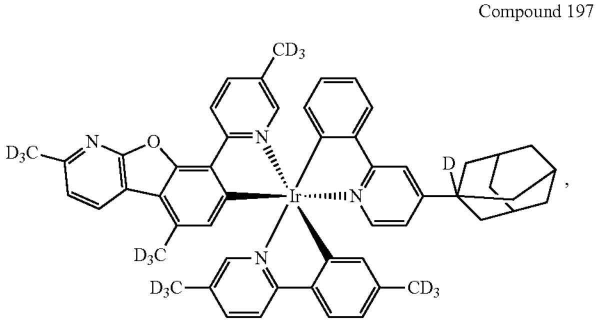
Compound 198
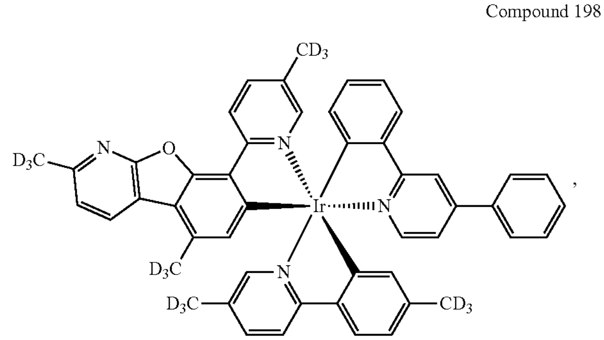

-continued
Compound 199
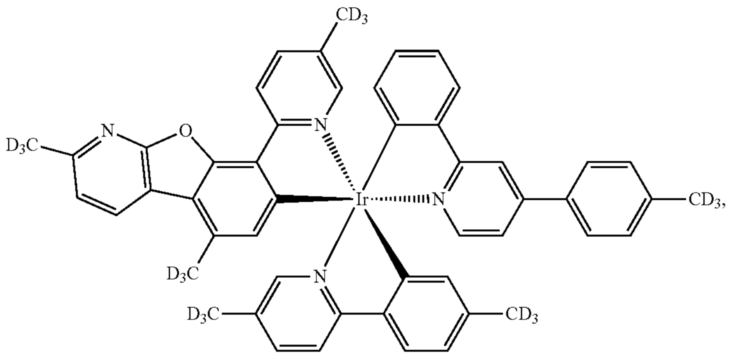
Compound 200
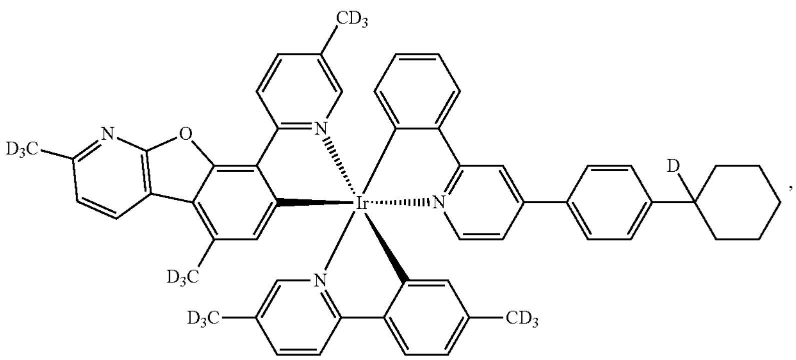
Compound 201
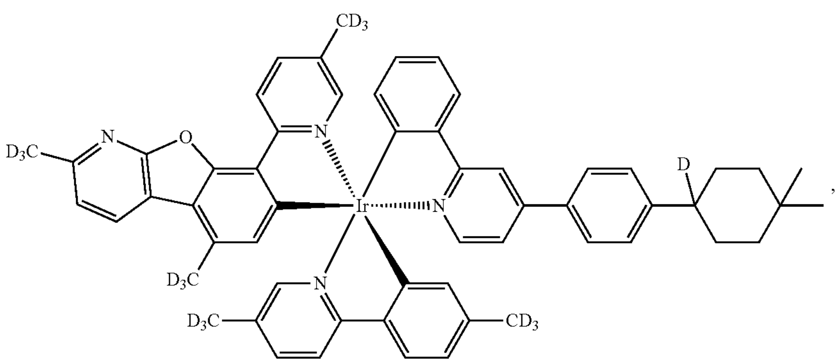
Compound 202
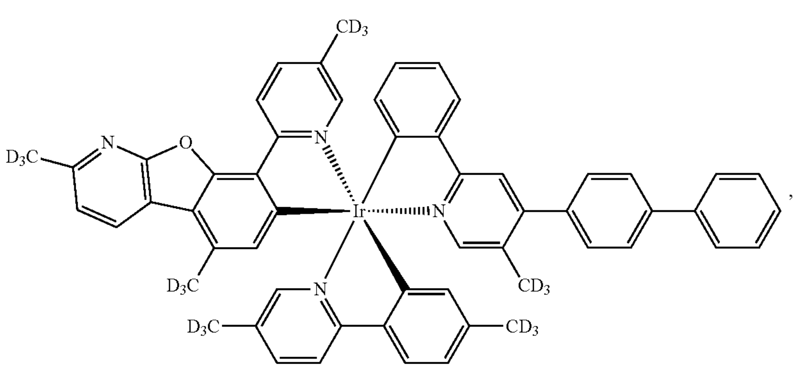

-continued
Compound 203
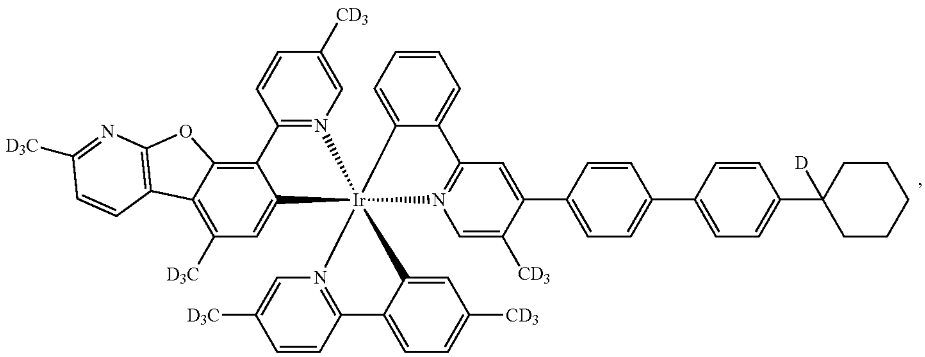
,
Compound 204
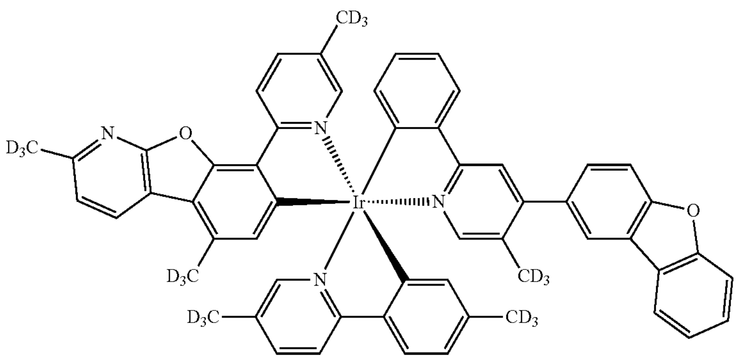
,
Compound 205
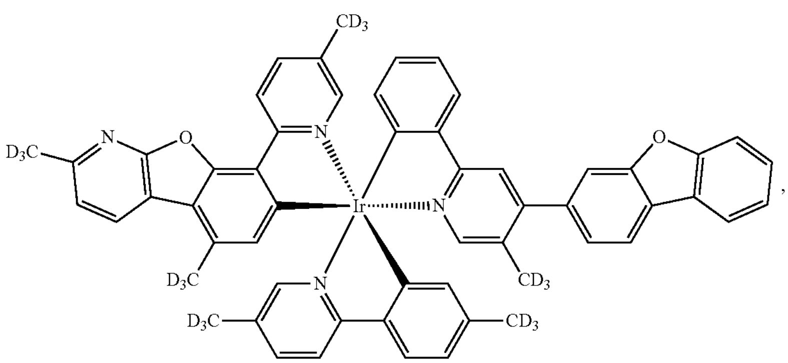
,
Compound 206
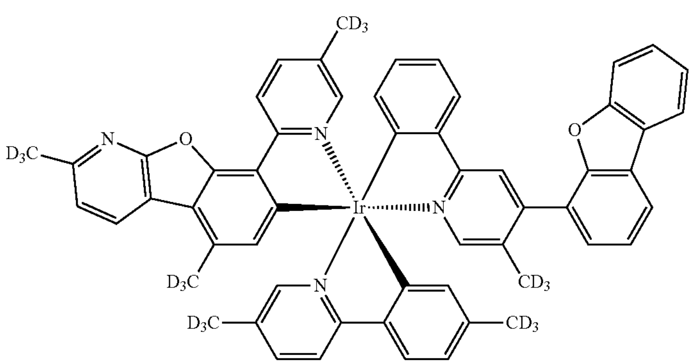
, -continued
Compound 207
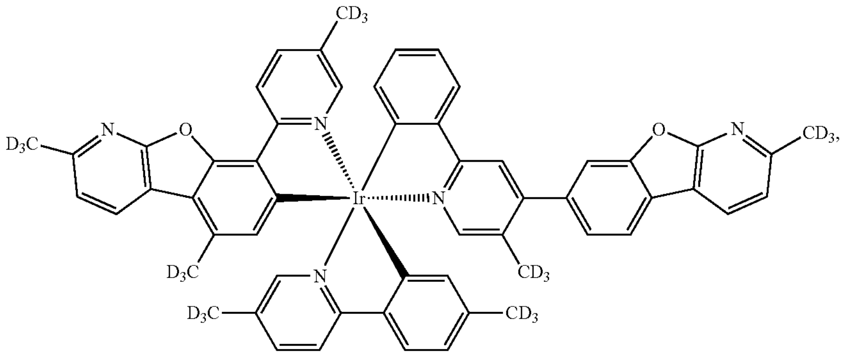
Compound 208
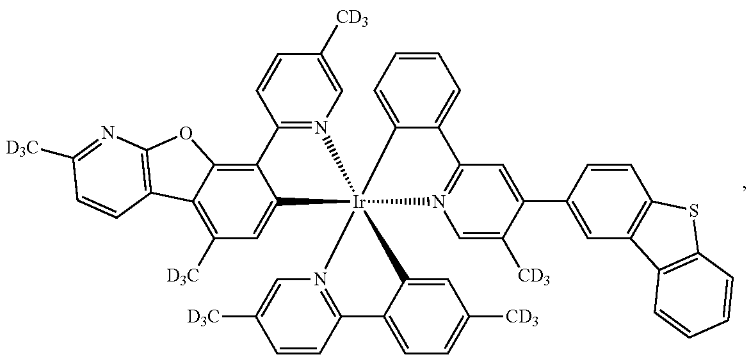
Compound 209
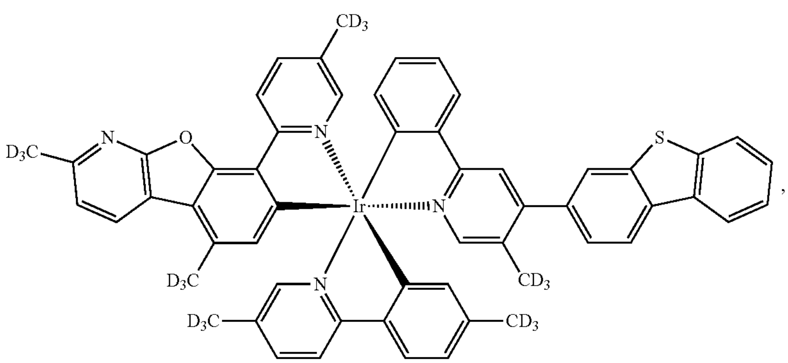
Compound 210
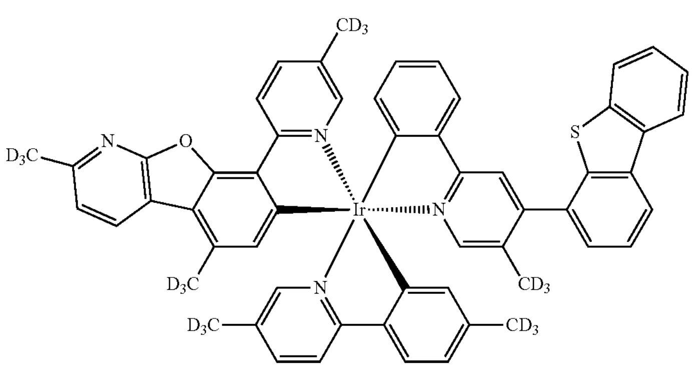

-continued
Compound 211
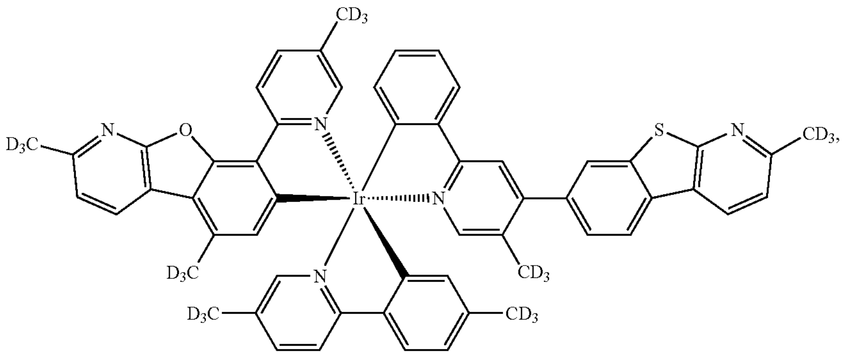
Compound 212
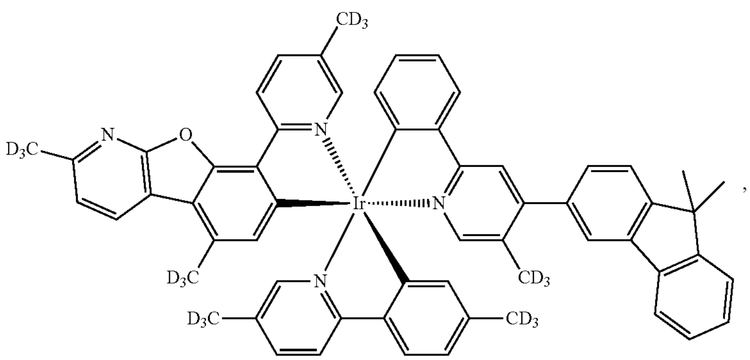
Compound 213
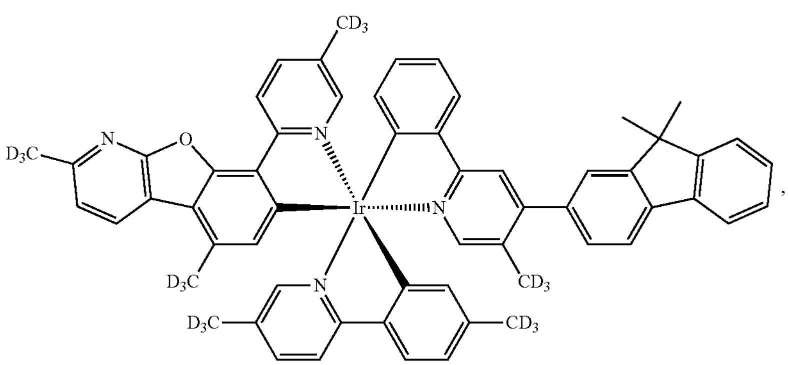
Compound 214
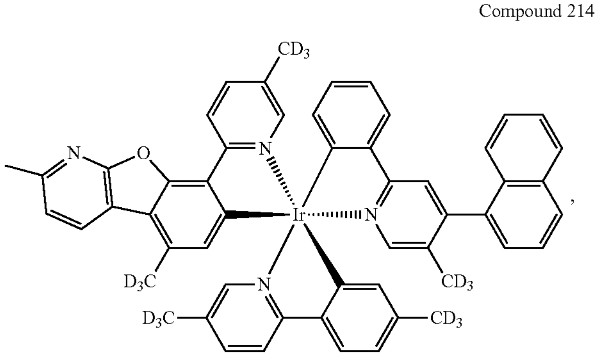
Compound 215
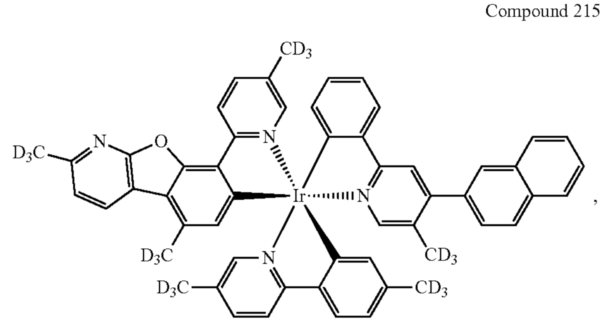

-continued
Compound 216
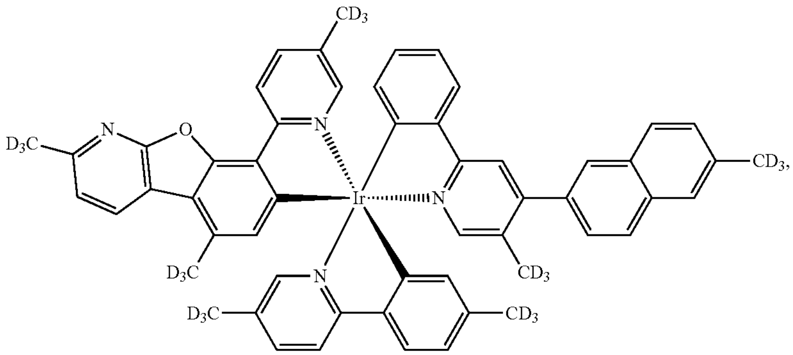
Compound 217
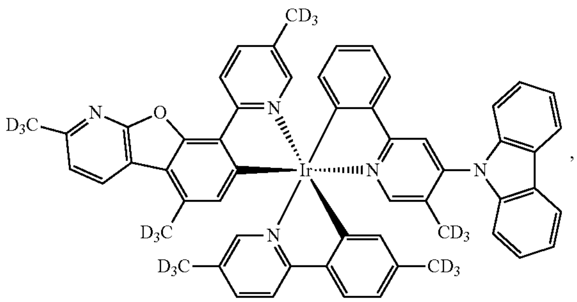
Compound 218
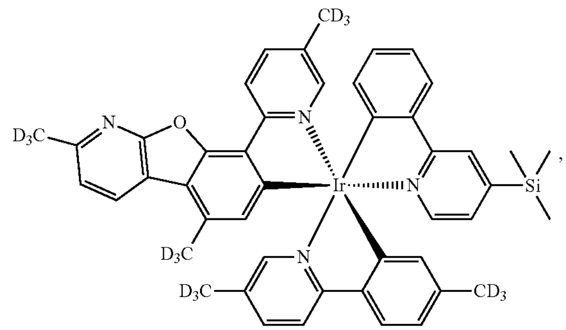
Compound 219
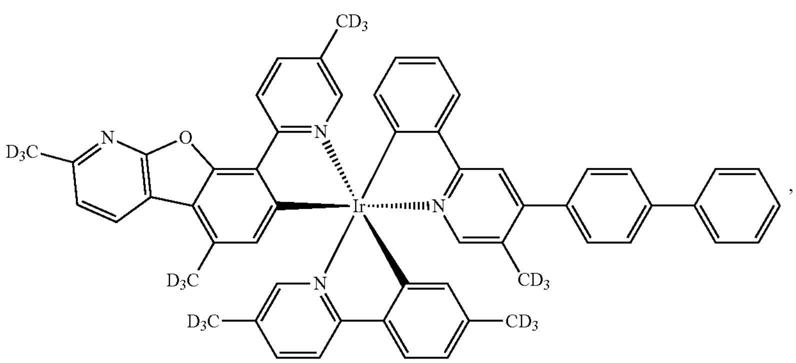
Compound 220
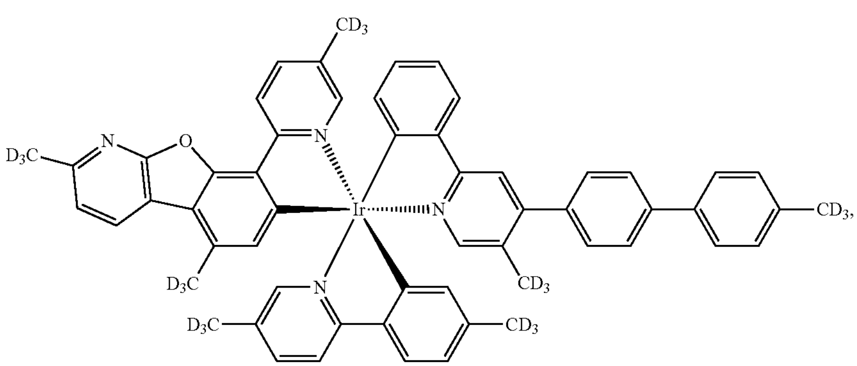

-continued
Compound 221
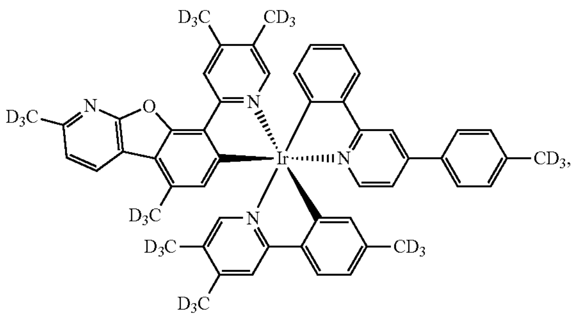
Compound 222
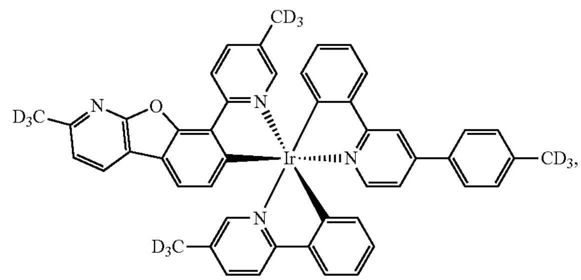
Compound 223
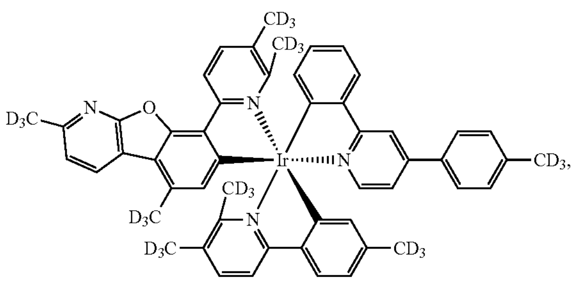
Compound 224
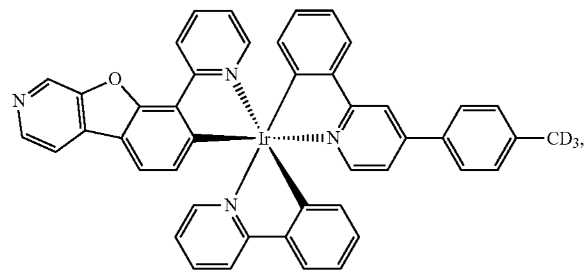
Compound 225
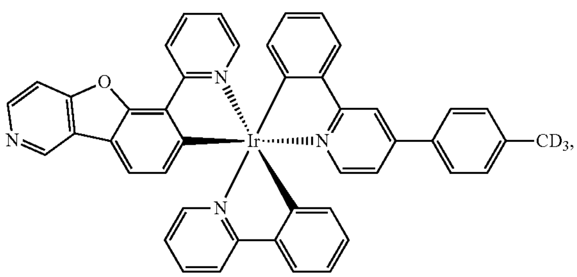
Compound 226
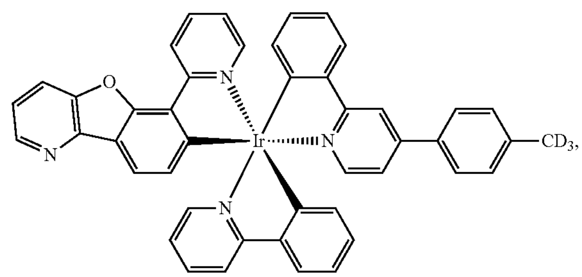
Compound 227
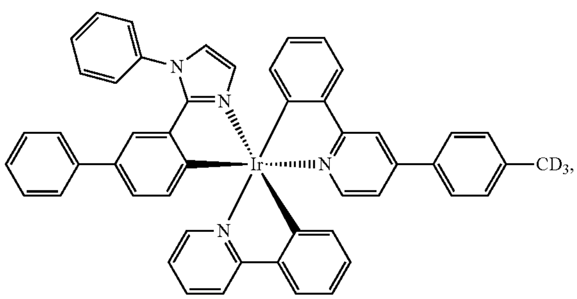
Compound 228
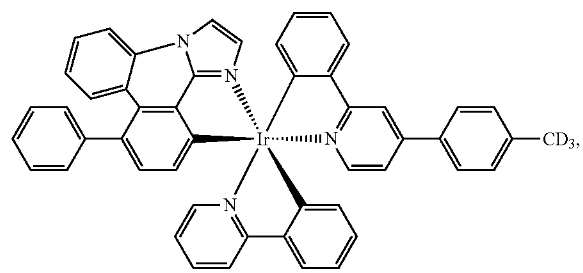
Compound 229
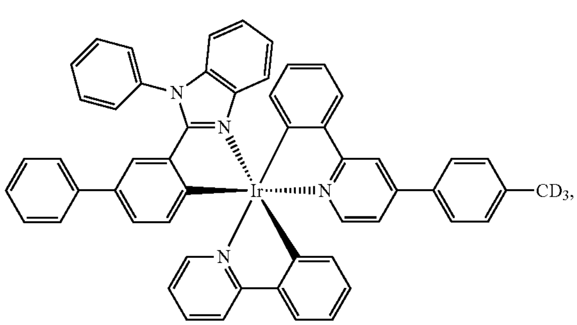
Compound 230
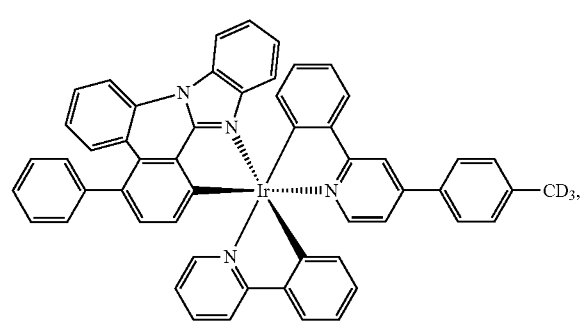

-continued
Compound 231
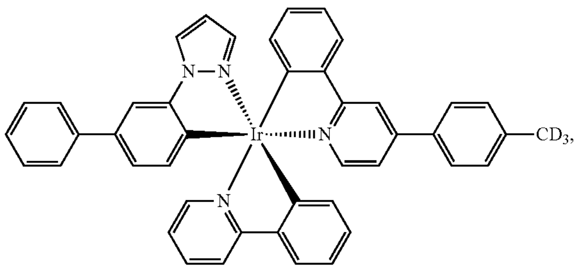
Compound 232
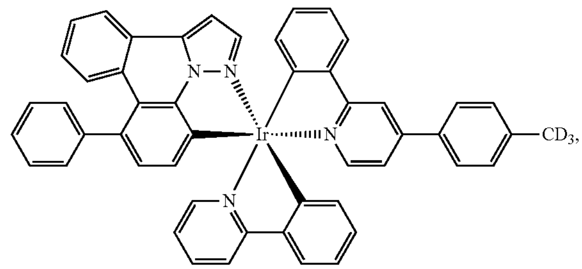
Compound 233
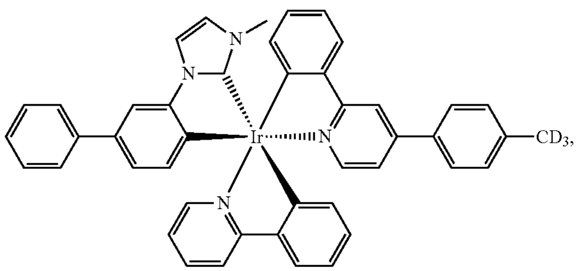
Compound 234
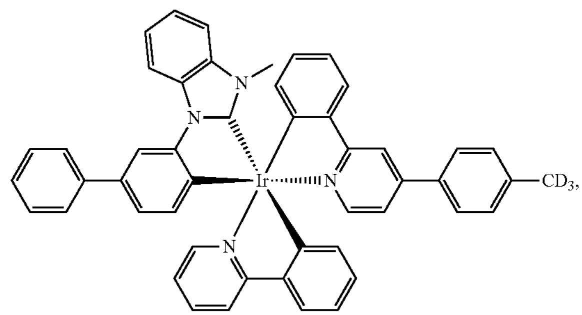
Compound 235
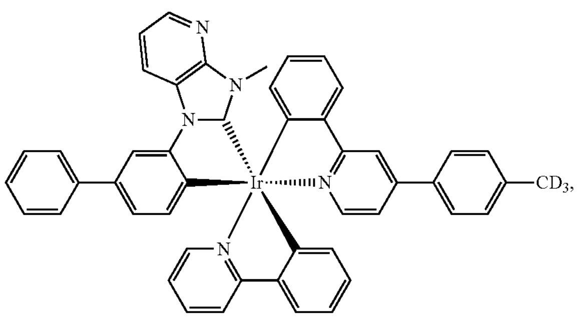
Compound 236
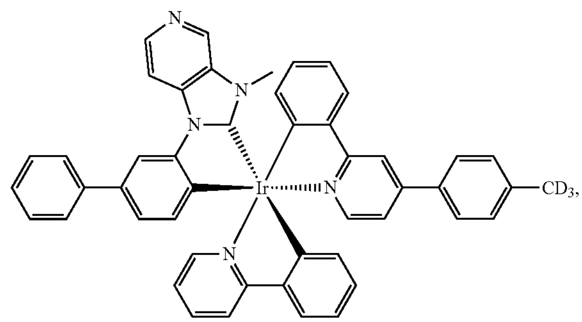
Compound 237
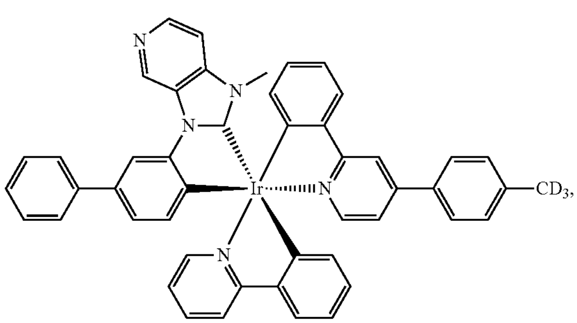
Compound 238
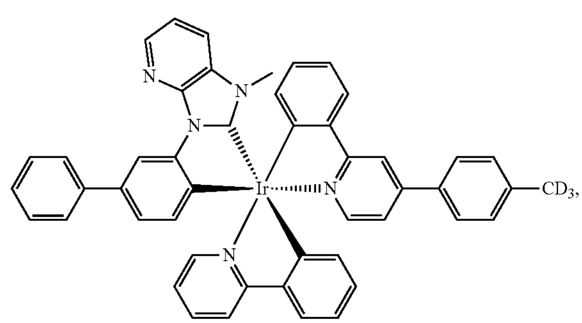
Compound 239
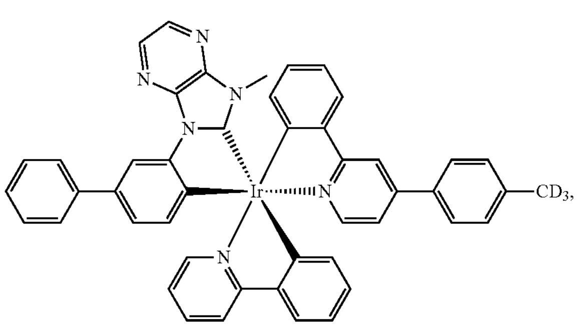
Compound 240
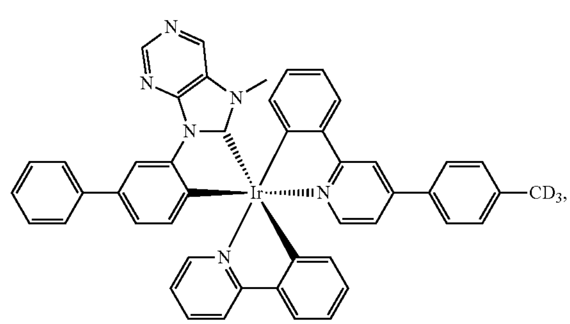

-continued
Compound 241
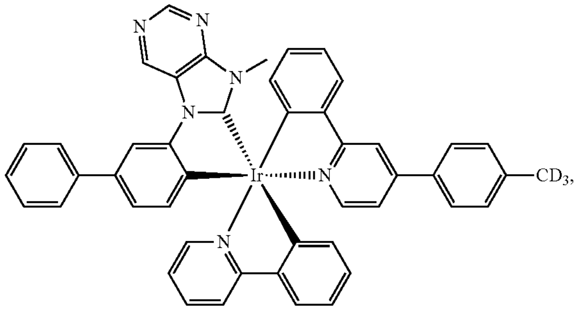
Compound 242
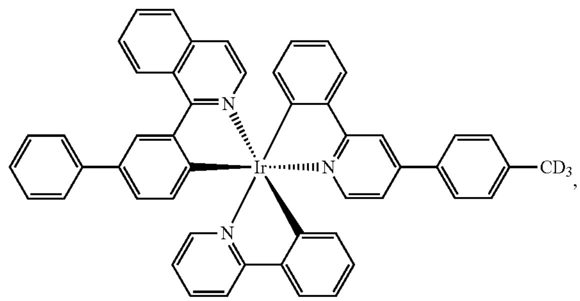
Compound 243
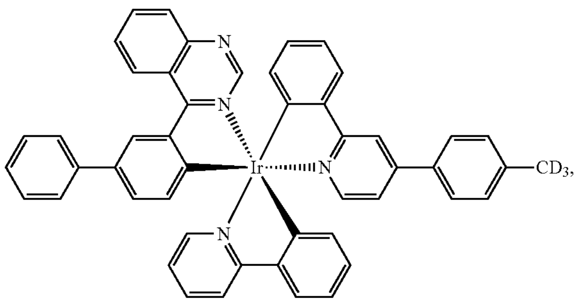
Compound 244
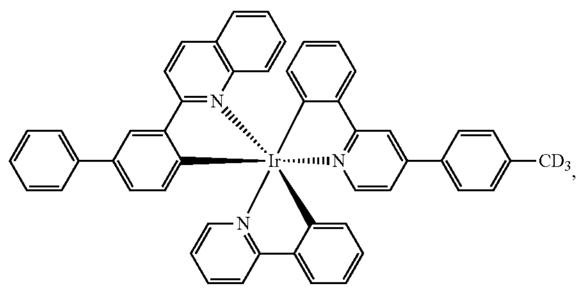
Compound 245
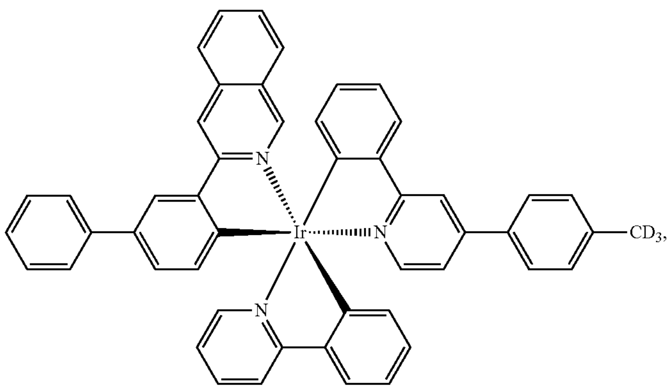
Compound 246
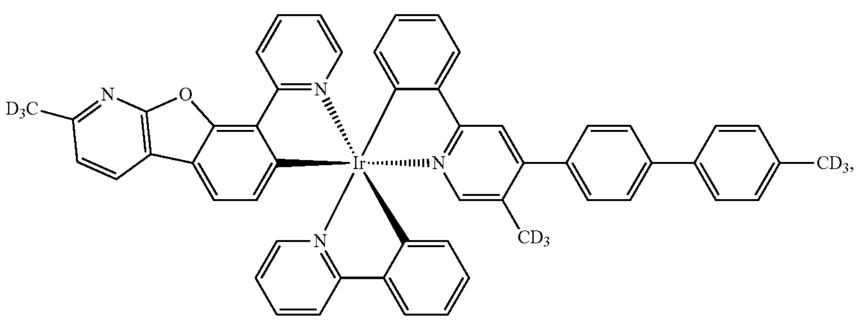
Compound 247
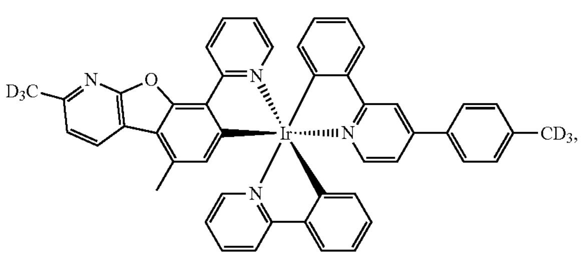
Compound 248
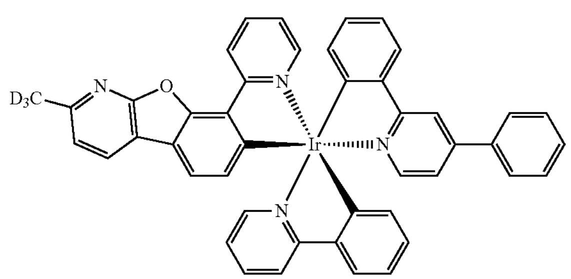

-continued
Compound 249
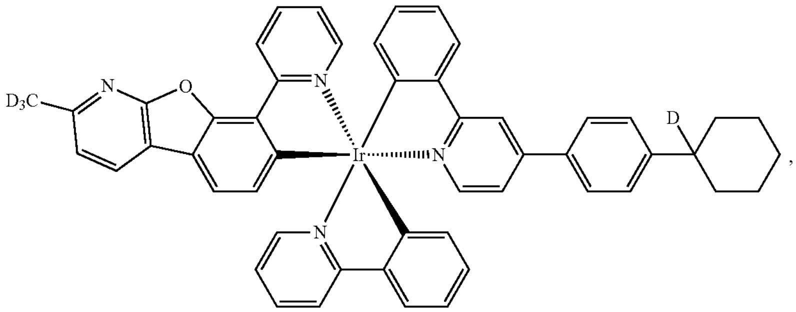
Compound 250
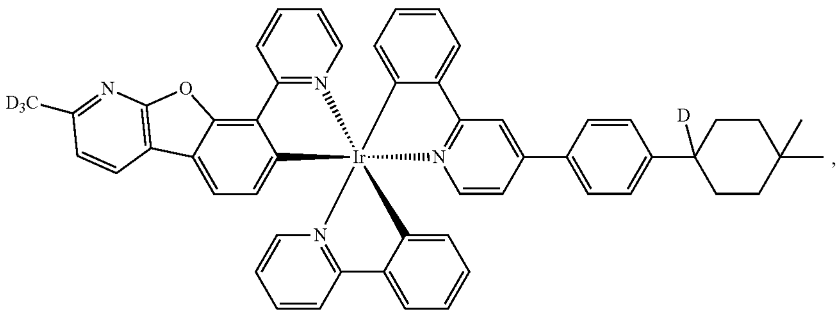
Compound 251
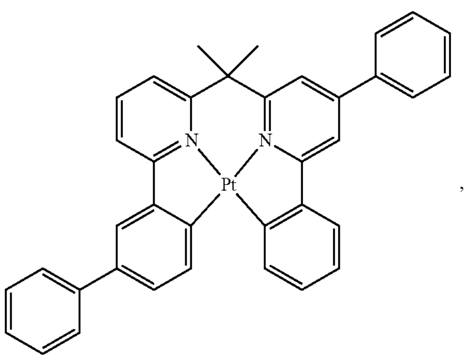
Compound 252
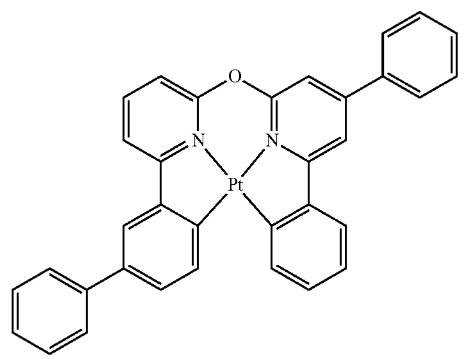
Compound 253
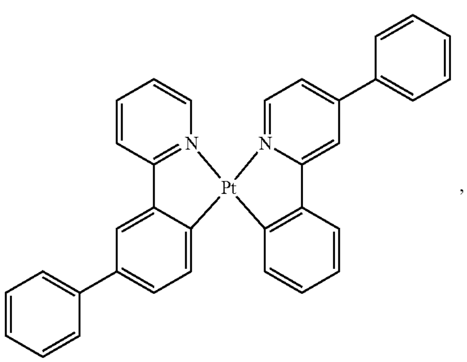
Compound 254
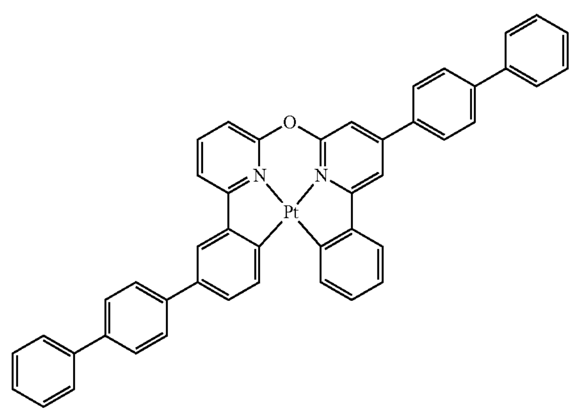

-continued
Compound 255
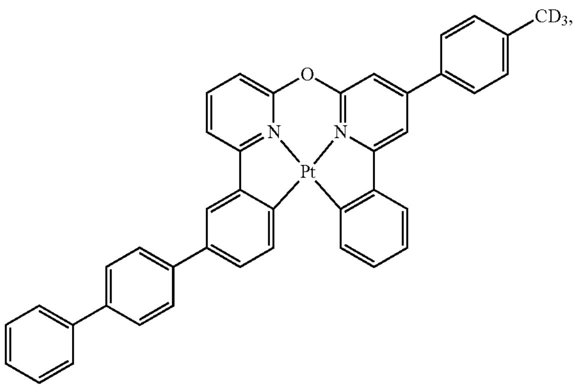
Compound 256
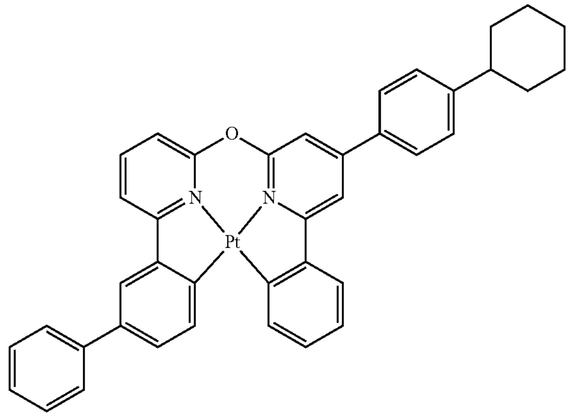
Compound 257
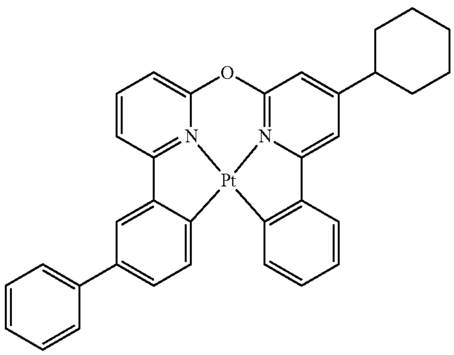
,
Compound 258
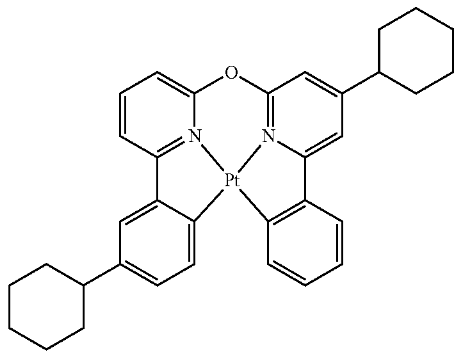
,
Compound 259
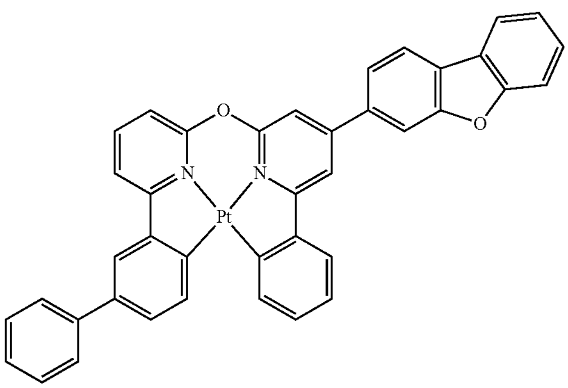
,
Compound 260
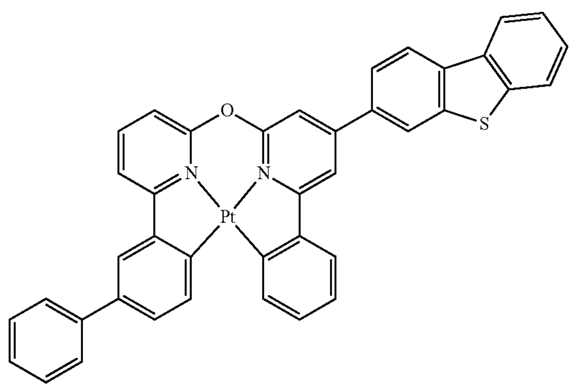
,
Compound 261
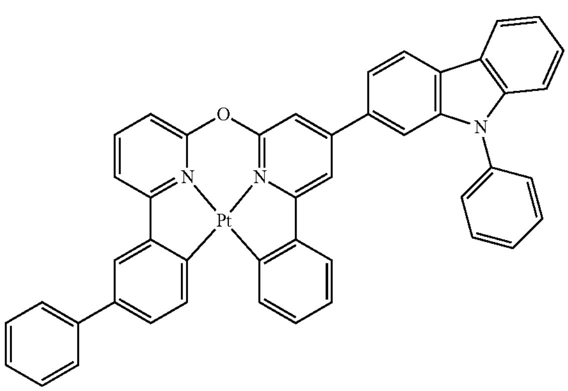
,
Compound 262
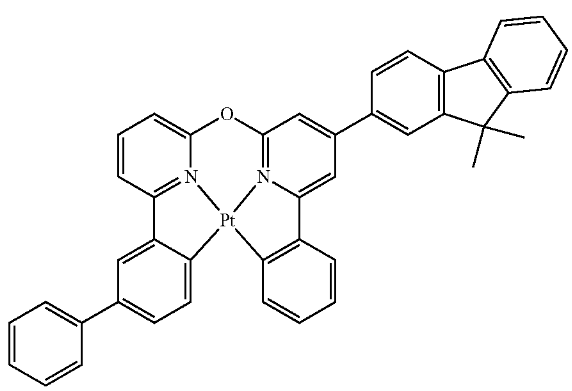
, -continued
Compound 263
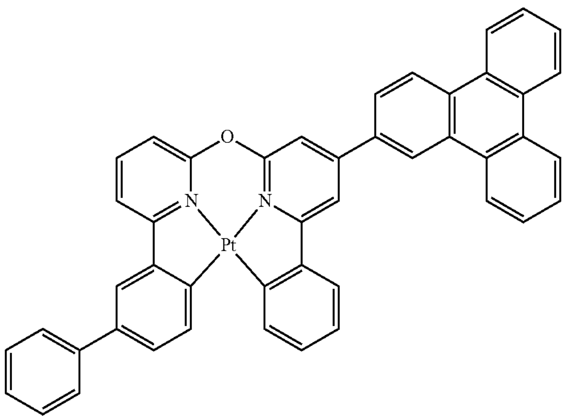
,
Compound 264
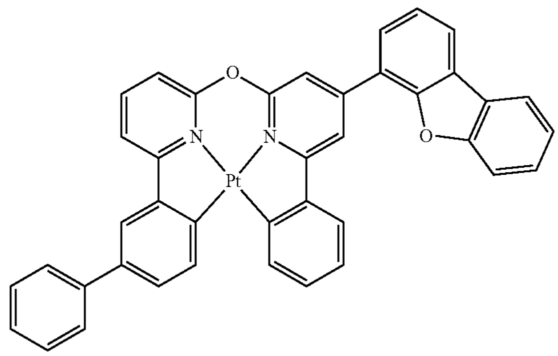
,
Compound 265
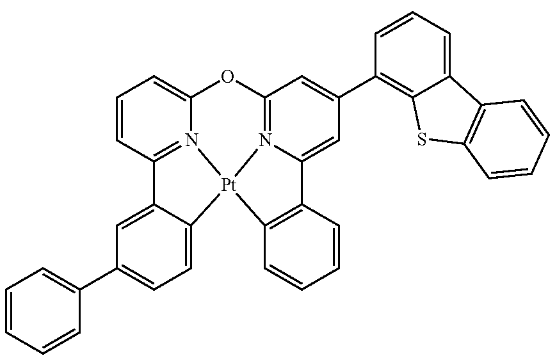
,
Compound 266
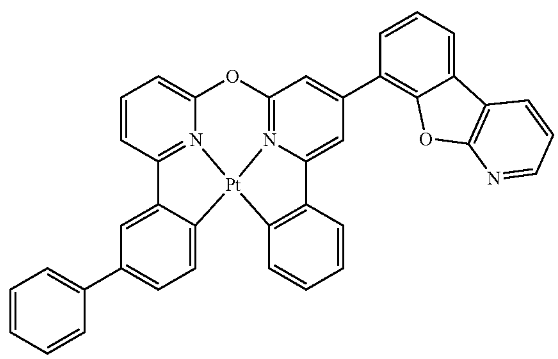
,
Compound 267
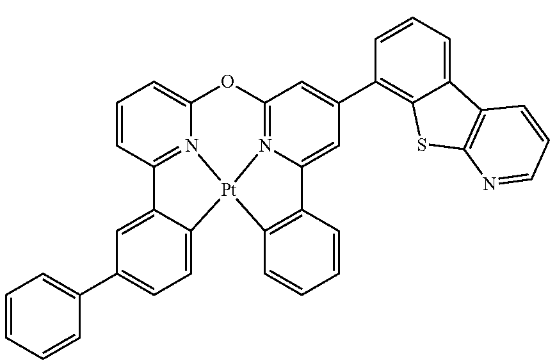
,
Compound 268
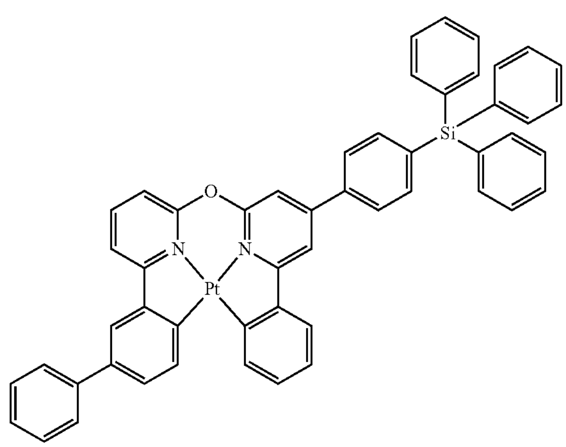
, -continued
Compound 269
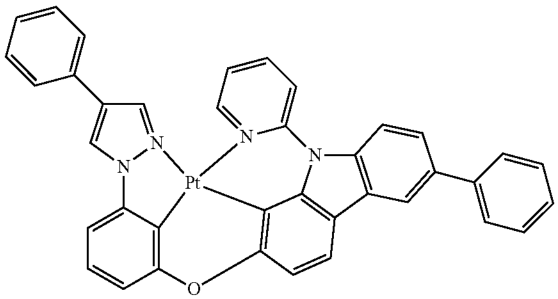
,
Compound 270
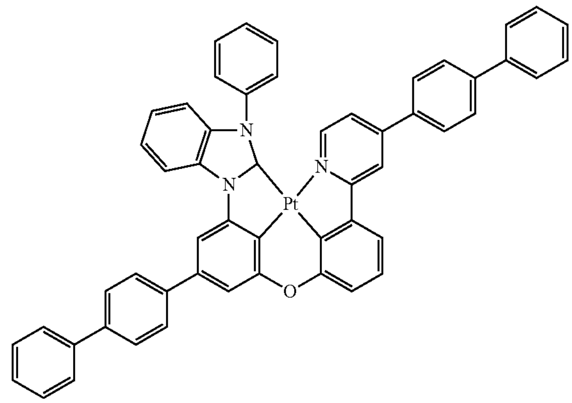
,
Compound 271
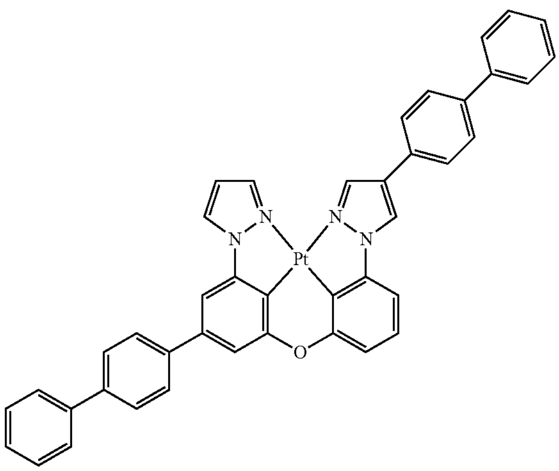
,
Compound 272
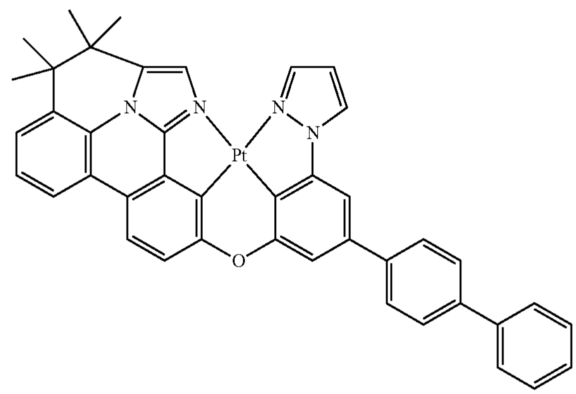
,
Compound 273
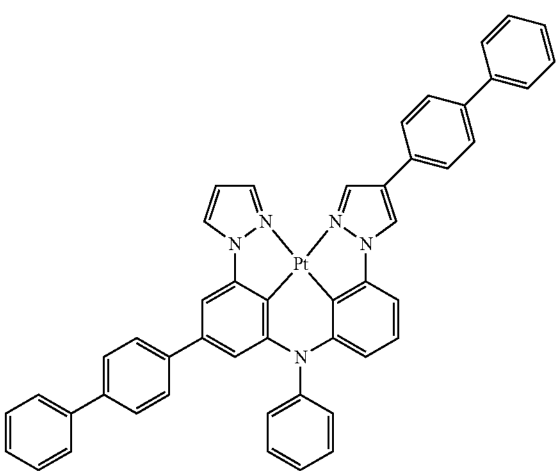
,
Compound 274
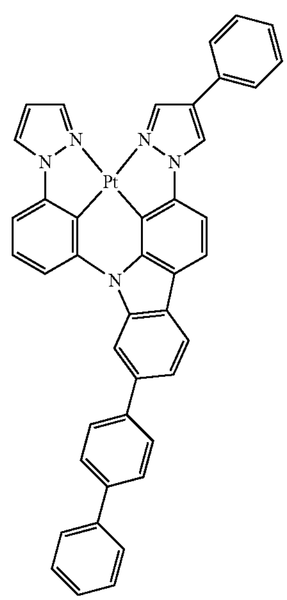
, -continued
Compound 275
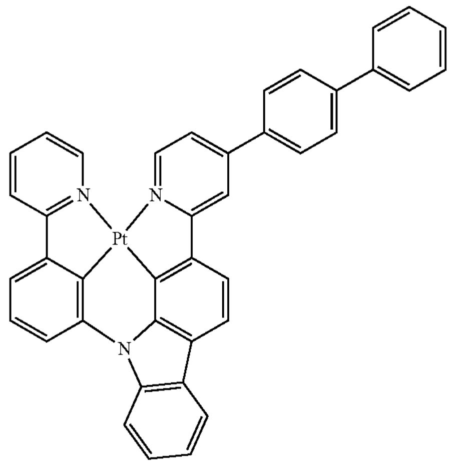
,
Compound 276
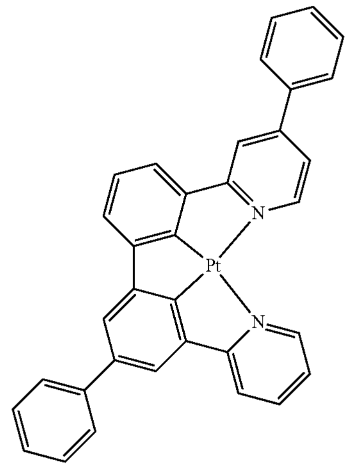
,
Compound 277
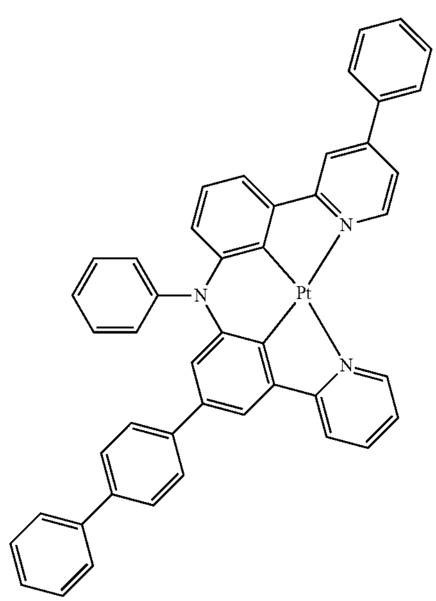
,
Compound 278
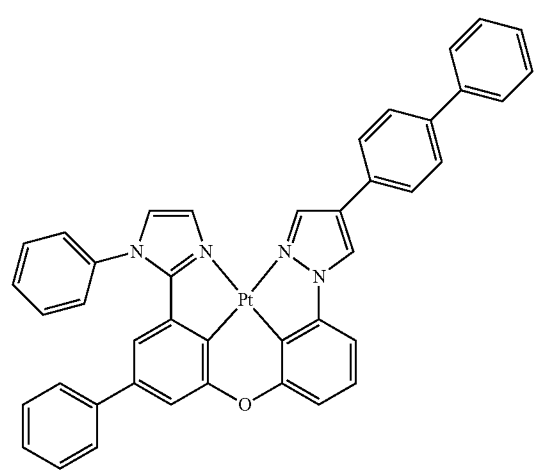
, -continued
Compound 279
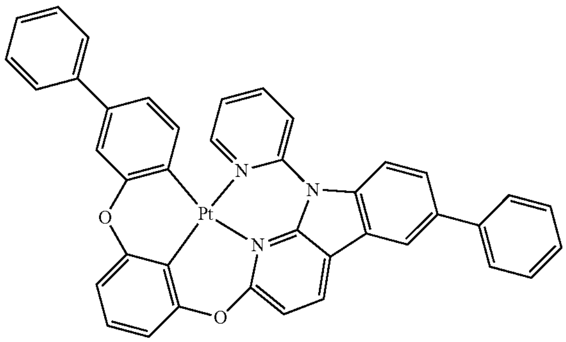
,
Compound 280
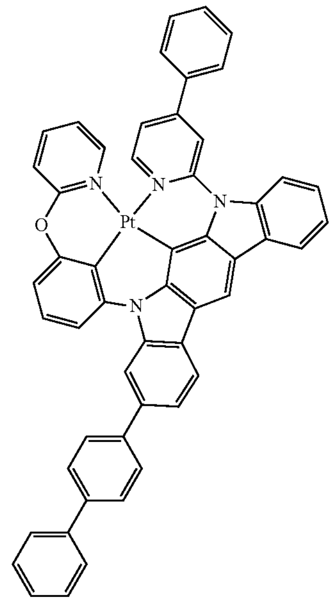
,
Compound 281
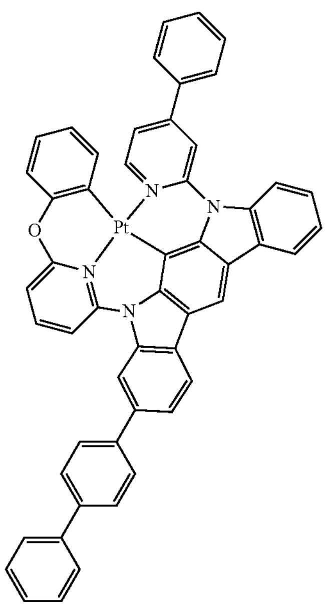
,
Compound 282
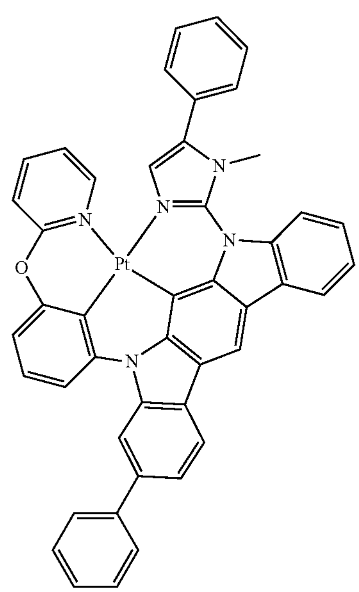
, -continued
Compound 283
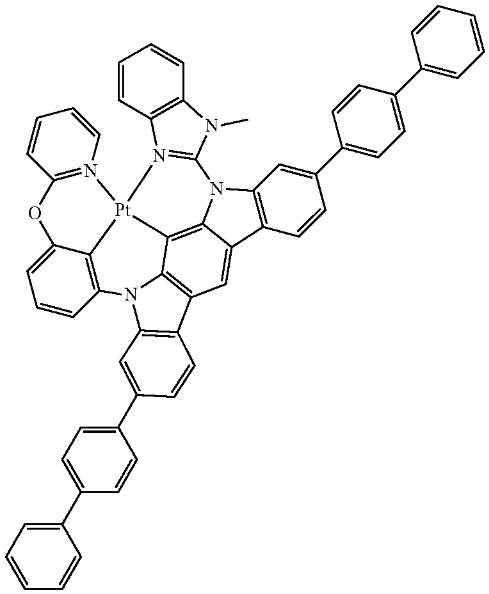
,
Compound 284
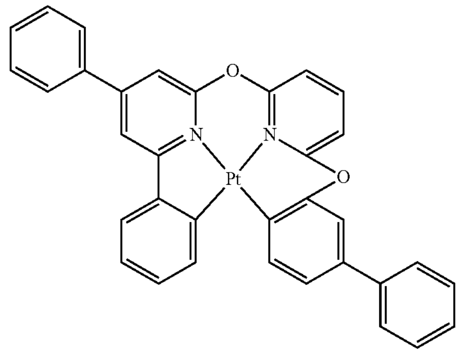
,
Compound 285
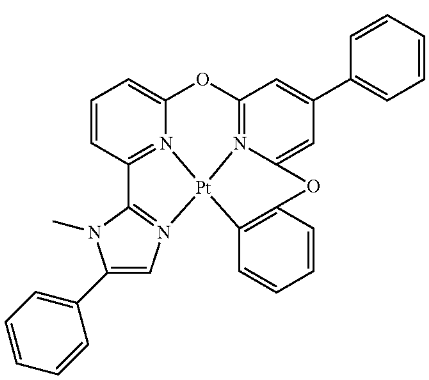
,
Compound 286
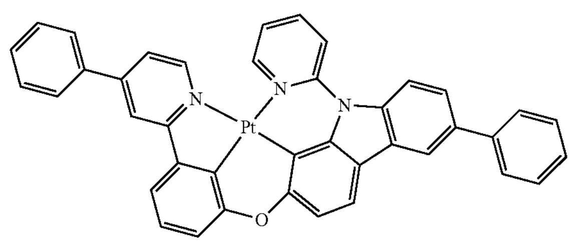
,
Compound 287
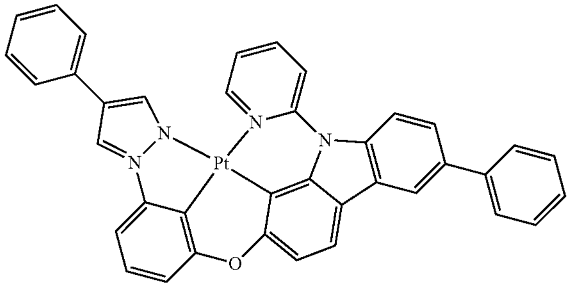
,
Compound 288
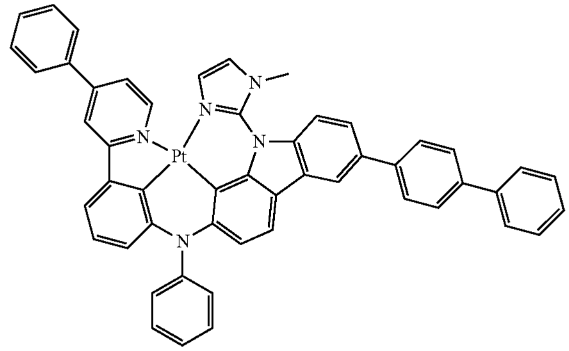
, -continued
Compound 289
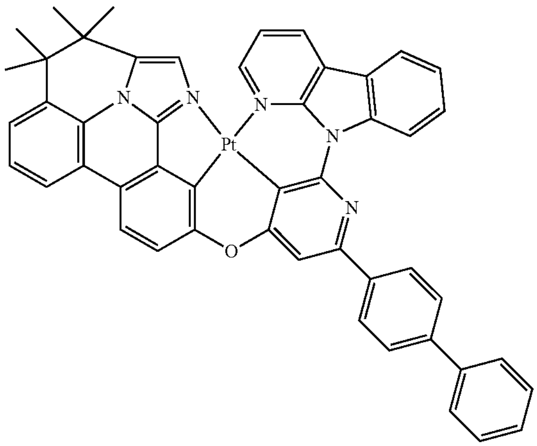
,
Compound 290
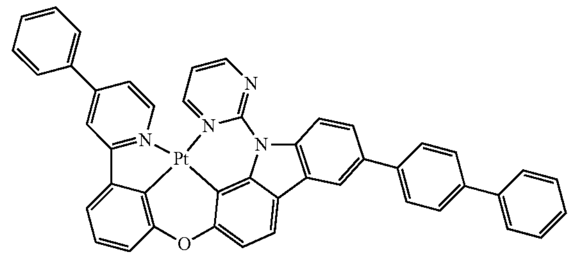
,
Compound 291
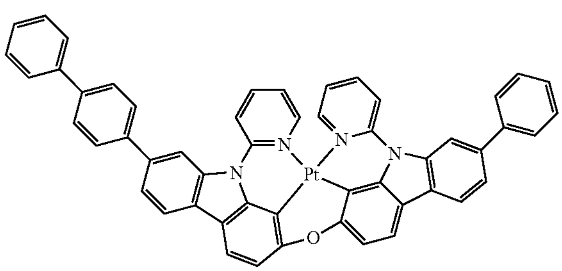
,
Compound 292
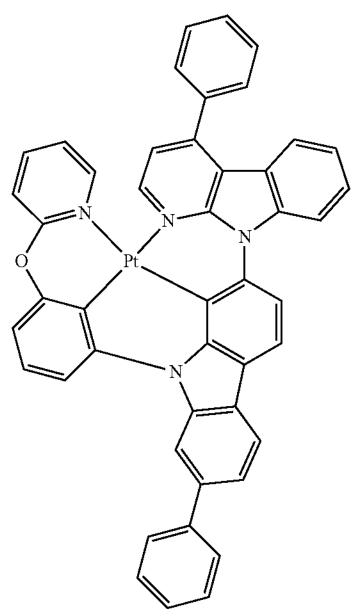
, -continued
Compound 293
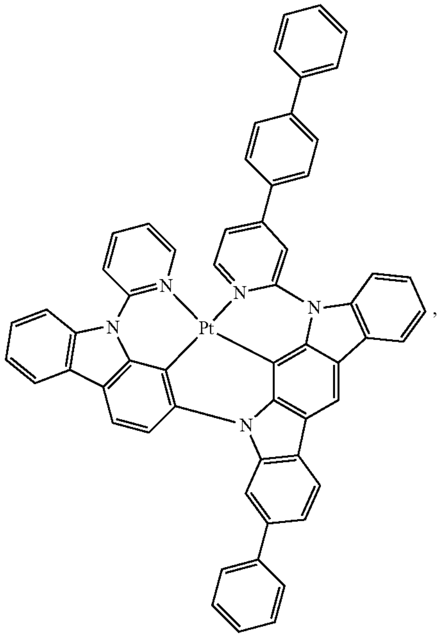
Compound 294
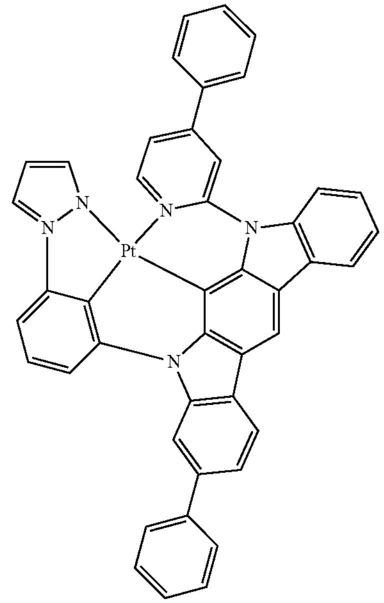
Compound 295
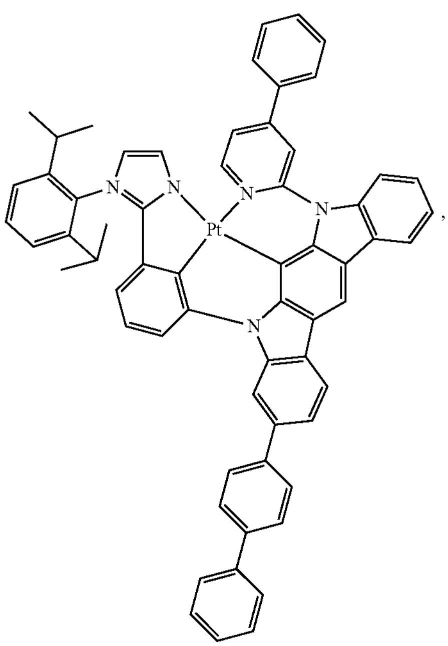
Compound 296
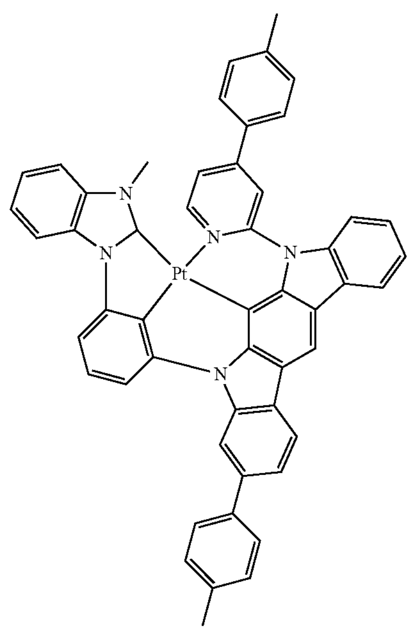

-continued
Compound 297
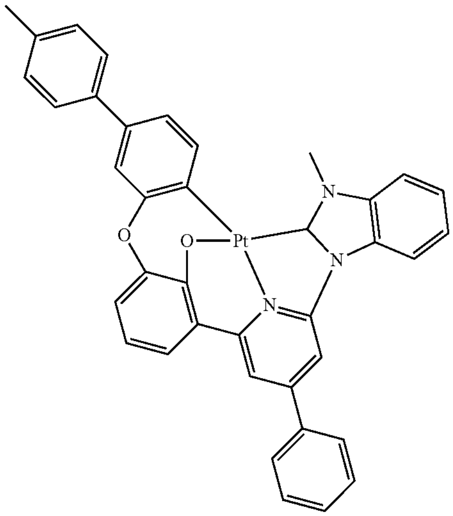
,
Compound 298
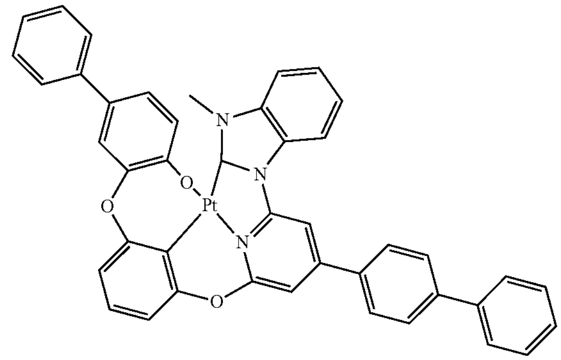
,
Compound 299
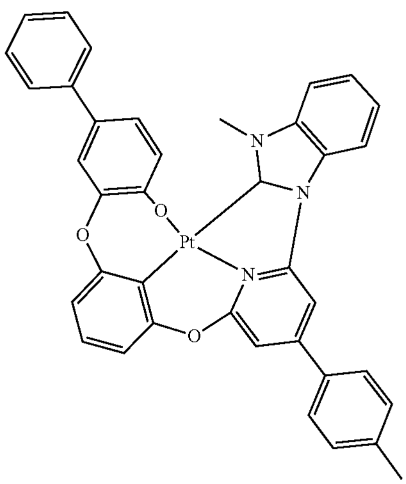
,
Compound 300
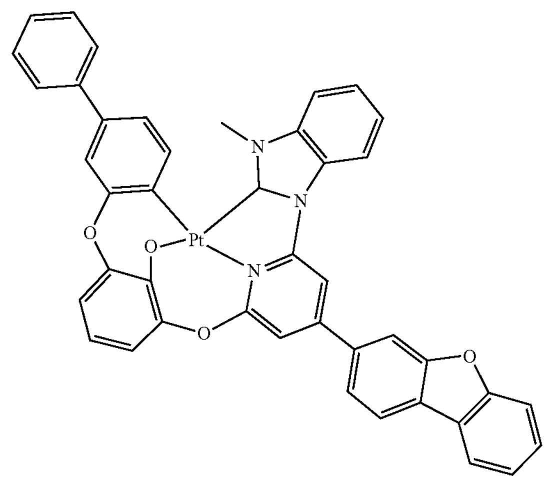
,
Compound 301
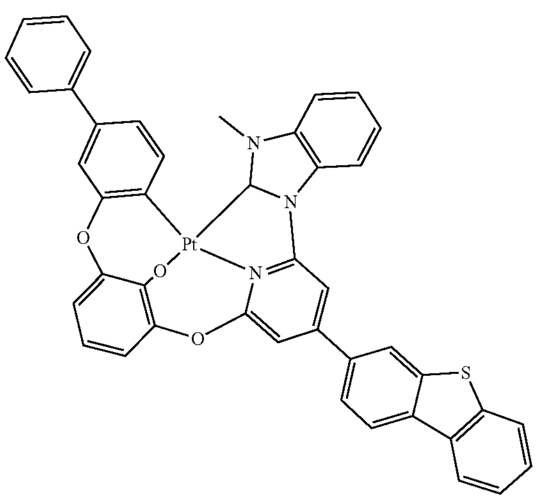
,
Compound 302
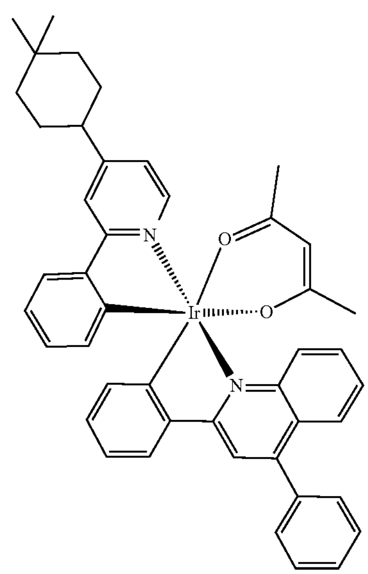
, -continued
Compound 303
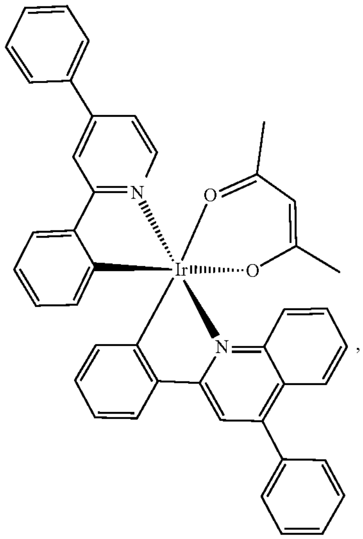
Compound 304
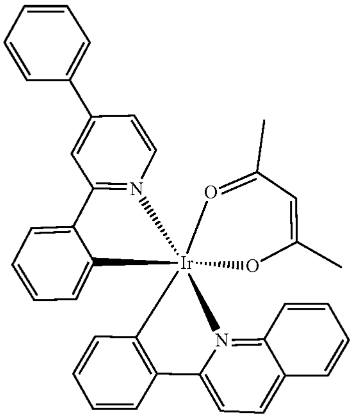
Compound 305
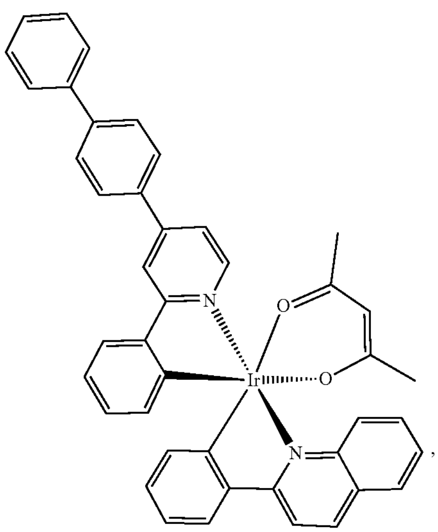
Compound 306
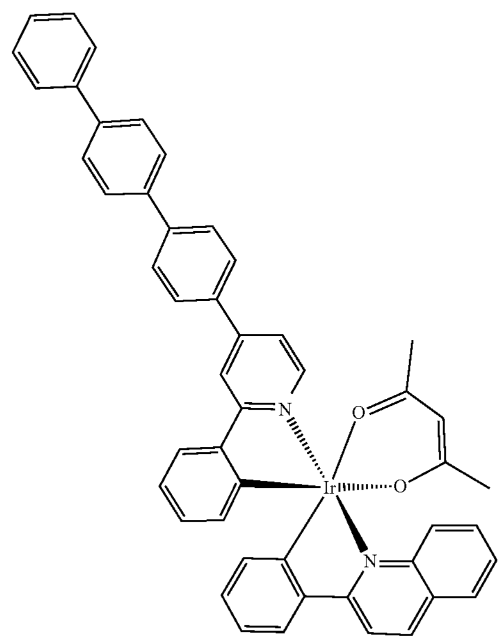
Compound 307
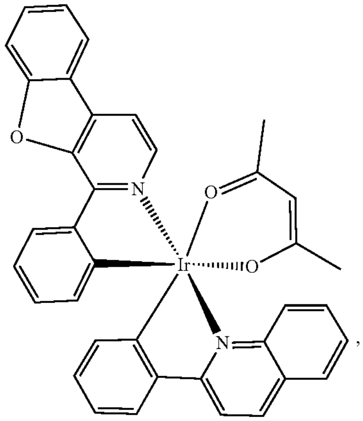
Compound 308
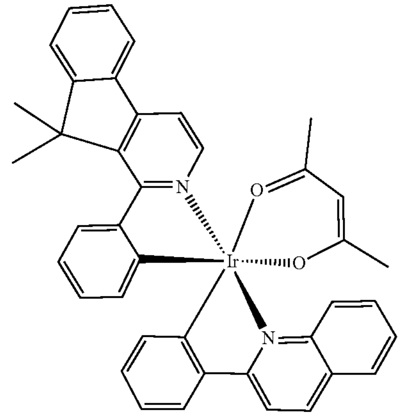

-continued
Compound 309
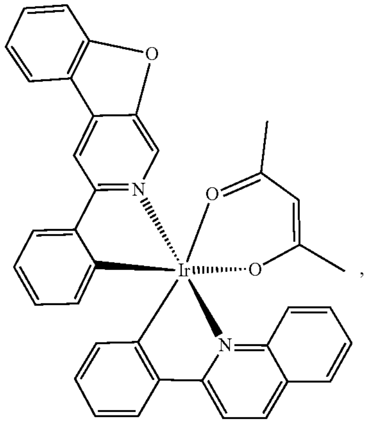
Compound 310
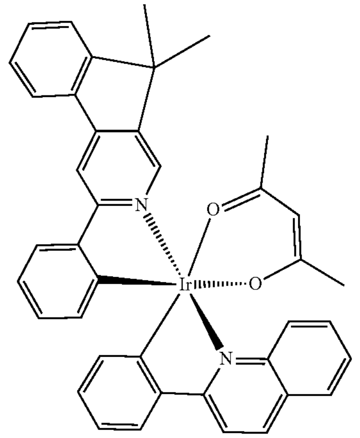
Compound 311
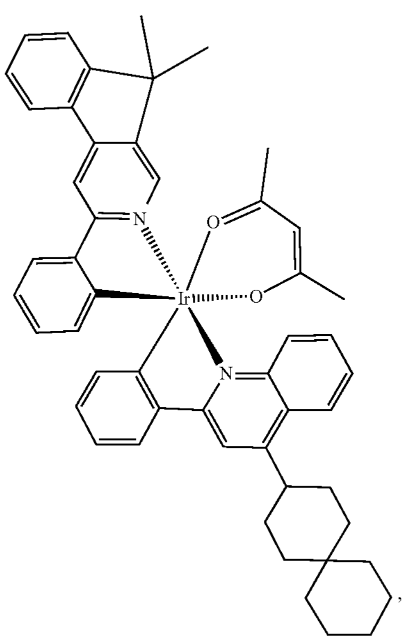

Compound 312
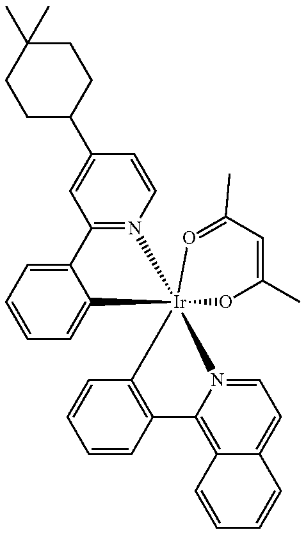
,
Compound 313
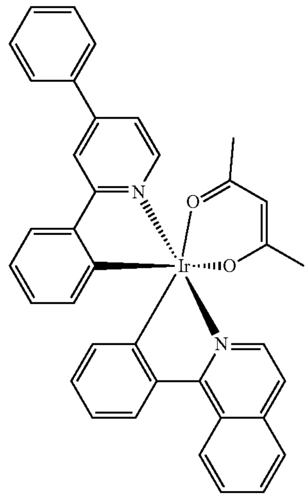
,
Compound 314
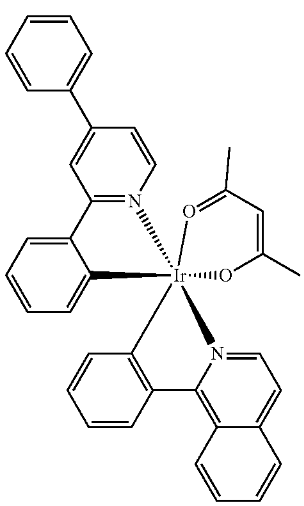
,
Compound 315
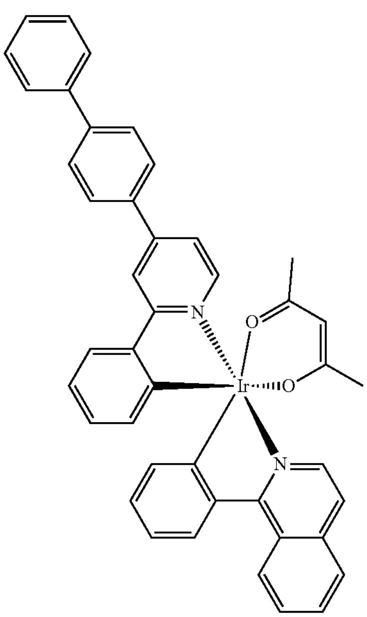
, -continued
Compound 316
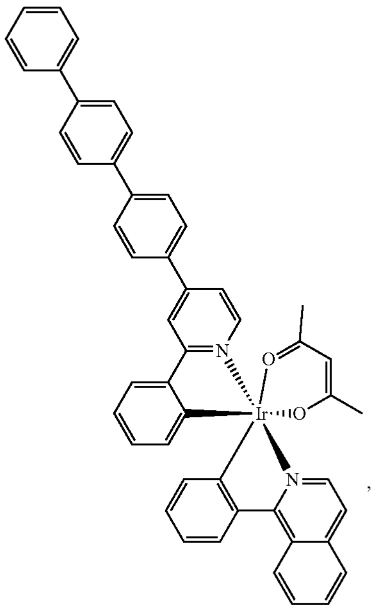
Compound 317
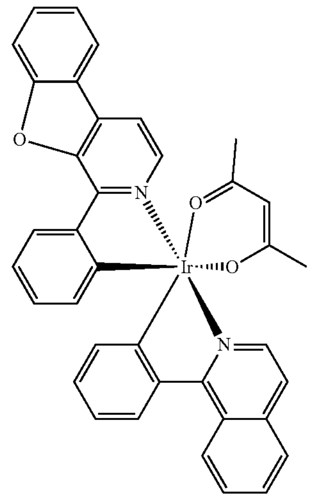
Compound 318
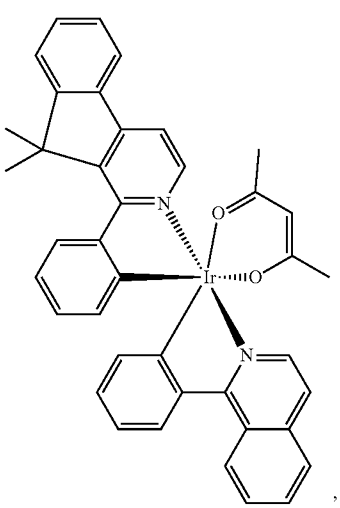
Compound 319
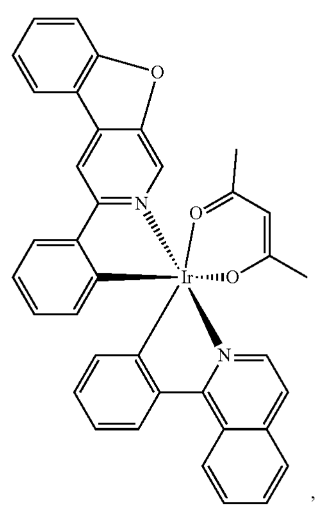

-continued
Compound 320
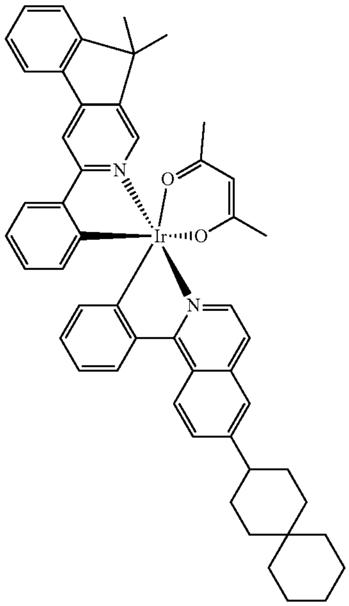
,
Compound 321
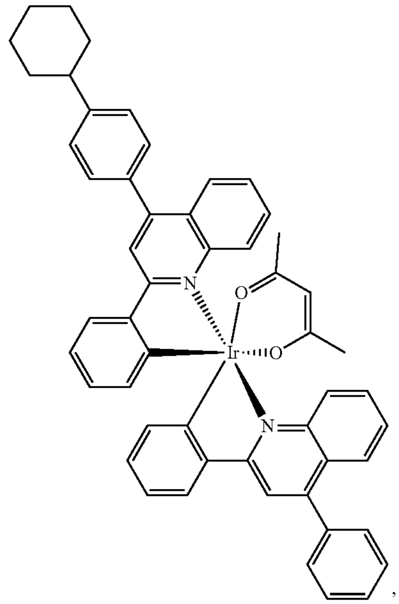
,
Compound 322
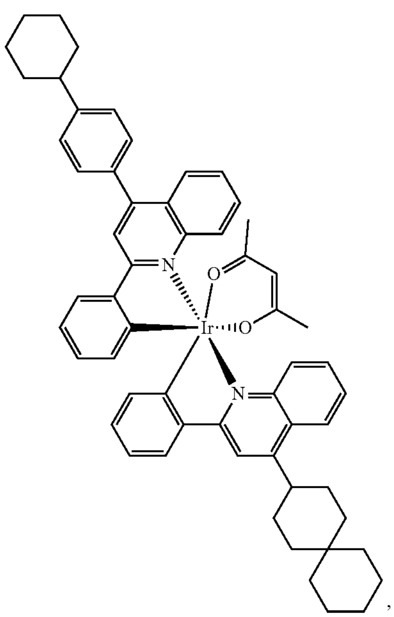
,
Compound 323
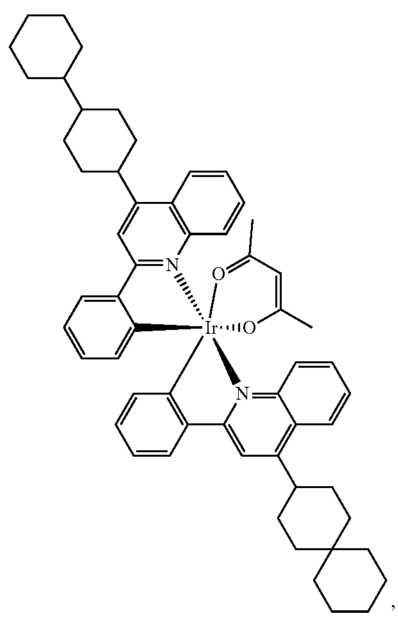
, -continued
Compound 324
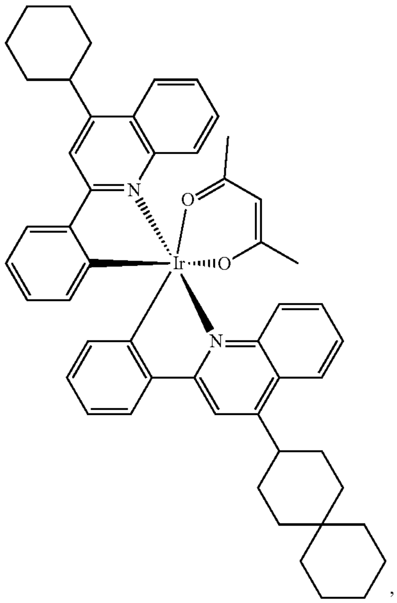
Compound 325
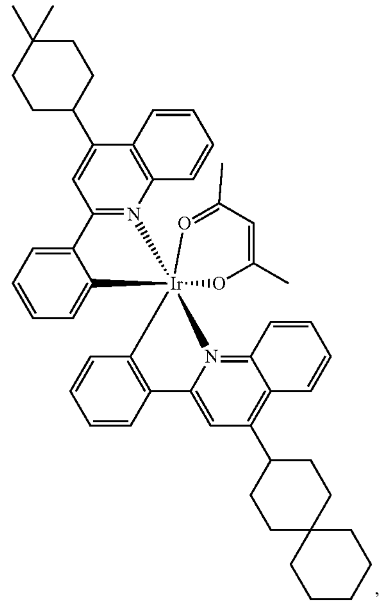
Compound 326
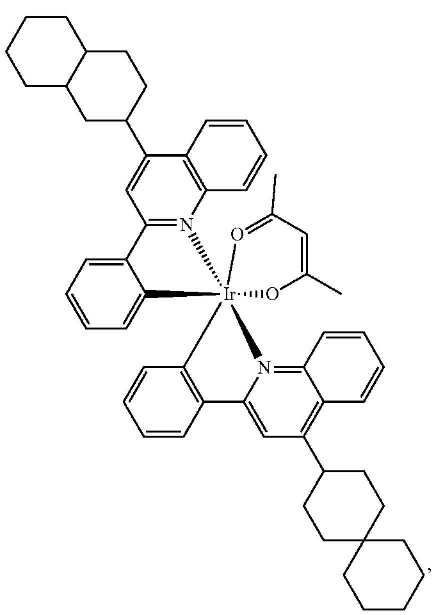
Compound 327
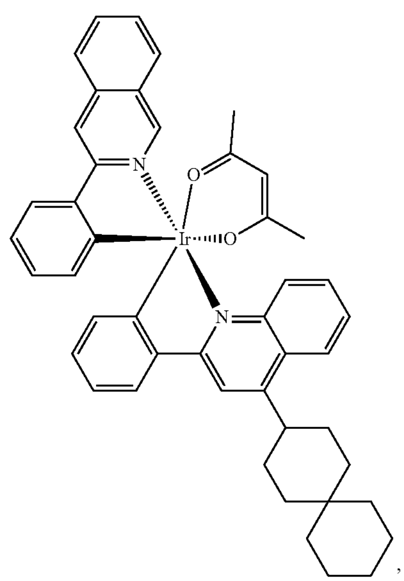

-continued
Compound 328
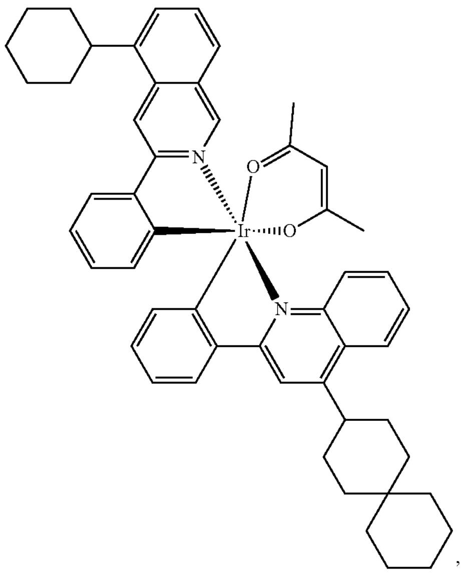
Compound 329
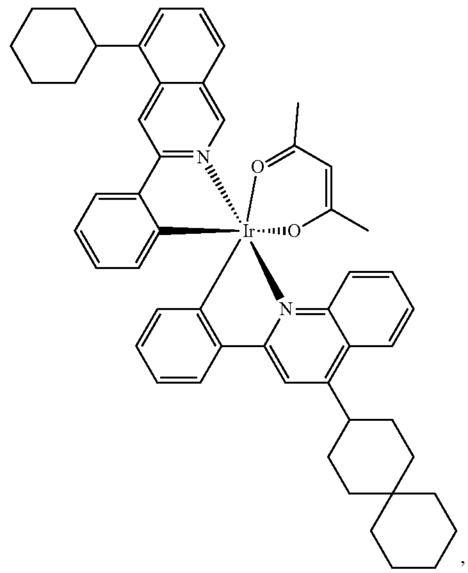
Compound 330
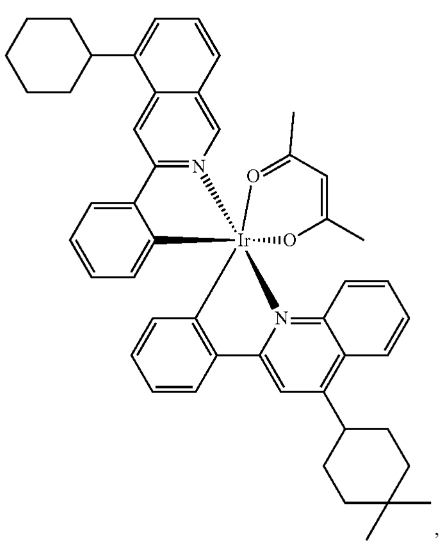
Compound 331
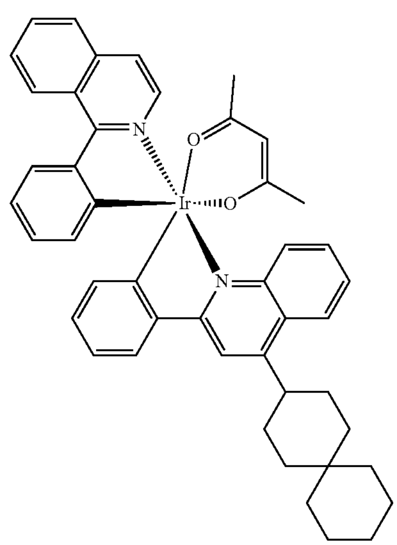

-continued
Compound 332
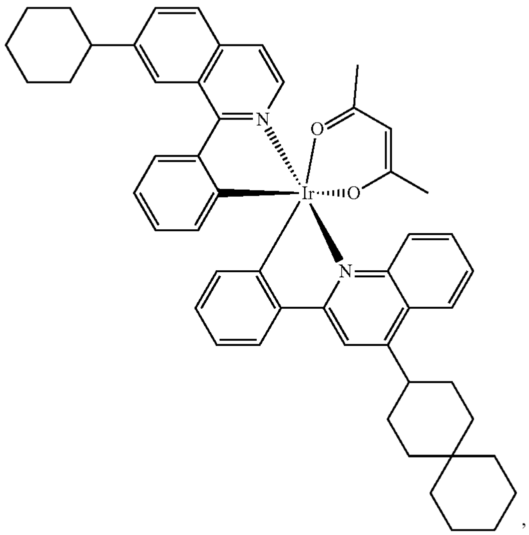
Compound 333
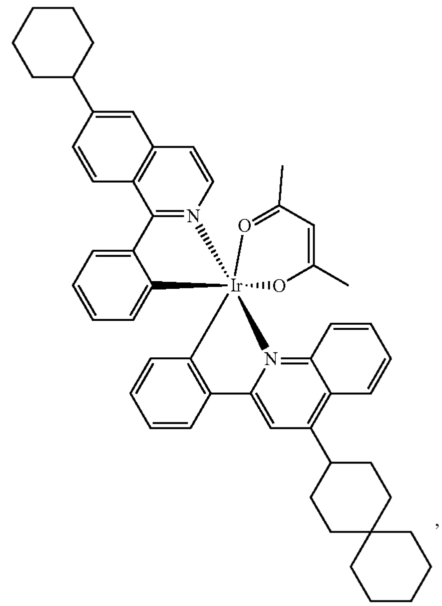
Compound 334
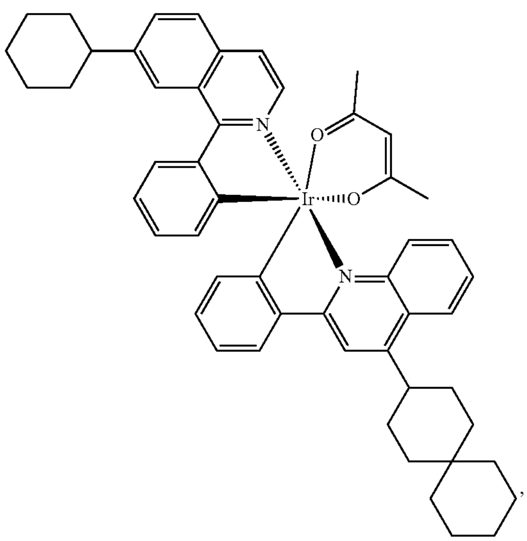
Compound 335
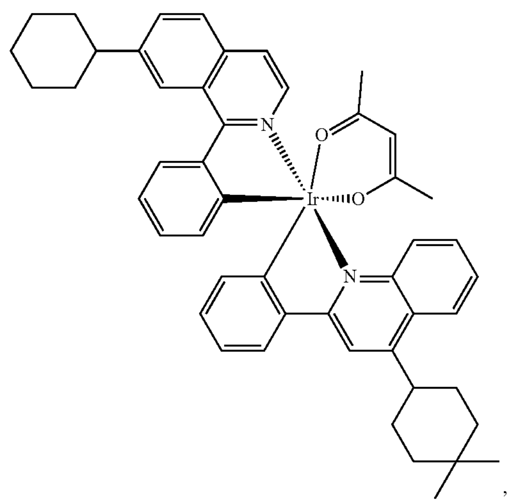
Compound 336
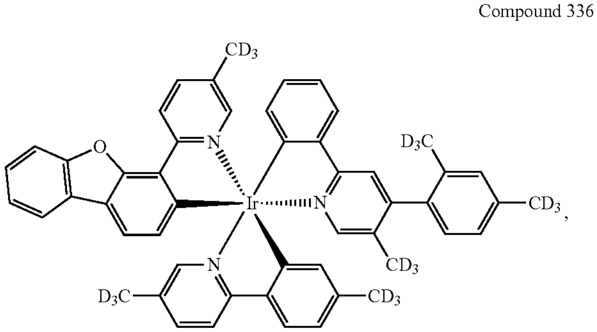
Compound 337
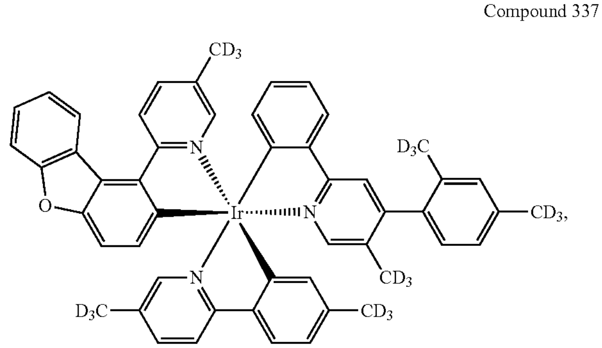

-continued
Compound 338
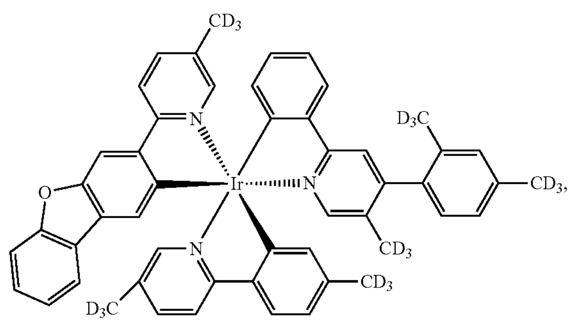
Compound 339
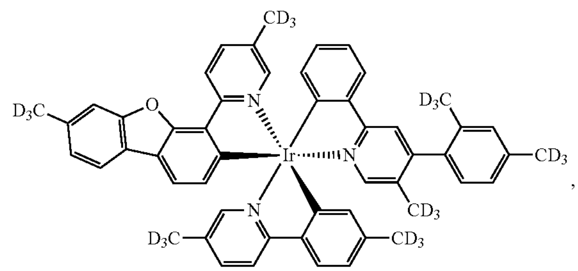
Compound 340
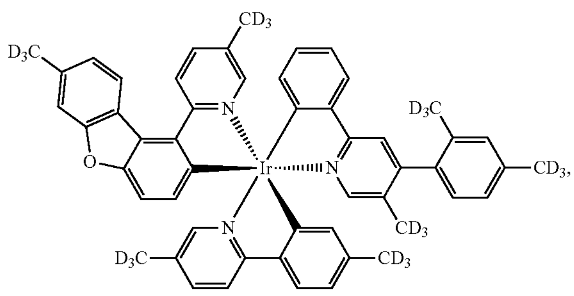
Compound 341
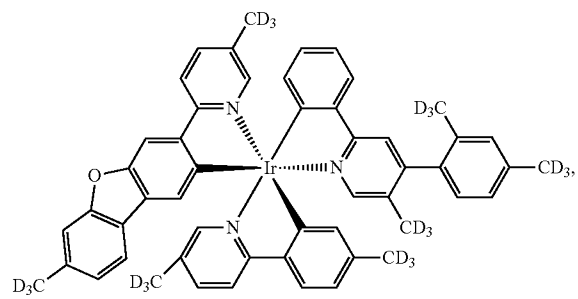
Compound 342
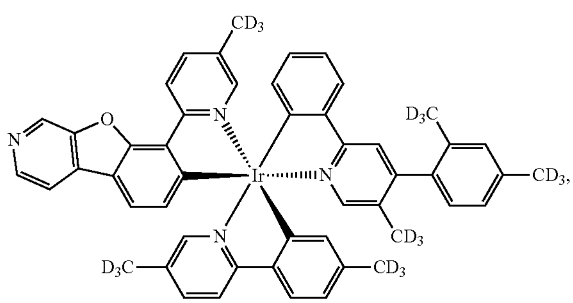
Compound 343
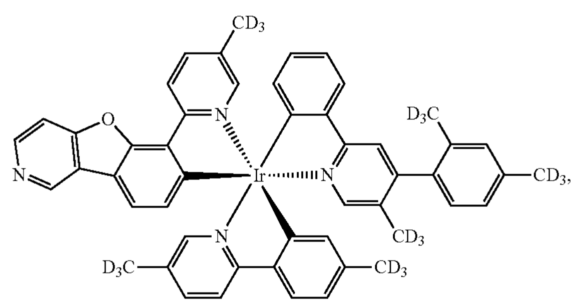
Compound 344
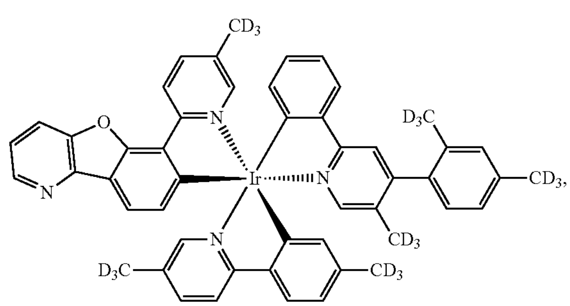
Compound 345
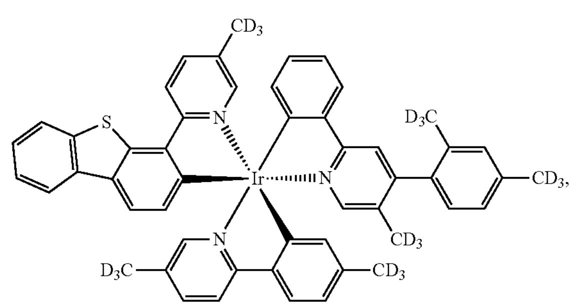
Compound 346
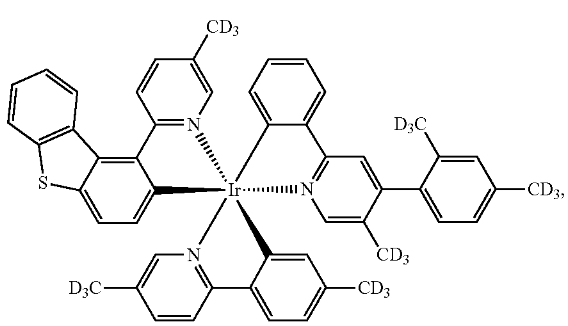
Compound 347
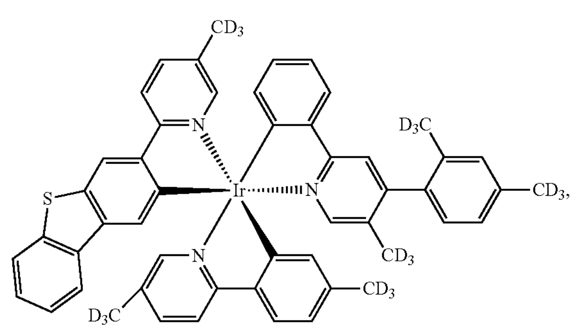

-continued
Compound 348
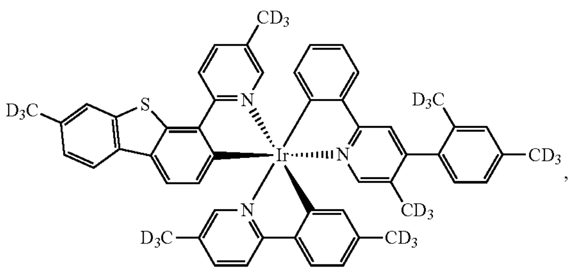
Compound 349
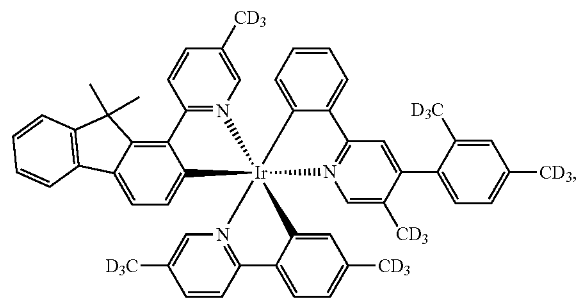
Compound 350
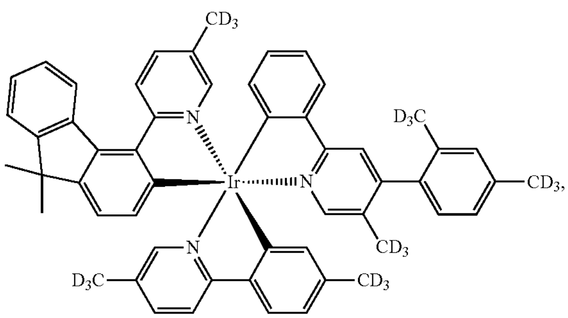
Compound 351
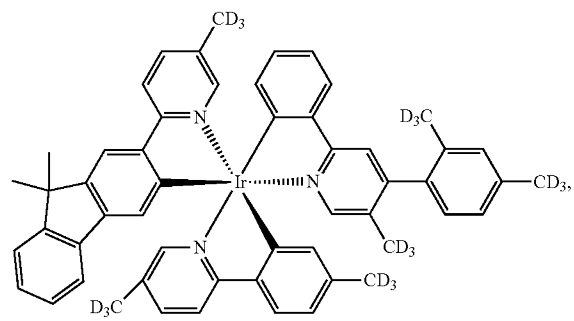
Compound 352
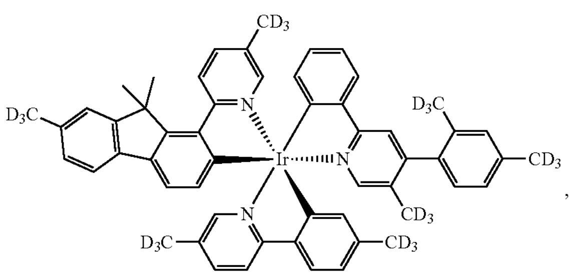
Compound 353
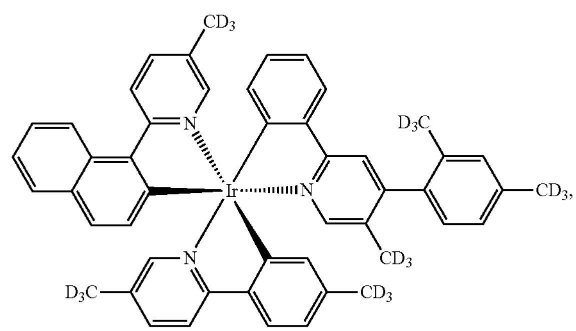
Compound 354
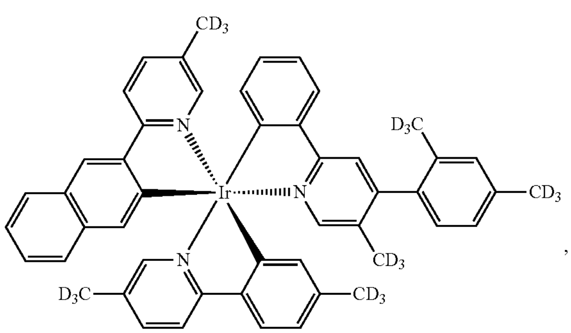
Compound 355
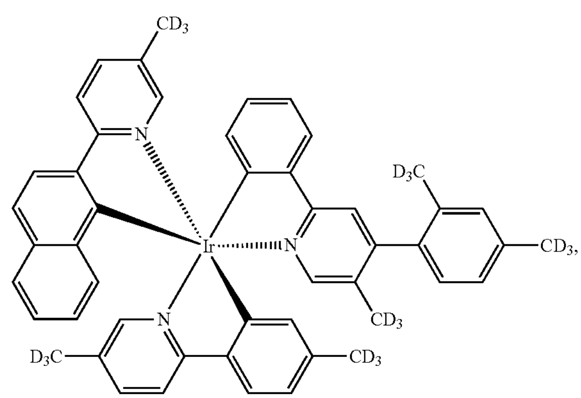

-continued
Compound 356
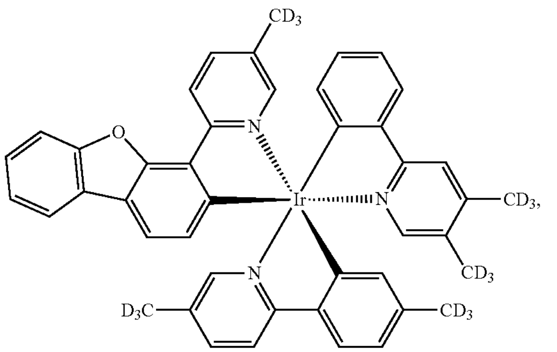
Compound 357
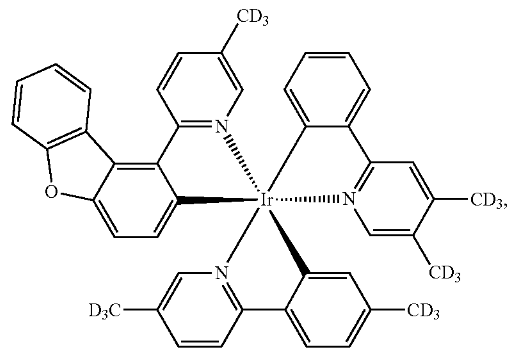
Compound 358
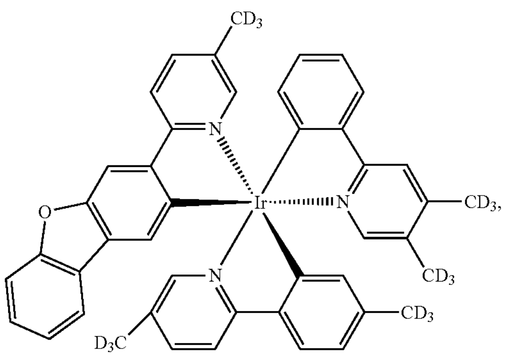
Compound 359
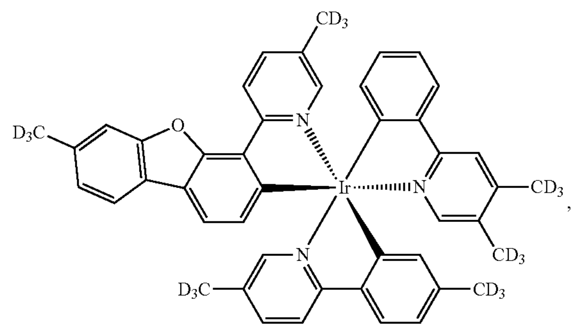
Compound 360
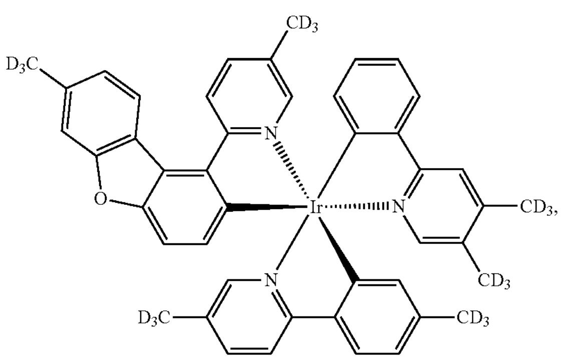
Compound 361
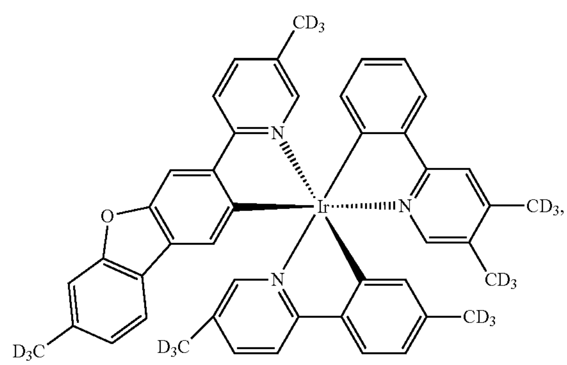
Compound 362
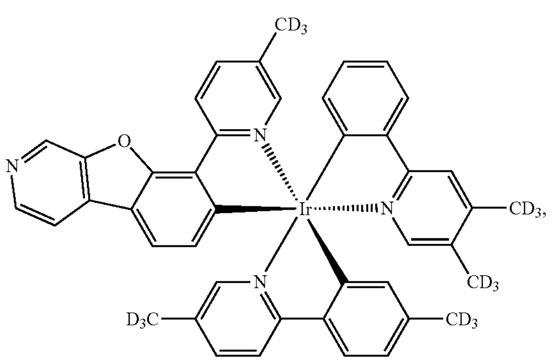
Compound 363
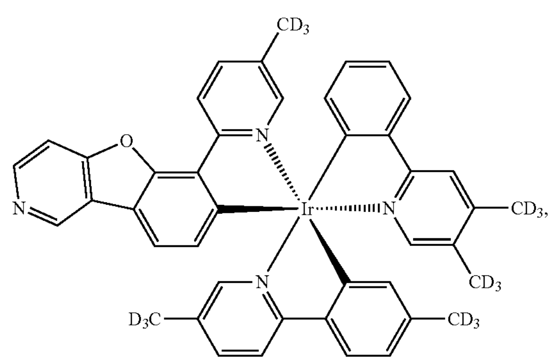

-continued
Compound 364
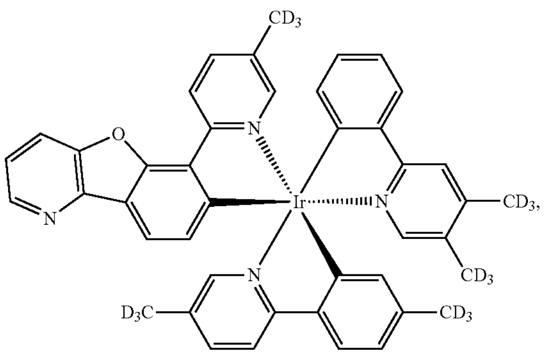
Compound 365
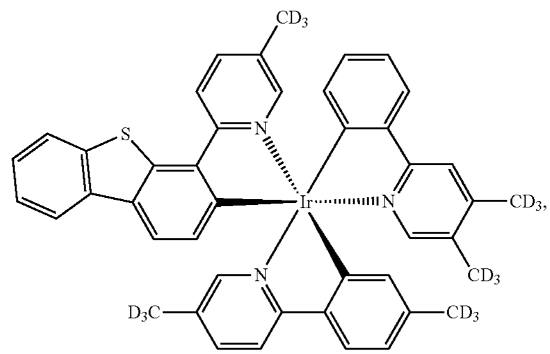
Compound 366
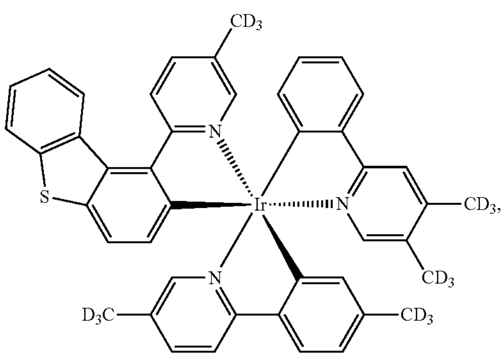
Compound 367
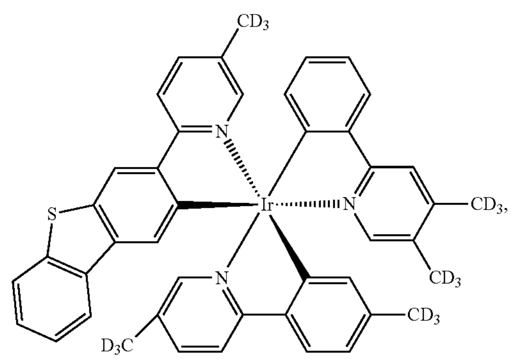
Compound 368
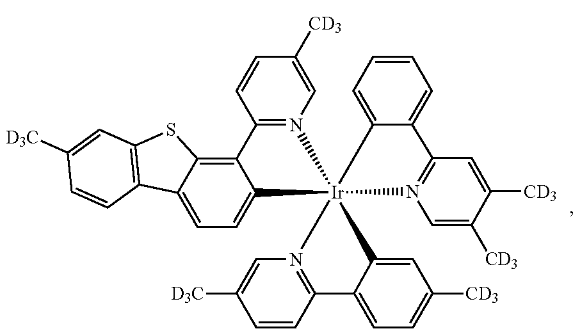
Compound 369
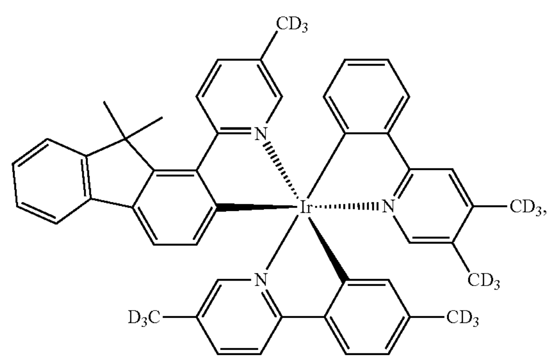
Compound 370
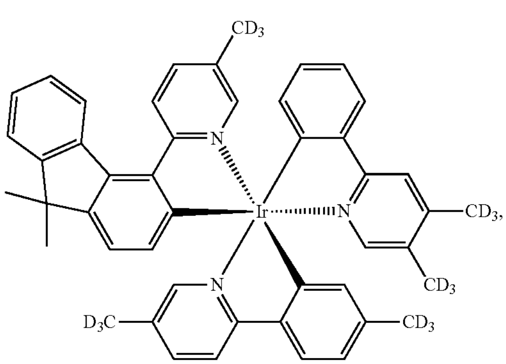
Compound 371
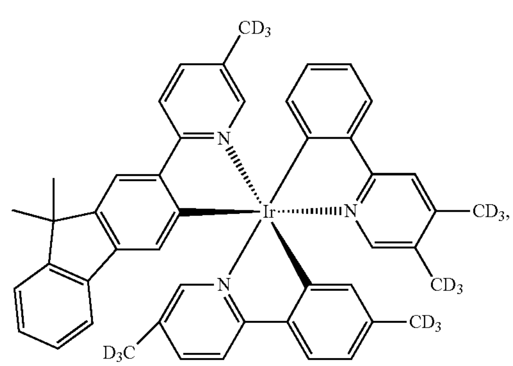

-continued
Compound 372
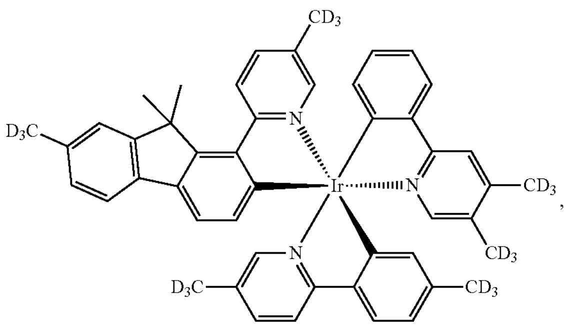
Compound 373
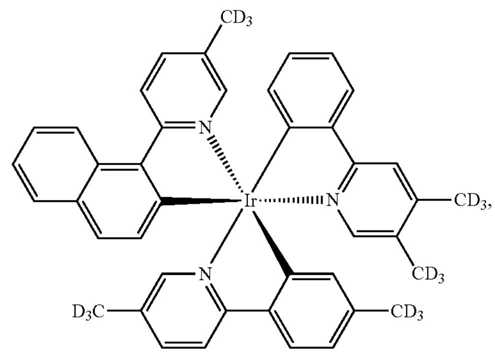
Compound 374
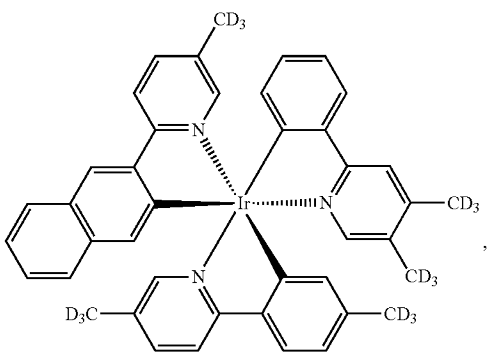
Compound 375
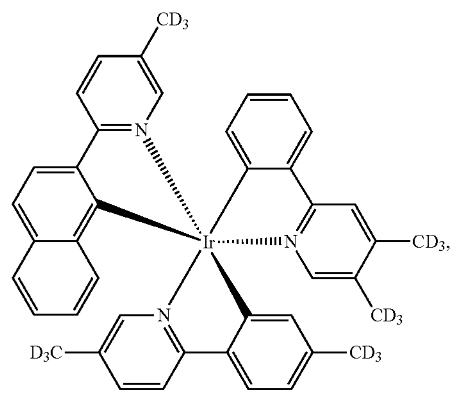
Compound 376
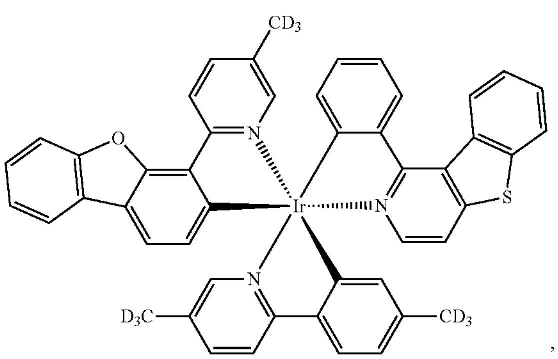
Compound 377
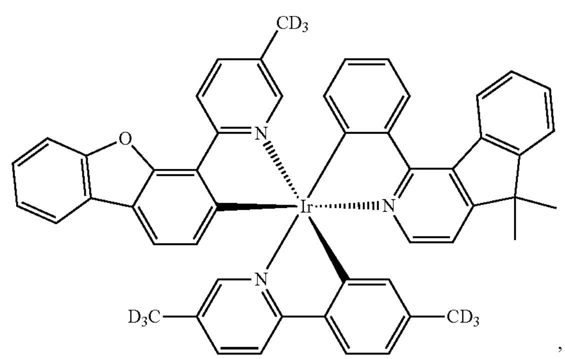
Compound 378
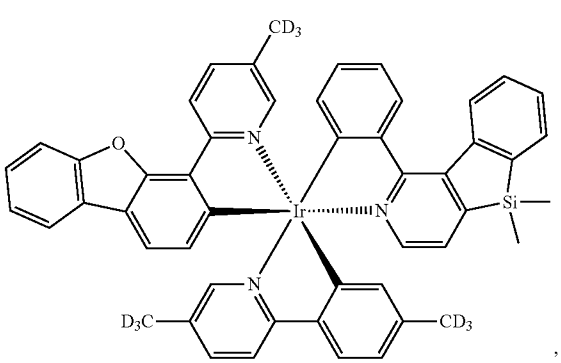
Compound 379
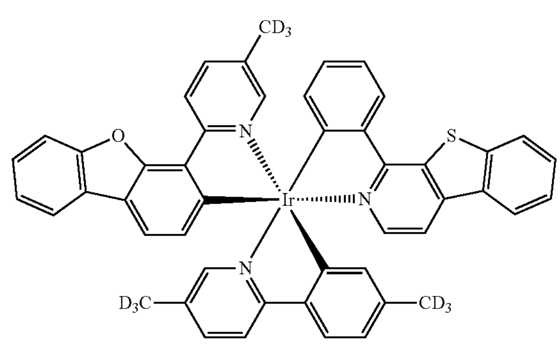

-continued
Compound 380
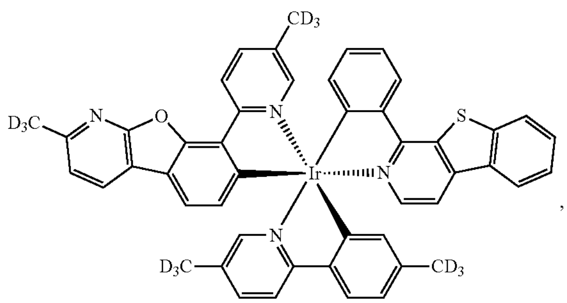
Compound 381
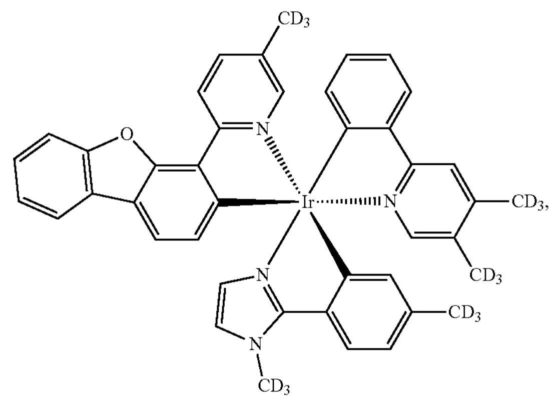
Compound 382
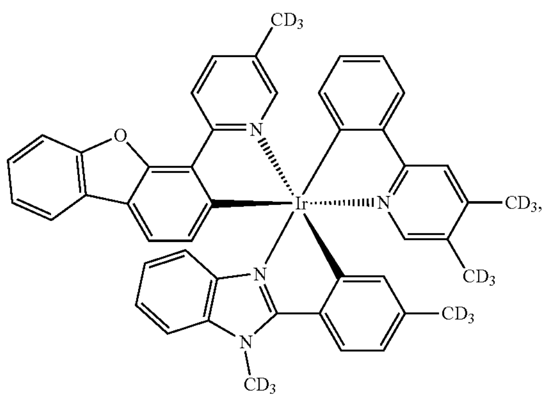
Compound 383
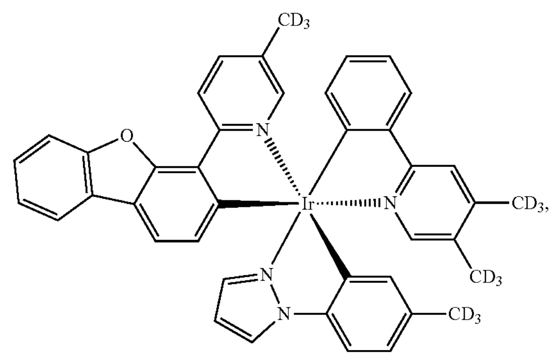
Compound 384
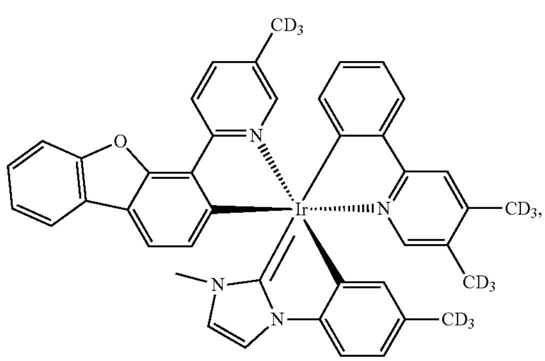
Compound 385
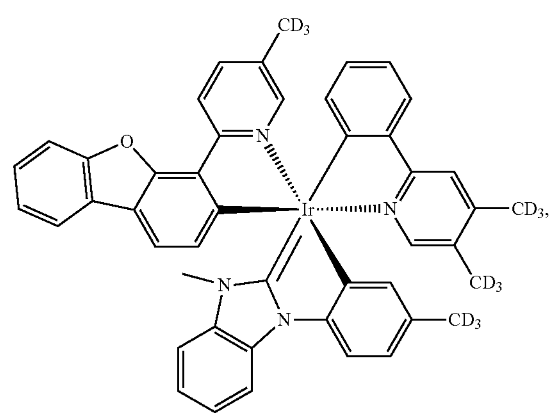
Compound 386
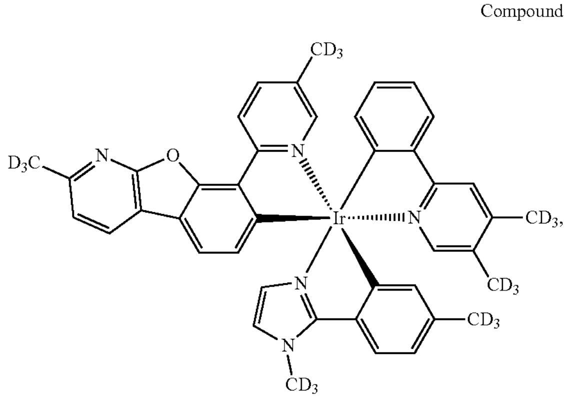
Compound 387
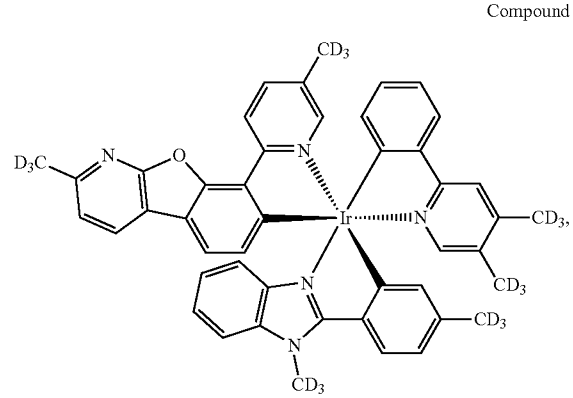

-continued
Compound 388
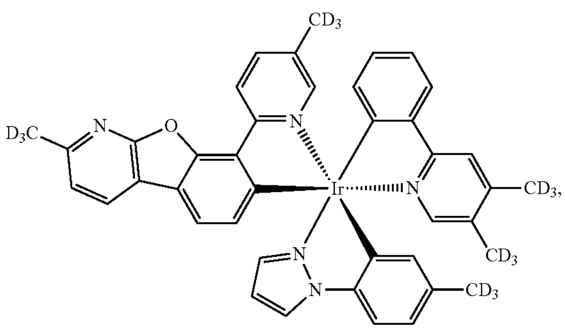
Compound 389
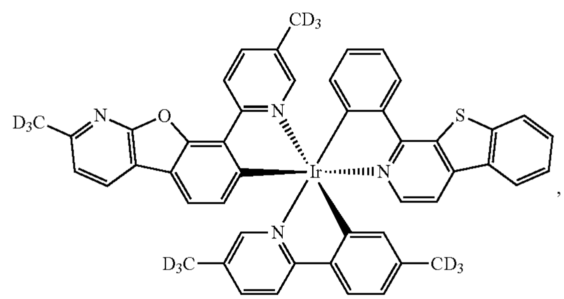
Compound 390
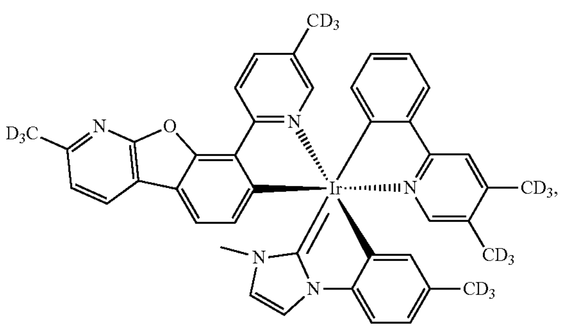
Compound 391
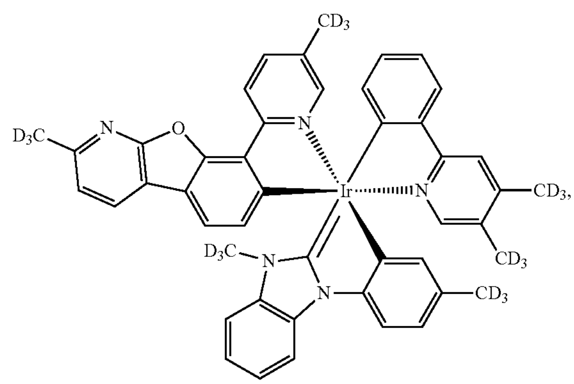
Compound 392
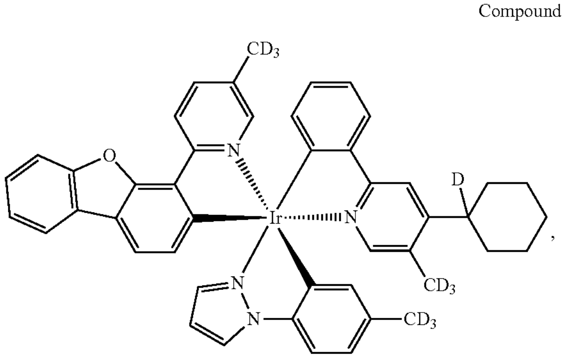
Compound 393
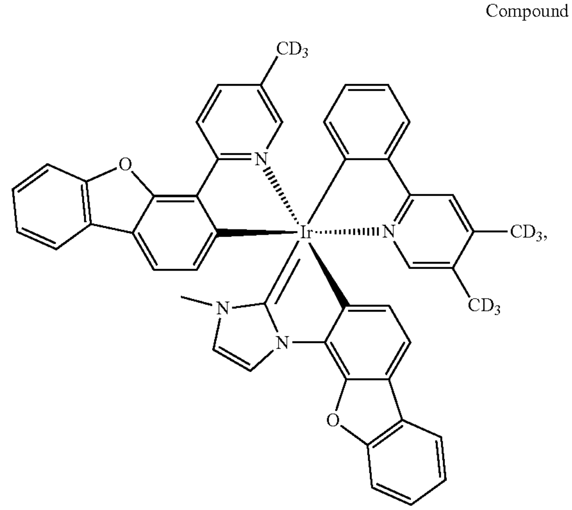

-continued
Compound 394
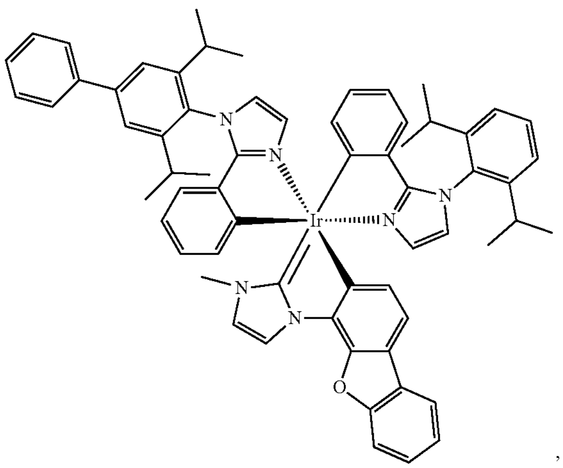
,
Compound 395
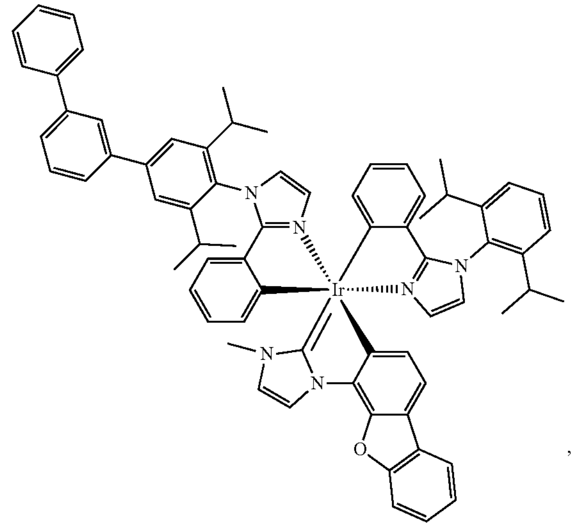
,
Compound 396
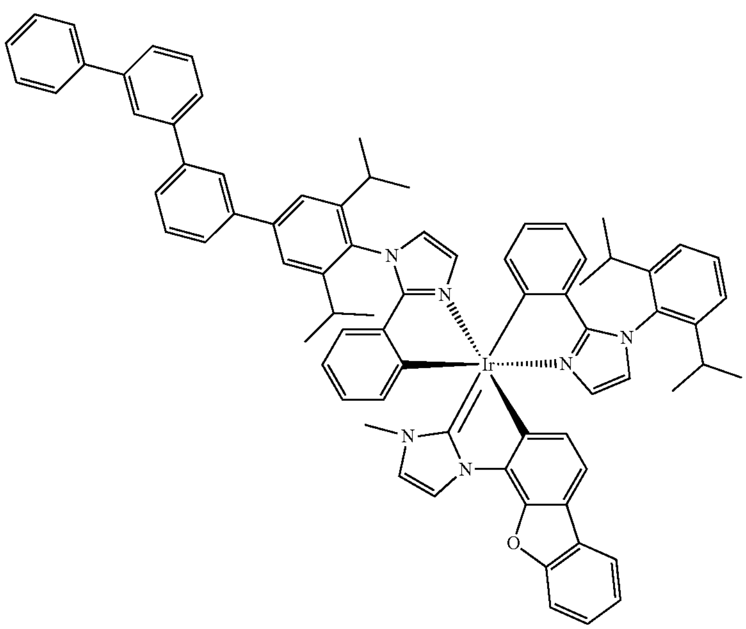
, -continued
Compound 397
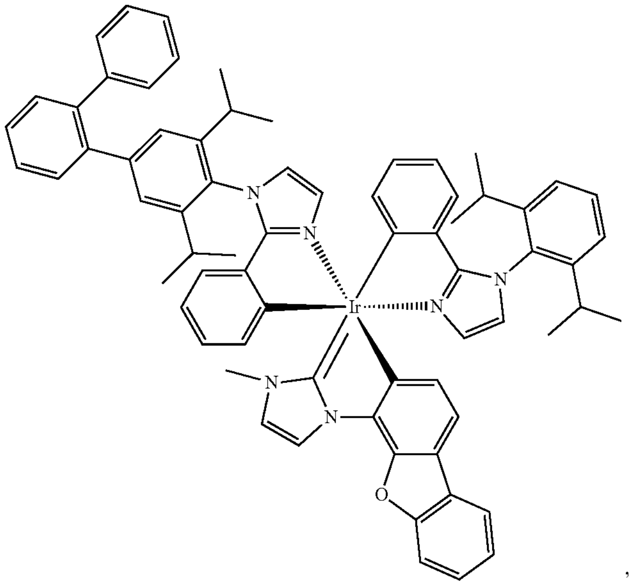
,
Compound 398
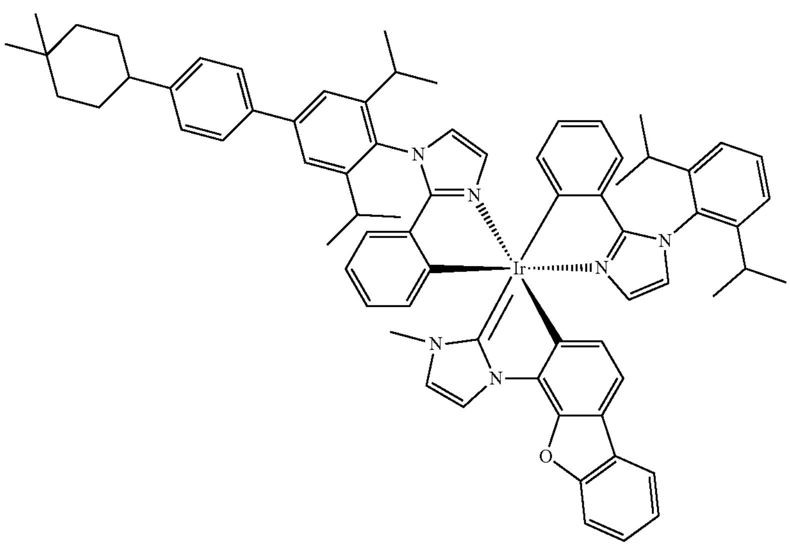
, -continued
Compound 399
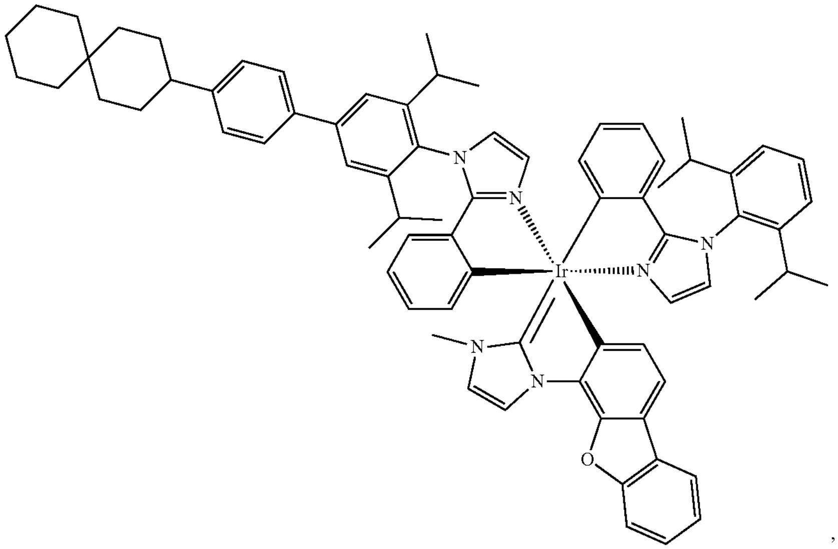
Compound 400
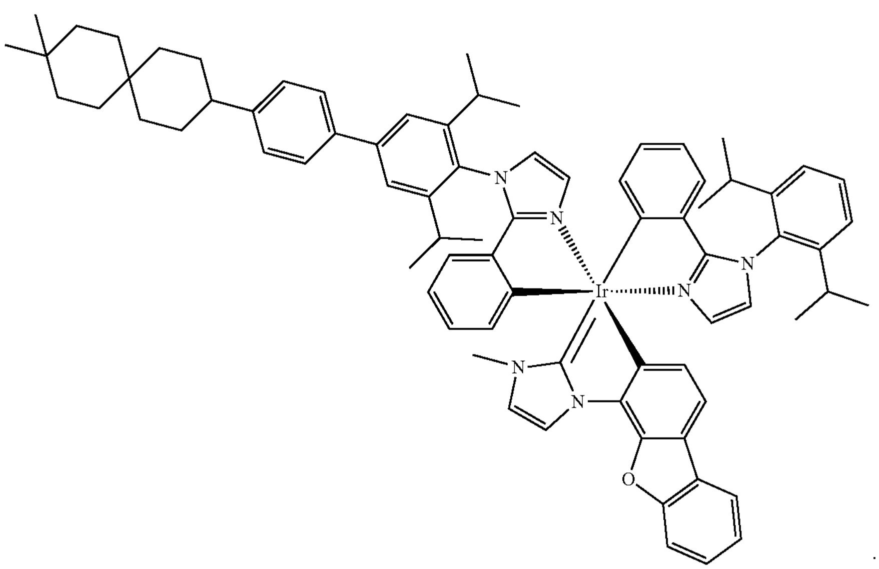

-continued
Compound 401
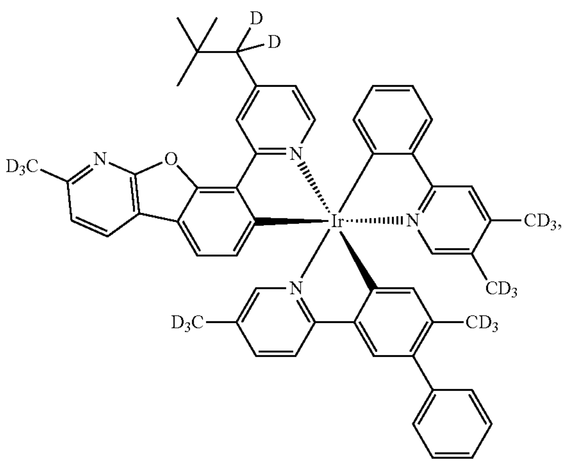
Compound 402
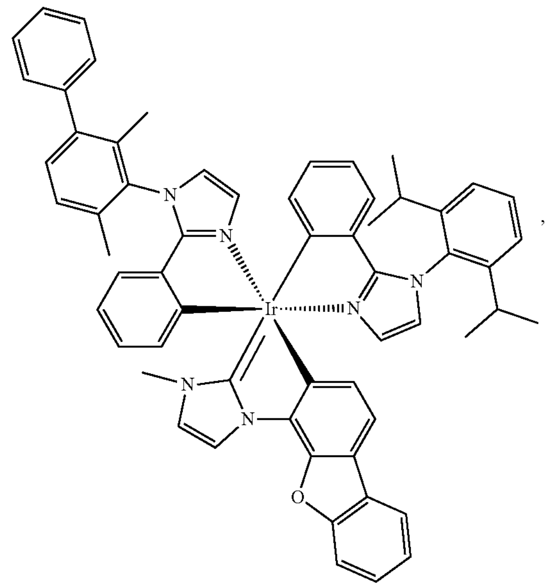
,
Compound 403
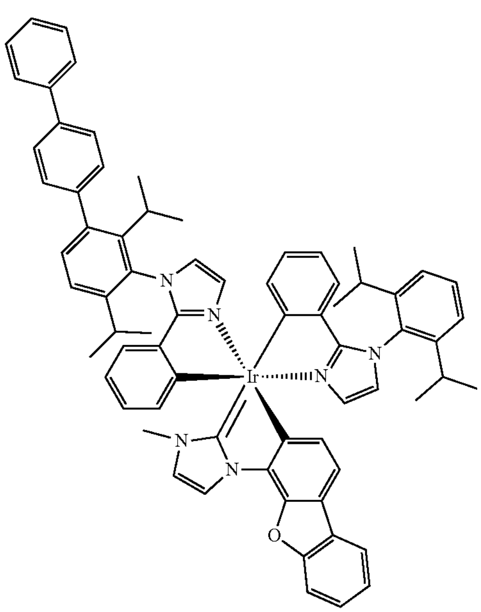
,
Compound 404
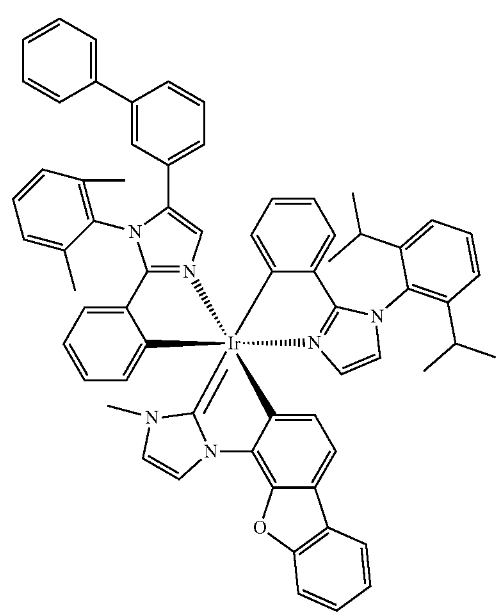
, -continued
Compound 405
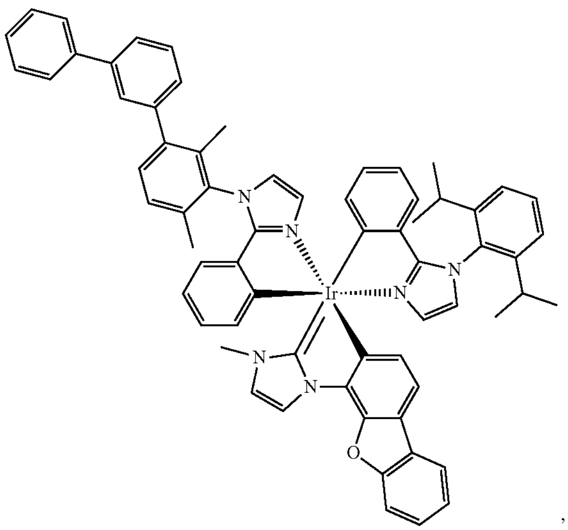
,
Compound 407
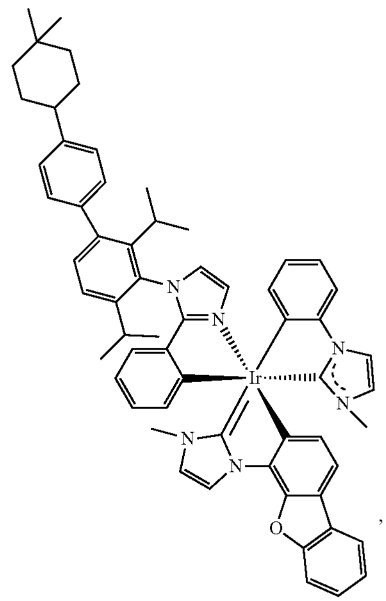
,
Compound 408
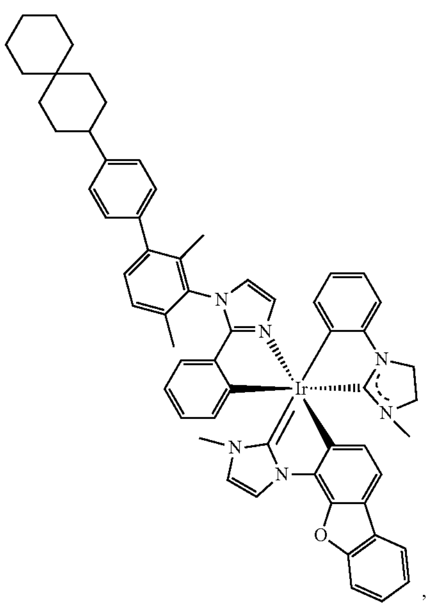
,
Compound 409
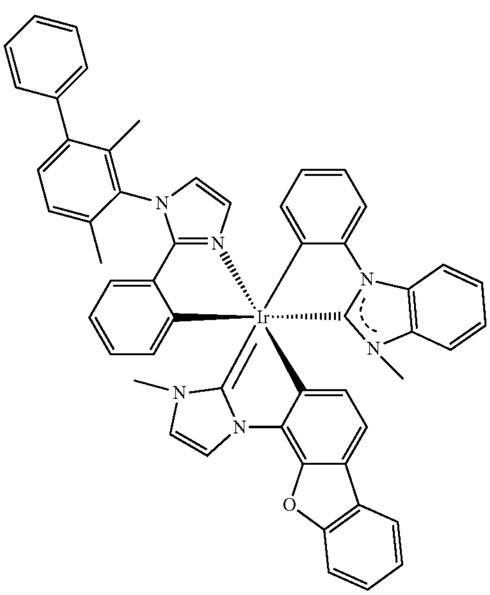
, -continued
Compound 410
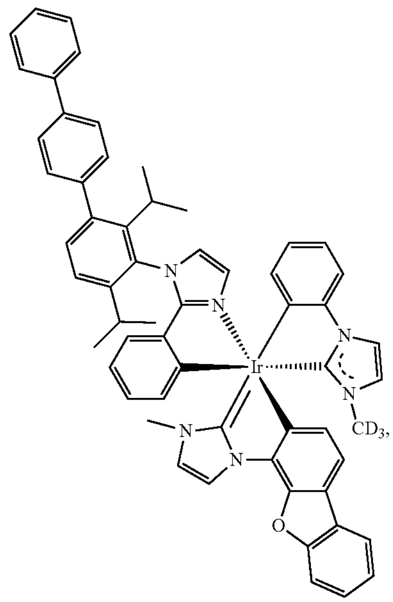
Compound 411
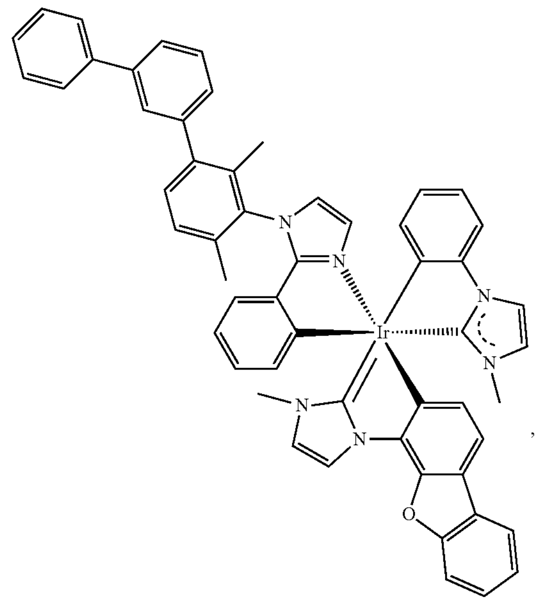
Compound 412
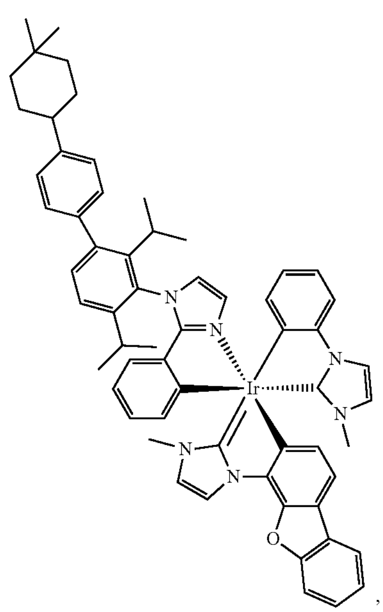
Compound 413
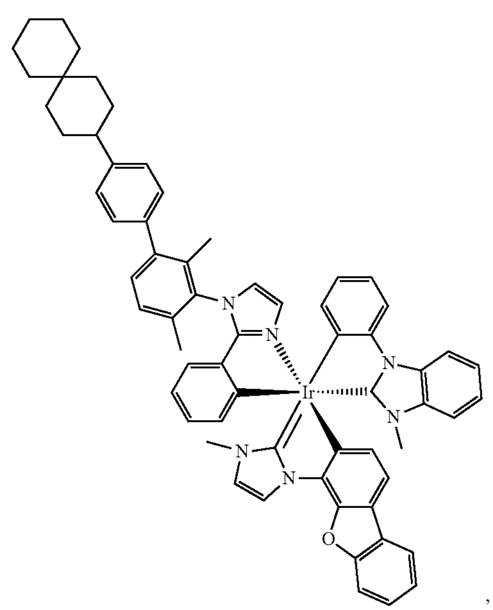

-continued
Compound 414
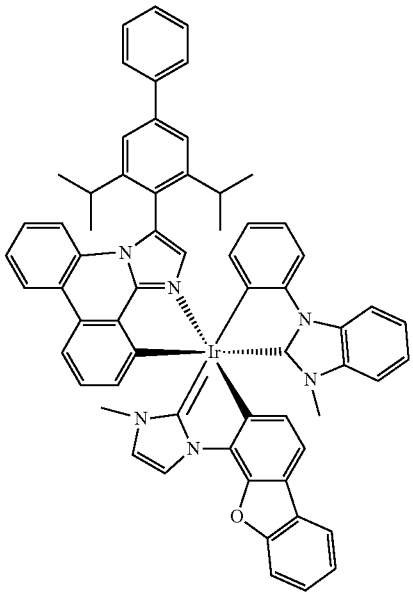
,
Compound 415
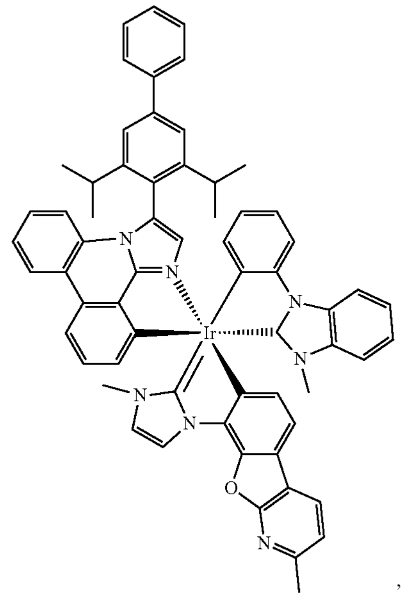
,
Compound 416
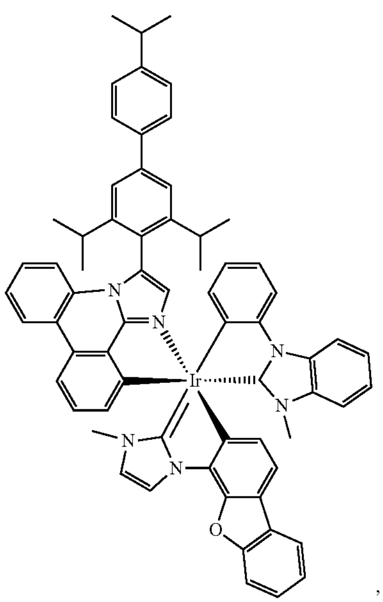
,
Compound 417
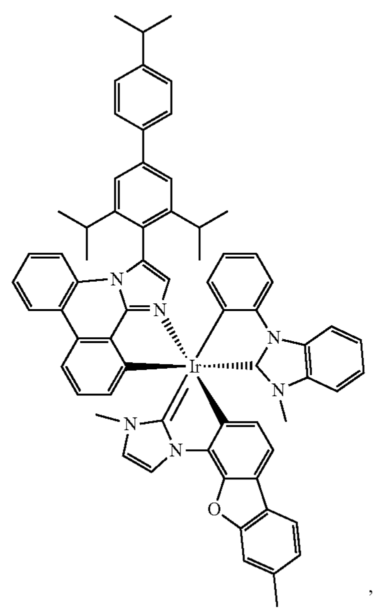
, -continued
Compound 418
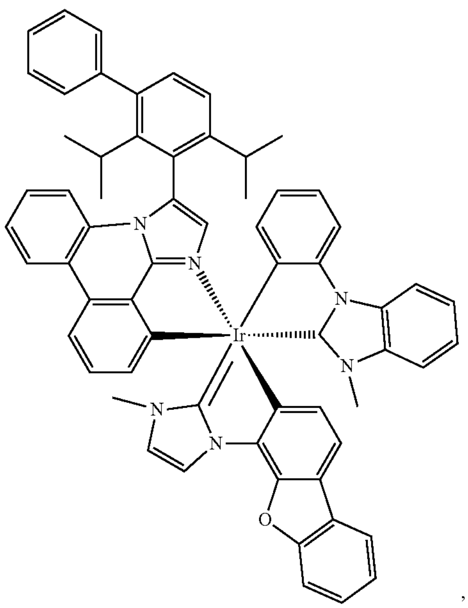
,
Compound 419
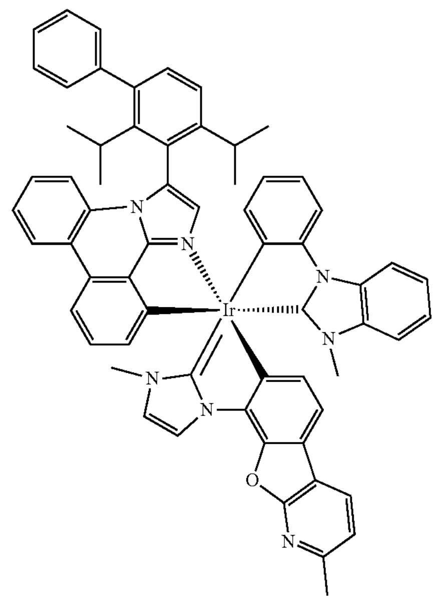
,
Compound 420
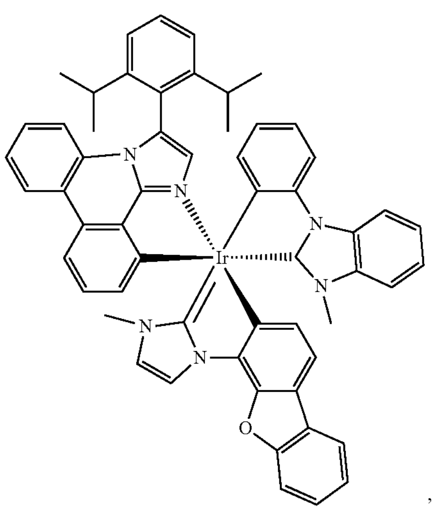
,
Compound 421
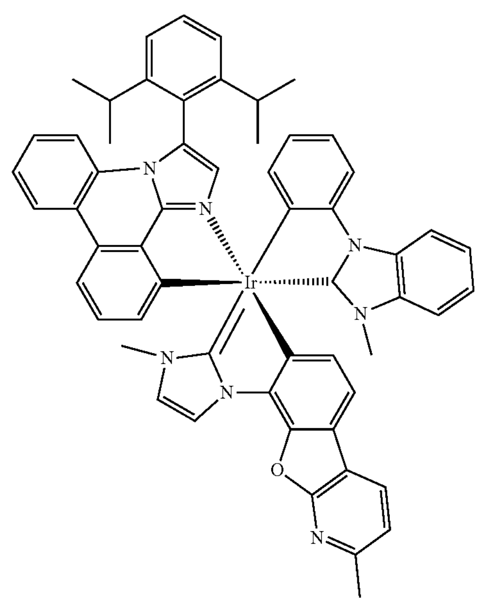
, -continued
Compound 422
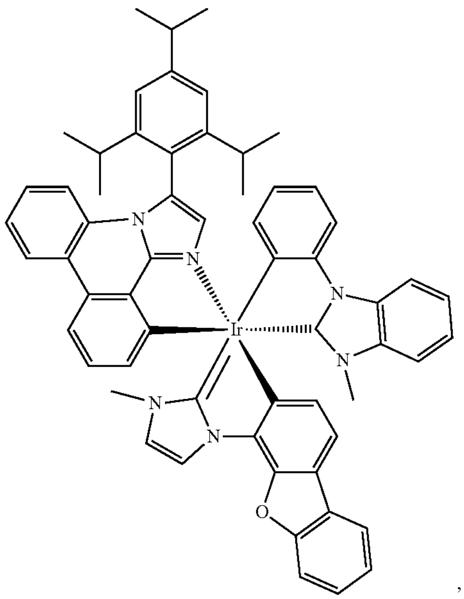
,
Compound 423
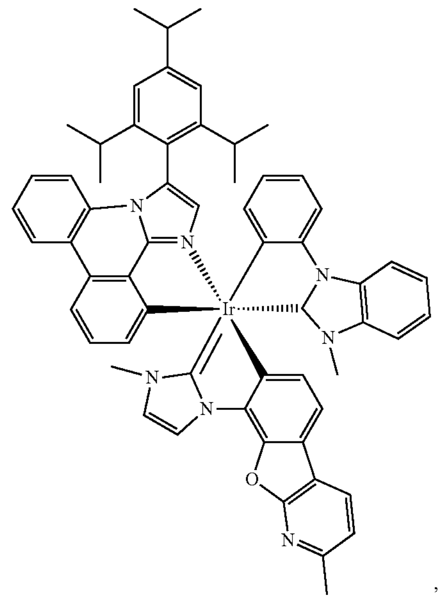
,
Compound 424
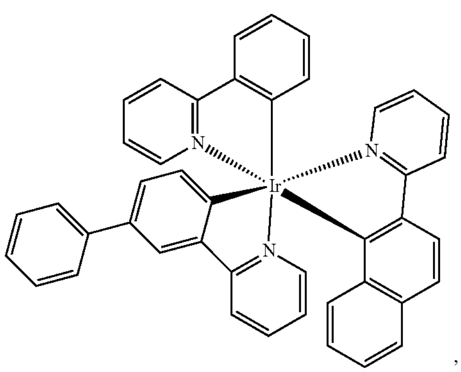
,
Compound 425
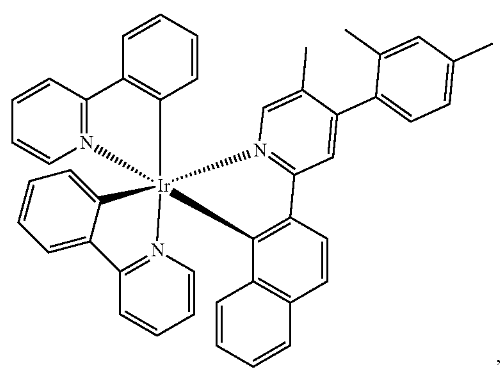
,
Compound 426
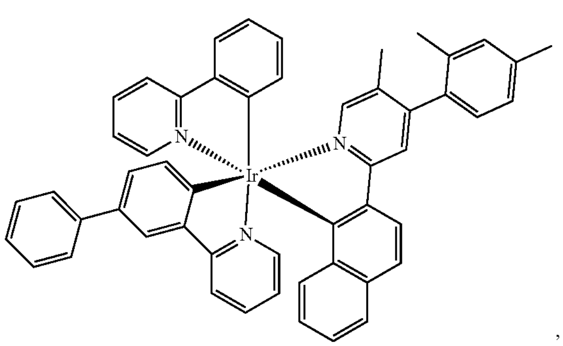
,
Compound 427
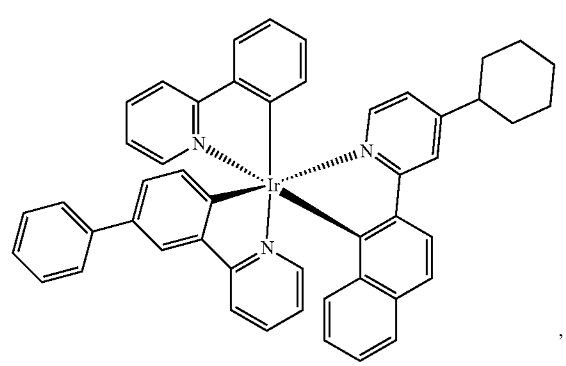
, -continued
Compound 428
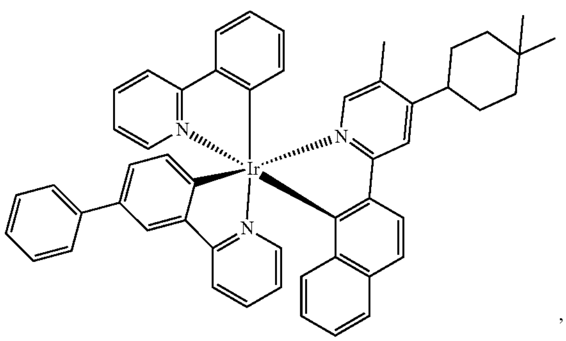
Compound 429
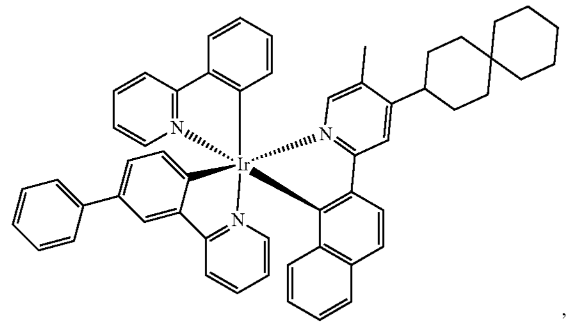
Compound 430
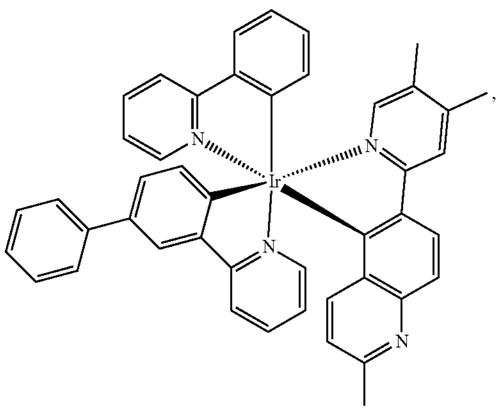
Compound 431
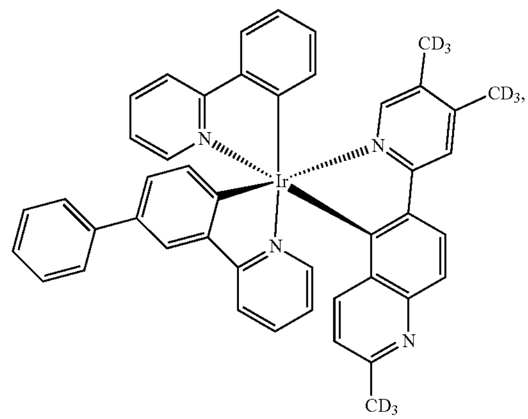
Compound 432
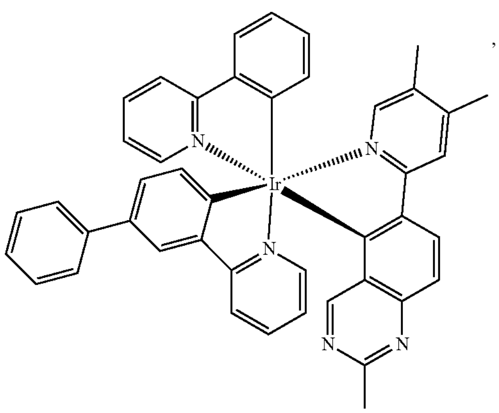
Compound 433
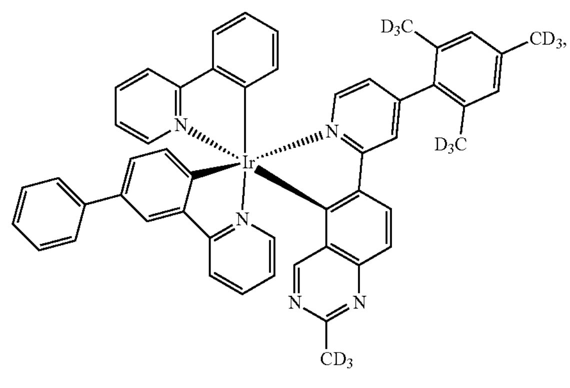
Compound 434
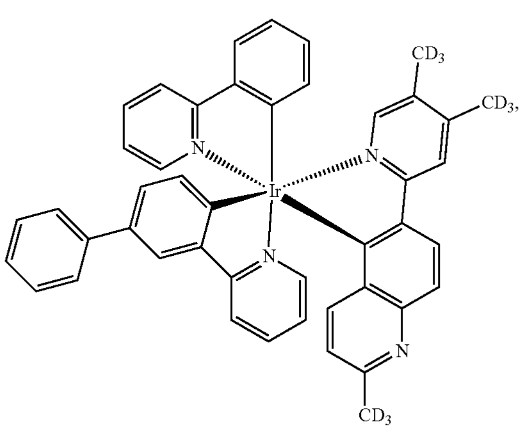
Compound 435
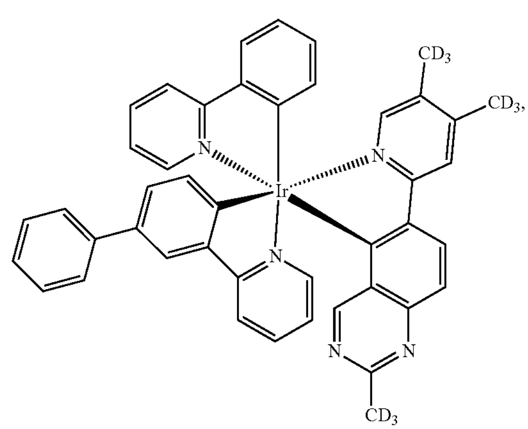

-continued

Compound 436

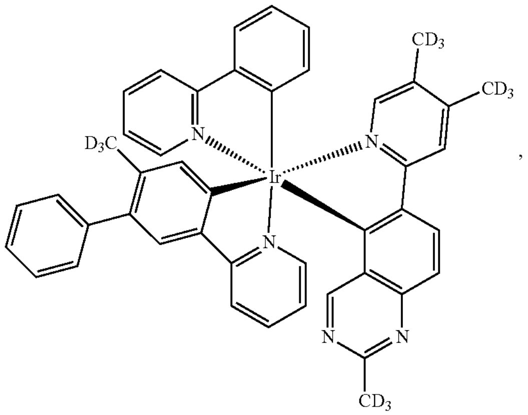

Compound 437

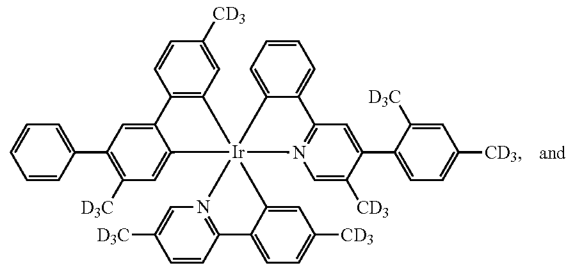

Compound 438

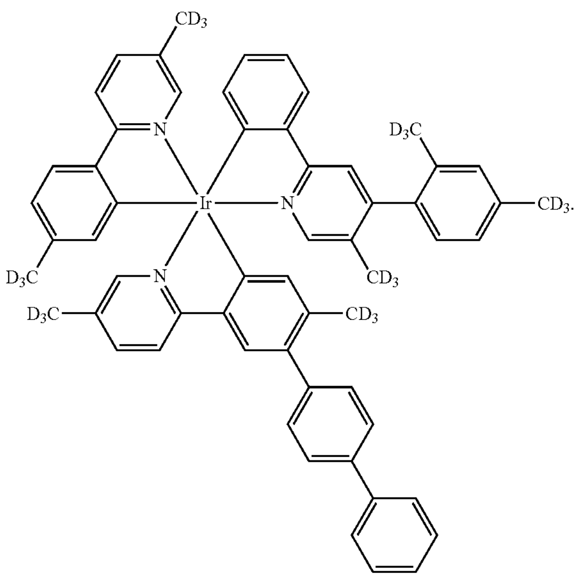

According to another aspect of the present disclosure, an organic light-emitting device (OLED) is disclosed where the OLED comprises: an anode; a cathode; and an organic layer, disposed between the anode and the cathode. The organic layer comprises a compound having the Formula selected from the group consisting of:

Formula I

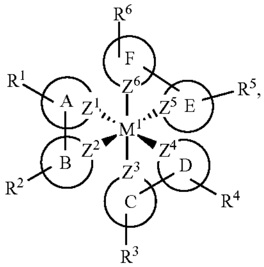

-continued

Formula II

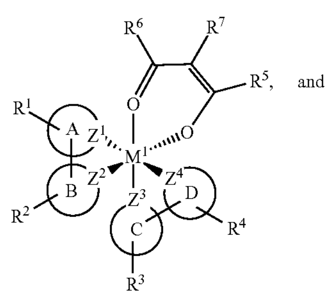

-continued

Formula III

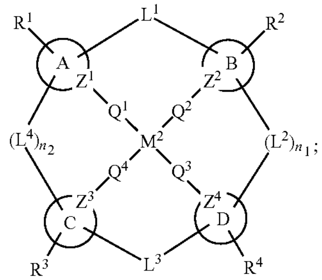

wherein rings A, B, C, D, E, and F are each a 5 or 6-membered carbocyclic or heterocyclic ring;

wherein in Formula I: A-B, C-D, and E-F form three bidentate ligands coordinated to metal $M^1$; wherein A-B, C-D, and E-F are different from each other; wherein ring A is trans to ring D, ring B is trans to ring E, and ring C is trans to ring F in a octahedral coordination configuration;

wherein in Formula II: A-B, C-D, and one acetylacetonate ligand form three bidentate ligands coordinated to metal $M^1$; wherein A-B, and C-D are different from each other; wherein ring A is trans to ring D, ring B is trans to oxygen atom, and ring C is trans to oxygen atom in a octahedral coordination configuration;

wherein in Formula III: $L^1$ and $L^3$ each independently selected from the group consisting of a direct bond, BR, NR, PR, O, S, Se, C═O, S═O, $SO_2$, CRR', SiRR', GeRR', alkyl, and combinations thereof; $n_1$, $n_2$ each independently is 0 or 1; when $n_1$ or $n_2$ is 1, $L^2$ or $L^4$ is selected from the group consisting of a direct bond, BR, NR, PR, O, S, Se, C═O, S═O, $SO_2$, CRR', SiRR', GeRR', alkyl, and combinations thereof; when $n_1$ or $n_2$ is 0, $L^2$ or $L^4$ is not present; $Q^1$, $Q^2$, $Q^3$, and $Q^4$ each independently selected from the group consisting of direct bond and oxygen; and when any of $Z^1$, $Z^2$, $Z^3$, and $Z^4$ is nitrogen, the $Q^1$, $Q^2$, $Q^3$, and $Q^4$ attached thereto is a direct bond;

ring A is trans to ring D, and ring B is trans to ring C in a square-planar coordination configuration;

wherein $R^1$, $R^2$, $R^3$, $R^4$, $R^3$, $R^6$, and $R^7$ each represents mono to the maximum possible number of substitution, or no substitution;

wherein $Z^1$, $Z^2$, $Z^3$, $Z^4$, $Z^5$, and $Z^6$ are each independently selected from the group consisting of carbon and nitrogen;

wherein $M^1$ is a metal selected from the group consisting of Ir, Os, Rh, Ru, and Re; $M^2$ is a metal selected from the group consisting of Pt and Pd;

wherein a first distance is the distance between the farthest atom away from $M^1$ in $R^1$ to the farthest atom away from $M^1$ in $R^4$;

wherein a second distance is the distance between the farthest atom away from $M^1$ in $R^2$ to the farthest atom away from $M^1$ in $R^5$;

wherein a third distance is the distance between the farthest atom away from $M^1$ in $R^3$ to the farthest atom away from $M^1$ in $R^6$;

wherein a fourth distance is the distance between the farthest atom away from $M^2$ in $R^1$ to the farthest atom away from $M^2$ in $R^4$;

wherein a fifth distance is the distance between the farthest atom away from $M^2$ in $R^2$ to the farthest atom away from $M^2$ in $R^3$;

wherein the first distance is longer than the second distance and the third distance each by at least 1.5 Å;

wherein the fourth distance is longer than the fifth distance by at least 1.5 Å;

wherein R, R', $R^1$, $R^2$, $R^3$, $R^4$, $R^3$, $R^6$, and $R^7$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two substituents among R, R', $R^1$, $R^2$, $R^3$, $R^4$, $R^3$, $R^6$, and $R^7$ are optionally joined or fused into a ring.

In some embodiments of the OLED, where the compound in the organic layer is of Formula I, at least one of (i), (ii), and (iii) is true, wherein (i) one $R^1$ connects to one $R^2$, (ii) one $R^3$ connects to one $R^4$, (iii) one $R^3$ connects to one $R^6$. In some embodiments where the compound is of Formula II, at least one of (i) and (ii) is true, wherein (i) one $R^1$ connects to one $R^2$, (ii) one $R^3$ connects to one $R^4$.

In some embodiments of the OLED, the organic layer is an emissive layer and the compound is an emissive dopant or a non-emissive dopant.

In some embodiments of the OLED, the organic layer further comprises a host, wherein the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, CH═CH—$C_nH_{2n+1}$, C≡$CC_nH_{2n+1}$, $Ar_1$, $Ar_1$-$Ar_2$, and $C_nH_{2n}$—$Ar_1$, or the host has no substitutions;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the OLED, the organic layer further comprises a host, wherein host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments of the OLED, the organic layer further comprises a host, wherein the host is selected from the group consisting of:

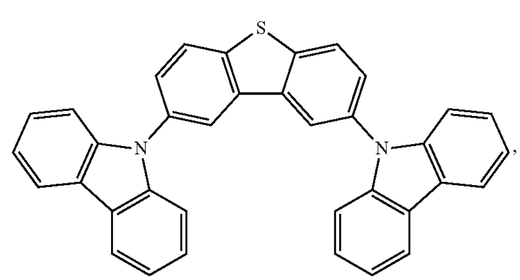

-continued
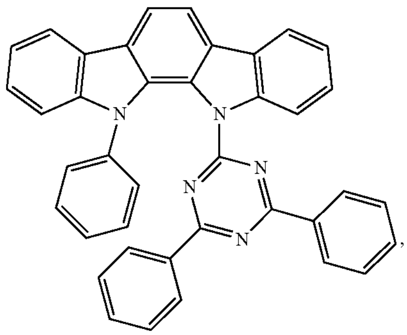
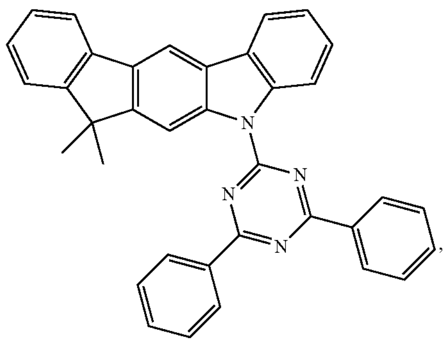
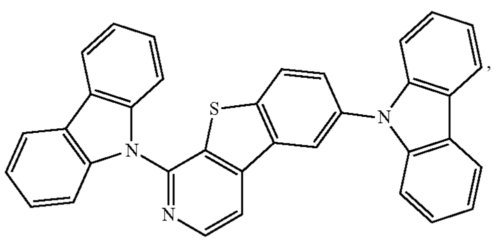
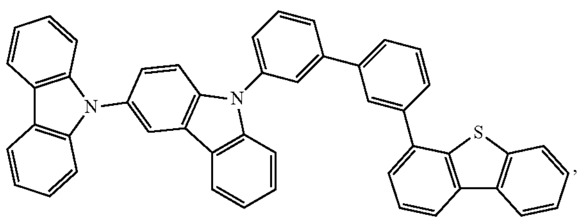
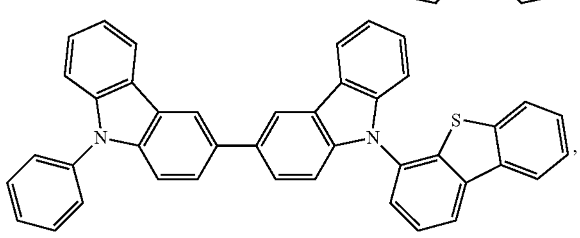
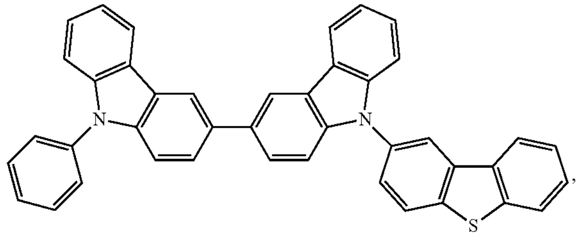
-continued
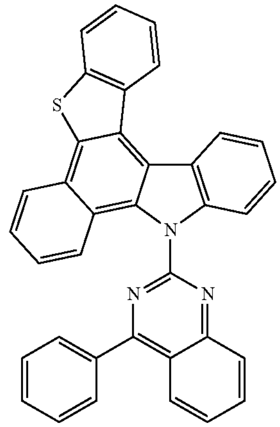
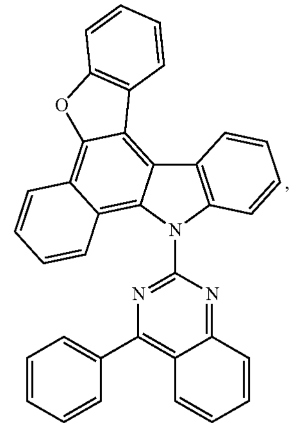
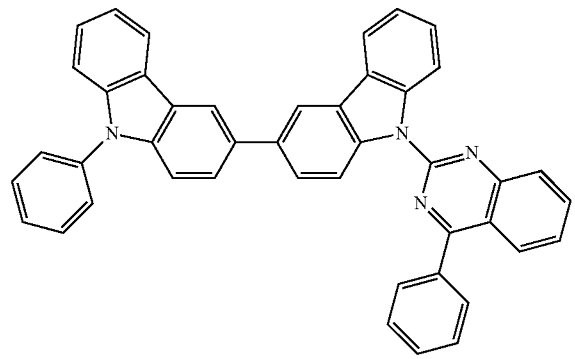
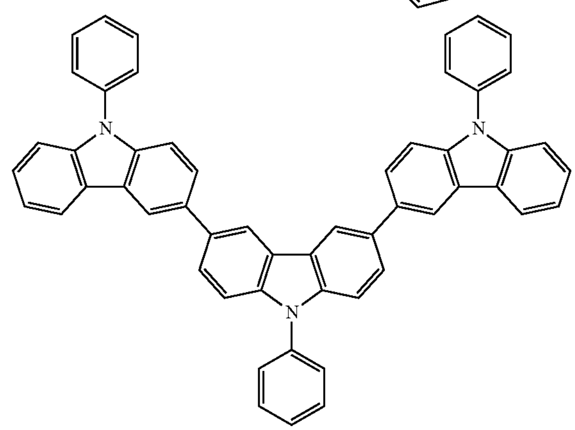
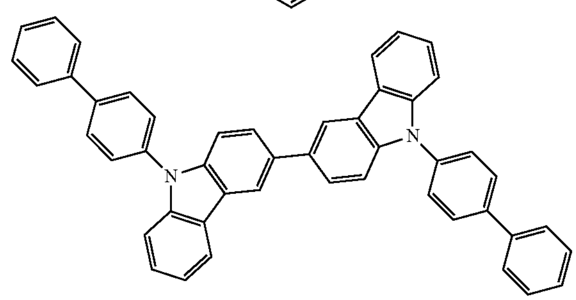
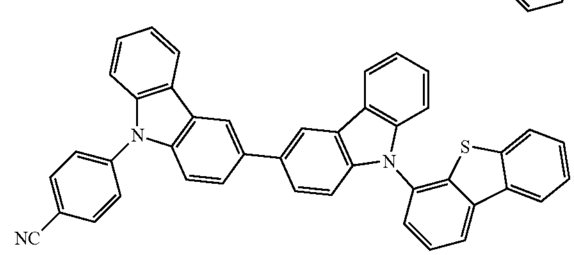

-continued

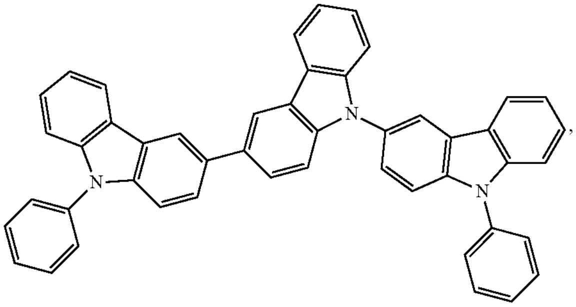

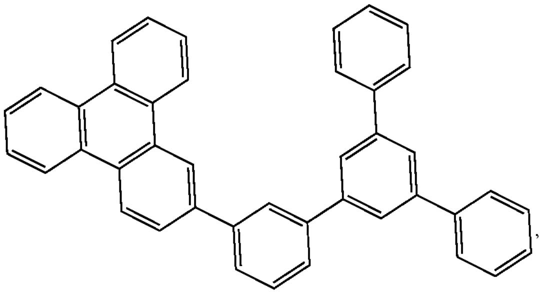

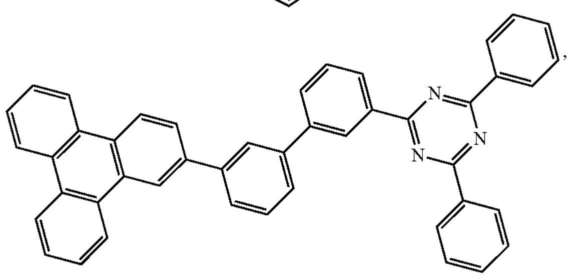

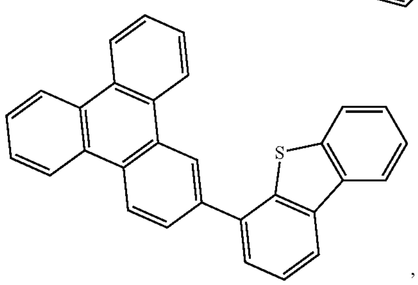

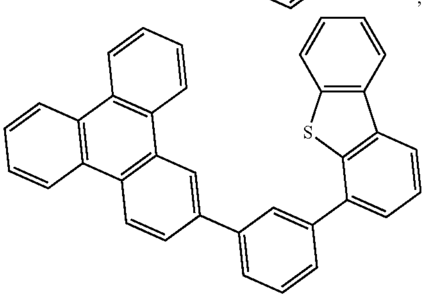

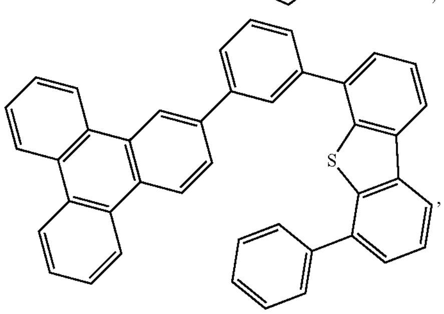

-continued

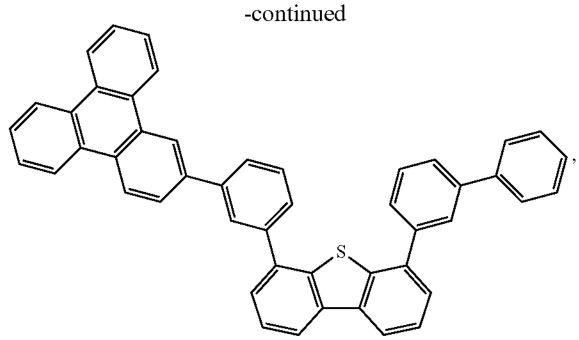

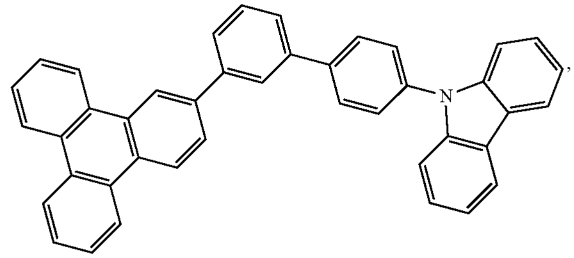

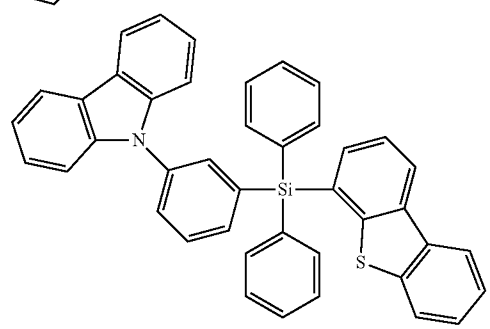

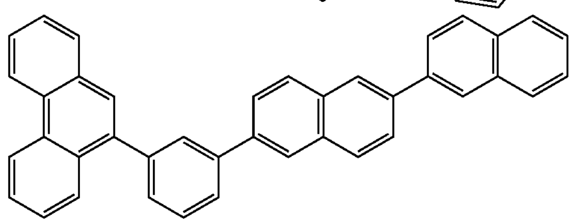

and combinations thereof.

In some embodiments of the OLED, the organic layer further comprises a host, wherein the host comprises a metal complex.

According to another aspect, a consumer product comprising the OLED described above is disclosed. In some embodiments of the consumer product, the consumer product is selected from the group consisting of flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays, 3-D displays, virtual reality or augmented reality displays, vehicles, video walls comprising multiple displays tiled together, theater or stadium screen, and a sign.

According to another aspect, a formulation comprising the compound having a formula selected from the group consisting of:

Formula I

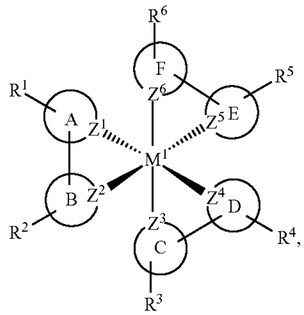

Formula II

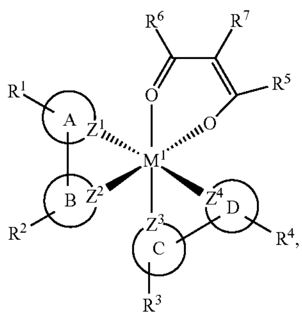

and

Formula III

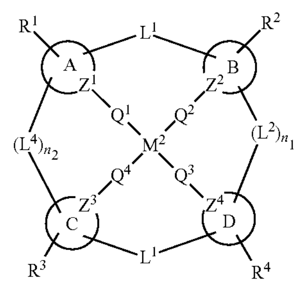

is disclosed, wherein rings A, B, C, D, E, and F are each a 5 or 6-membered carbocyclic or heterocyclic ring;

wherein in Formula I: A-B, C-D, and E-F form three bidentate ligands coordinated to metal $M^1$; wherein A-B, C-D, and E-F are different from each other; wherein ring A is trans to ring D, ring B is trans to ring E, and ring C is trans to ring F in a octahedral coordination configuration;

wherein in Formula II: A-B, C-D, and one acetylacetonate ligand form three bidentate ligands coordinated to metal $M^1$; wherein A-B, and C-D are different from each other; wherein ring A is trans to ring D, ring B is trans to oxygen atom, and ring C is trans to oxygen atom in a octahedral coordination configuration;

wherein in Formula III: $L^1$ and $L^3$ each independently selected from the group consisting of a direct bond, BR, NR, PR, O, S, Se, C═O, S═O, $SO_2$, CRR', SiRR', GeRR', alkyl, and combinations thereof; $n_1$, $n_2$ each independently is 0 or 1; when $n_1$ or $n_2$ is 1, $L^2$ or $L^4$ is selected from the group consisting of a direct bond, BR, NR, PR, O, S, Se, C═O, S═O, $SO_2$, CRR', SiRR', GeRR', alkyl, and combinations thereof; when $n_1$ or $n_2$ is 0, $L^2$ or $L^4$ is not present; $Q^1$, $Q^2$, $Q^3$, and $Q^4$ each independently selected from the group consisting of direct bond and oxygen; when any of $Z^1$, $Z^2$, $Z^3$, and $Z^4$ is nitrogen, the $Q^1$, $Q^2$, $Q^3$, and $Q^4$ attached thereto is a direct bond;

ring A is trans to ring D, ring B is trans to ring C in a square-planar coordination configuration;

wherein $R^1$, $R^2$, $R^3$, $R^4$, $R^3$, $R^6$, and $R^7$ each represents mono to the maximum possible number of substitution, or no substitution;

wherein $Z^1$, $Z^2$, $Z^3$, $Z^4$, $Z^5$, and $Z^6$ are each independently selected from the group consisting of carbon and nitrogen;

wherein $M^1$ is a metal selected from the group consisting of Ir, Os, Rh, Ru, and Re; $M^2$ is a metal selected from the group consisting of Pt and Pd;

wherein a first distance is the distance between the farthest atom away from $M^1$ in $R^1$ to the farthest atom away from $M^1$ in $R^4$;

wherein a second distance is the distance between the farthest atom away from $M^1$ in $R^2$ to the farthest atom away from $M^1$ in $R^5$;

wherein a third distance is the distance between the farthest atom away from $M^1$ in $R^3$ to the farthest atom away from $M^1$ in $R^6$;

wherein a fourth distance is the distance between the farthest atom away from $M^2$ in $R^1$ to the farthest atom away from $M^2$ in $R^4$;

wherein a fifth distance is the distance between the farthest atom away from $M^2$ in $R^2$ to the farthest atom away from $M^2$ in $R^3$;

wherein the first distance is longer than the second distance and the third distance each by at least 1.5 Å;

wherein the fourth distance is longer than the fifth distance by at least 1.5 Å;

wherein R, R', $R^1$, $R^2$, $R^3$, $R^4$, $R^3$, $R^6$, and $R^7$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two substituents among R, R', $R^1$, $R^2$, $R^3$, $R^4$, $R^3$, $R^6$, and $R^7$ are optionally joined or fused into a ring.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The formulation can include one or more components selected from the group consisting of a solvent, a host, a hole injection material, hole transport material, and an electron transport layer material, disclosed herein.

EXPERIMENTAL

Synthesis of Compound 437

Step 1

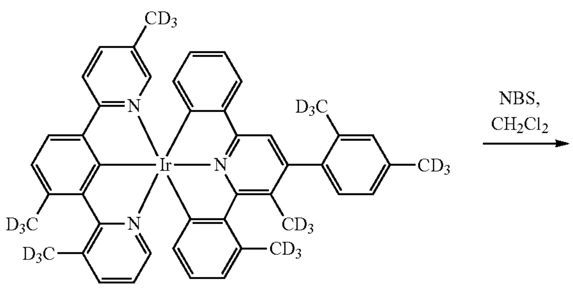

CC-2

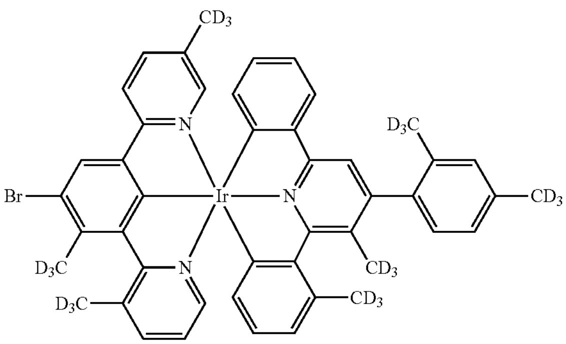

CC-2-Br

CC-2 (2.3 g, 2.71 mmol) was dissolved in dry dichloromethane (400 ml). The mixture was degassed with $N_2$ and cooled to 0° C. 1-Bromopyrrolidine-2,5-dione (0.81 g, 2.71 mmol) was dissolved in DCM (300 mL) and added dropwise. After addition, the temperature was gradually raised to room temperature and stirred for 12 hrs. Saturated $NaHCO_3$ (20 mL) solution was added. The organic phase was separated and collected. The solvent was removed and the residue was coated on Celite and purified on silica gel column eluted with toluene/heptane 70/30 (v/v) to give the product CC-2-Br (0.6 g, 24%).

Step 2

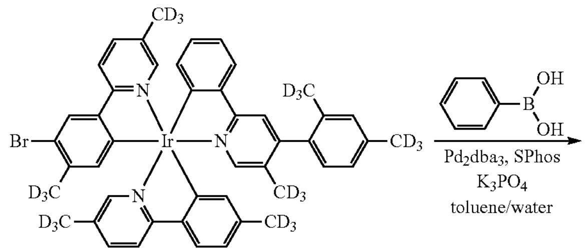

CC-2-Br

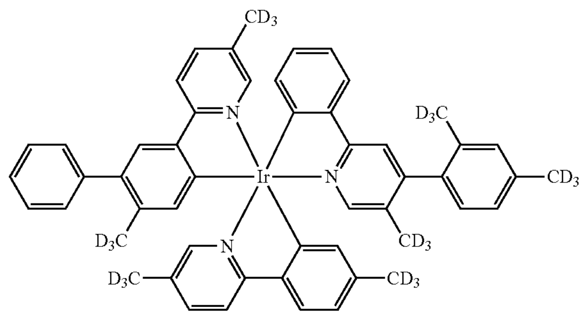

Compound 437

CC-2-Br (0.72 g, 0.775 mmol) was dissolved in a mixture of toluene (40 ml) and water (4 ml). The mixture was purged with $N_2$ for 10 mins. $K_3PO_4$ (0.411 g 1.937 mmol), SPhos (0.095 g, 0.232 mmol), $Pd_2dba_3$ (0.043 g, 0.046 mmol), and phenylboronic acid (0.189 g, 1.55 mmol) were added. The mixture was heated under $N_2$ at 110° C. for 12 hrs. The reaction then was cooled down to room temperature, the product was extracted with DCM. The organic phase was separated and collected. The solvent was removed and the residue was coated on Celite and purified on silica gel column eluted with toluene/heptane 70/30 (v/v). The product was purified by crystallization from toluene/MeOH to give compound 437 (0.7 g).

Synthesis of Compound 438

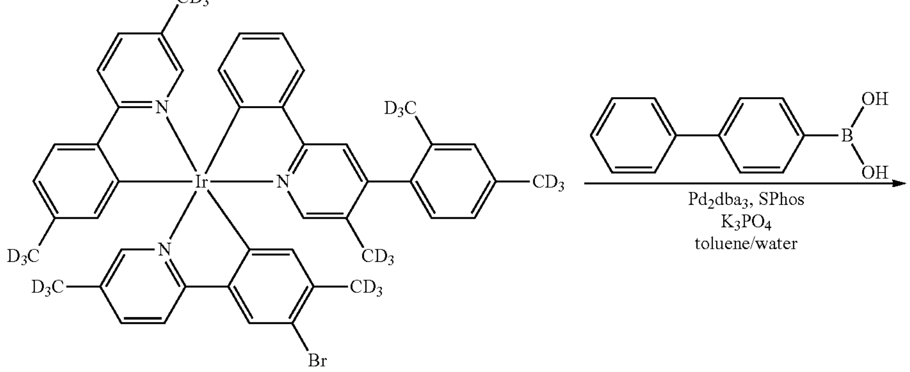

CC-2-Br-2

-continued

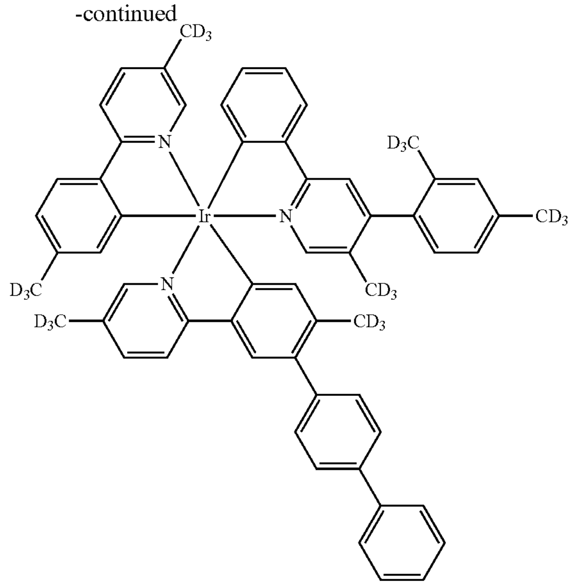

Compound 438

CC-2-Br-2 (0.6 g, 0.646 mmol) was dissolved in a mixture of toluene (100 ml) and water (10 ml). The mixture was purged with $N_2$ for 10 mins. $K_3PO_4$ (0.343 g 1.61 mmol), SPhos (0.080 g, 0.19 mmol), $Pd_2dba_3$ (0.035 g, 0.039 mmol), and [1,1-biphenyl]4-ylboronic acid (0.256 g, 1.29 mmol) were added. The mixture was heated under $N_2$ at 110° C. for 12 hrs. Then the reaction was cooled down to room temperature, the product was extracted with DCM and organic phase was separated. The solvent was removed and the residue was coated on Celite and purified on silica gel column eluted with toluene/heptane 70/30 (v/v). The product was purified by crystallization from toluene/MeOH to give compound 438 (0.64 g).

Synthesis of Compound 161

Step 1

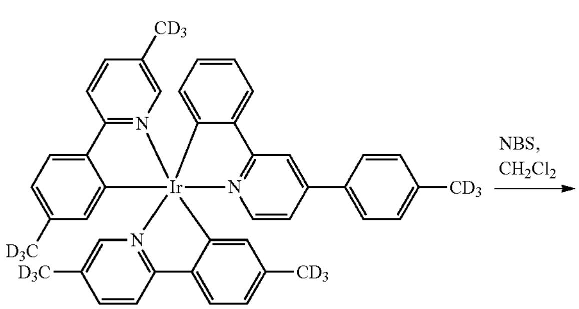

-continued

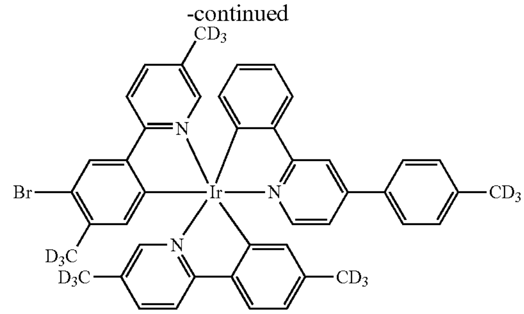

CC-1-Br

CC-1 (2.04 g, 2.500 mmol) was dissolved in dry dichloromethane (400 ml). The mixture was degassed with $N_2$ and cooled to 0° C. 1-bromopyrrolidine-2,5-dione (0.445 g, 2.500 mmol) was dissolved in DCM (200 mL) and dropwise added. After addition, the temperature was gradually raised to room temperature and stirred for 16 hrs. Sat. $NaHCO_3$ (20 mL) solution was added. The organic phase was separated and collected. The solvent was removed and the residue was coated on Celite and purified on silica gel column eluted by using 70/30 toluene/heptane to give the product CC-1-Br (0.6 g).

Step 2

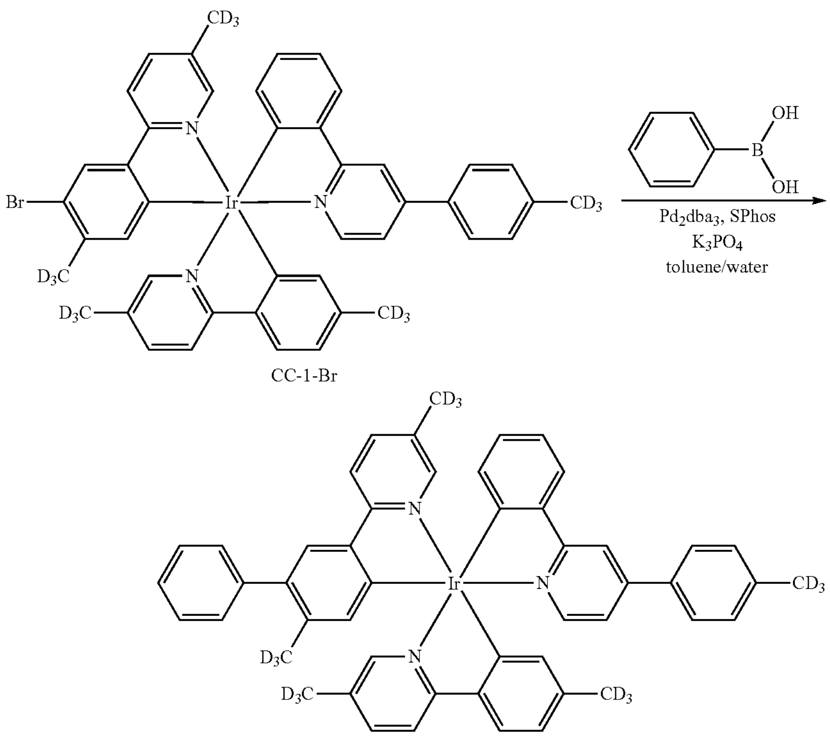

Compound 161

CC-1-Br (1.16 g, 1.296 mmol) was dissolved in a mixture of toluene (120 ml) and water (12.00 ml). The mixture was purged with $N_2$ for 10 mins. $K_3PO_4$ (0.688 g, 3.24 mmol, Sphos (0.160 g, 0.389 mmol), $Pd_2dba_3$ (0.071 g, 0.078 mmol), and phenylboronic acid (0.316 g, 2.59 mmol) were added. The mixture was heated under $N_2$ at 110° C. for 16 hrs. After the reaction was complete it was cooled down to room temperature, the product was extracted with DCM. The organic phase was separated and collected. The solvent was removed and the residue was coated on Celite and purified on silica gel column eluted by using 70/30 toluene/heptane. The product was purified by recrystallization in toluene/MeOH to give Compound 161 (1.0 g).

Synthesis of Compound 401

Step 1

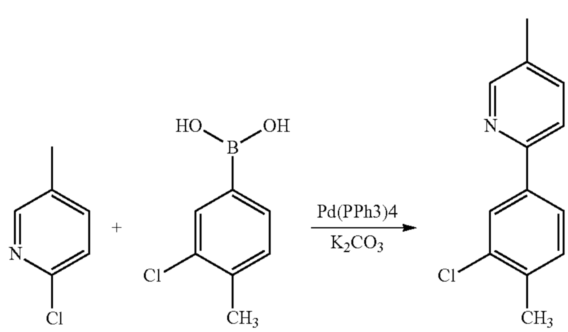

2-Chloro-5-methylpyridine (10.03 g, 79 mmol), (3-chloro-4-methylphenyl)boronic acid (13.4 g, 79 mmol), and potassium carbonate (21.74 g, 157 mmol) were dissolved in the mixture of DME (150 ml) and water (20 ml) under nitrogen to give a colorless suspension. $Pd(PPh_3)_4$ (0.909 g, 0.786 mmol) was added to the reaction mixture, then the reaction mixture was degassed and heated to 95° C. for 12 hrs. It was then cooled down to room temperature, organic phase was separated and evaporated. The residue was subjected to column chromatography on silica gel column, eluted with heptanes/THF 9/1 (v/v), providing after crystallization from heptanes 10 g (58% yield) of white solid.

Step 2

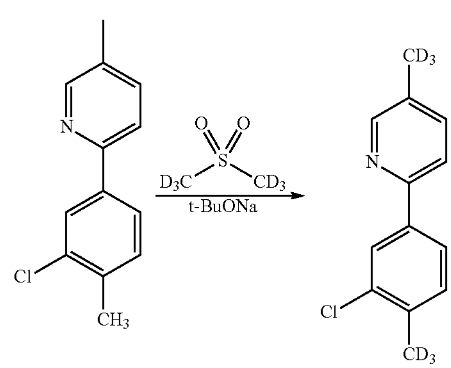

2-(3-Chloro-4-methylphenyl)-5-methylpyridine (10 g, 45.9 mmol), ((methyl-d3)sulfonyl)methane-d3 (92 g, 919 mmol), and sodium 2-methylpropan-2-olate (2.65 g, 27.6 mmol) were dissolved together under nitrogen to give a dark solution. The reaction mixture was heated to 80° C. under nitrogen for 12 hrs, cooled down, diluted with ethyl acetate, washed with water, dried over sodium sulfate, filtered and evaporated. Purified by column chromatography on silica gel, eluted with heptanes/THF 9/1 (v/v), providing white solid, then crystallyzed from heptanes, providing colorless crystalline material (9.1 g, 81% yield).

Step 3

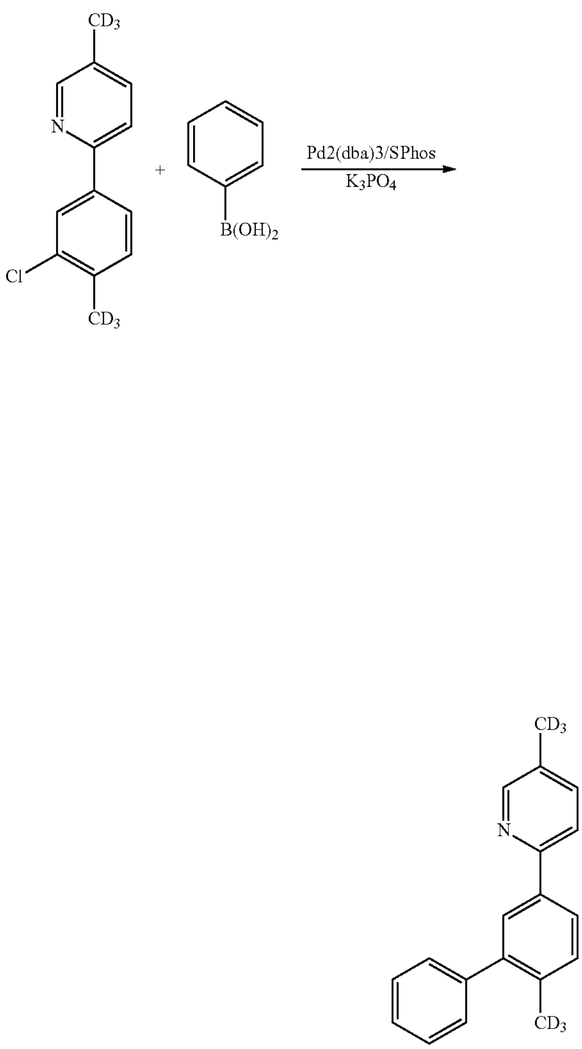

2-(3-Chloro-4-(methyl-d3)phenyl)-5-(methyl-d3)pyridine (7.45 g, 33.3 mmol), phenylboronic acid (6.09 g, 49.9 mmol), potassium phosphate (15.34 g, 66.6 mmol), $Pd_2(dba)_3$ (0.305 g, 0.333 mmol) and dicyclohexyl(2',6'-dimethoxy-[1,1'-biphenyl]-2-yl)phosphane (Sphos, 0.273 g, 0.666 mmol) were dissolved in the mixture of DME (150 ml) and water (25 ml) under nitrogen to give a red suspension. The reaction mixture was degassed and heated to reflux under nitrogen. After overnight heating about 80% conversion was achieved. Addition of more Ph boronic acid and catalyst didn't improve conversion. Separated organic phase, evaporated and purified the residue by column chromatography on silica gel, eluted with heptanes/THF 9/1, then crystallyzed from heptanes. White solid (6.2 g, 70% yield).

Step 4

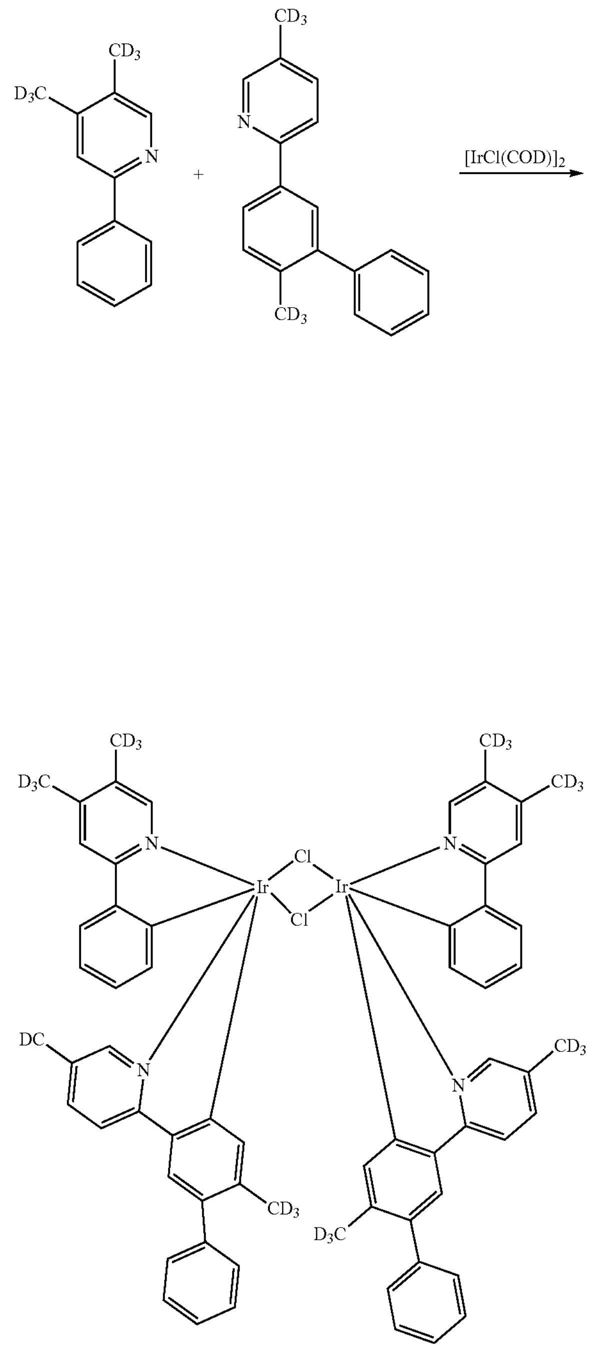

Under nitrogen atmosphere 4,5-bis(methyl-d3)-2-phenylpyridine (1.427 g, 7.54 mmol), 5-(methyl-d3)-2-(6-(methyl-d3)-[1,1'-biphenyl]-3-yl)pyridine (2 g, 7.54 mmol), and [IrCl(COD)]2 (2.53 g, 3.77 mmol) were dissolved in ethoxyethanol (50 ml) under nitrogen to give a red solution. The reaction mixture was heated to reflux for 1 hr, then precipitate was formed. Added 30 mL more of ethoxyethanol and continued to reflux for 48 hrs, then the reaction mixture was cooled down to room temperature. The crude material was used without additional purification on the next step.

Step 5

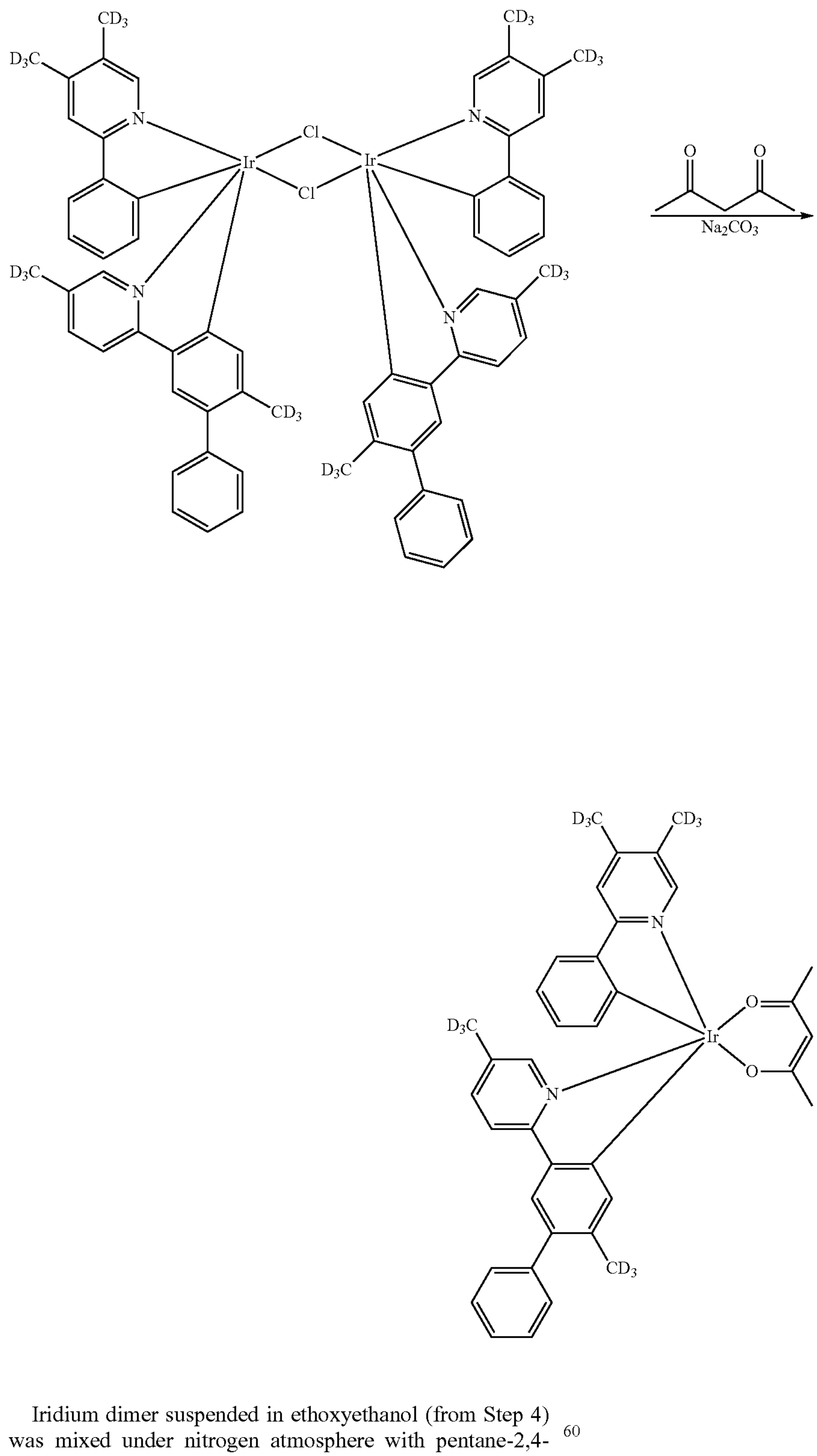

Iridium dimer suspended in ethoxyethanol (from Step 4) was mixed under nitrogen atmosphere with pentane-2,4-dione (2.59 g, 25.9 mmol) and sodium carbonate (3.43 g, 32.3 mmol) in 50 ml of methanol, stirred 24 hrs under nitrogen at 55° C. and evaporated. The yellow residue was subjected to column chromatography on silica gel column, eluted with gradient mixture heptanes/toluene, providing 5 g (36% yield) of the target acac complex.

Step 6

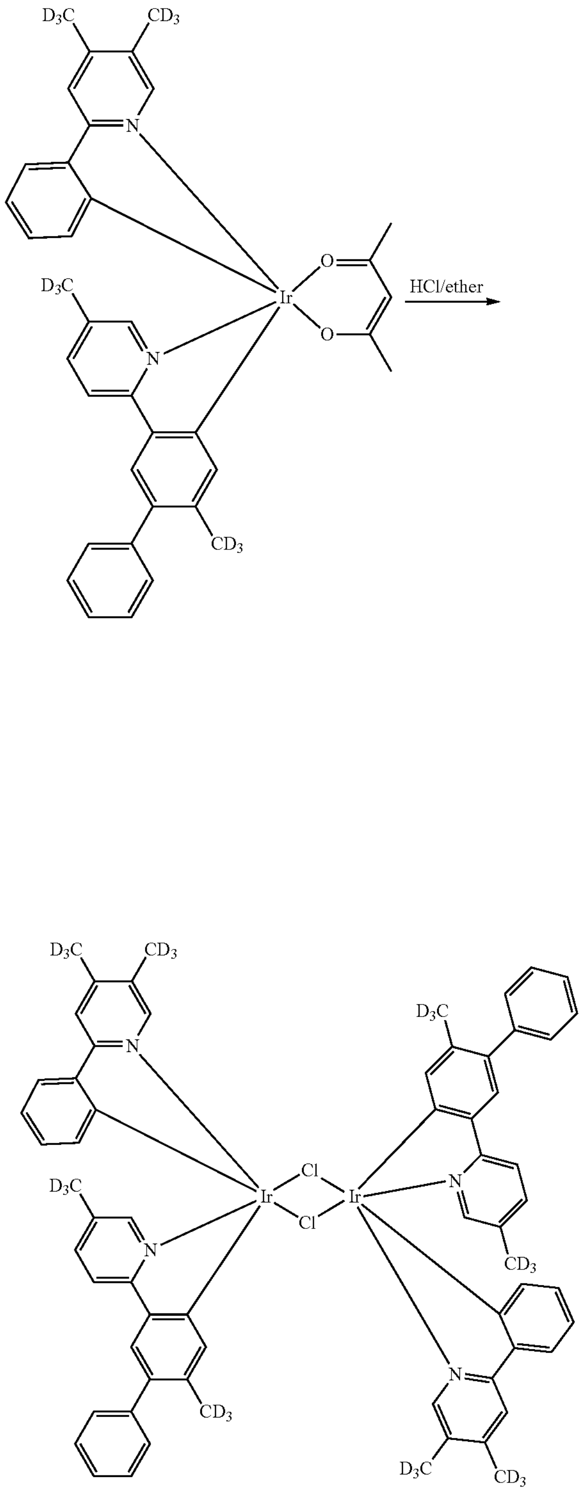

The acac complex (5 g, 6.72 mmol) was dissolved in DCM (20 mL), then HCl in ether (16.80 ml, 33.6 mmol) was added as one portion, stirred for 10 min, evaporated. The residue was triturated in methanol. The solid was filtered and washed with methanol and heptanes to obtain yellow solid (4.55 g, 100% yield).

Step 7

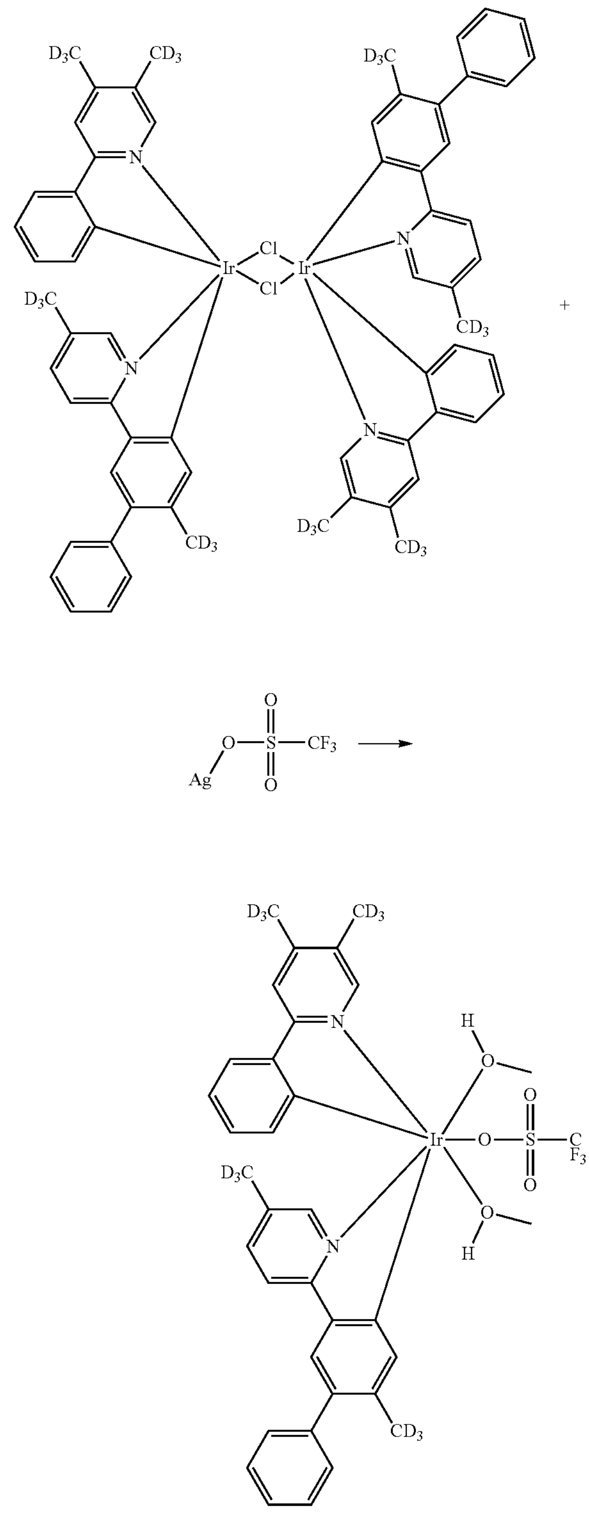

The Ir dimer (4.55 g, 3.34 mmol) and (((trifluoromethyl) sulfonyl)oxy)silver (2.062 g, 8.03 mmol) were suspended in 50 ml of DCM/methanol 1/1 (v/v) mixture and stirred over 72 hrs at room temperature, filtered through celite and evaporated, providing yellow solid (4.75 g, 83% yield).

Step 8

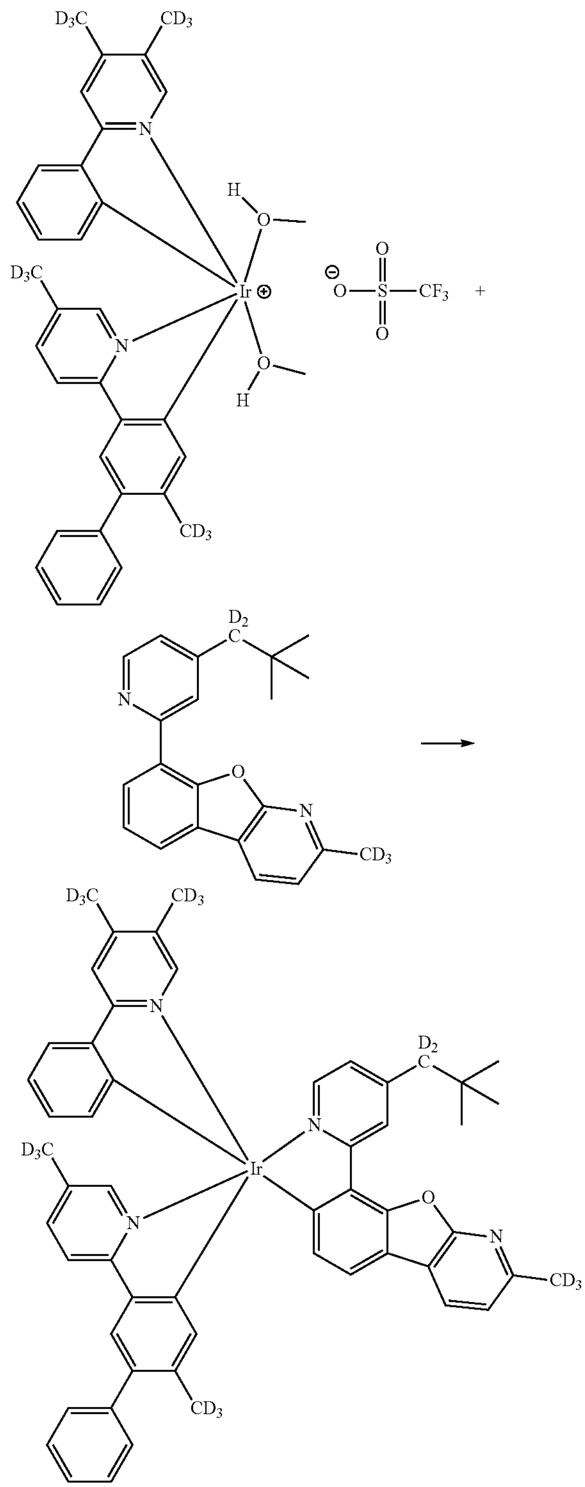

The mixture of triflic salt (3 g, 3.5 mmol) and 2-(13-methyl-d2)-8-(4-(2,2-dimethylpropyl-1,1-d2)pyridin-2-yl)benzofuro[2,3-b]pyridine (2.56 g, 7.7 mmol) in 30 mL of methanol were stirred under nitrogen at 65° C. for 5 days. Then material was cooled down, and methanol was evaporated. The residue was subjected to column chromatography on the silica gel column, eluted with 2% of ethyl acetate in toluene, providing two isomers of the product (1.7 g with high Rr and 0.7 g of complex with low Rr). Complex with low Rr is the target compound 401.

Device Examples

All example devices were fabricated by high vacuum (<$10^{-7}$ Torr) thermal evaporation. The anode electrode was 750 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication with a moisture getter incorporated inside the package. The organic stack of the device examples consisted of sequentially, from the ITO Surface: 100 Å of HAT-CN as the hole injection layer (HIL); 450 Å of HTM as a hole transporting layer (HTL); emissive layer (EML) with thickness 400 Å. Emissive layer containing H-host (H1): E-host (H2) in 6:4 ratio and 12 weight % of green emitter. 350 Å of Liq (8-hydroxyquinoline lithium) doped with 40% of ETM as the ETL. Device structure is shown in the table 1. Table 1 shows the schematic device structure. The chemical structures of the device materials are shown below.

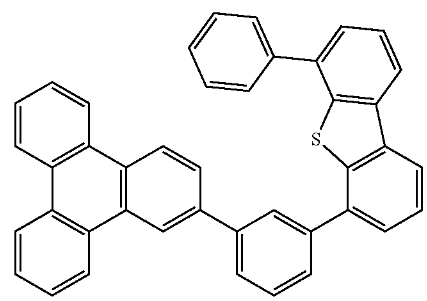

H1

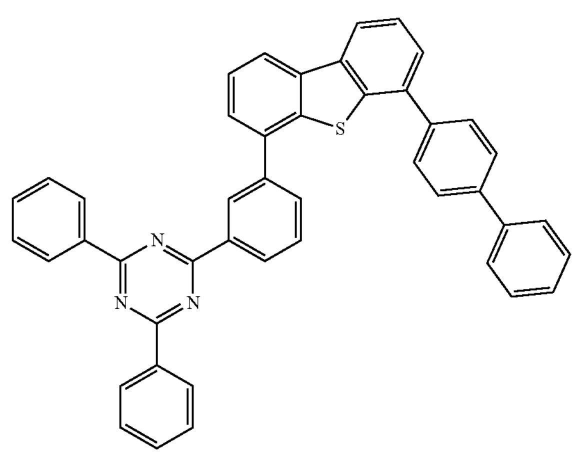

H2

-continued
Compound 437
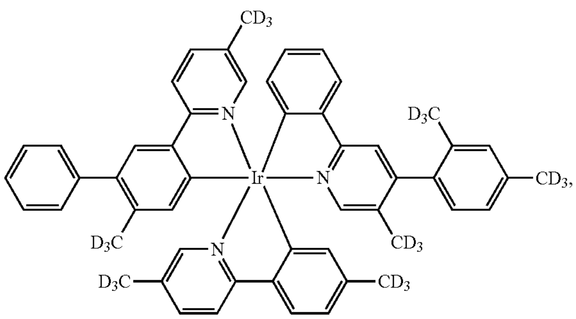
Compound 438
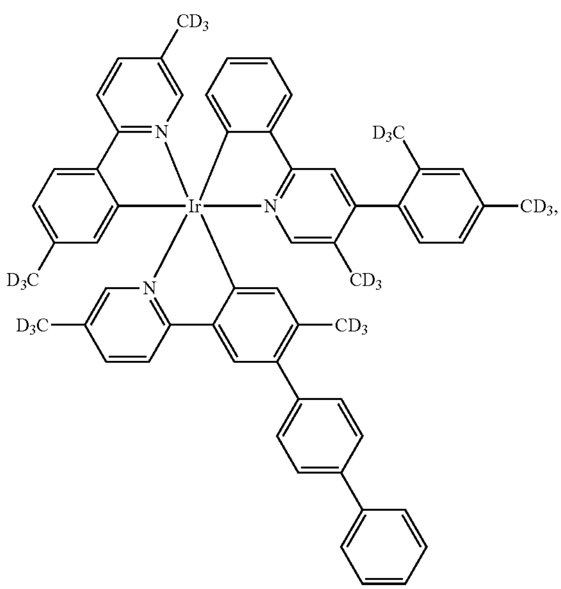
Comparative example
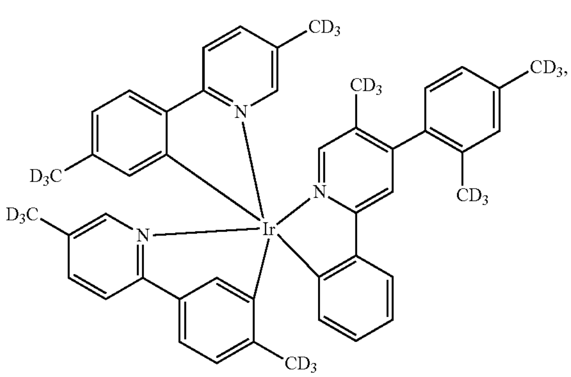
-continued
CC-1
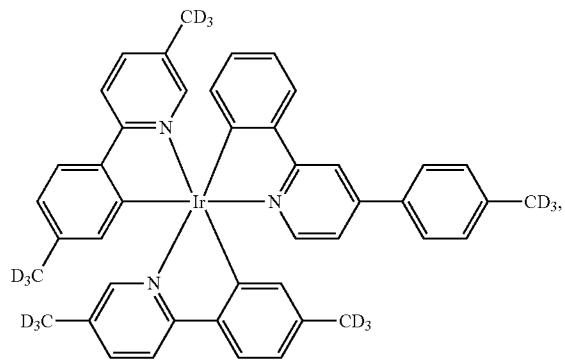
CC-2
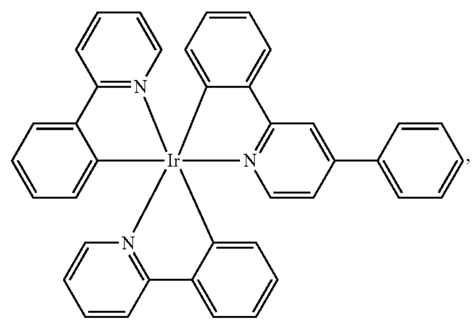
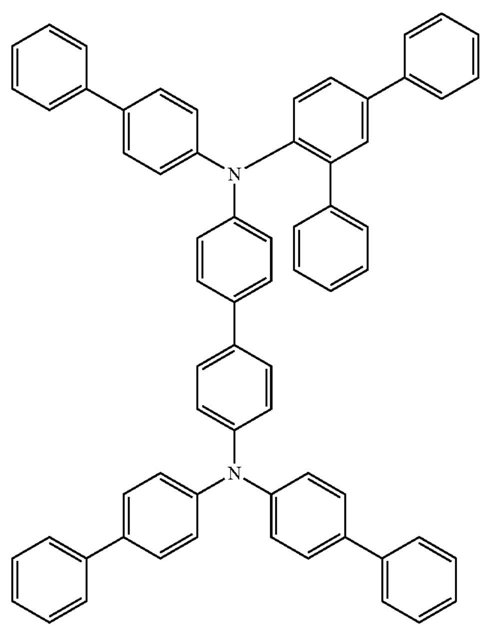
HTM -continued

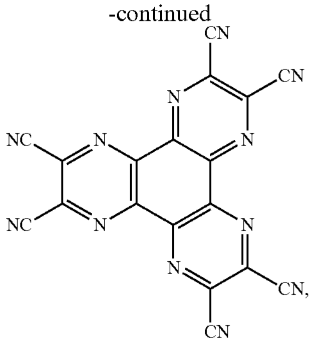

HATCN

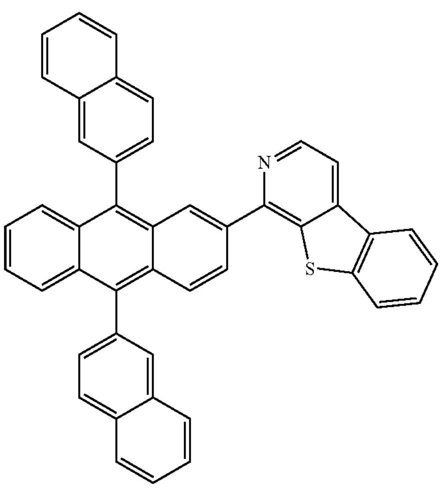

ETM

-continued

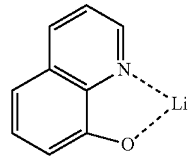

Liq

Upon fabrication the devices have been measured for EL, JVL, and lifetime tested at DC 80 mA/cm$^2$. Device performance is shown in Table 3, voltage, LE, EQE, PE, and $LT_{97\%}$ are all normalized to the comparative compound.

TABLE 2

| schematic device structure | | |
|---|---|---|
| Layer | Material | Thickness [Å] |
| Anode | ITO | 800 |
| HIL | HAT-CN | 100 |
| HTL | HTM | 450 |
| Green EML | H1:H2: example dopant | 400 |
| ETL | Liq:ETM 40% | 350 |
| EIL | Liq | 10 |
| Cathode | Al | 1,000 |

TABLE 3

| Device performance | | | | | | | | | | |
|---|---|---|---|---|---|---|---|---|---|---|
| | 1931 CIE | | | | At 10 mA/cm$^2$ | | | | at 80 mA/cm$^2$* | |
| Emitter [12%] | x | y | λ max [nm] | FWHM [nm] | Voltage [rel] | LE [rel] | EQE [rel] | PE [rel] | $L_0$ [nits] | $LT_{97\%}$ [rel] |
| Comparative example | 0.319 | 0.624 | 521 | 73 | 1.00 | 1.00 | 1.00 | 1.00 | 46,497 | 1.00 |
| Compound 438 | 0.315 | 0.628 | 519 | 71 | 1.02 | 1.04 | 1.03 | 1.02 | 46,542 | 1.70 |
| Compound 437 | 0.313 | 0.628 | 518 | 71 | 0.99 | 1.12 | 1.12 | 1.14 | 51,738 | 3.00 |

Comparing compounds 437 and 438 with the comparative example; the efficiency of both compound 437 and 438 are higher than the comparative example. Presumably compound 437 and compound 438 have higher horizontal emitting dipole orientation than the comparative example. Elongated and planar substituents with high electrostatic potential enlarge the interacting surface region between Ir complex and host molecules, resulting in stacking Ir complexes parallel to the film surface and increasing the out coupling efficiency. Moreover, the $LT_{97}$%~ at 80 mA/cm$^2$ of both compound 437 and compound 438 is greater than that of the comparative example, indicating that the elongated substituents not only increase the efficiency but also increase the stability of the complexes in device.

Provided in Table 4 below is a summary of the device data recorded at 9000 nits for the device examples, the EQE value is normalized to Device C-2.

TABLE 4

| Device ID | Dopant | Color | EQE (%) |
|---|---|---|---|
| Device 3 | Compound 161 | Yellow | 1.24 |
| Device C-1 | CC-1 | Yellow | 1.10 |
| Device C-2 | CC-2 | Yellow | 1.00 |

The data in Table 4 show that the device using the inventive compound as the emitter achieves the same color but higher efficiency in comparison with the comparative examples. It is noted that the only difference between the inventive compound and the comparative compound (CC-1) is that the inventive compound has a phenyl moiety replacing one of the protons in the comparative compounds, which increases the distance between the terminal atoms in one direction across the Ir metal center. The device results show that the larger aspect ratio of the emitter molecule seems to be critical in achieving higher device efficiency.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

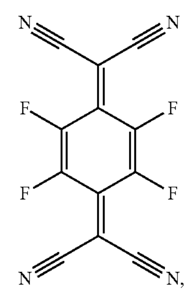

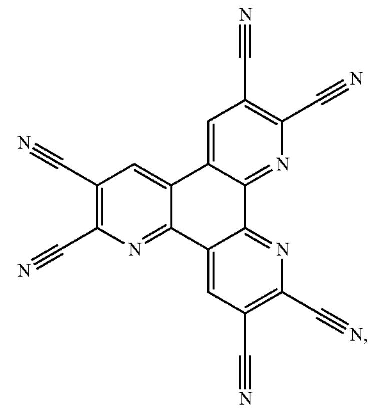

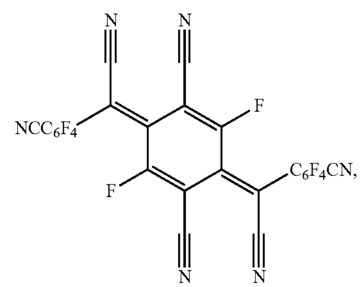

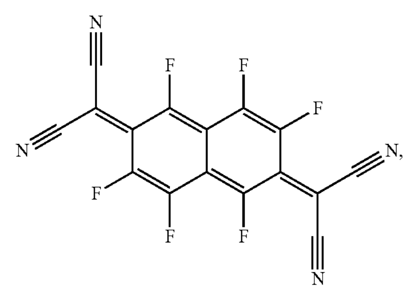

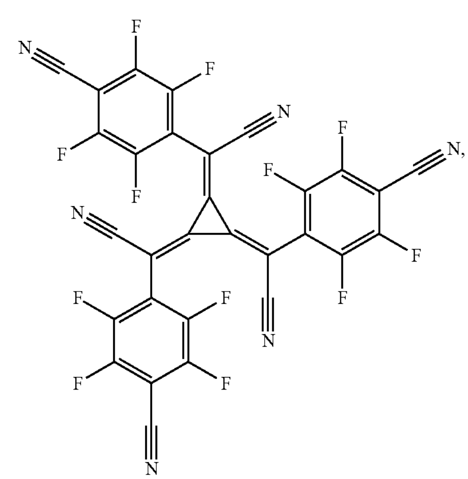

-continued

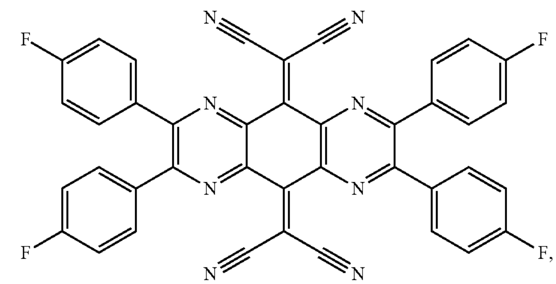

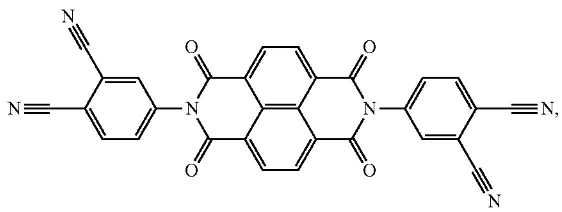

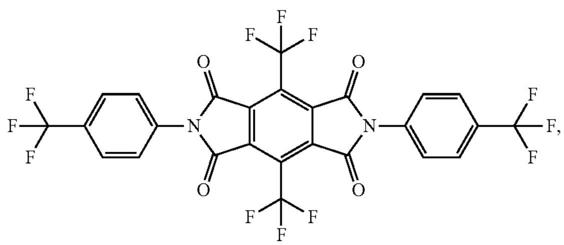

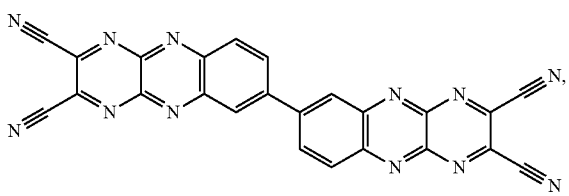

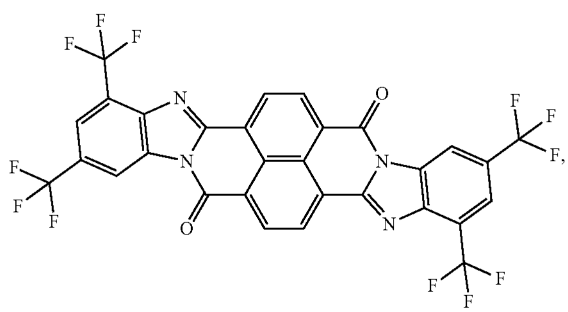

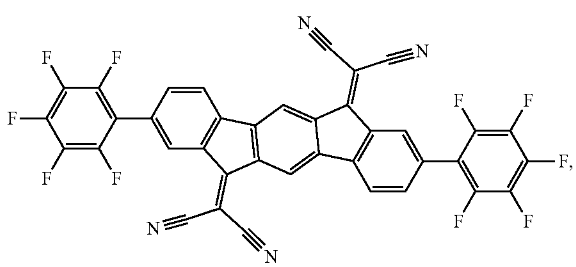

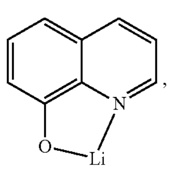

, and

-continued

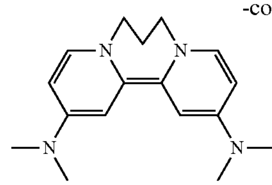

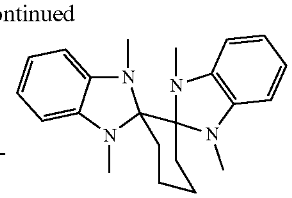

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

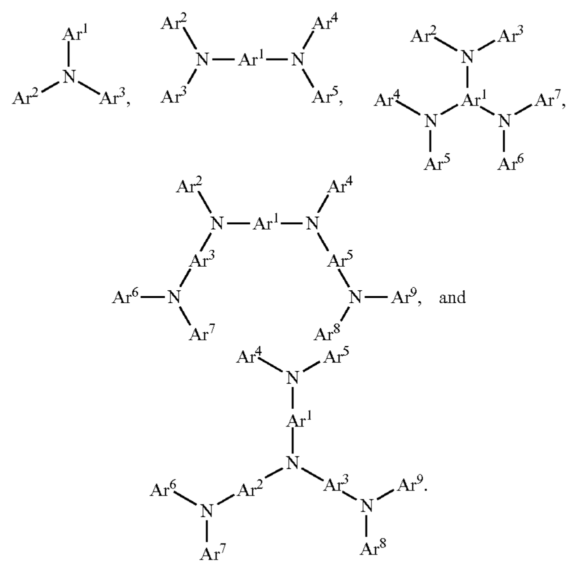

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

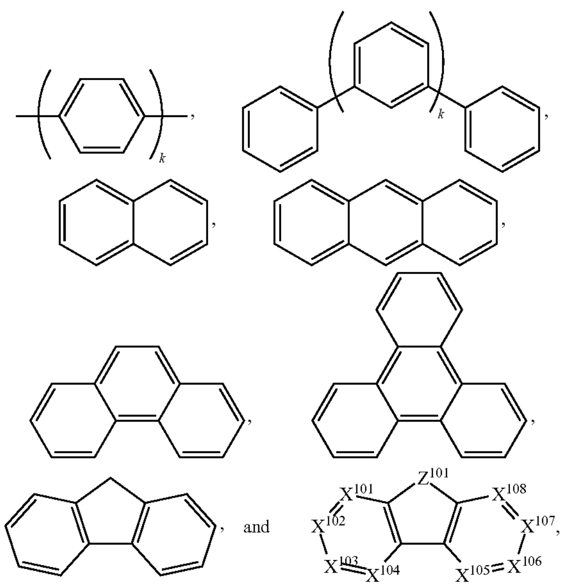

wherein k is an integer from 1 to 20; $X^{101}$ to $X^{108}$ is C (including CH) or N; $Z^{101}$ is $NAr^1$, O, or S; $Ar^1$ has the same group defined above.

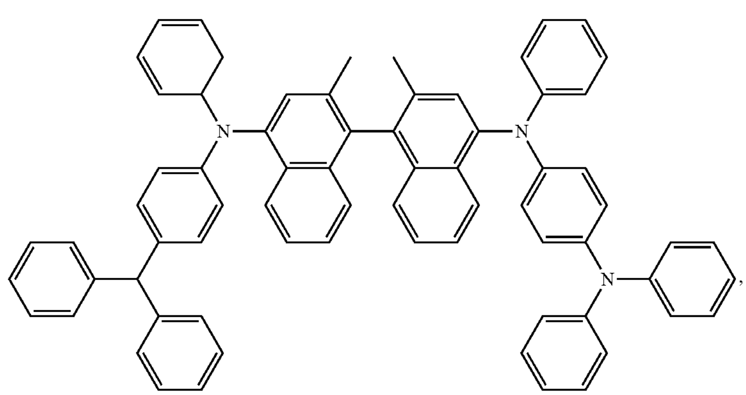

Examples of metal complexes used in HIL or HTL include, but are not limited to the following general formula:

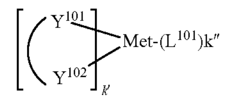

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

-continued
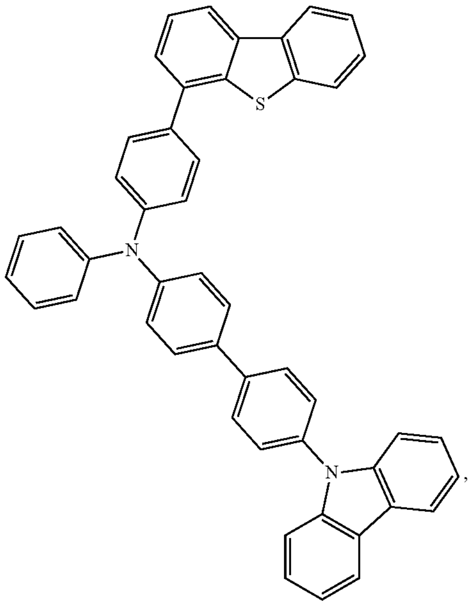
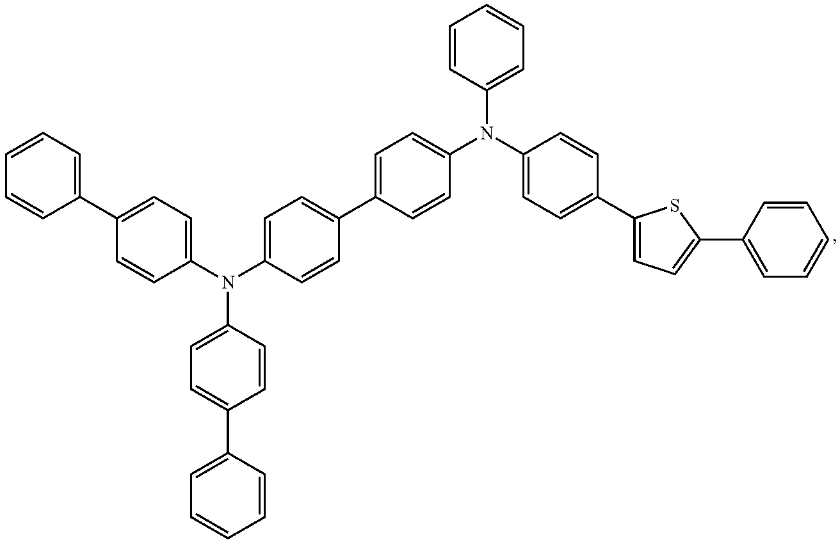
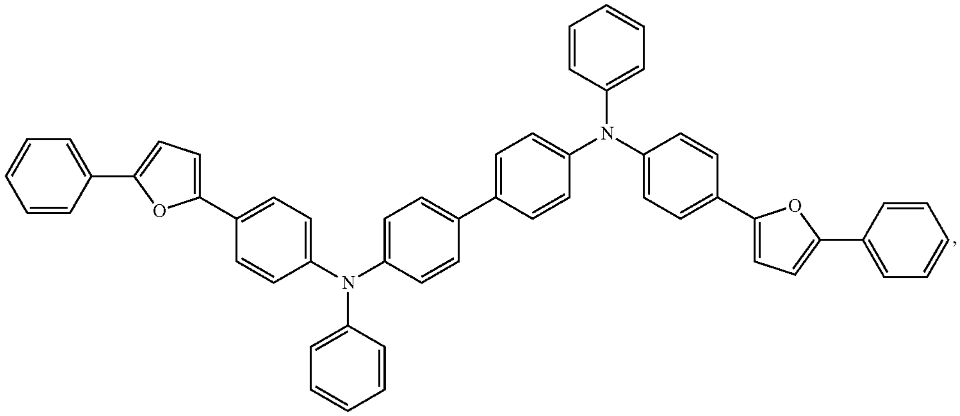

-continued
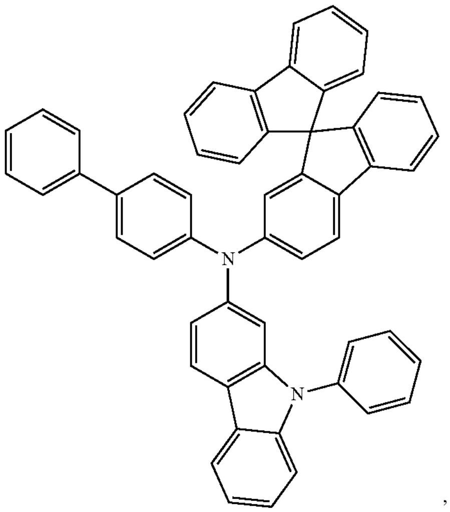
,
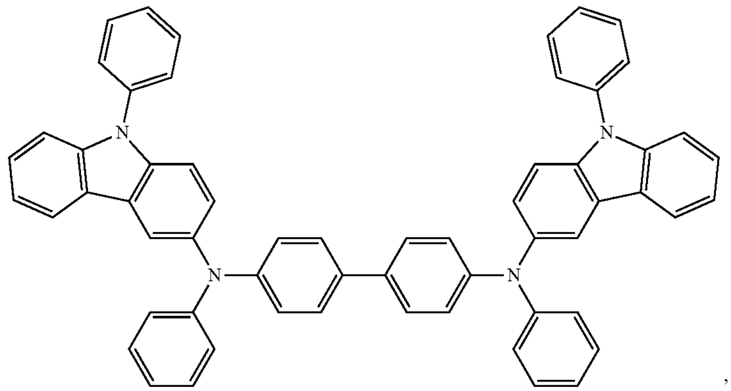
,
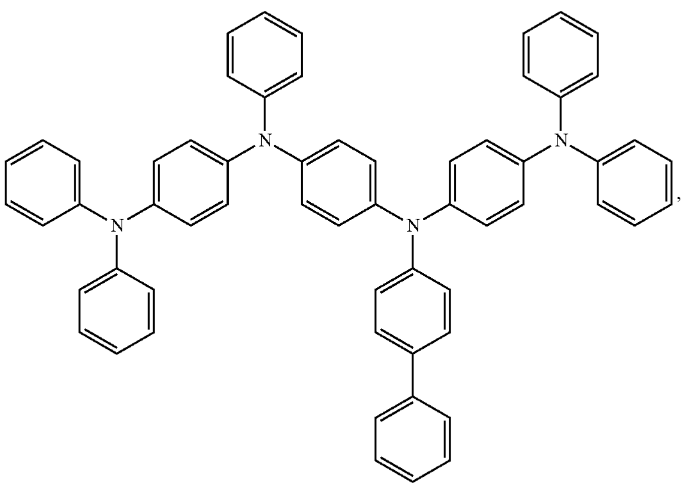
,
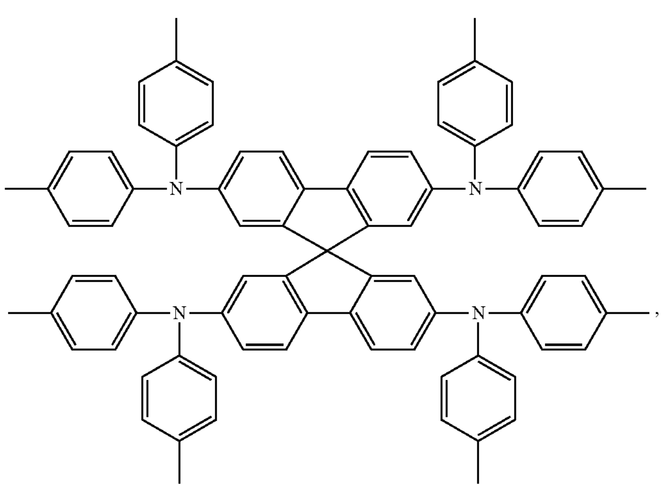
,

-continued
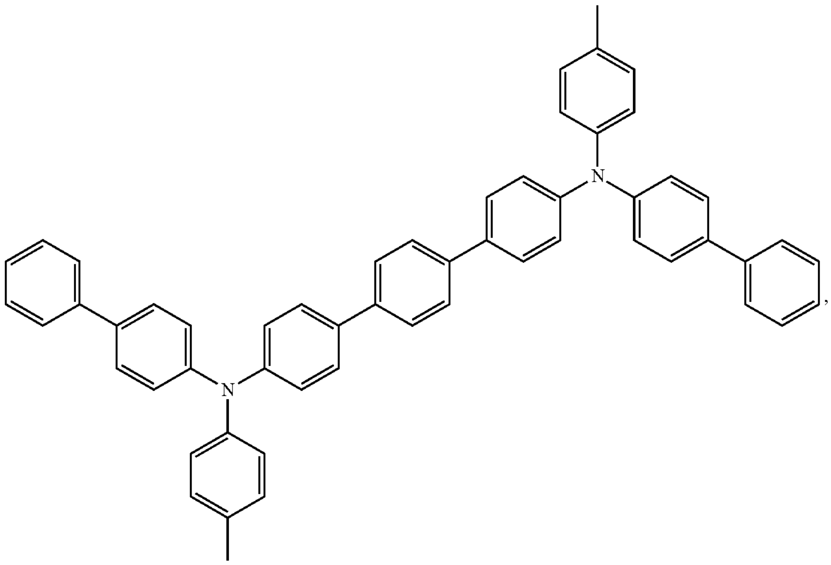
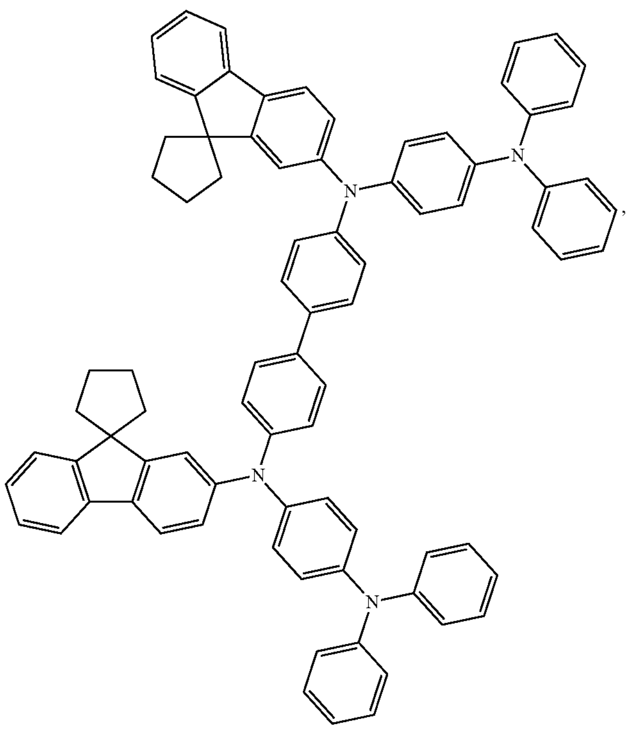
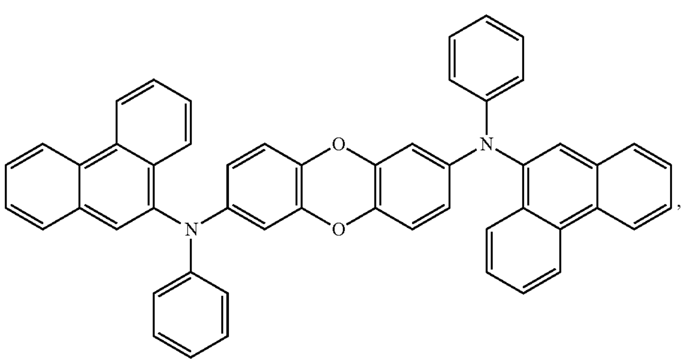

-continued
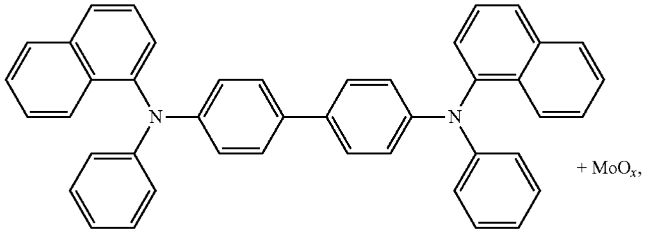
+ $MoO_x$,
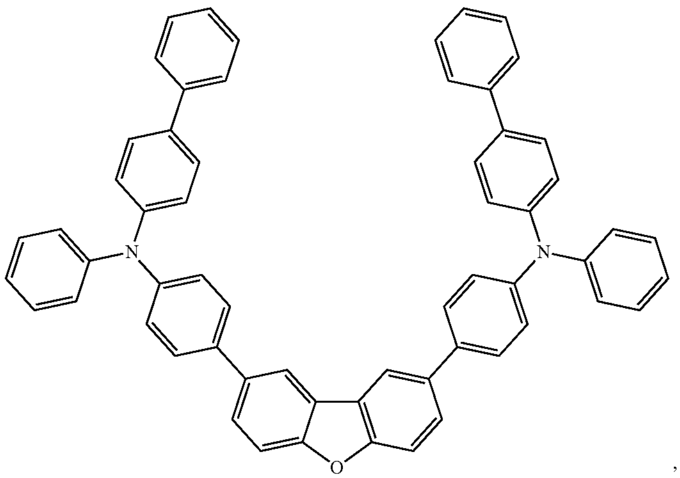
,
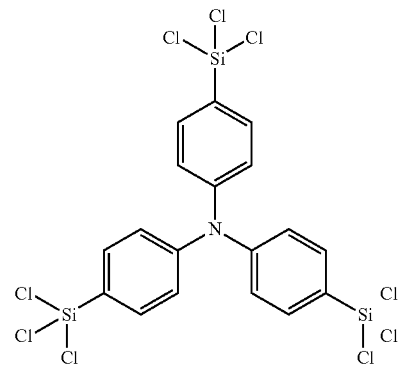
,
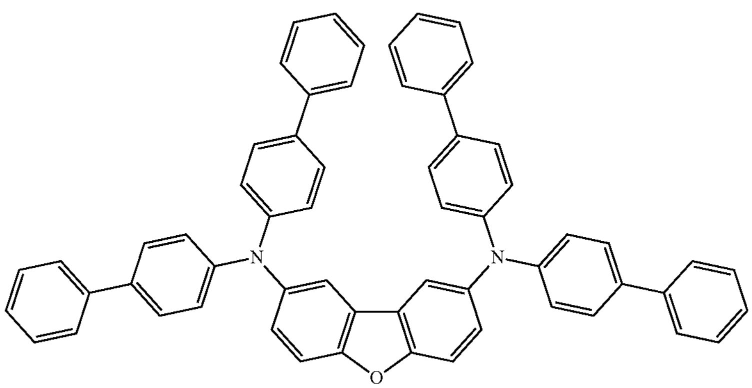
,
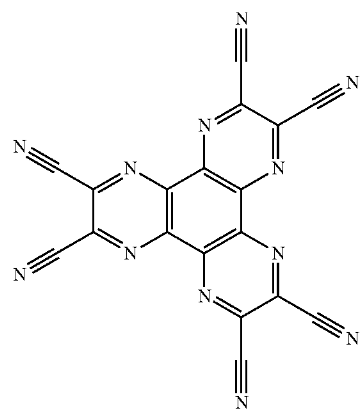
,
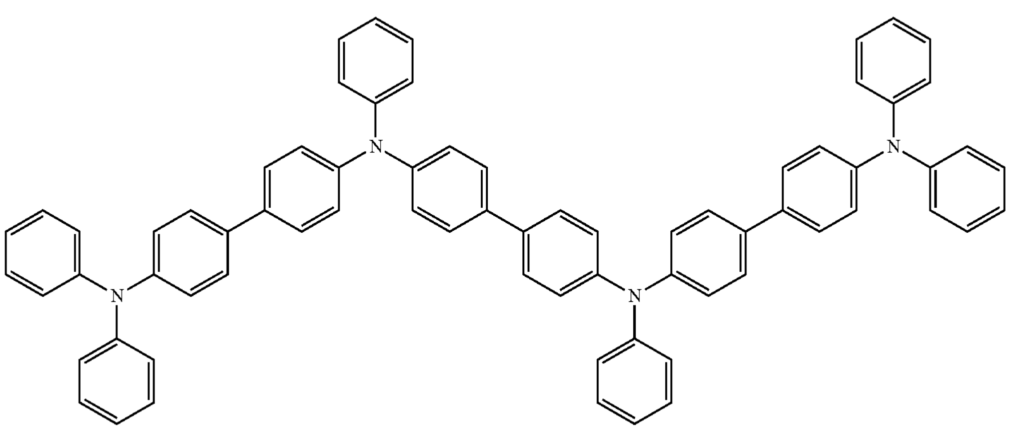
, -continued
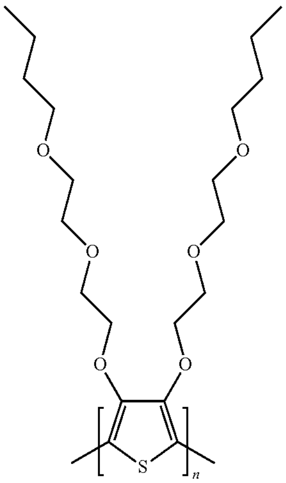
,
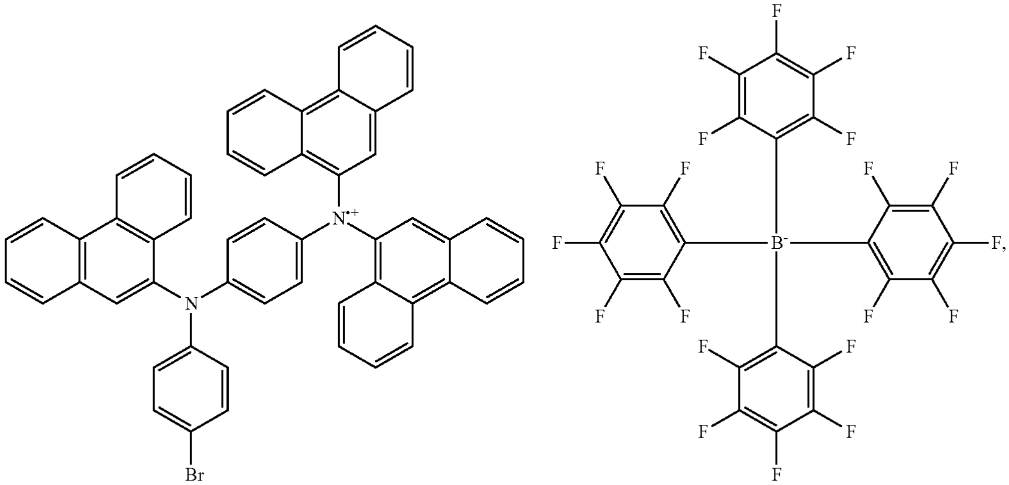
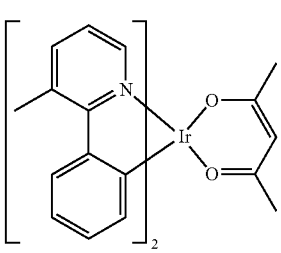
,
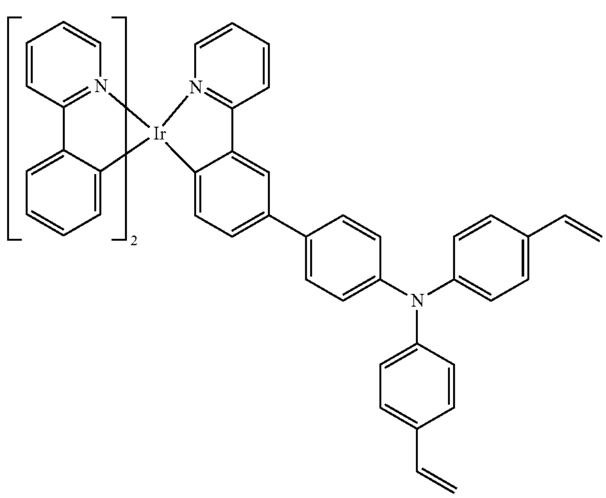
, -continued
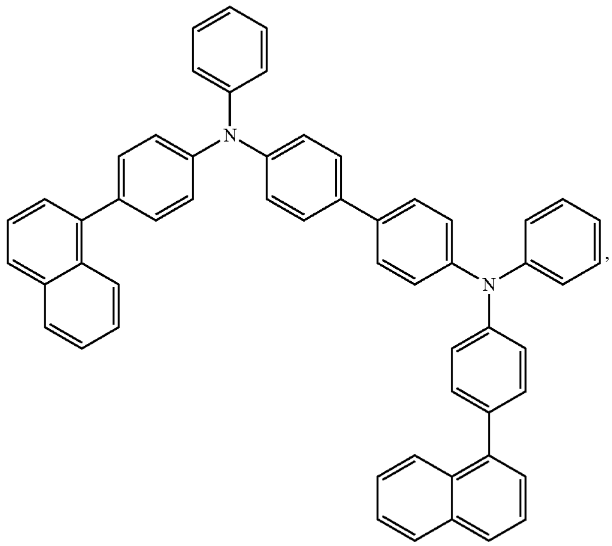
,
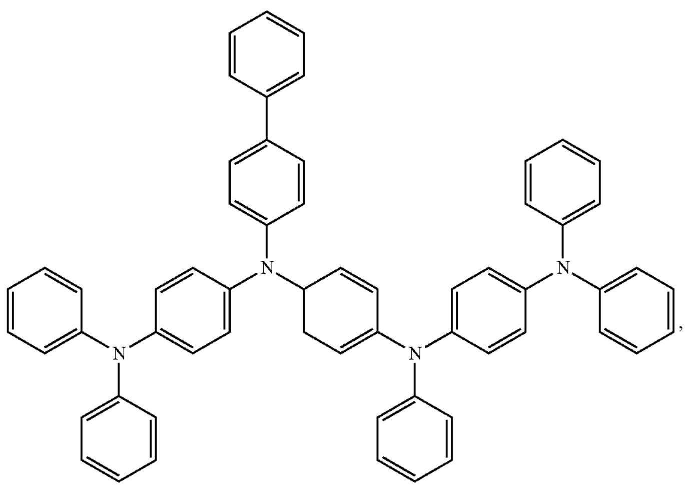
,
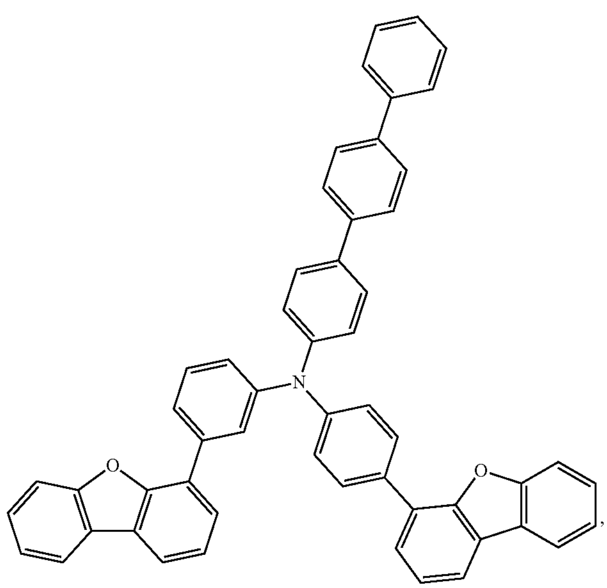
, -continued
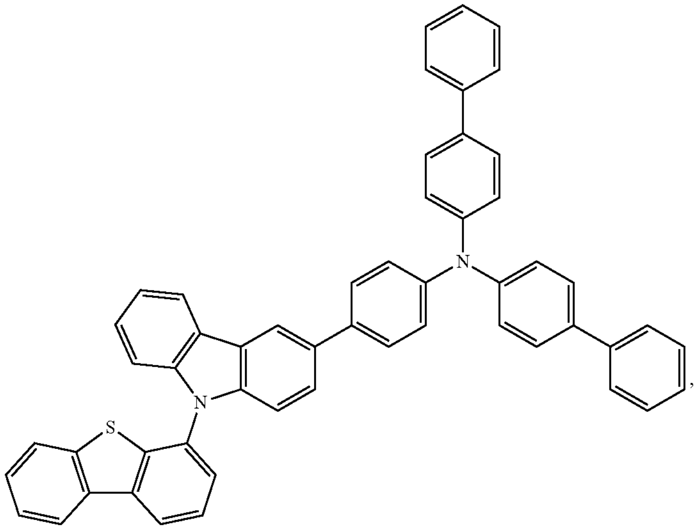
,
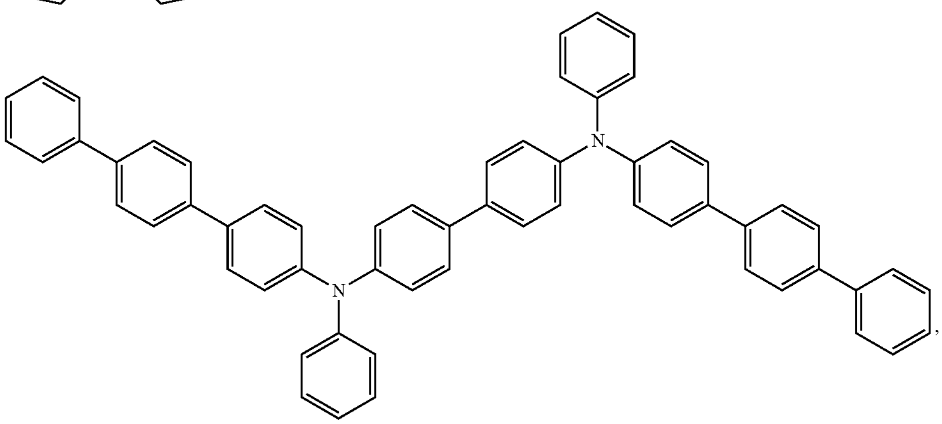
,
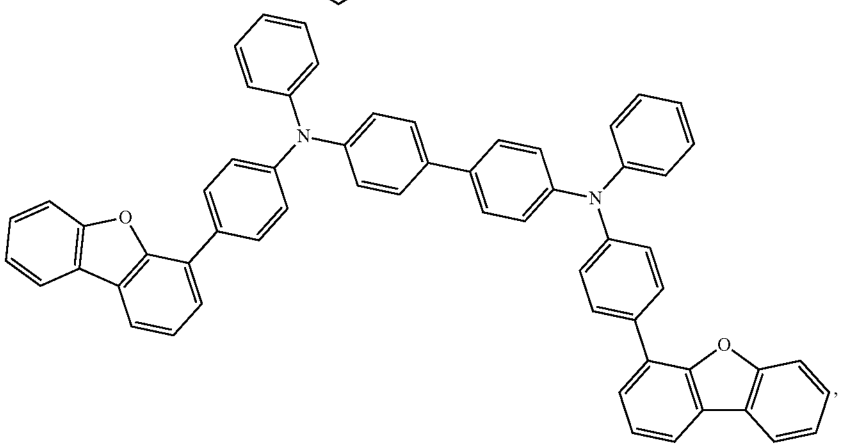
,
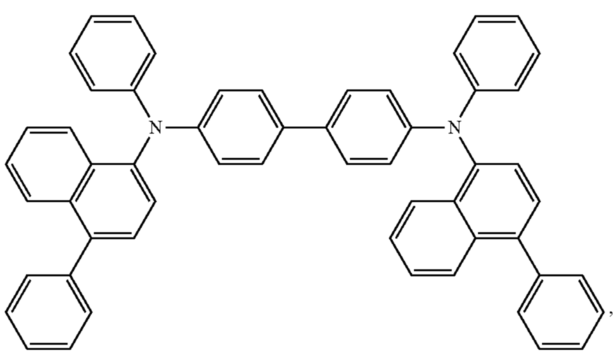
, -continued
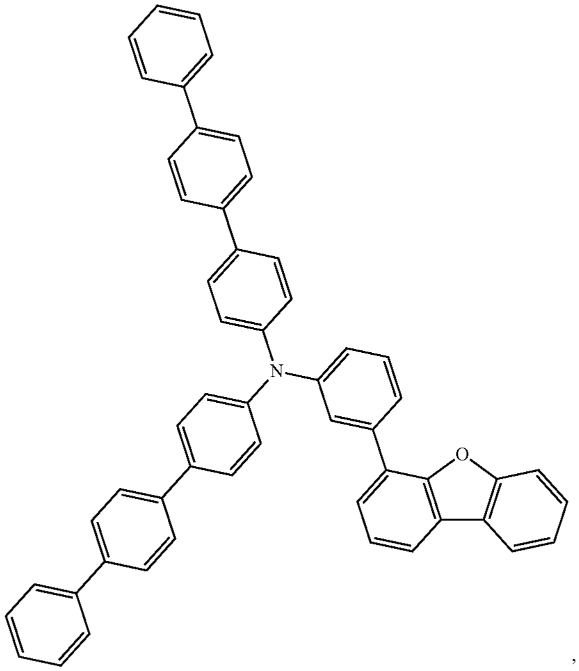
,
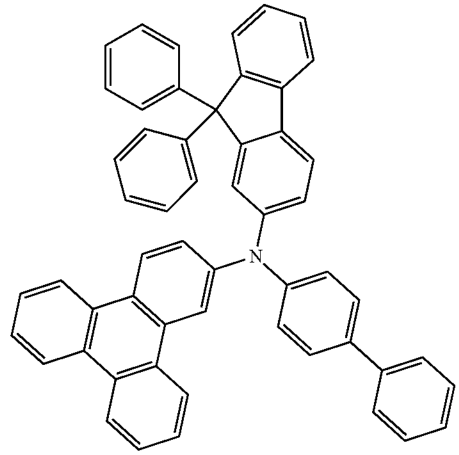
,
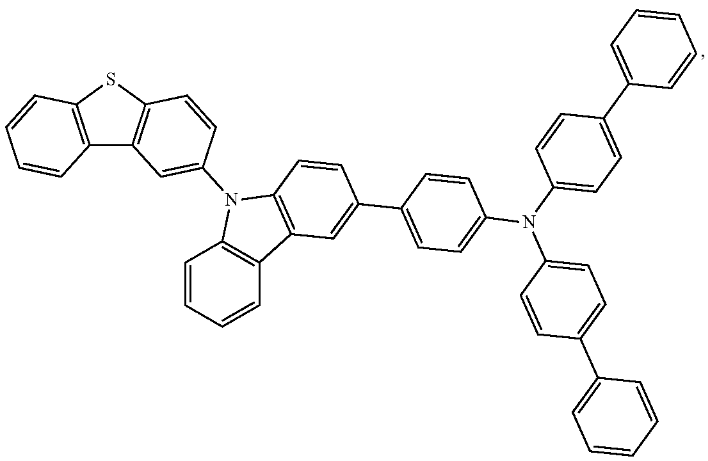
,
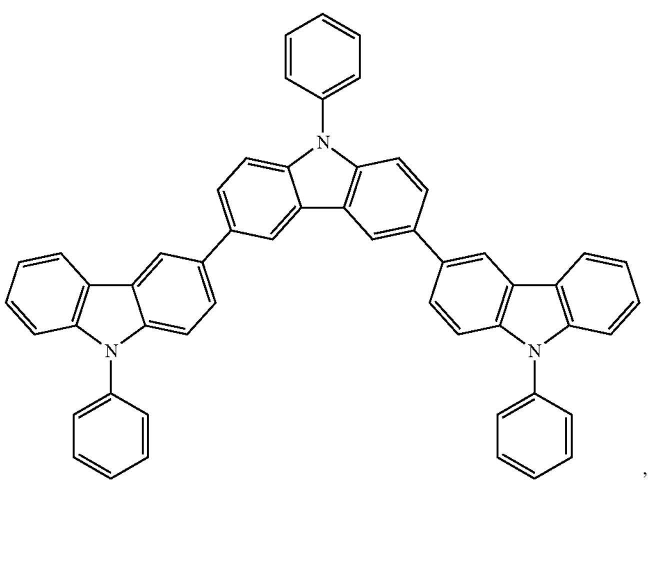
,
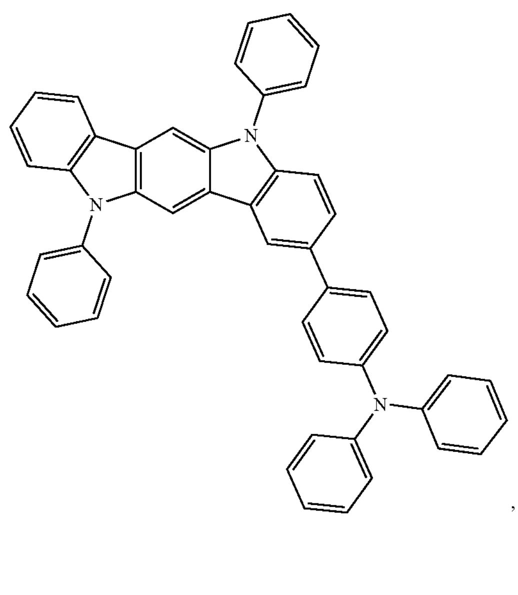
, -continued
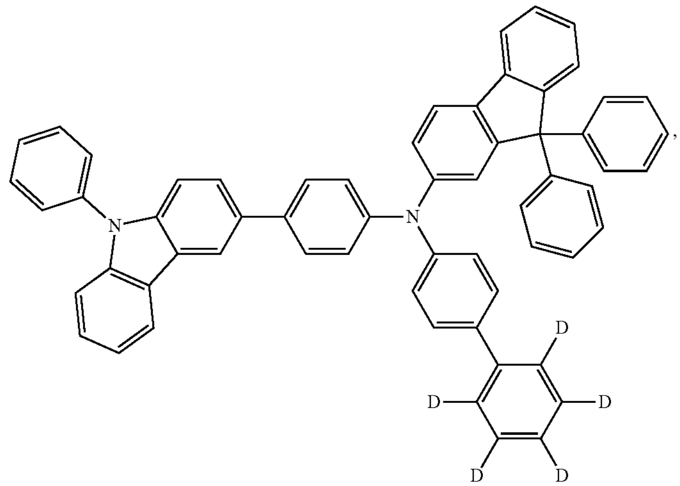
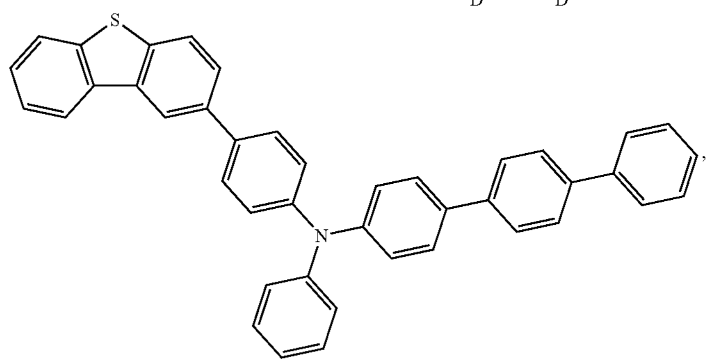
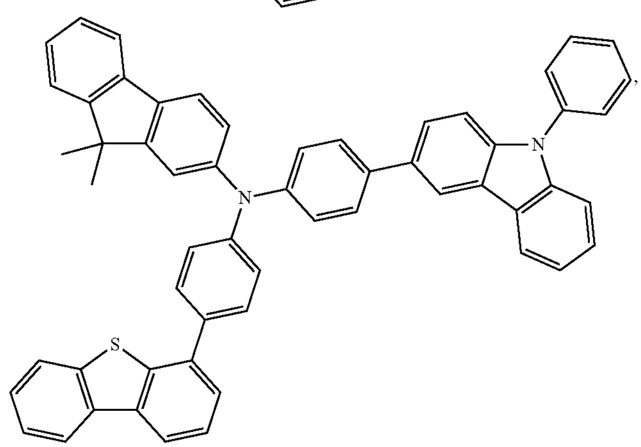
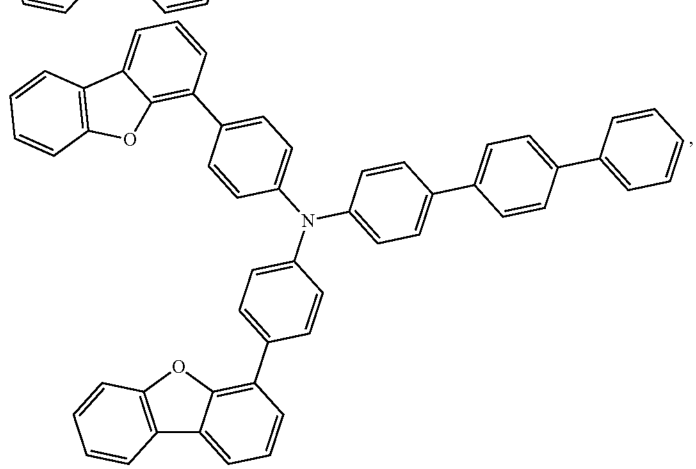

-continued
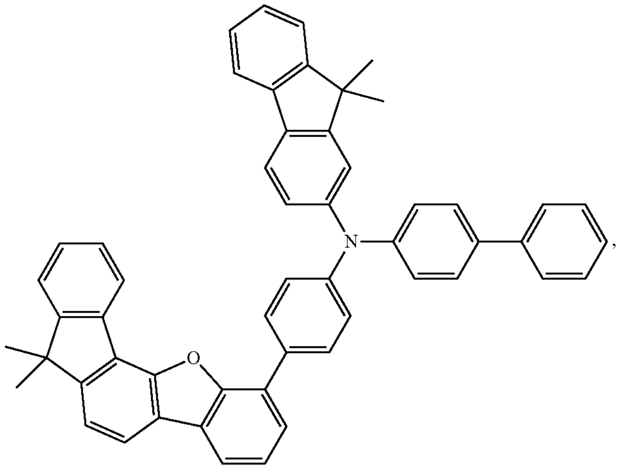
,
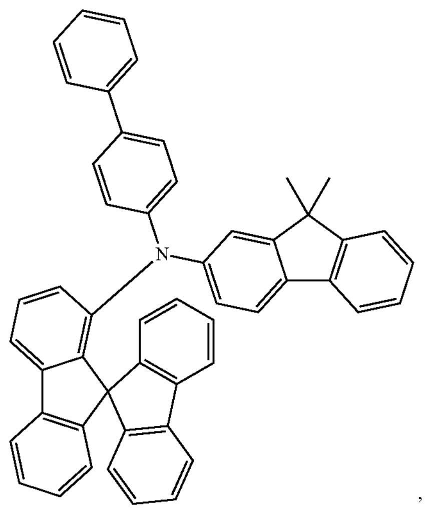
,
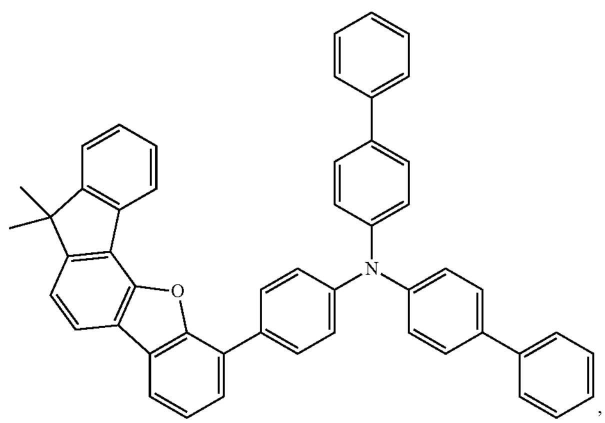
,
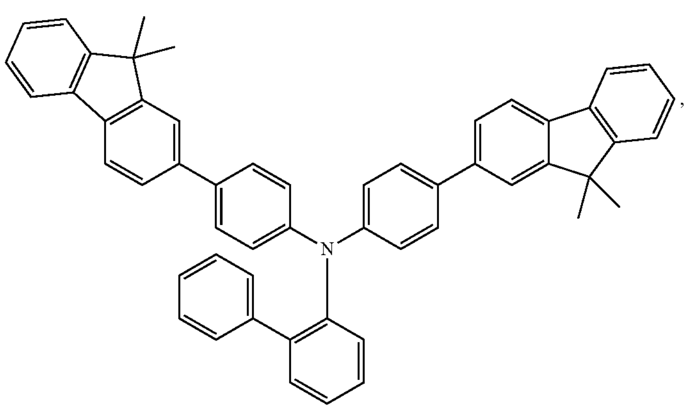
,

-continued
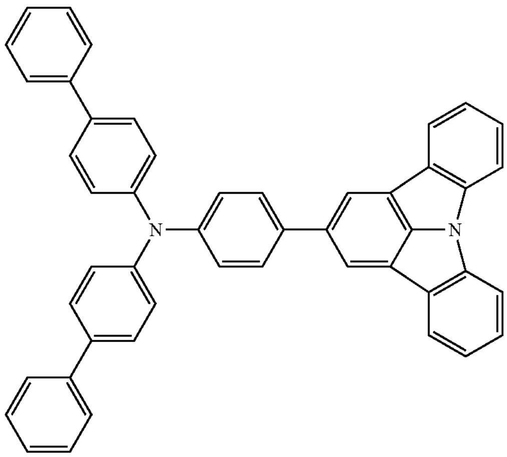
,
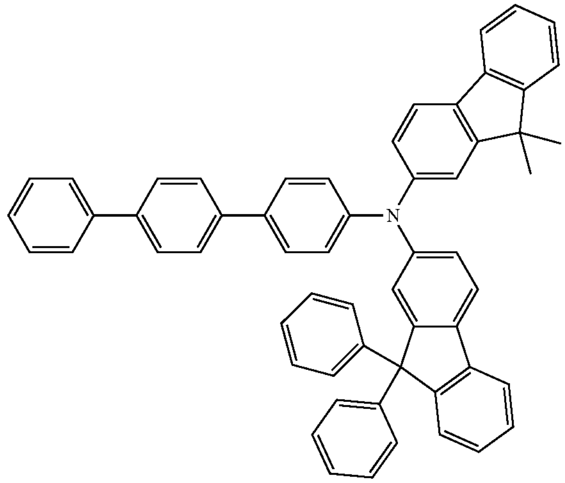
,
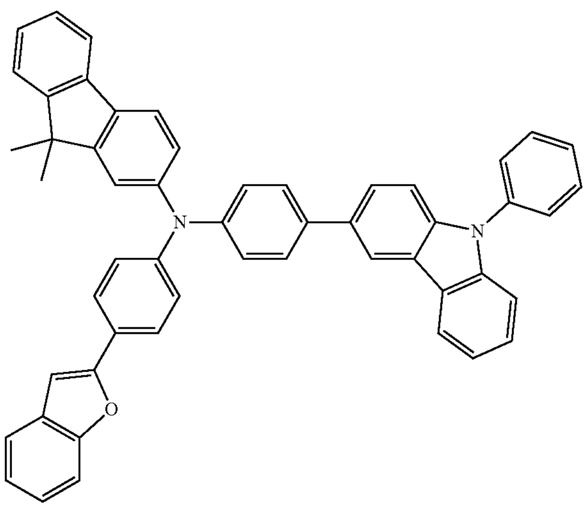
,
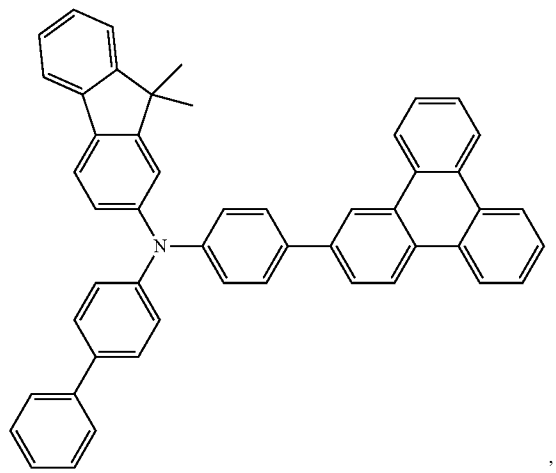
,
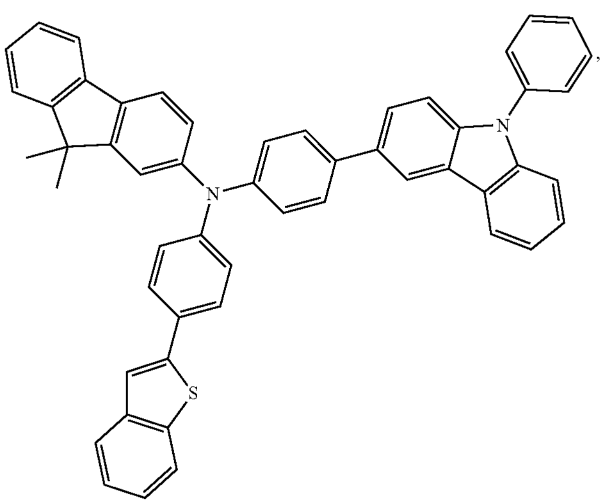
, -continued
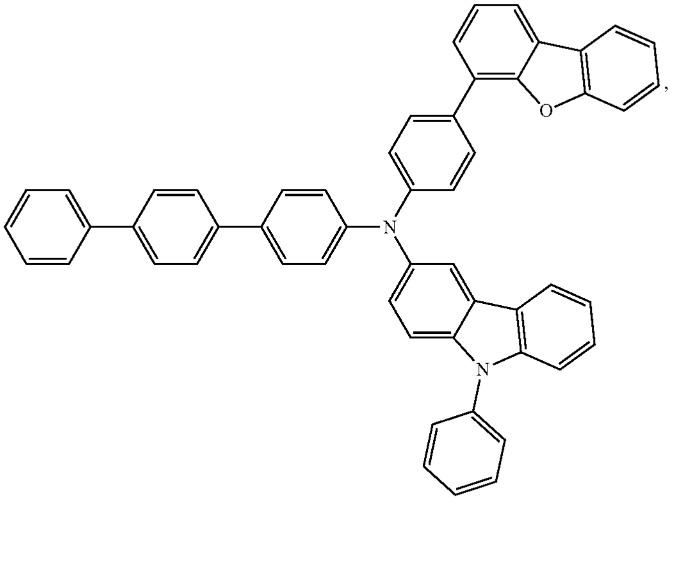
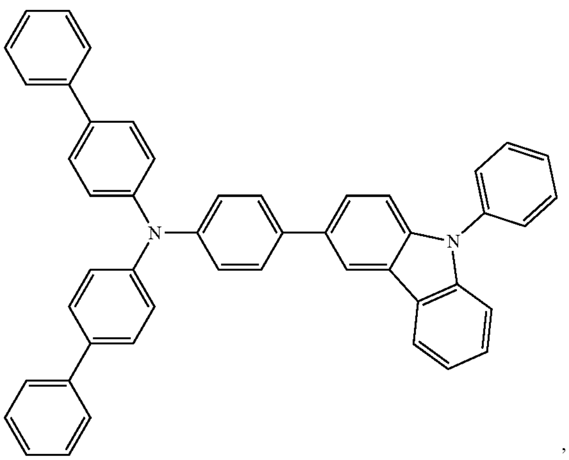
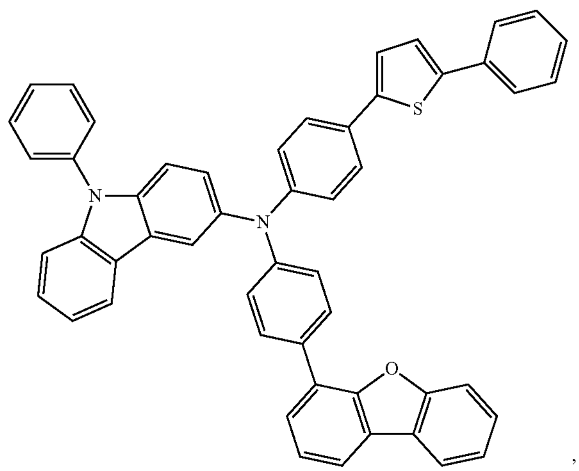
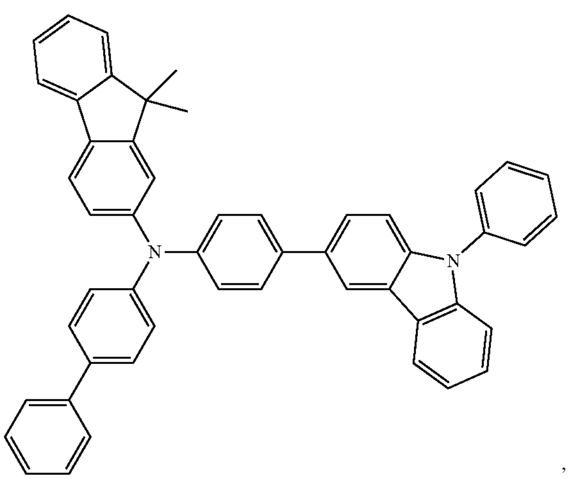
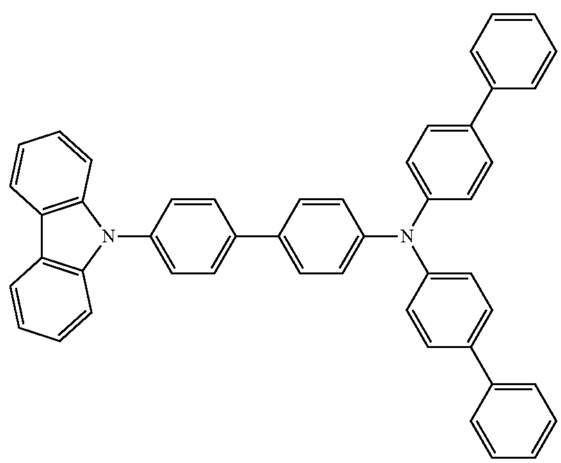

-continued
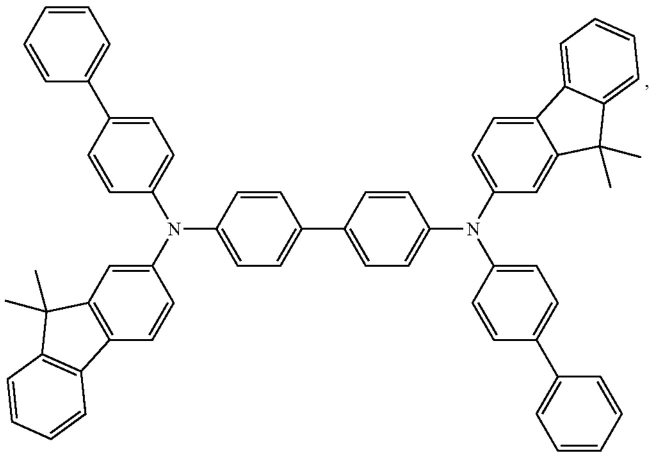
,
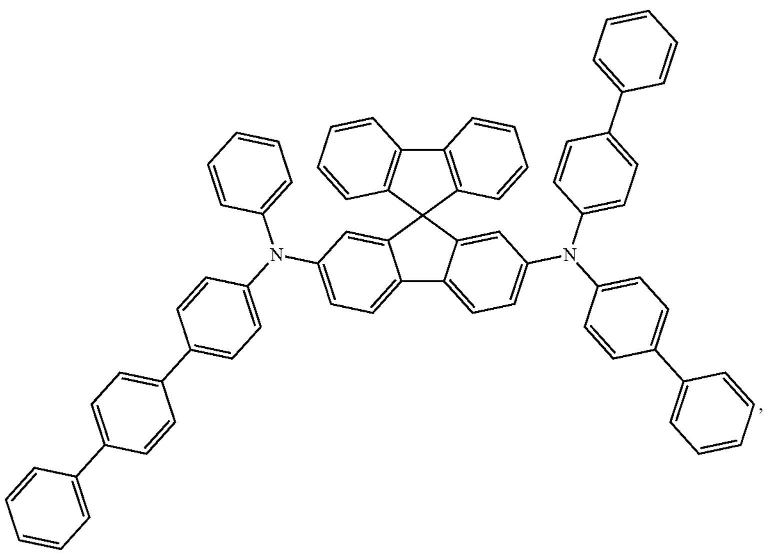
,
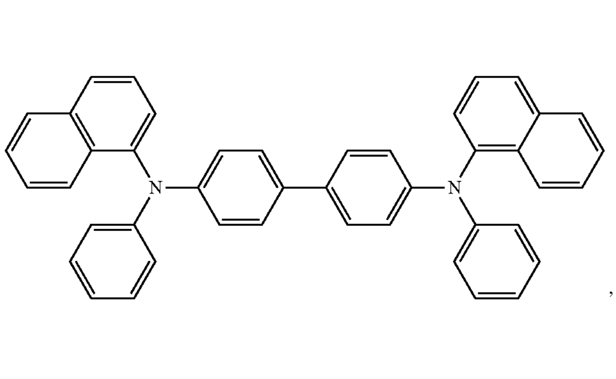
,
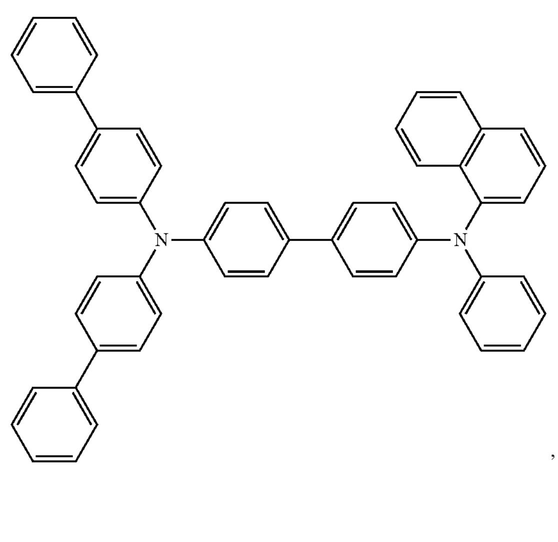
,

-continued
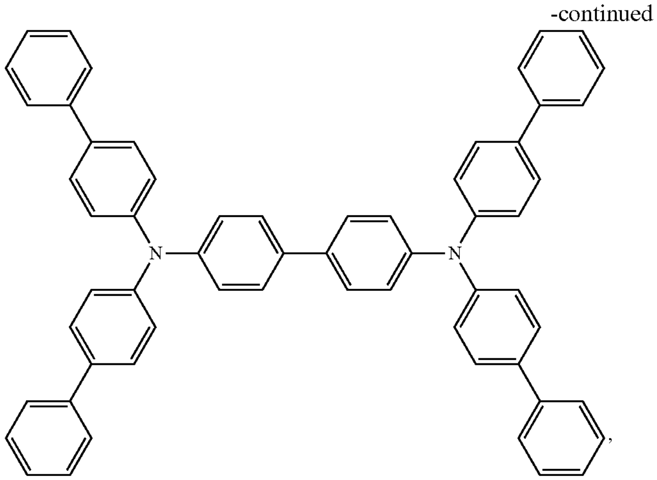
,
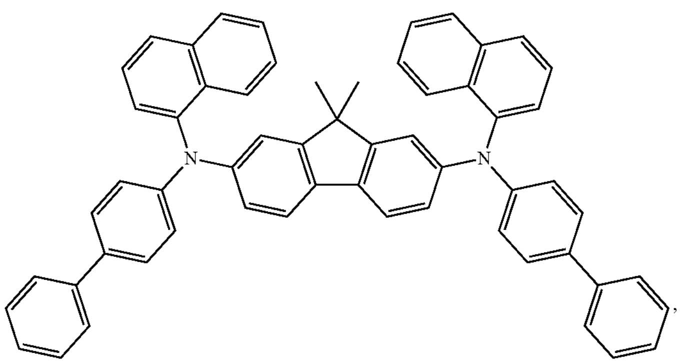
,
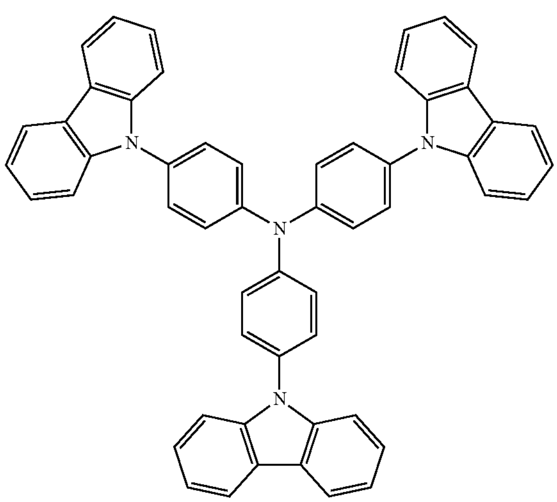
,
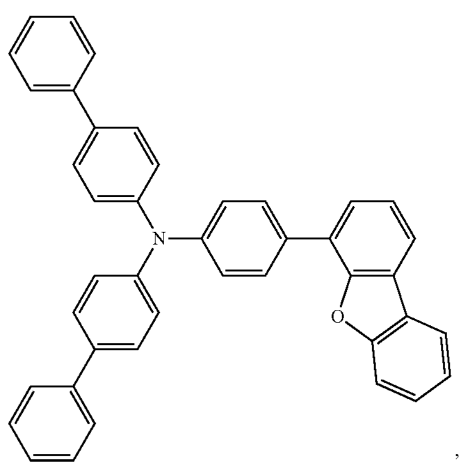
,

-continued

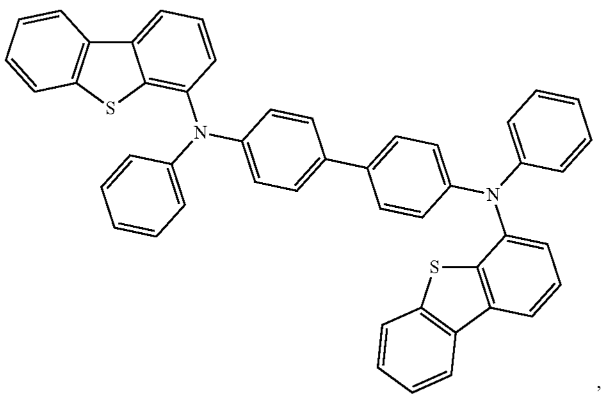

,

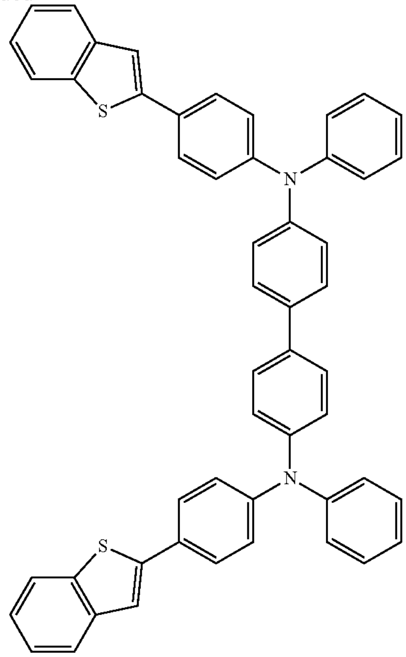

, and

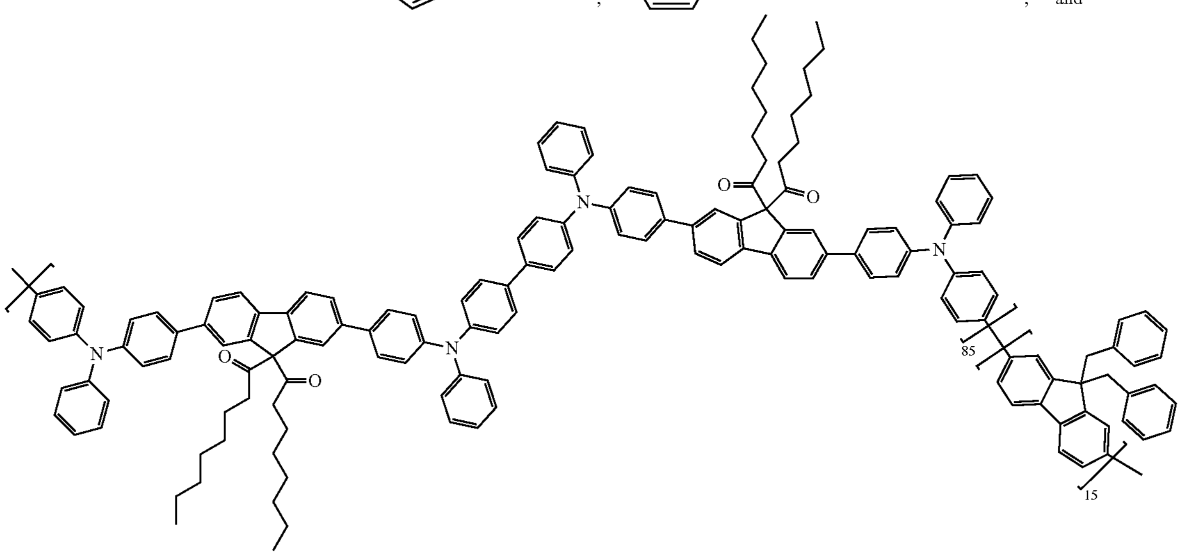

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

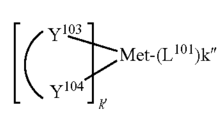

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

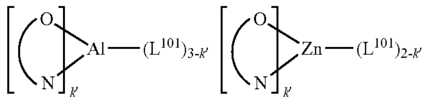

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

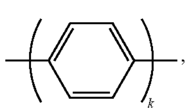

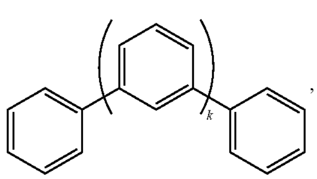

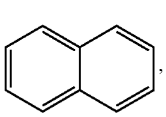

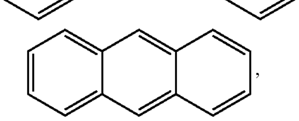

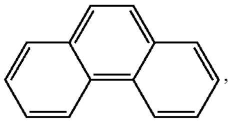

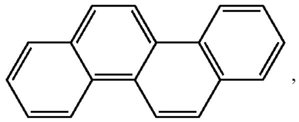

-continued

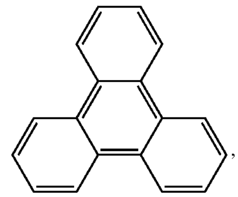

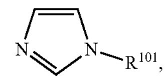

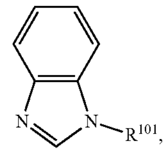

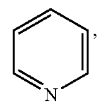

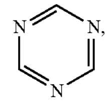

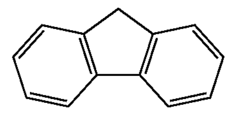

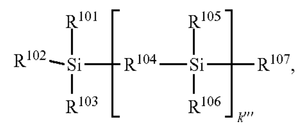

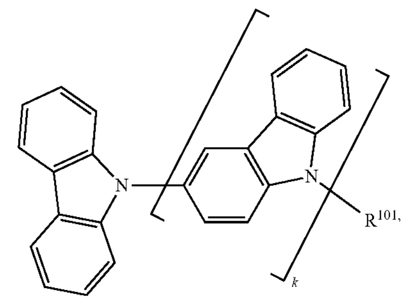

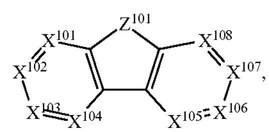

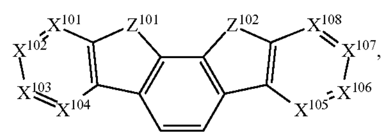

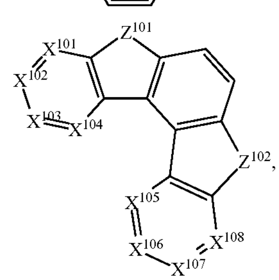

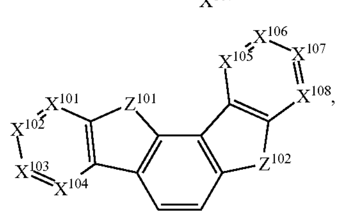

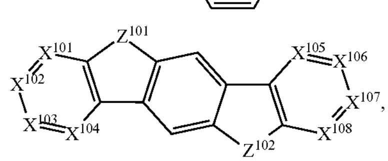

and

-continued

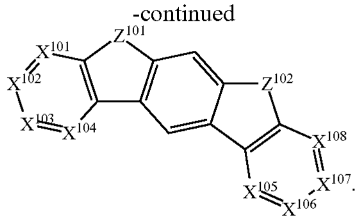

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

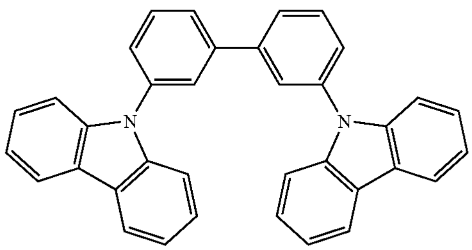

,

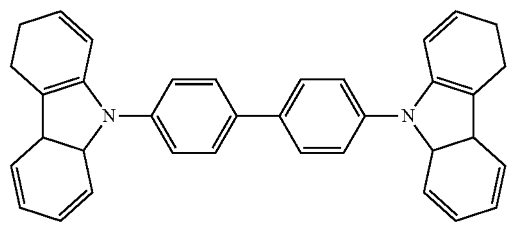

,

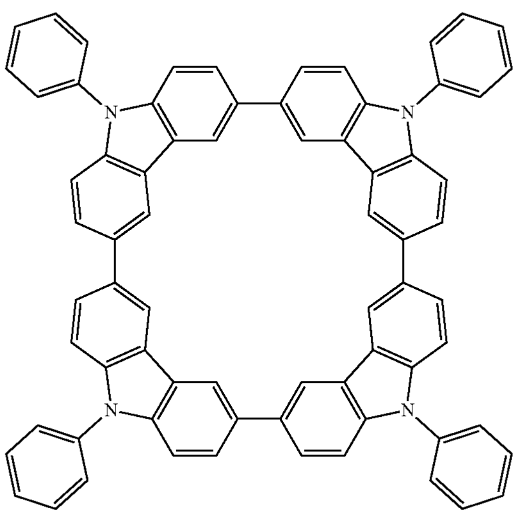

,

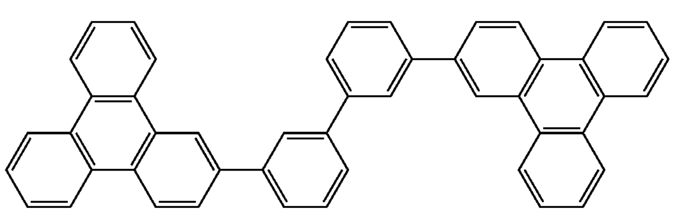

,

-continued
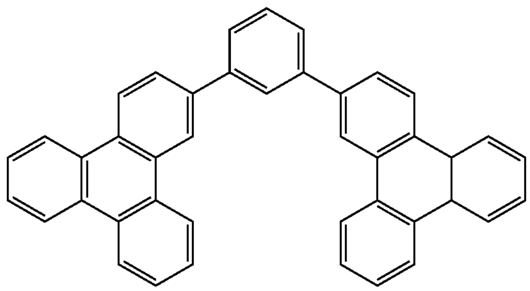
,
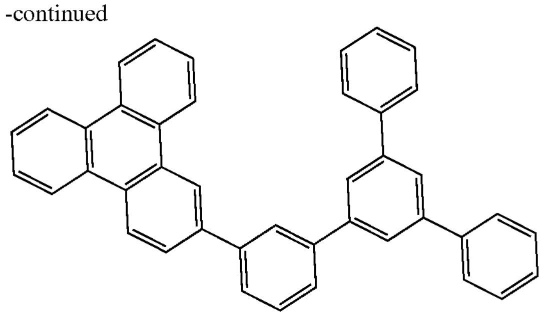
,
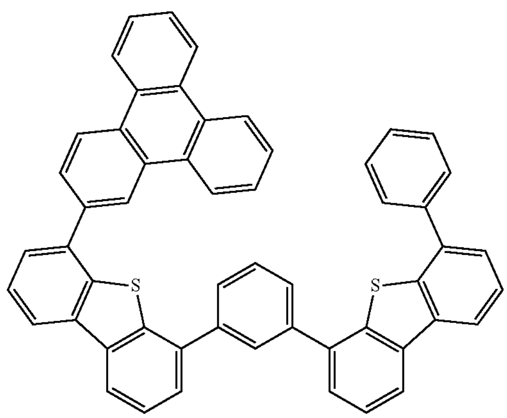
,
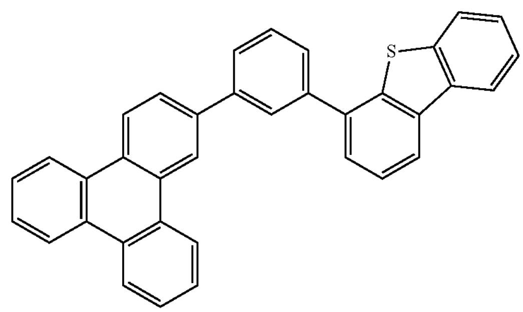
,
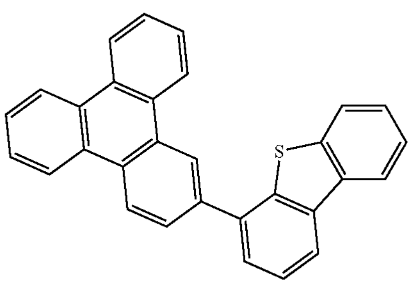
,
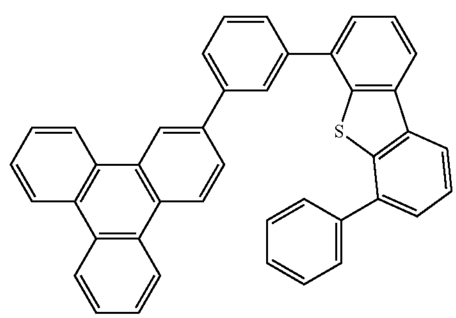
,
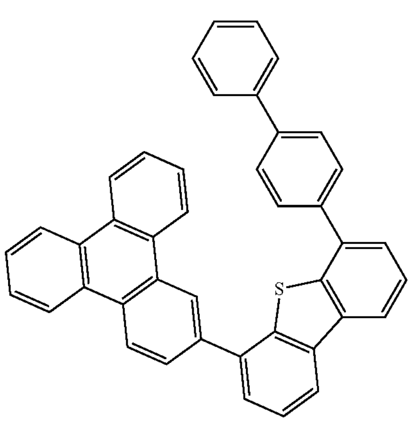
,
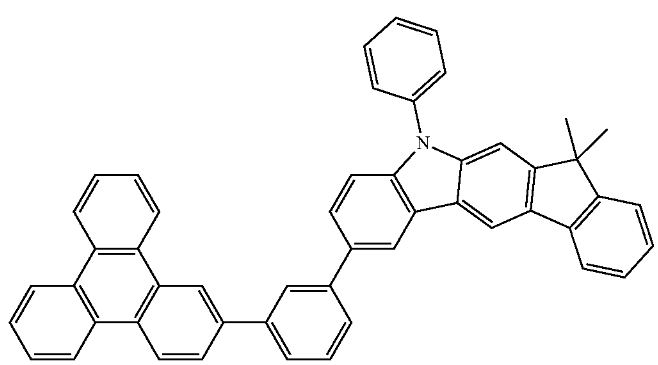
, -continued
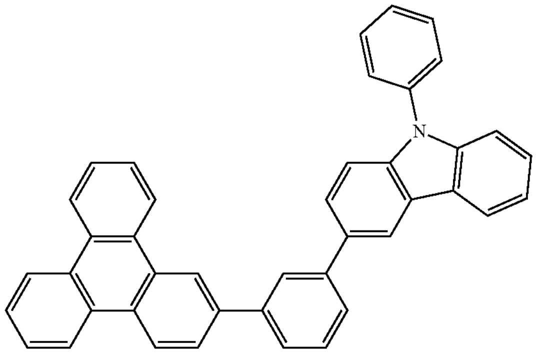
,
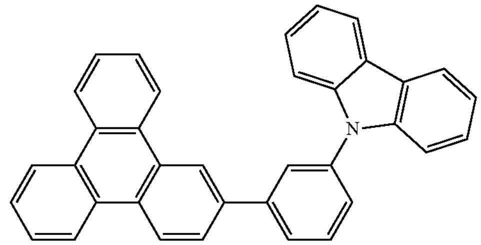
,
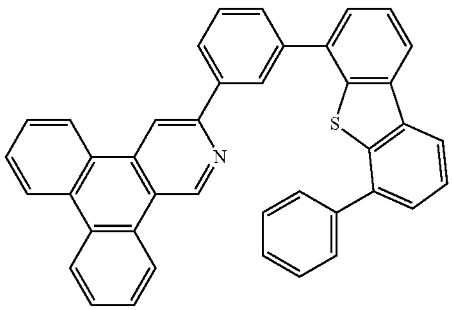
,
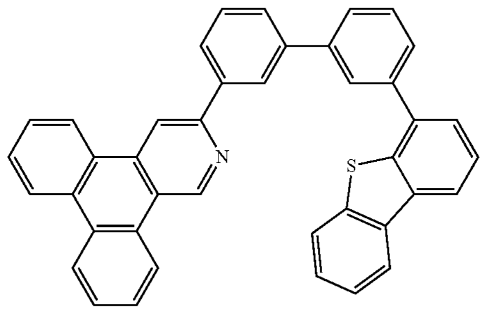
,
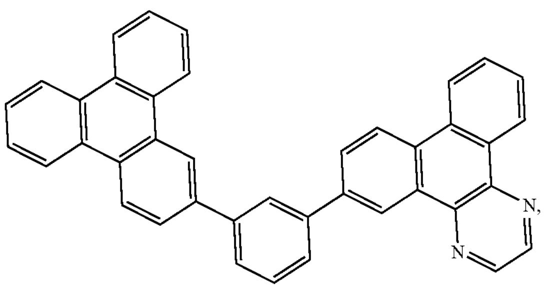
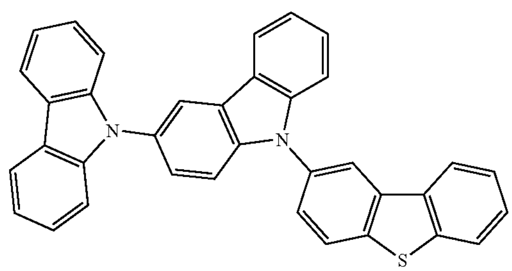
,
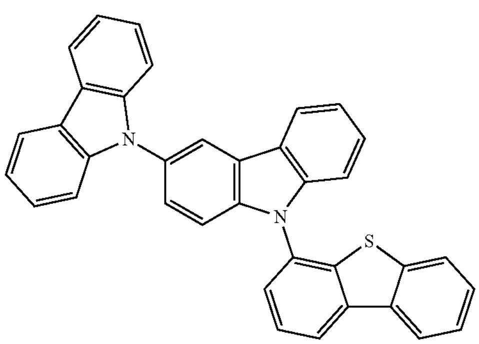
,
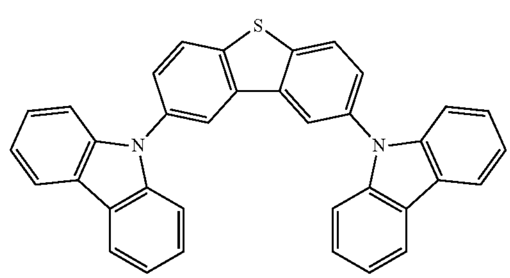
,
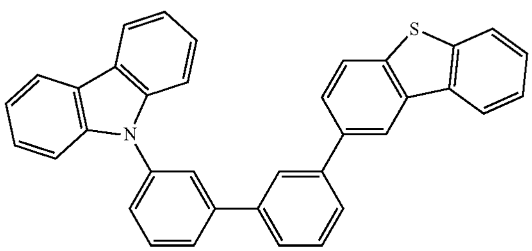
,
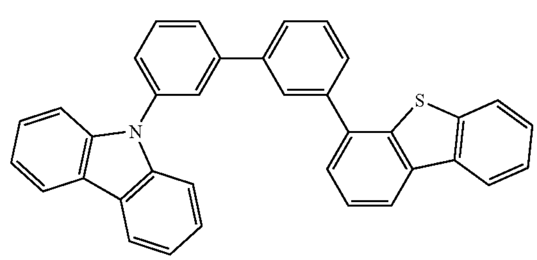
, -continued
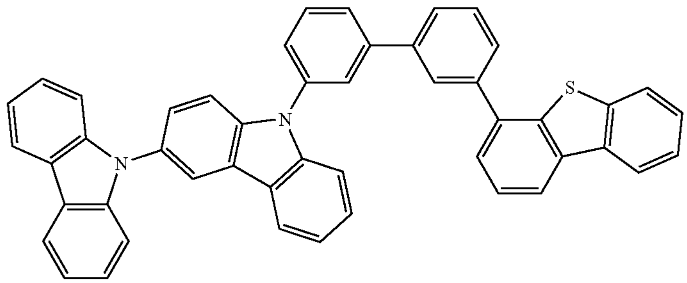
,
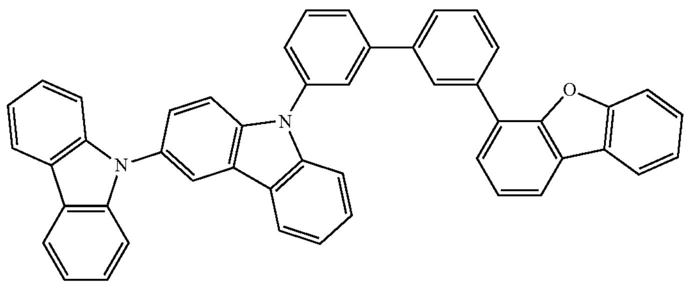
,
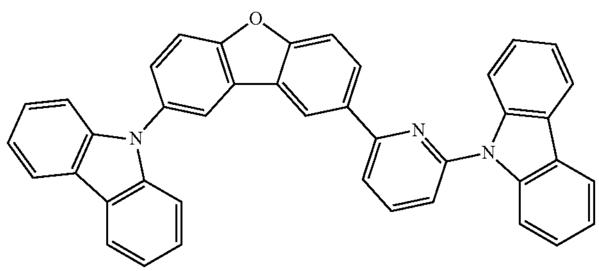
,
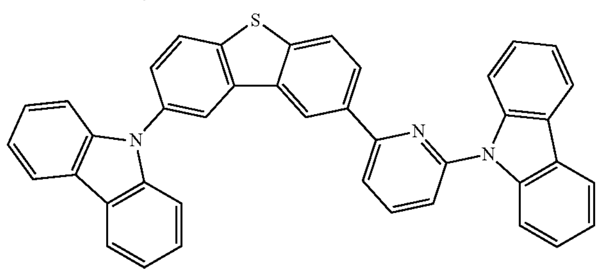
,
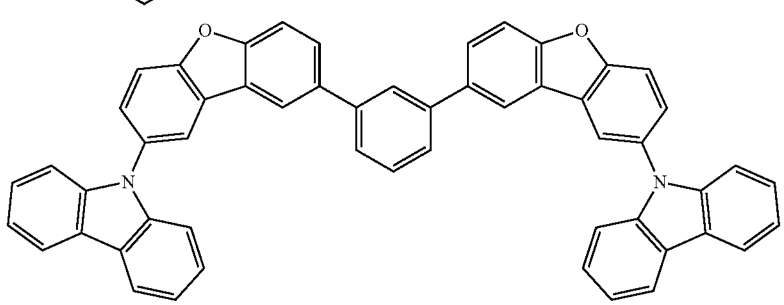
,
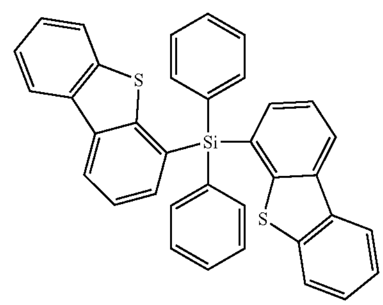
,
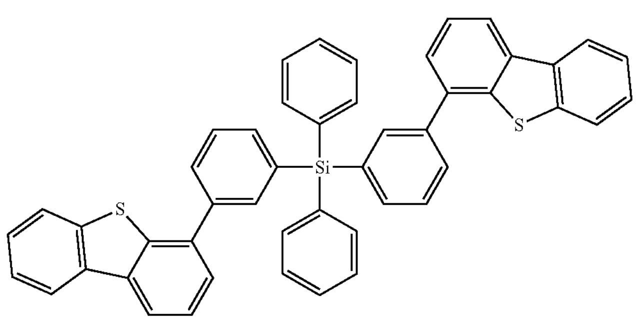
, -continued
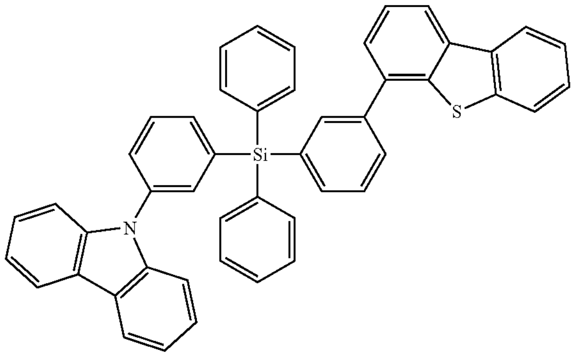
,
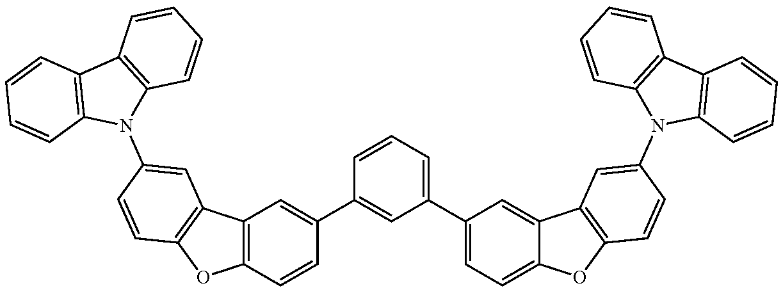
,
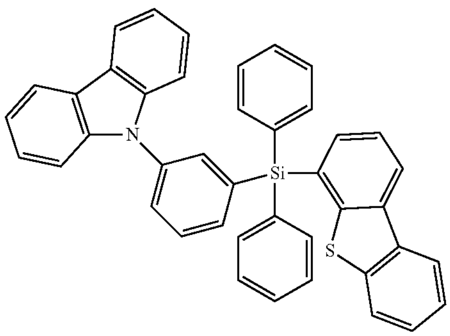
,
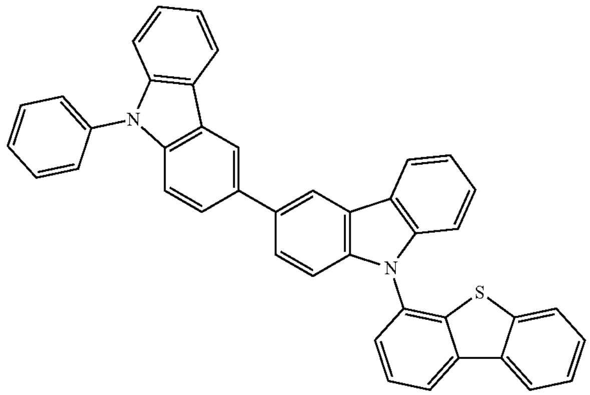
,
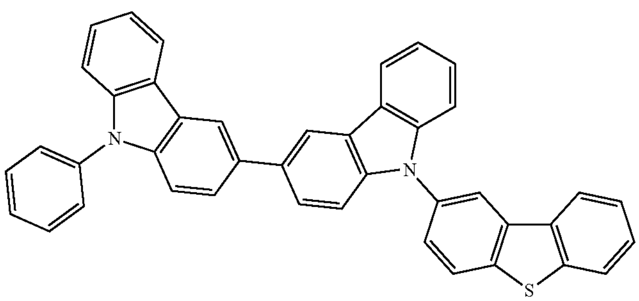
,
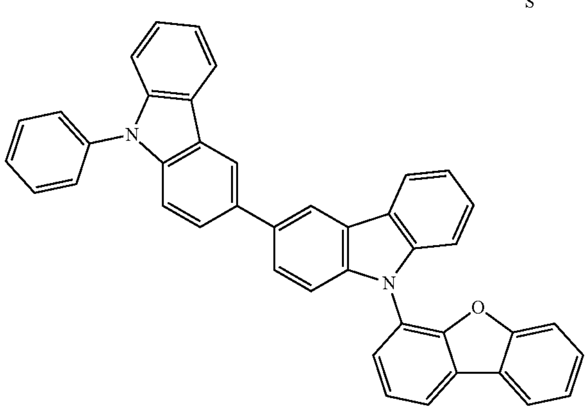
, -continued
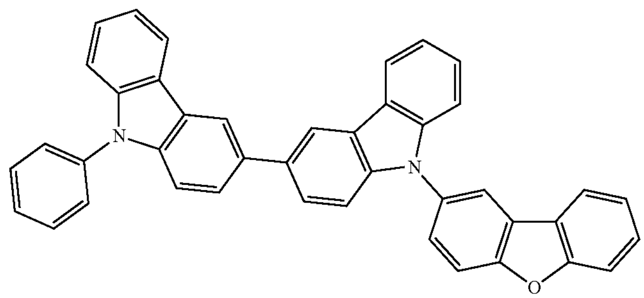
,
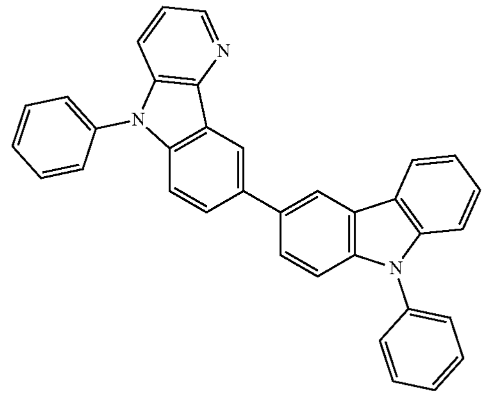
,
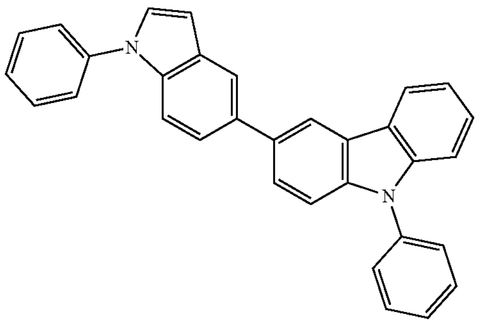
,
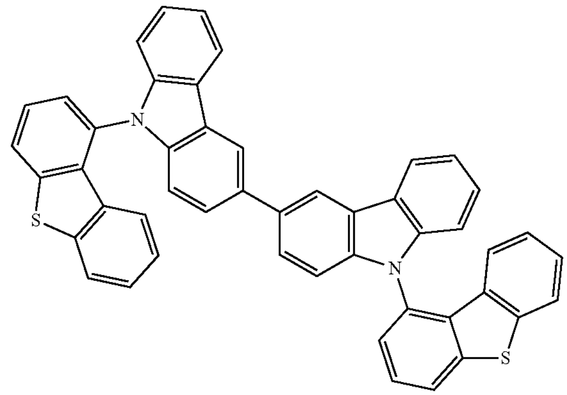
,
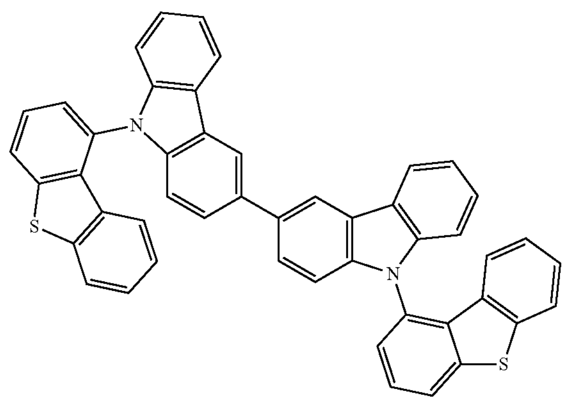
,
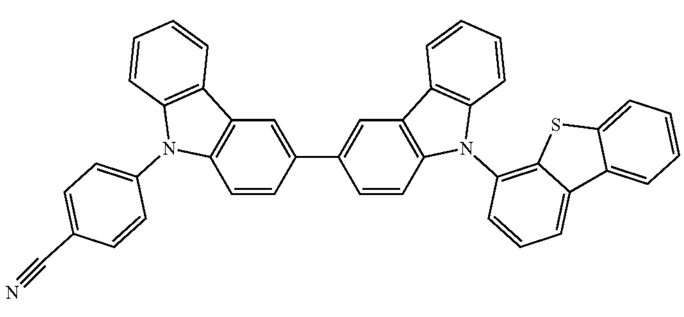
, -continued
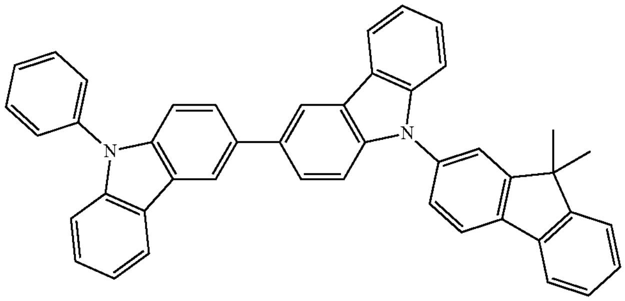
,
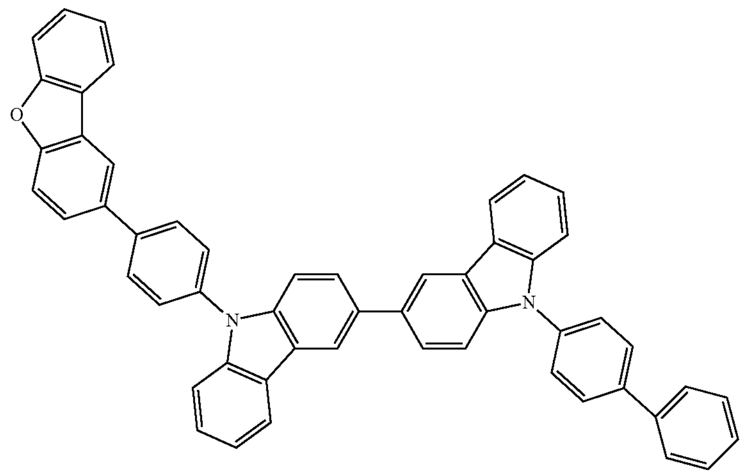
,
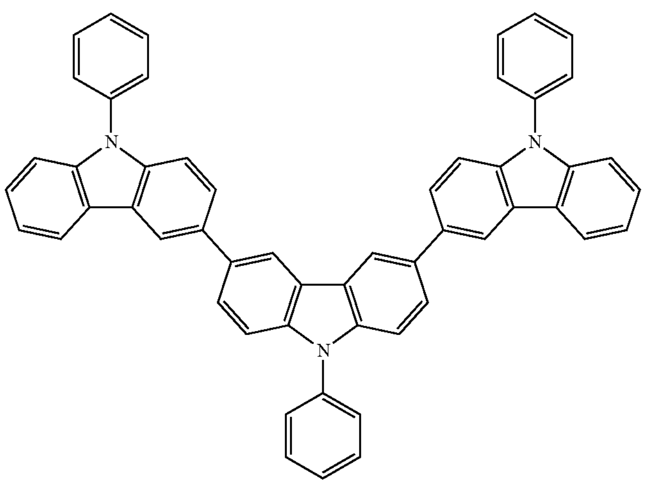
,
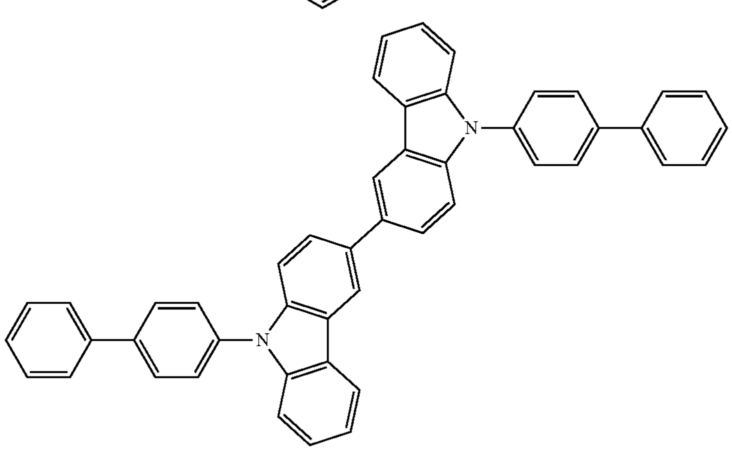
, -continued
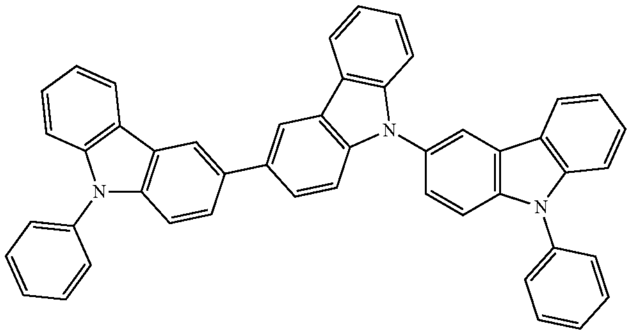
,
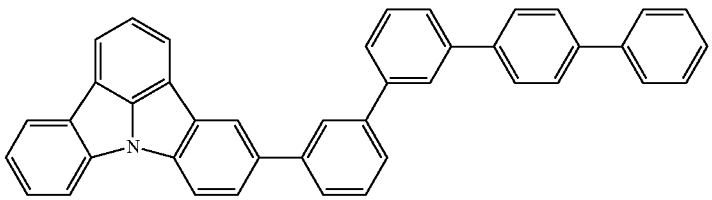
,
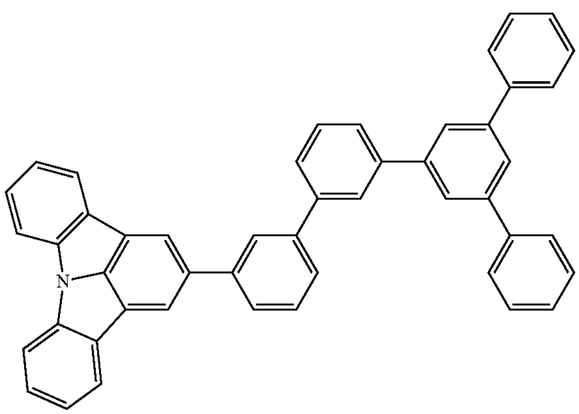
,
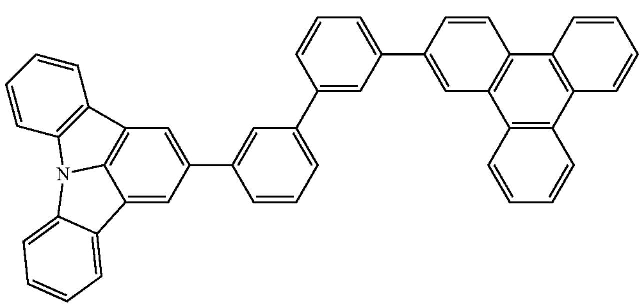
,
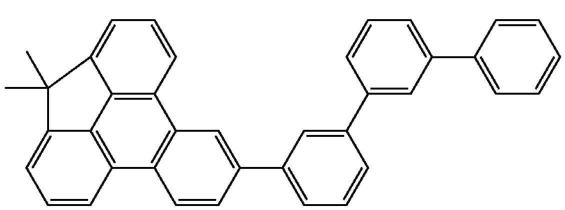
, -continued
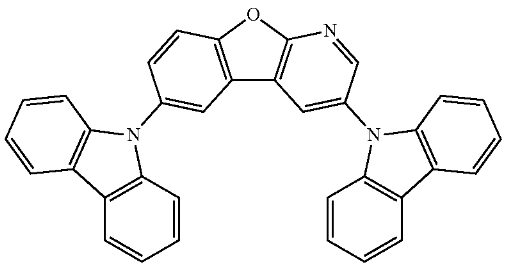,
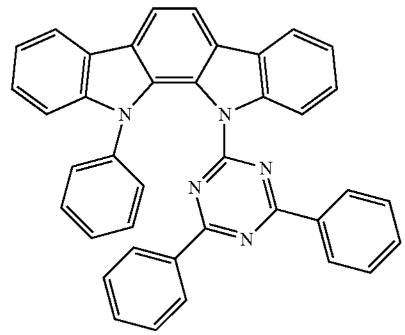,
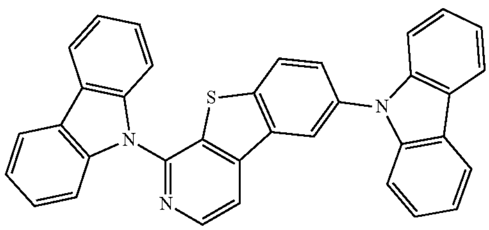,
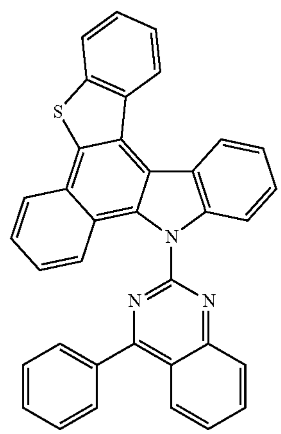,
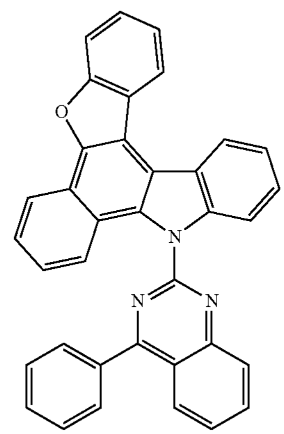,
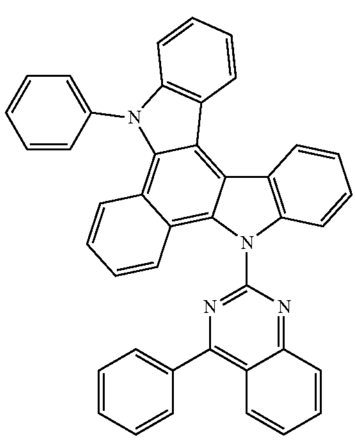,
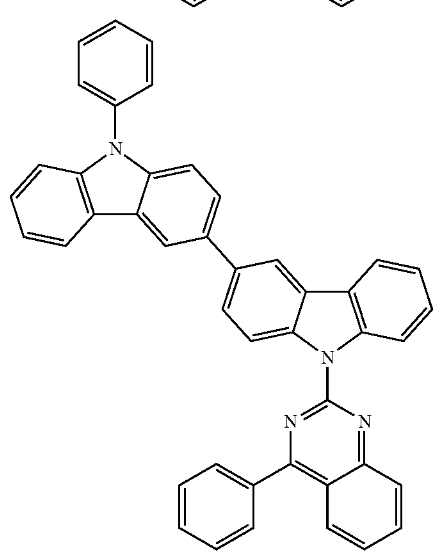,
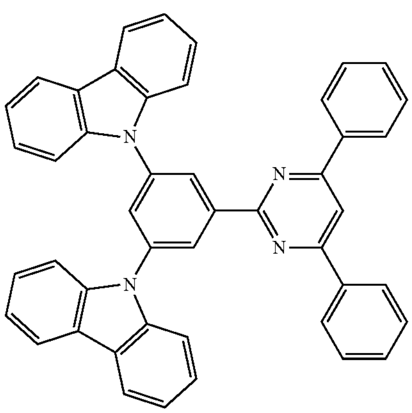,
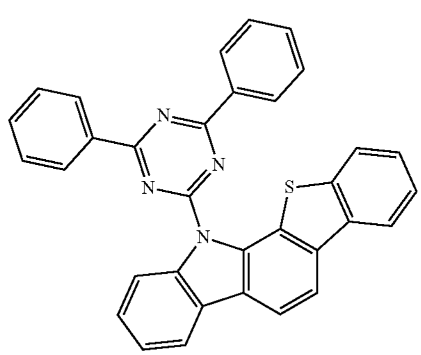, -continued
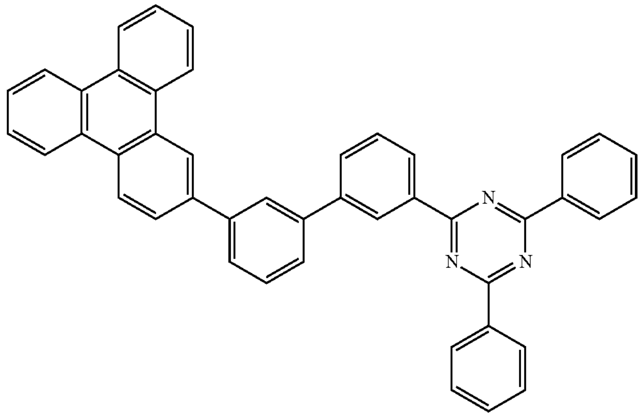
,
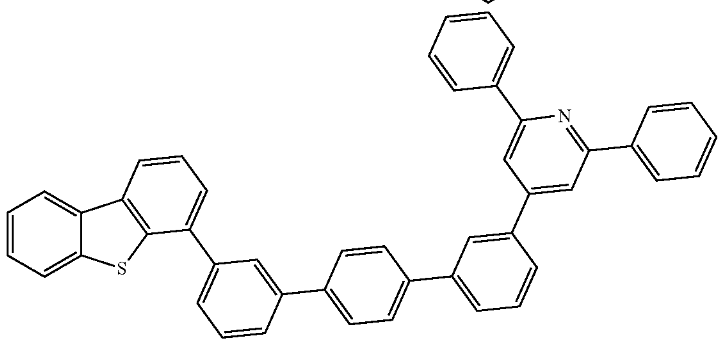
,
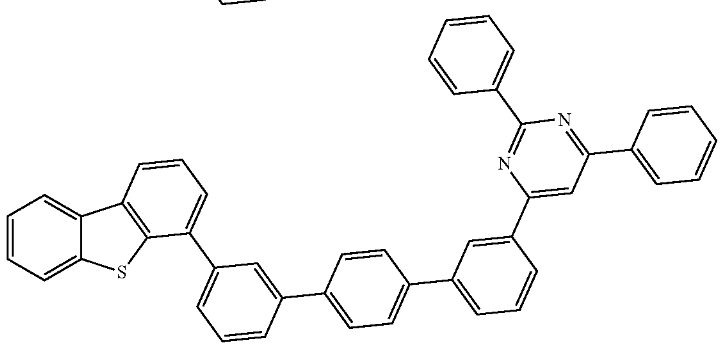
,
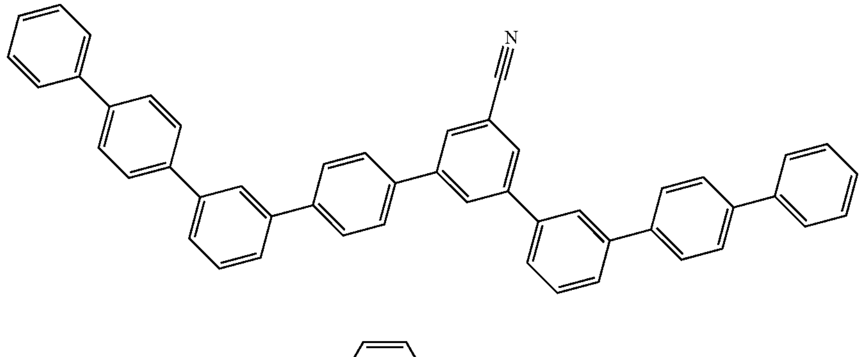
,
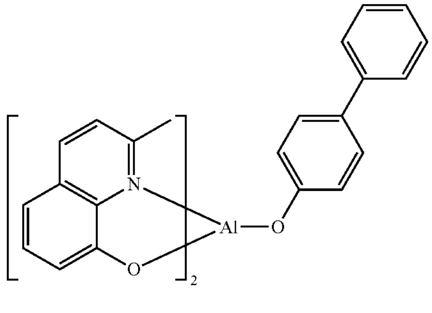
,
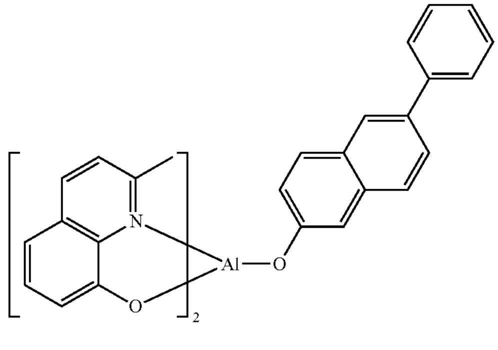
,
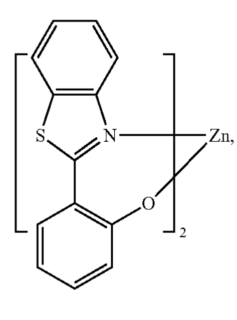

-continued

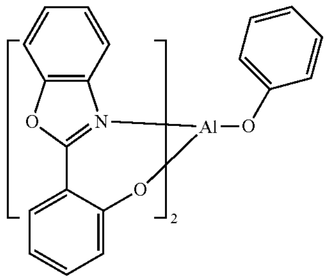

,

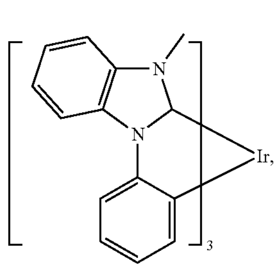

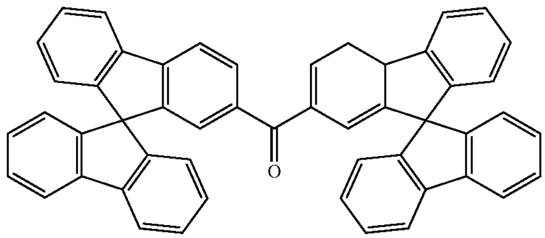

,

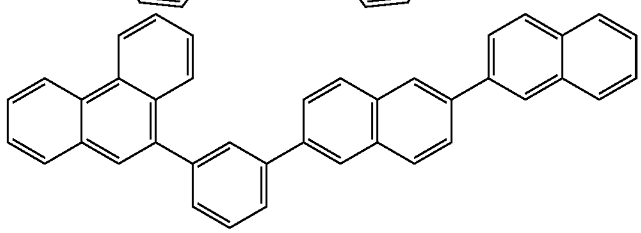

,

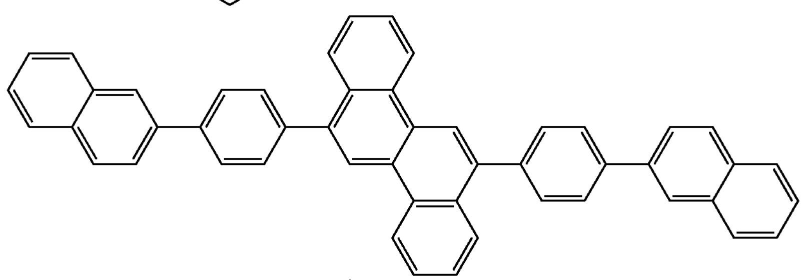

, and

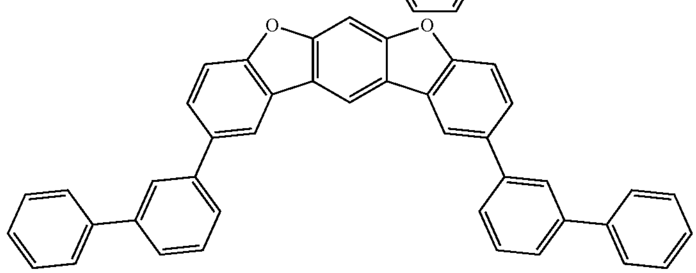

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
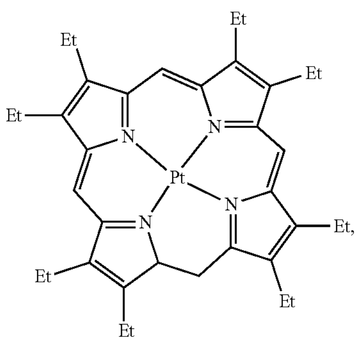
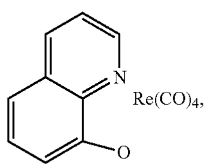
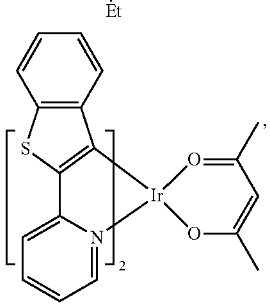
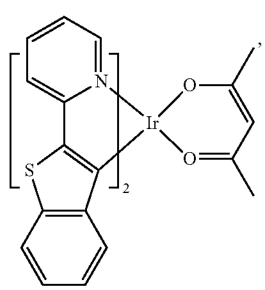
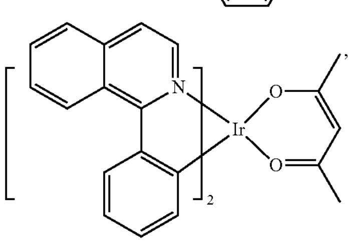
-continued
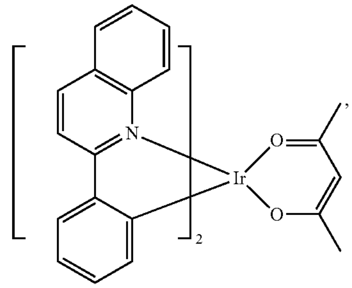
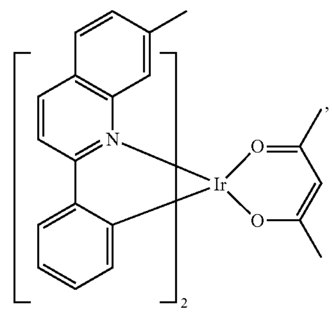
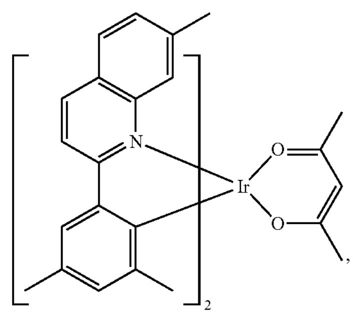
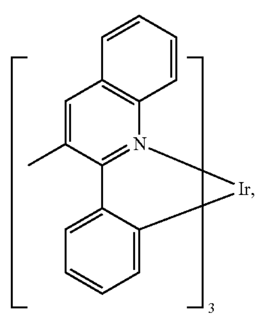
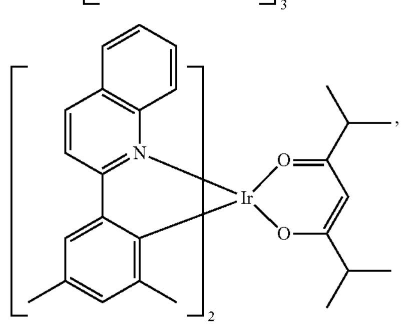

-continued
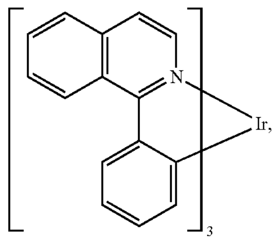
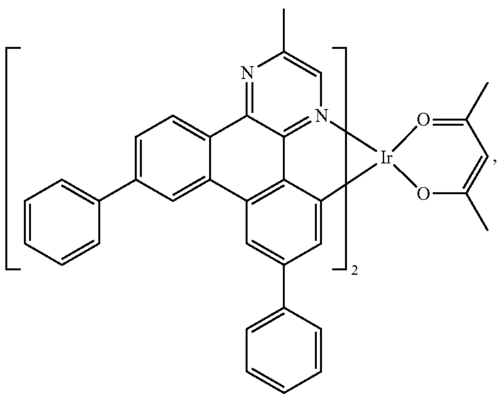
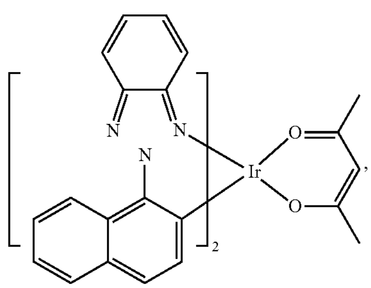
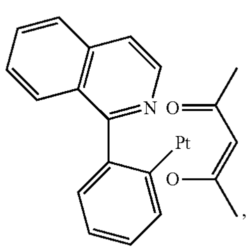
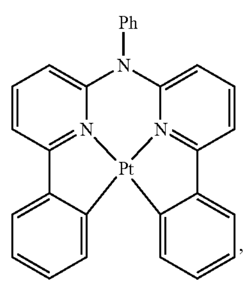
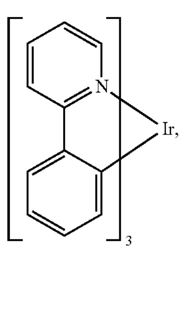
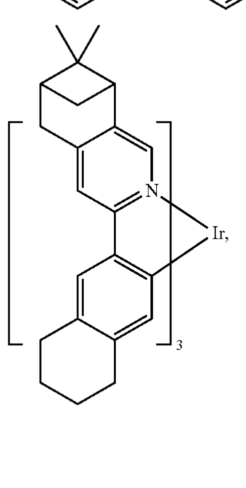
-continued
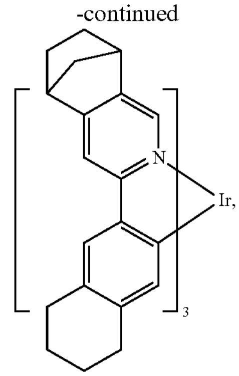
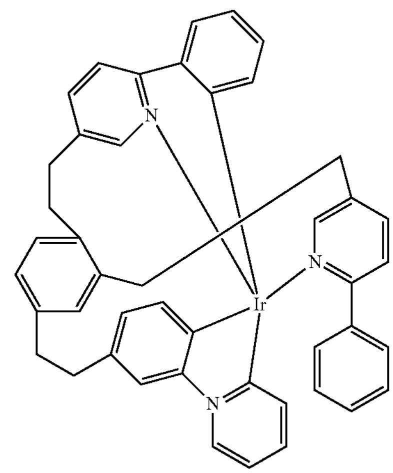
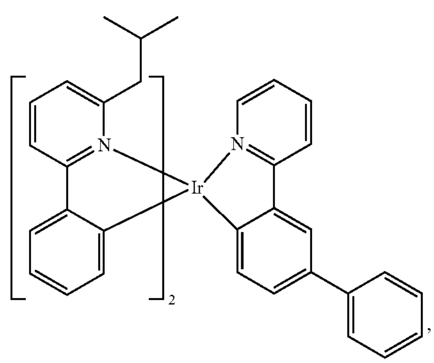
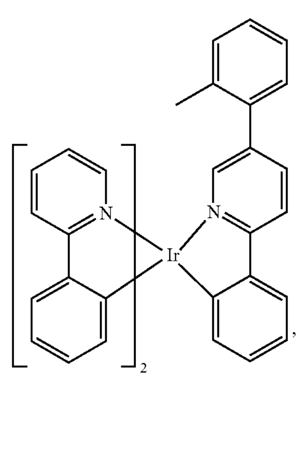

-continued
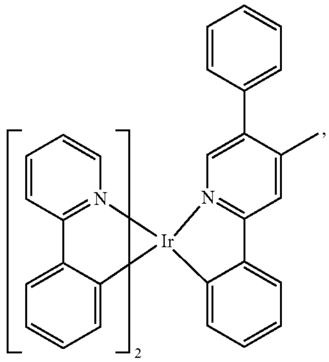
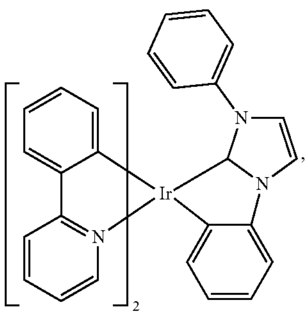
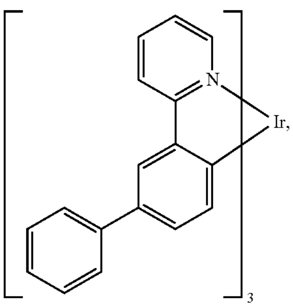
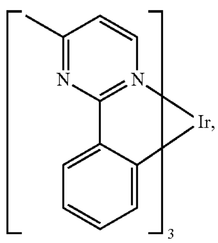
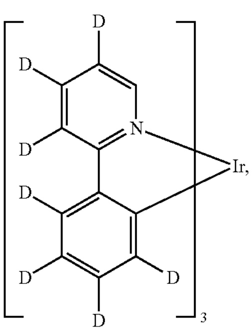
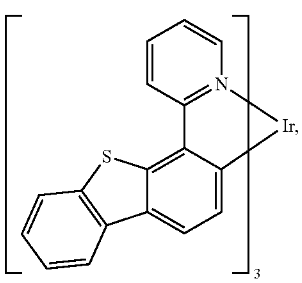
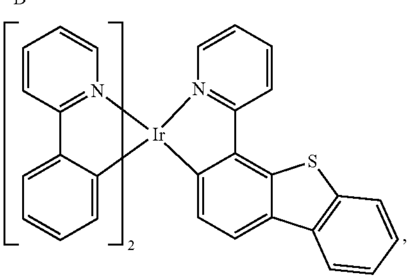
-continued
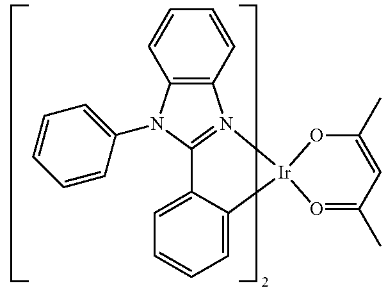
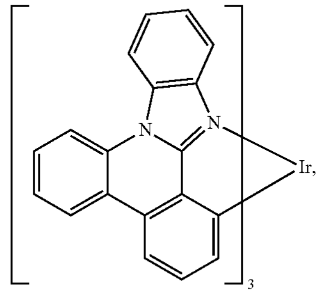
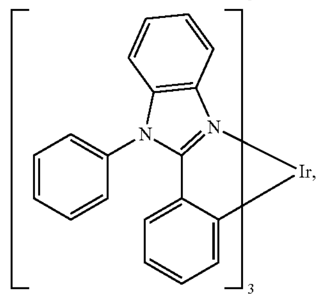
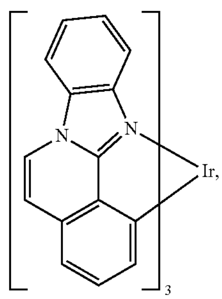
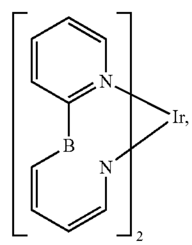
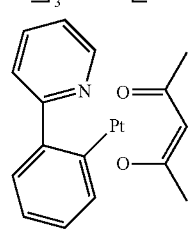
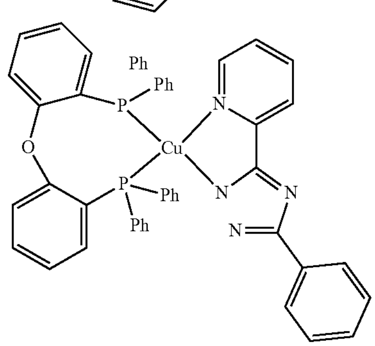

-continued
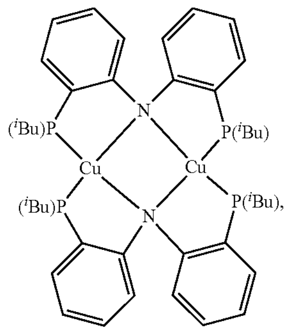
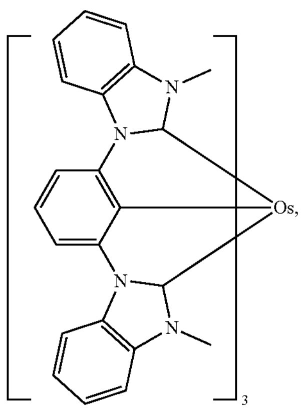
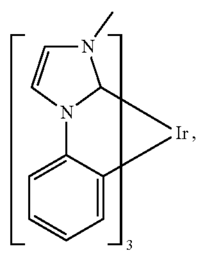
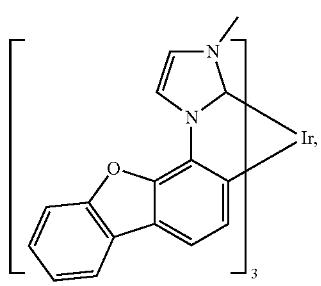
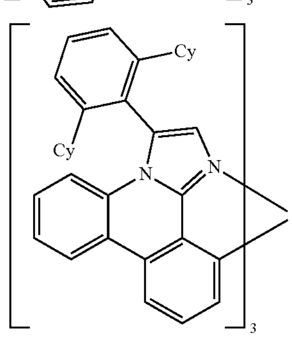
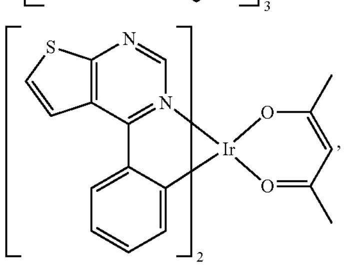
-continued
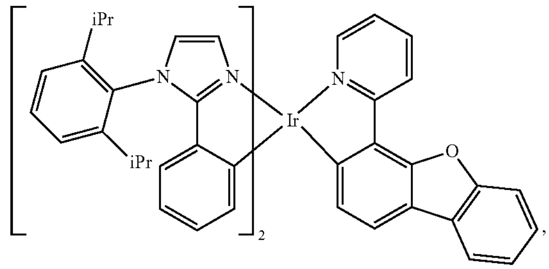
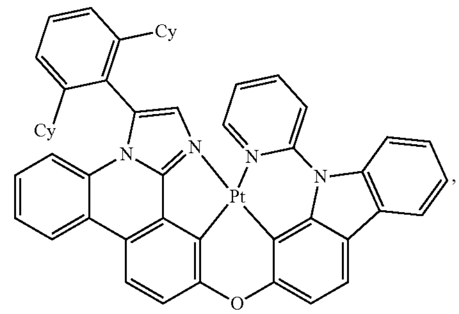
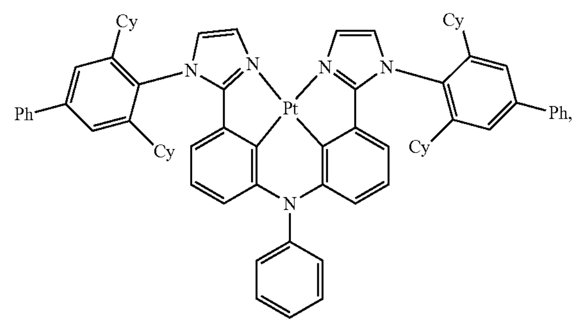
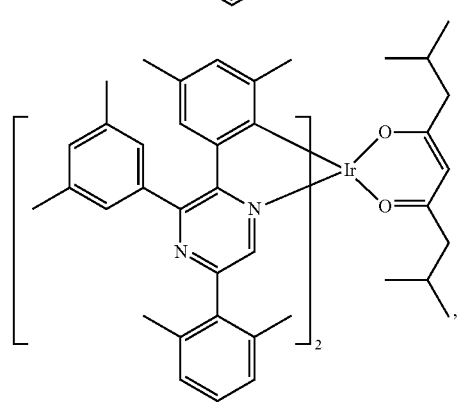
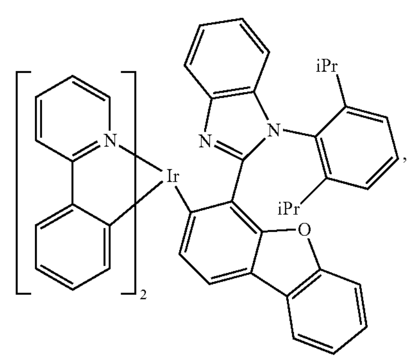

-continued
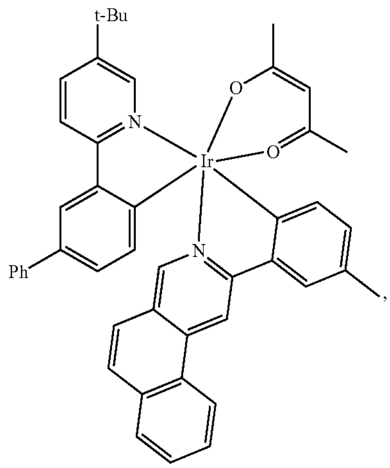
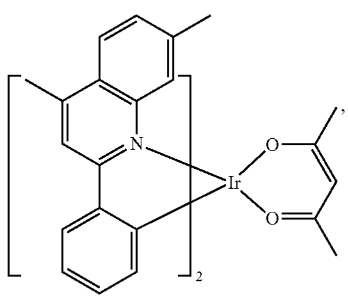
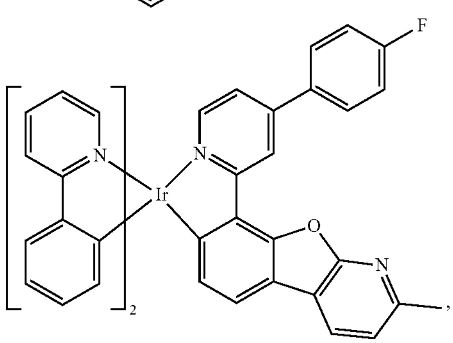
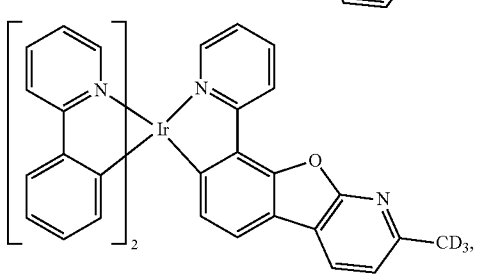
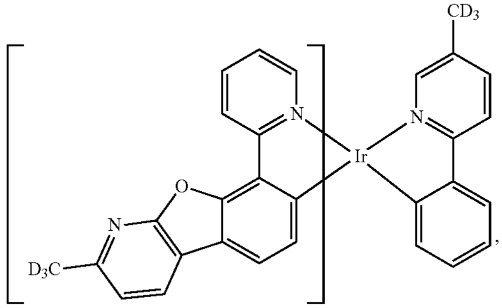
-continued
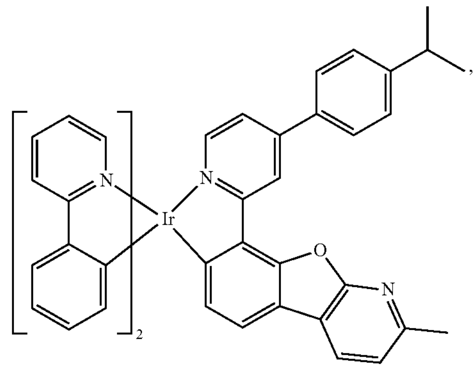
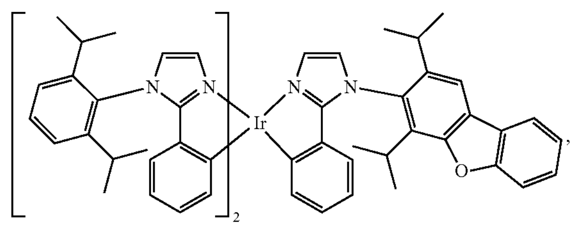
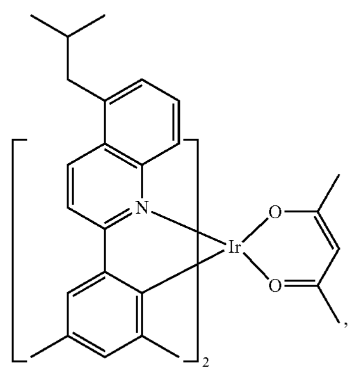
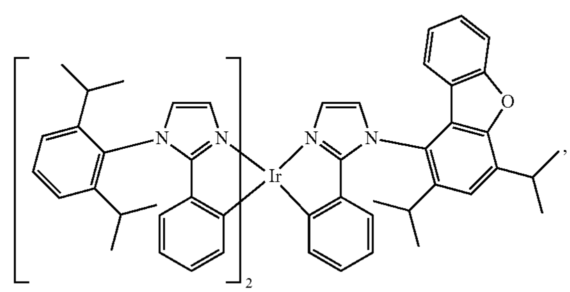
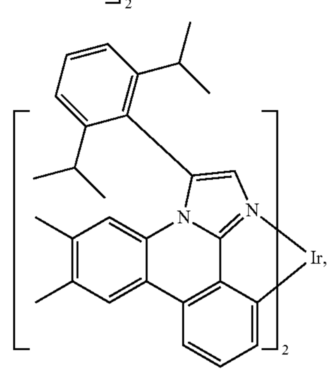

-continued
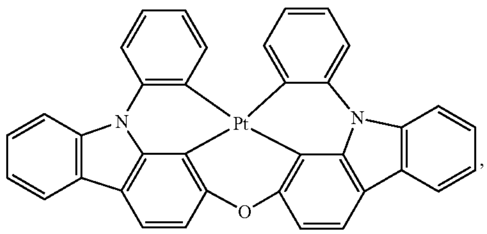
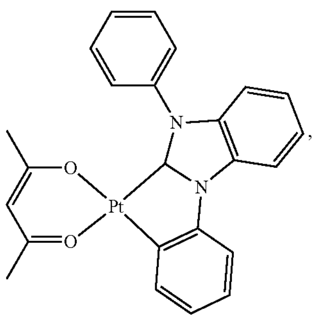
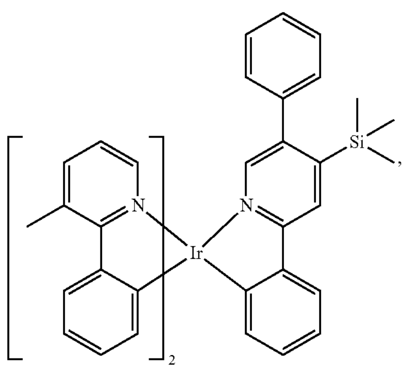
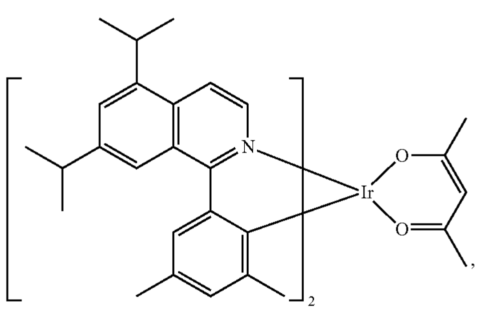
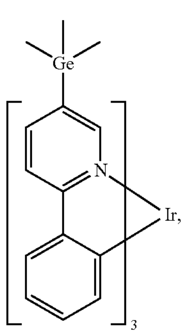
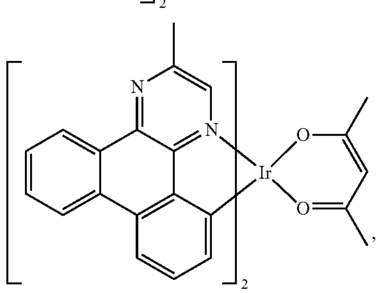
-continued
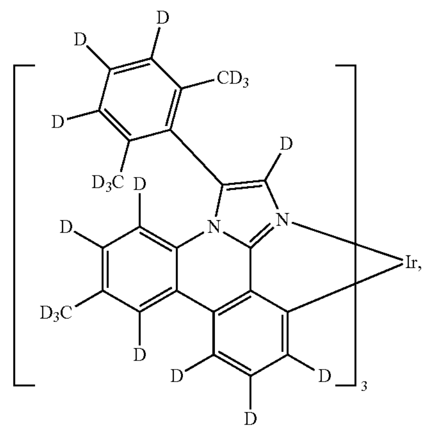
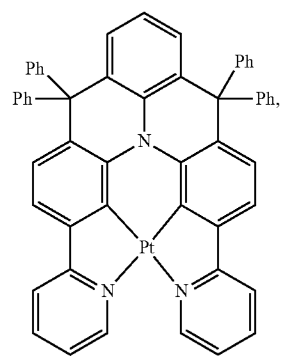
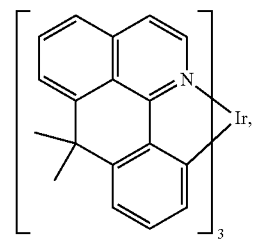
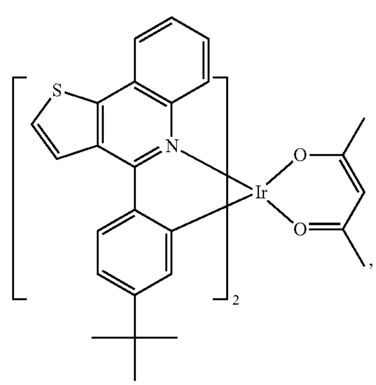
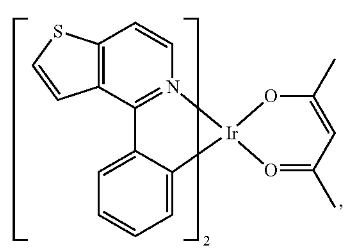

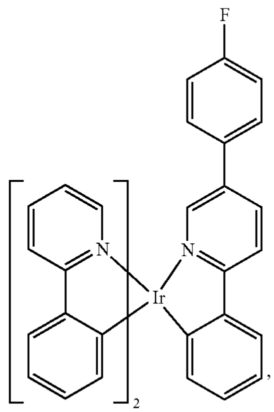
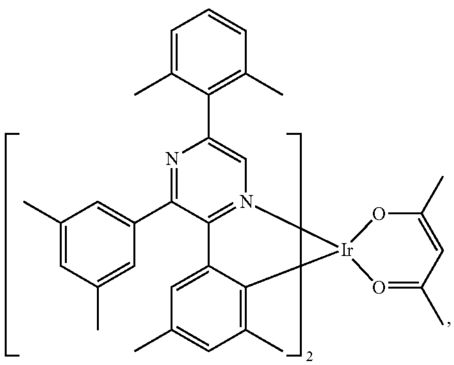
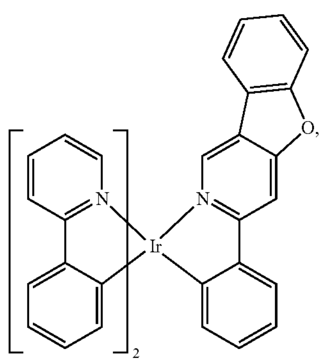
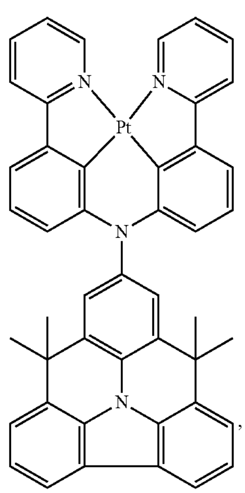
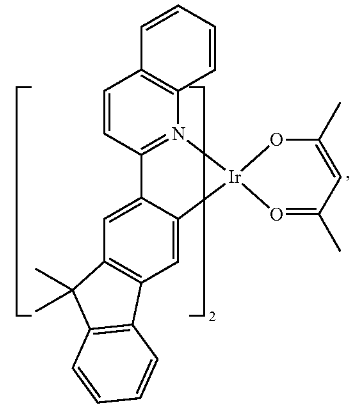
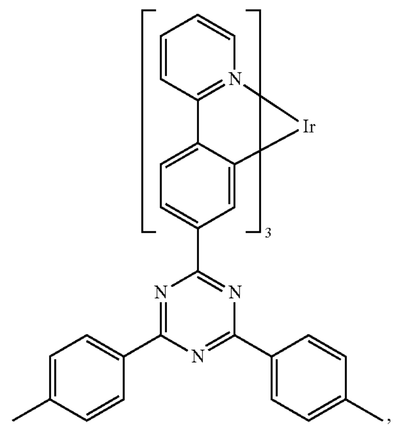
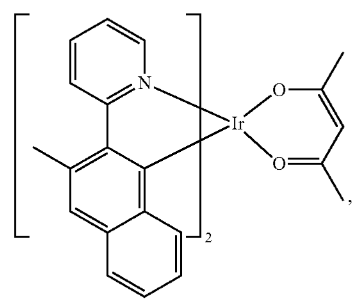
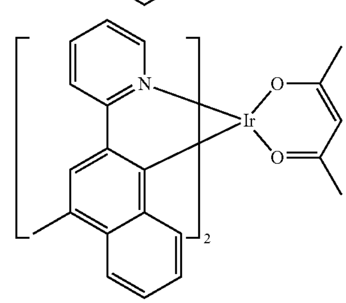
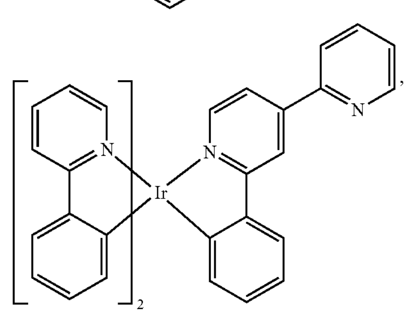

-continued
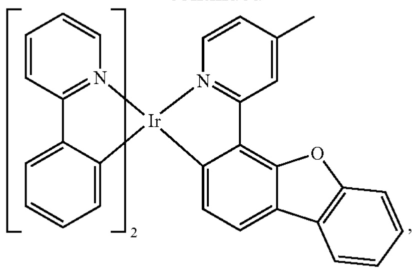
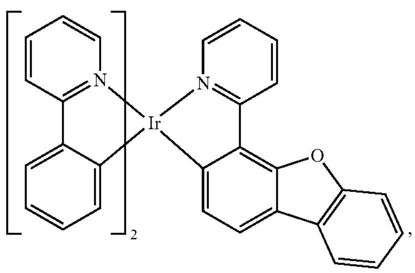
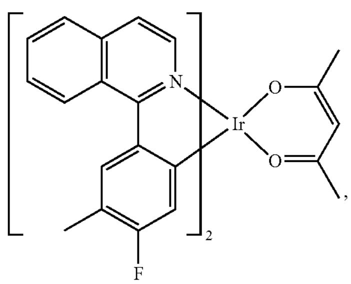
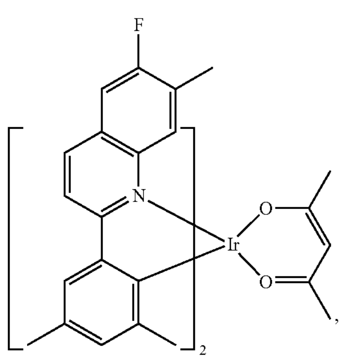
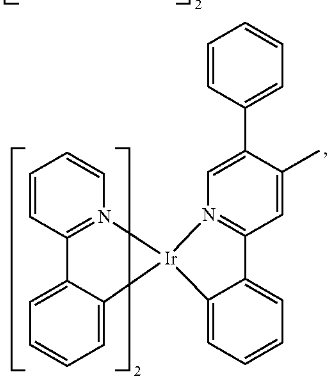
-continued
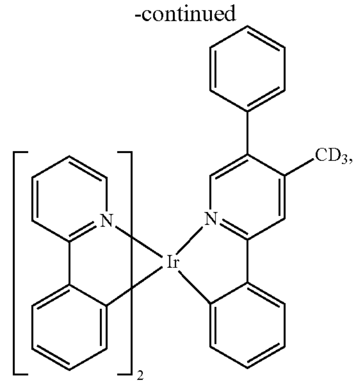
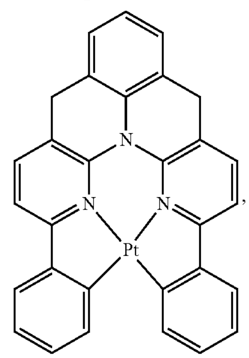
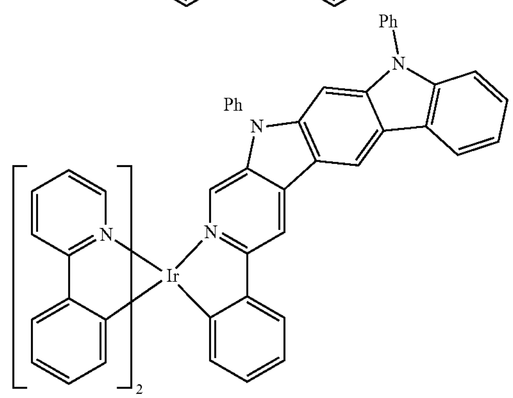
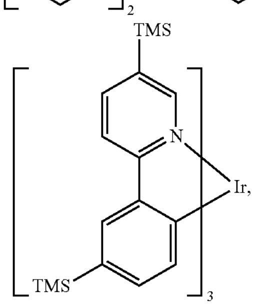
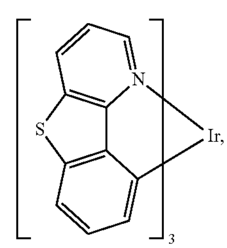
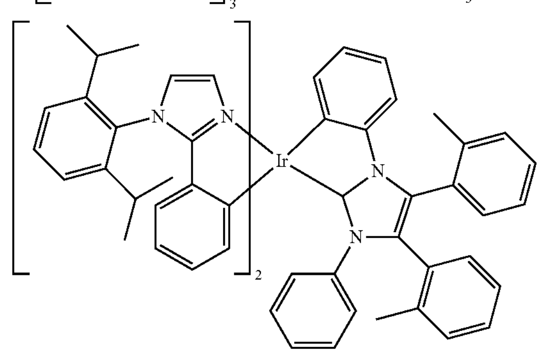

-continued
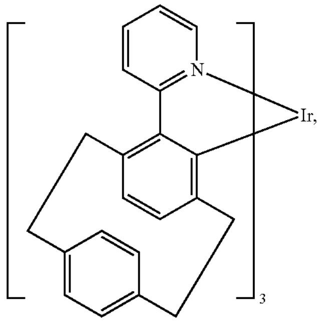
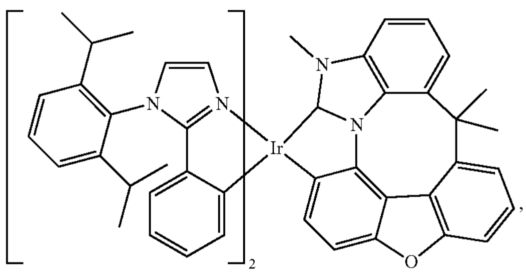
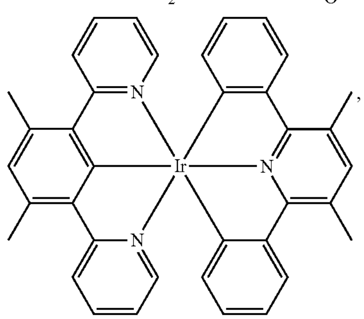
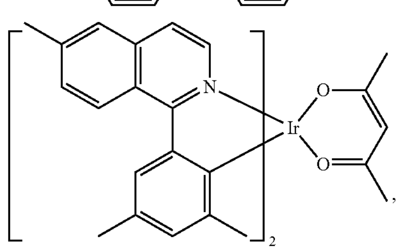
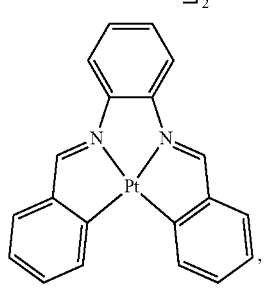
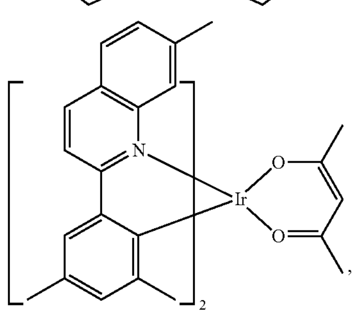
-continued
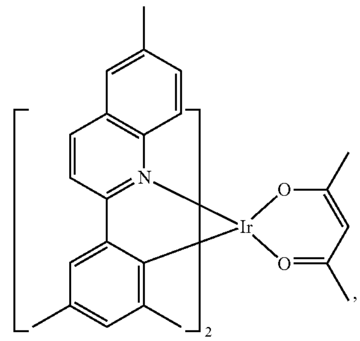
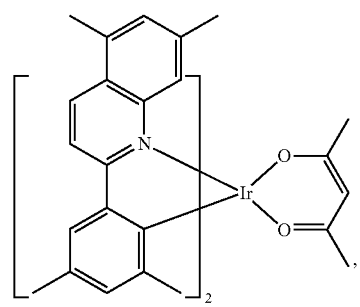
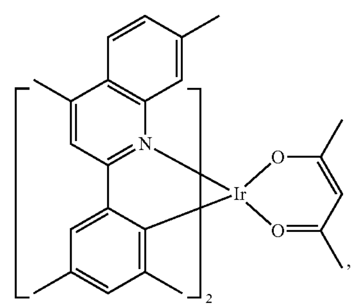
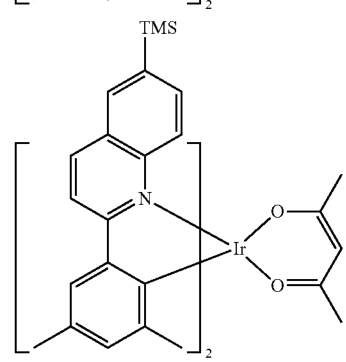
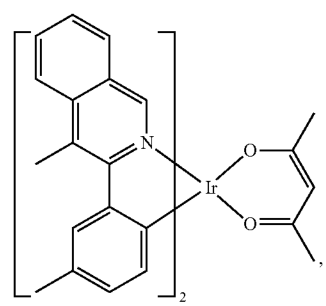

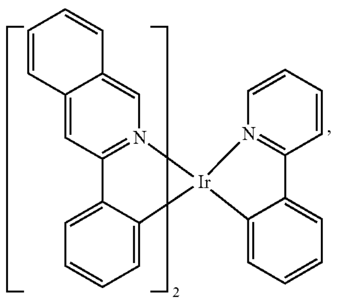
N
Ir
N
2
,
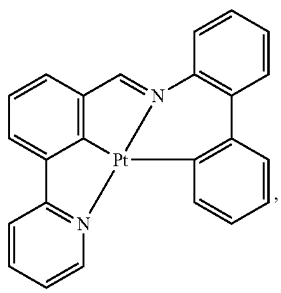
N
Pt
N
,
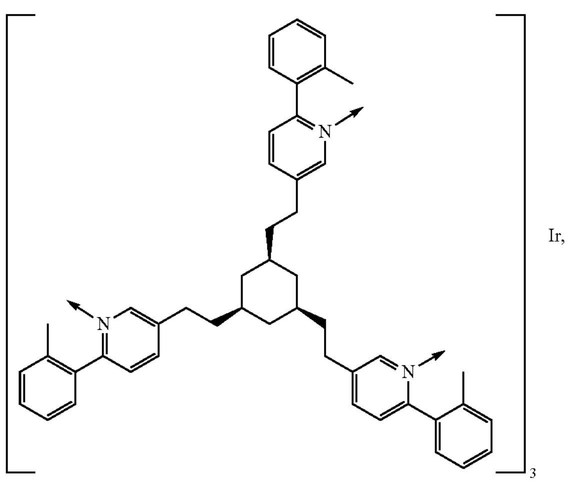
N
N
N
3
Ir,
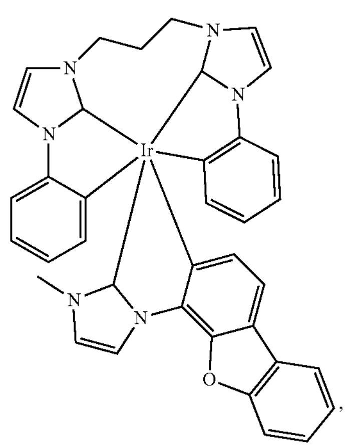
N
N
N
Ir
N
N
N
O
,
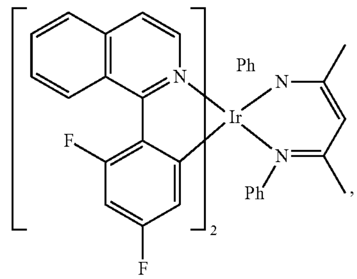
N
Ph
N
Ir
F
N
Ph
F
2
,
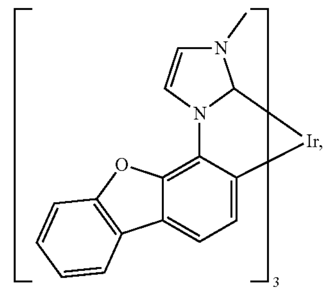
N
N
Ir,
O
3
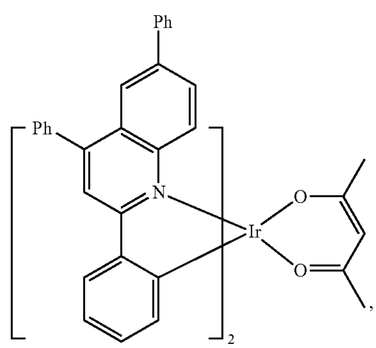
Ph
Ph
N
O
Ir
O
2
,
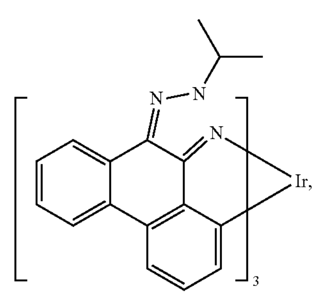
N
N
N
Ir,
3
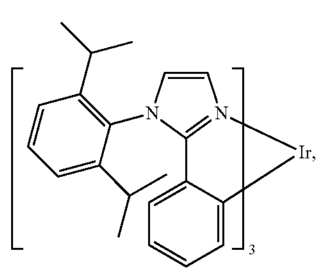
N
N
Ir,
3
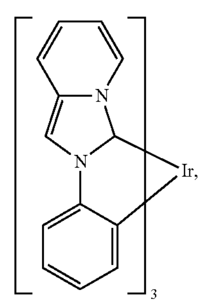
N
N
Ir,
3

-continued

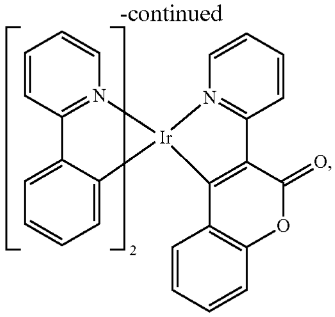

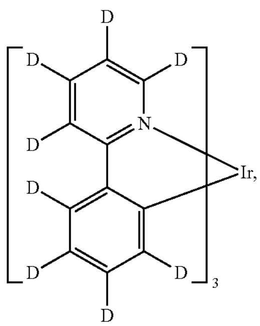

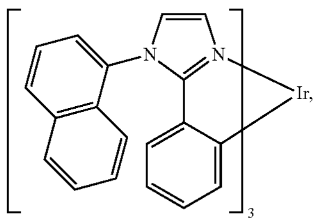

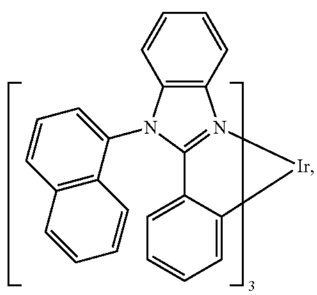

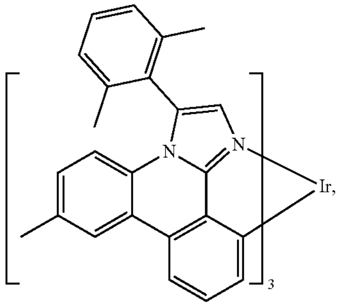

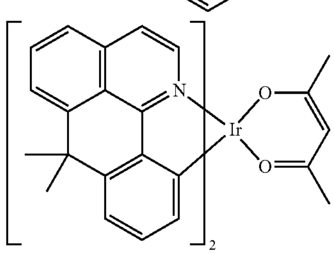

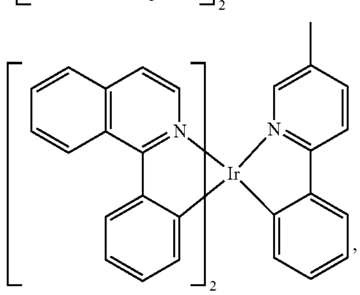

-continued

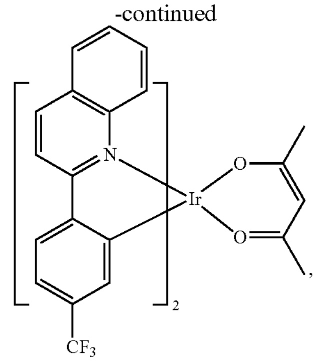

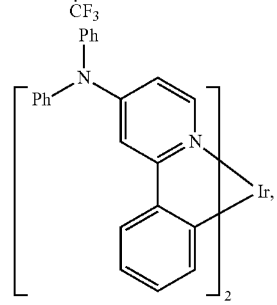

and

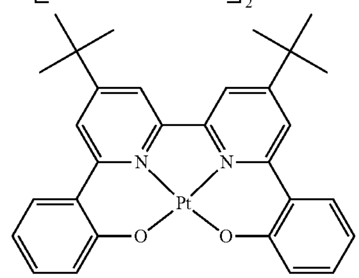

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

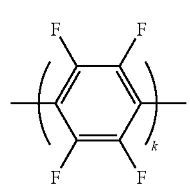

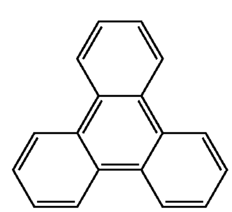

-continued

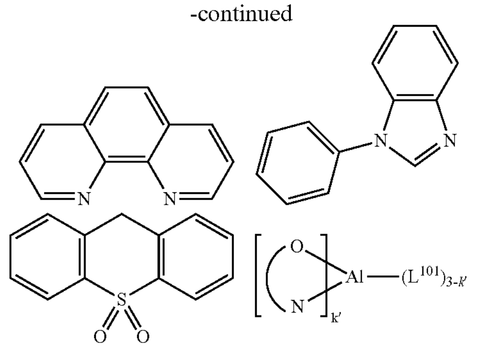

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

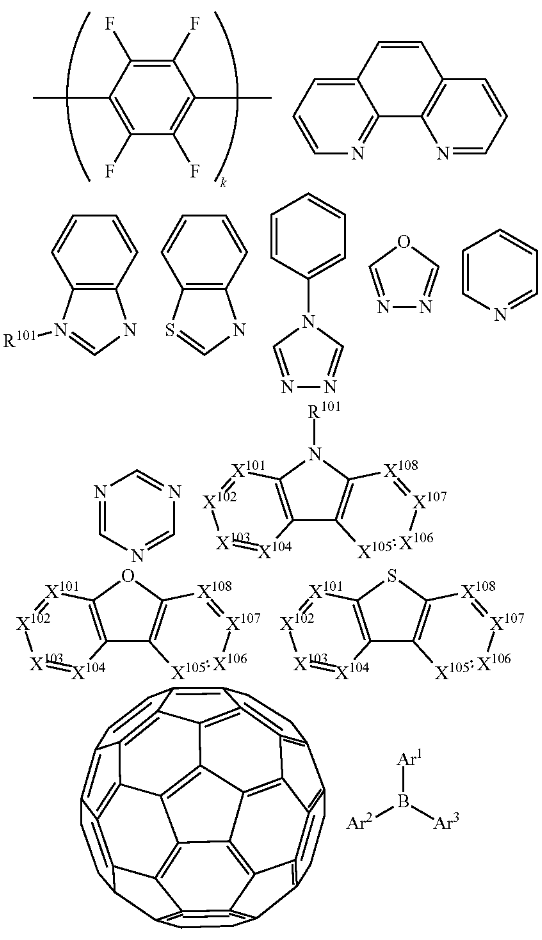

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

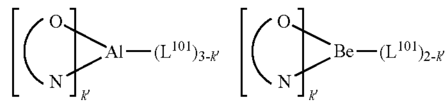

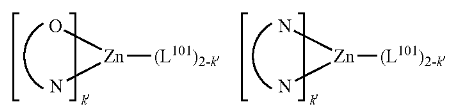

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

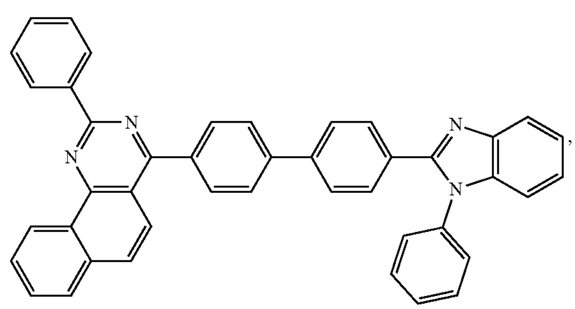

-continued
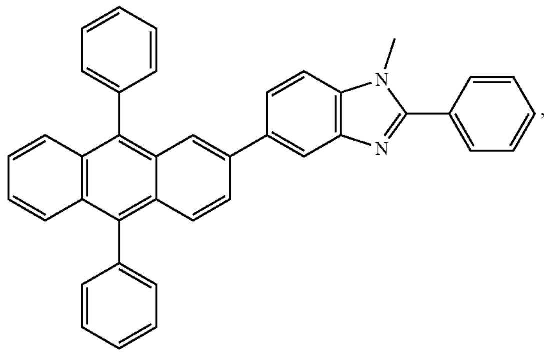
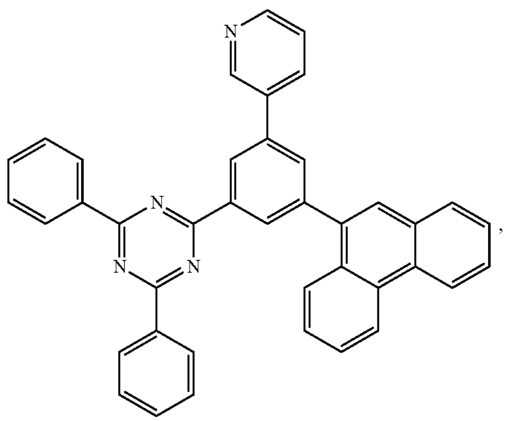
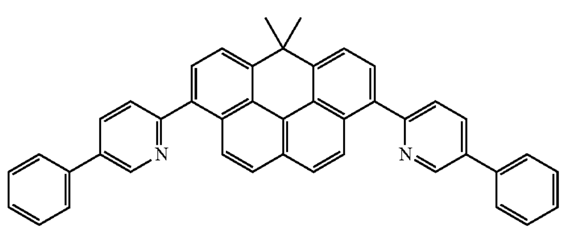
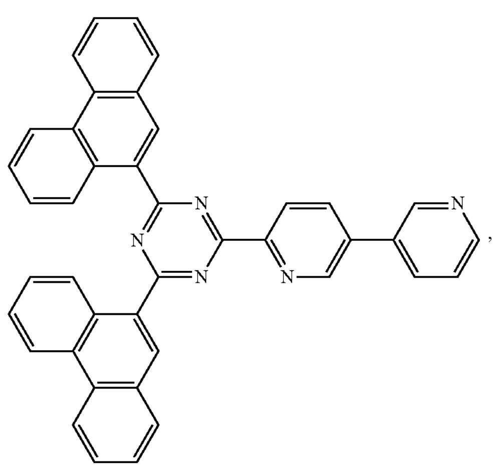
-continued
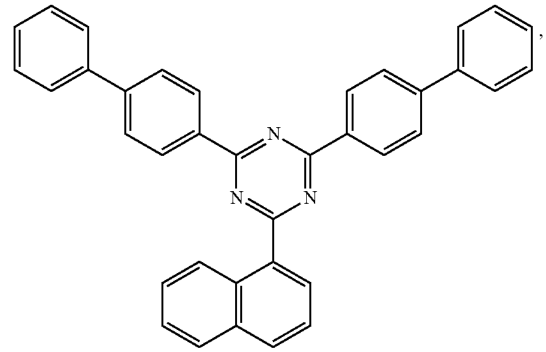
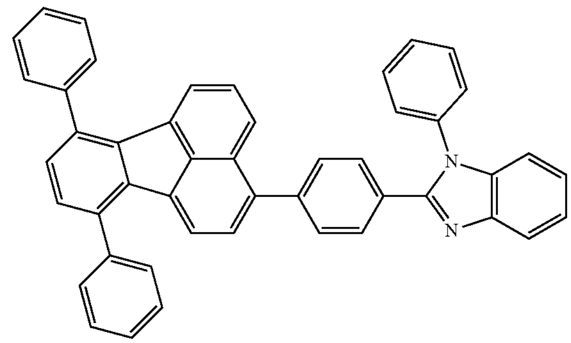
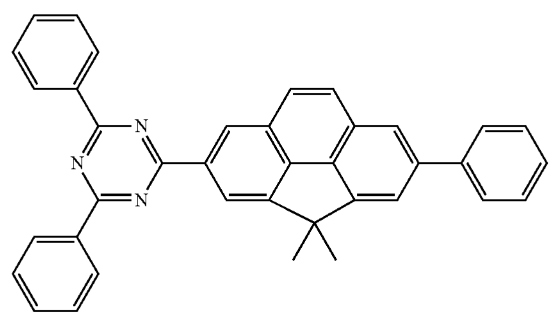
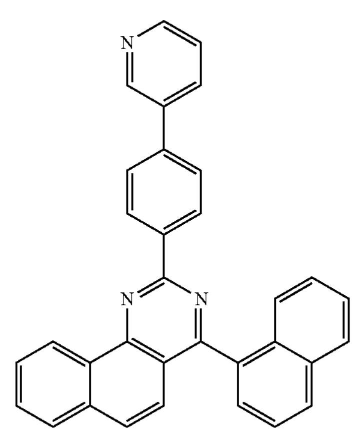

-continued
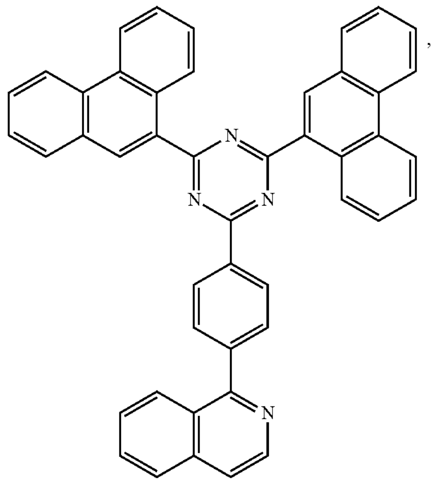
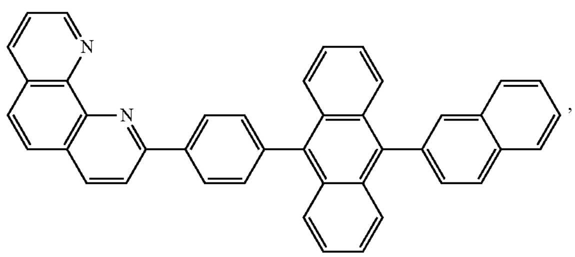
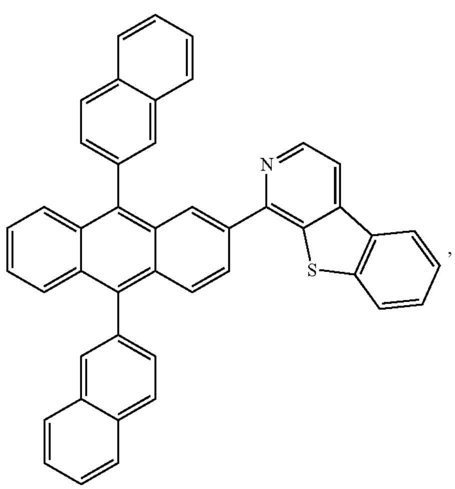
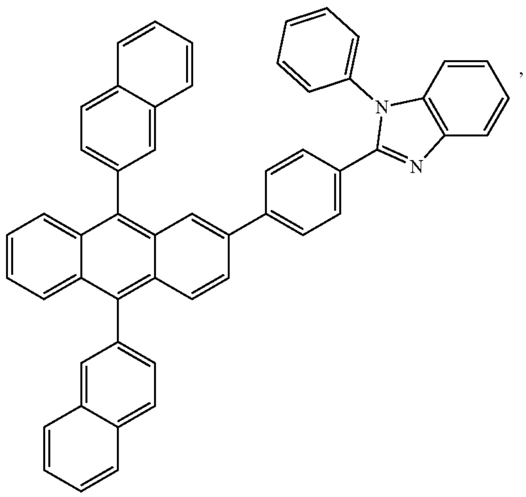
-continued
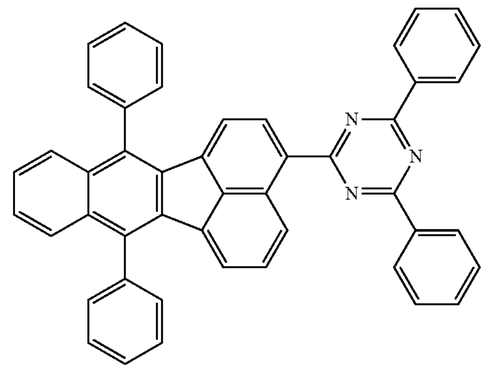
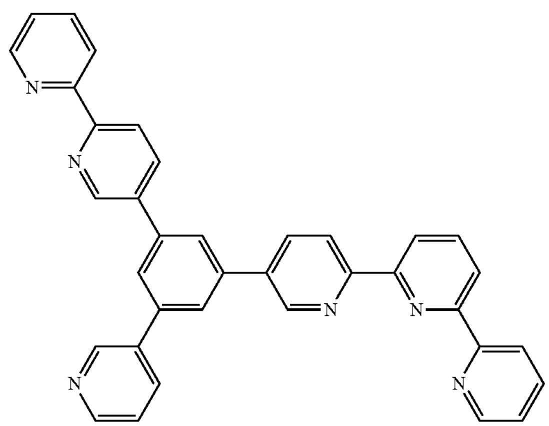
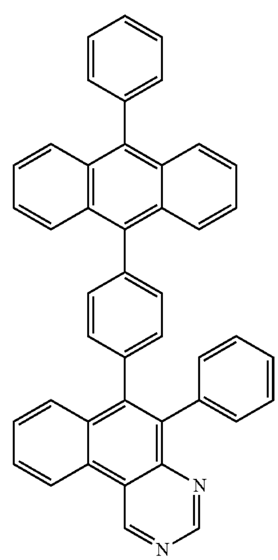

-continued
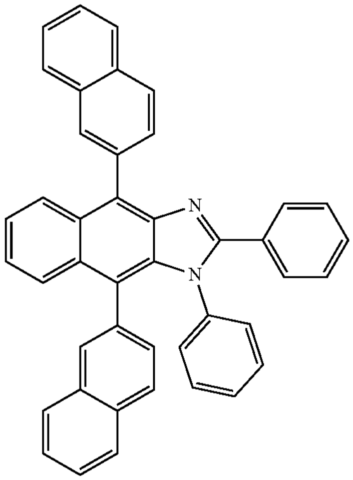
,
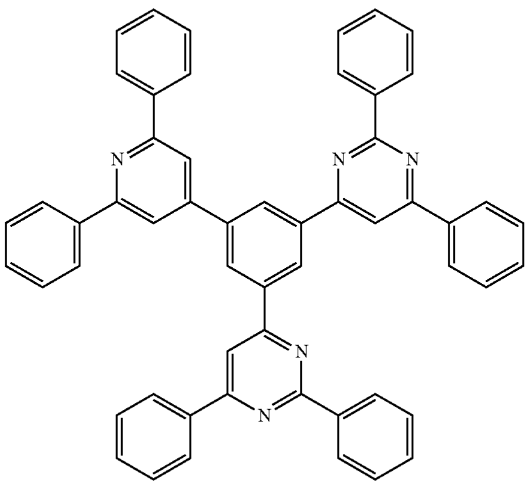
,
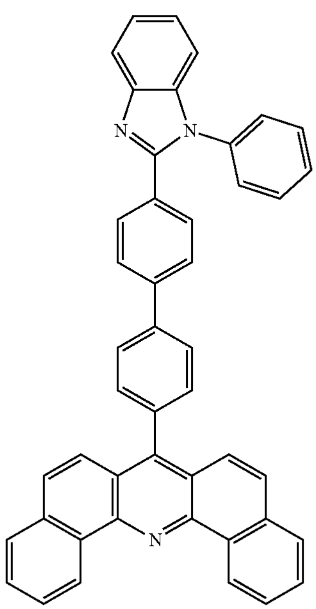
,
-continued
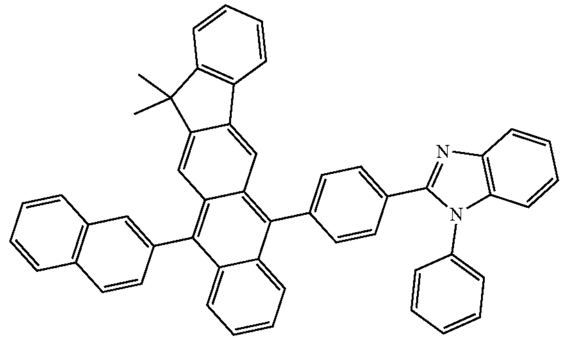
,
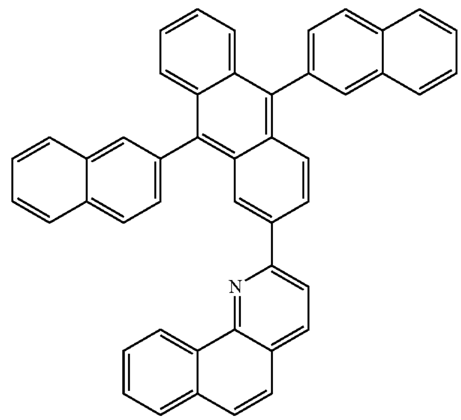
,
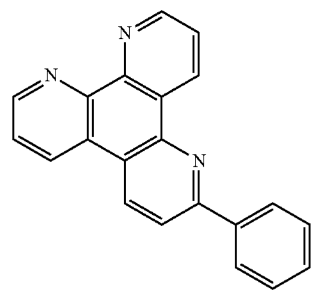
,
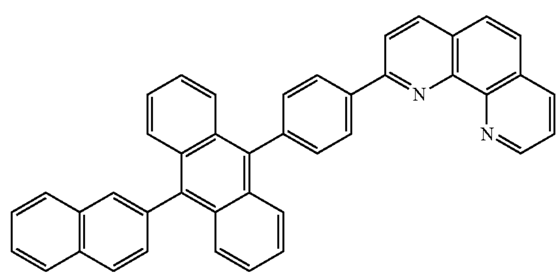
,
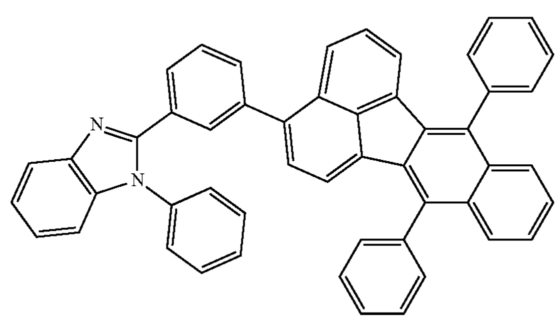
, -continued
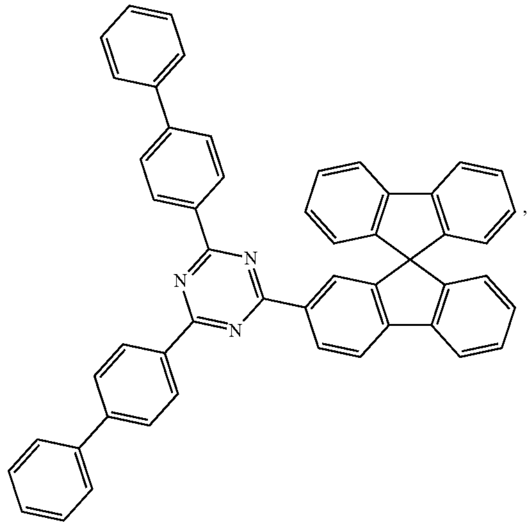
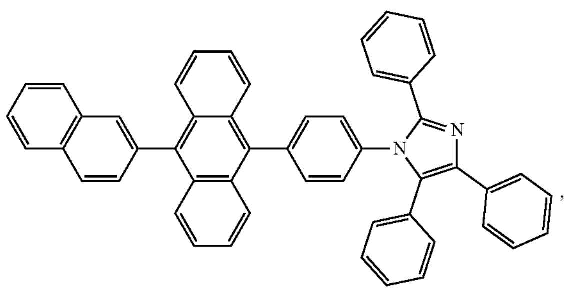
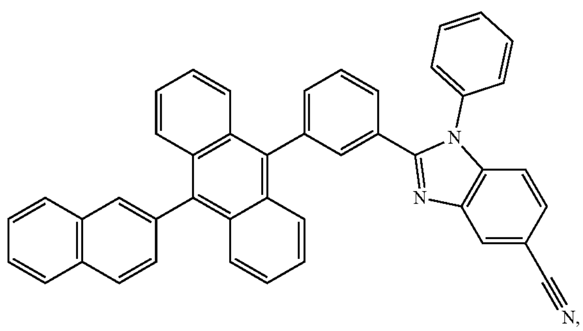
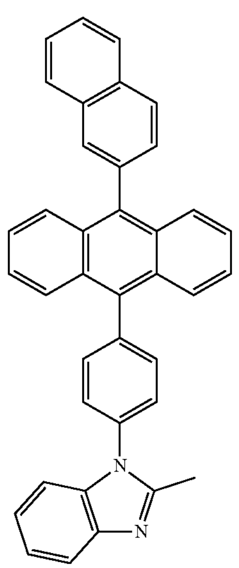
-continued
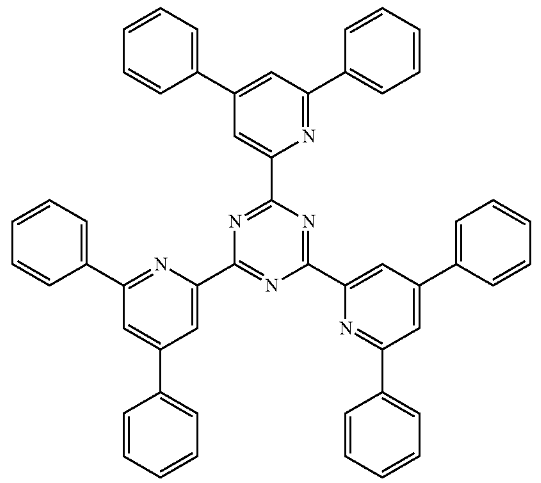
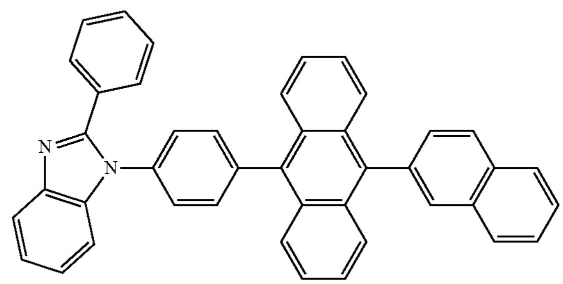
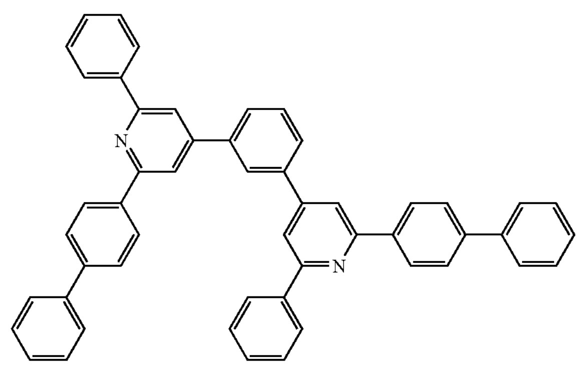
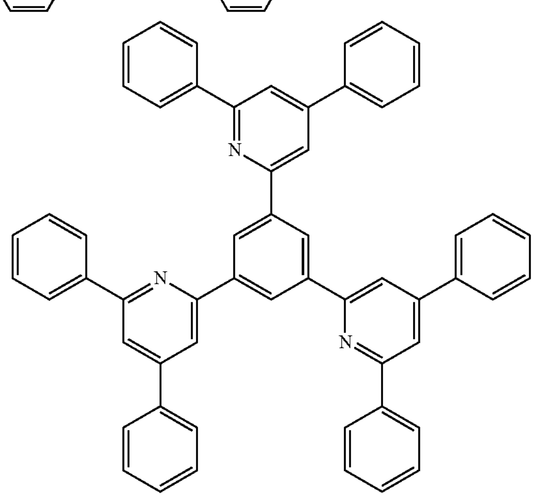

-continued

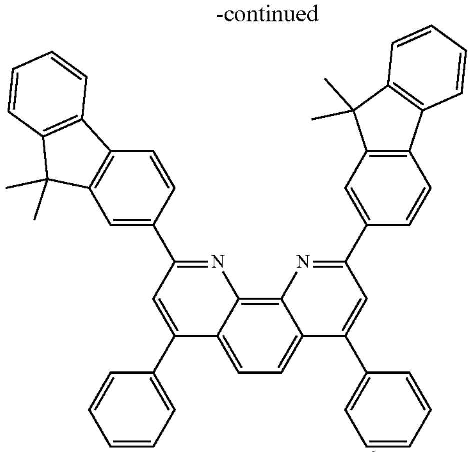

, and

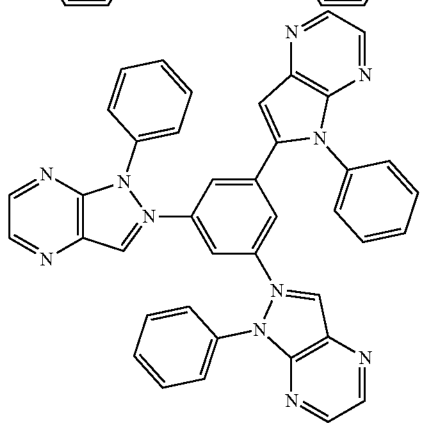

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula of Formula III,

Formula III

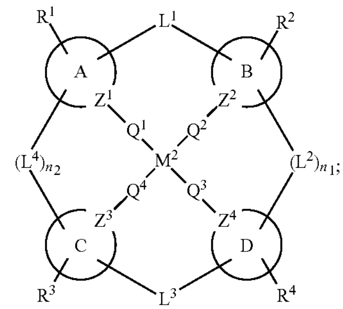

wherein rings A, B, C, and D are each a 5 or 6-membered carbocyclic or heterocyclic ring;

wherein $L^1$ and $L^3$ are each independently selected from the group consisting of a direct bond, BR, NR, PR, O, S, Se, C═O, S═O, $SO_2$, CRR', SiRR', GeRR', alkyl, and combinations thereof;

wherein $n_1$ and $n_2$ each independently is 0 or 1;

wherein, if $n_1$ or $n_2$ is 1, then $L^2$ or $L^4$ is selected from the group consisting of a direct bond, BR, NR, PR, O, S, Se, C═O, S═O, $SO_2$, CRR', SiRR', GeRR', alkyl, and combinations thereof; and wherein, if $n_1$ or $n_2$ is 0, $L^2$ or $L^4$ is not present;

$Q^1$, $Q^2$, $Q^3$ and $Q^4$ are each independently selected from the group consisting of direct bond and oxygen;

wherein $Z^1$, $Z^2$, $Z^3$, and $Z^4$ are each independently carbon or nitrogen;

when any of $Z^1$, $Z^2$, $Z^3$ and $Z^4$ is nitrogen, the $Q^1$, $Q^2$, $Q^3$ and $Q^4$ attached thereto is a direct bond;

ring A is trans to ring D, ring B is trans to ring C in a square-planar coordination configuration;

wherein $R^1$, $R^2$, $R^3$, and $R^4$ each represents mono to the maximum possible number of substitution, or no substitution;

wherein $M^2$ is Pt, and the compound comprises at least one Pt-carbene bond;

wherein a fourth distance is the distance between the atom in $R^1$ that is the farthest away from $M^2$ to the atom in $R^4$ that is the farthest away from $M^2$;

wherein a fifth distance is the distance between the atom in $R^2$ that is the farthest away from $M^2$ to the atom in $R^3$ that is the farthest away from $M^2$;

wherein the fourth distance is longer than the fifth distance by at least 1.5 Å;

wherein R, R', $R^1$, $R^2$, $R^3$, and $R^4$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents among R, R', $R^1$, $R^2$, $R^3$, and $R^4$ are optionally joined or fused into a ring; and wherein at least one of the following is true:

(i) at least one of $L^1$ to $L^3$ is a C—C direct bond;

(ii) each of $Q^1$ to $Q^4$ is a direct bond; or (iii) at least two of $Q^1$ to $Q^4$ are O.

2. The compound of claim 1, wherein rings A, B, C, and D are each independently selected from the group consisting of phenyl, pyridine, and imidazole.

3. The compound of claim 1, wherein rings A and C are phenyl, and rings B and D are selected from the group consisting of pyridine, pyrimidine, imidazole, and pyrazole.

4. The compound of claim 1, wherein rings B and D are selected from the group consisting of pyridine, pyrimidine, imidazole, and pyrazole.

5. The compound of claim 1, wherein $R^1$, $R^2$, $R^3$, and $R^4$ are each independently selected from the group consisting of hydrogen, deuterium, halide, alkyl, cycloalkyl, silyl, aryl, heteroaryl, and combinations thereof.

6. The compound of claim 1, wherein the fourth distance is longer than the fifth distance by at least 4.3 Å.

7. The compound of claim 1, wherein at least one of the rings A, B, C, or D is fused by another 5- or 6-membered ring.

8. The compound of claim 1, wherein the bidentate ligands A-B and C-D are each independently selected from the group consisting of:

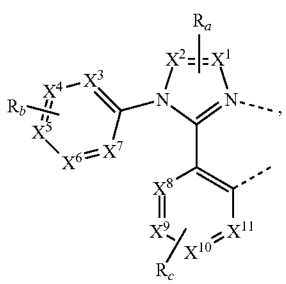
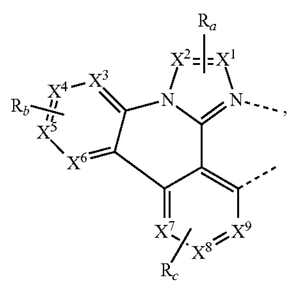
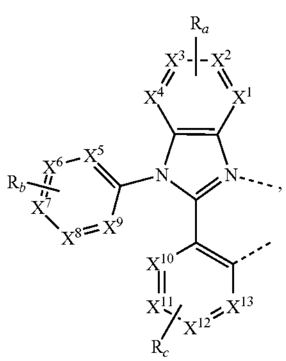
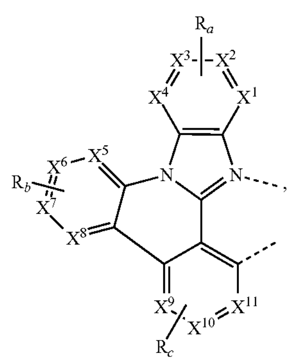
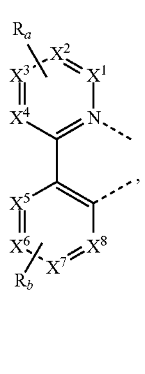
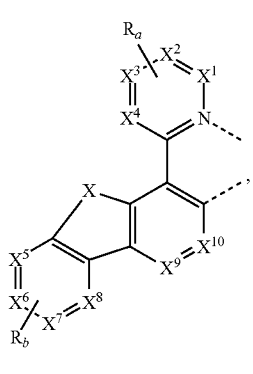

-continued

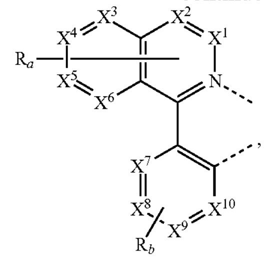
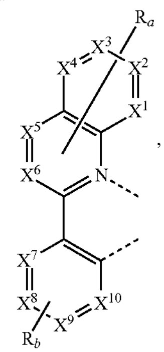
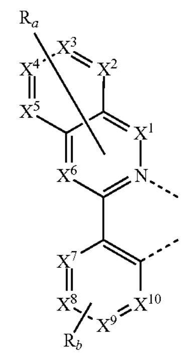
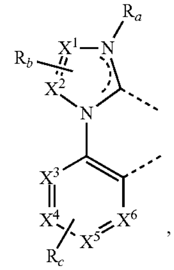
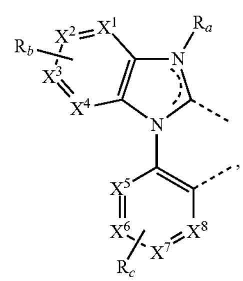
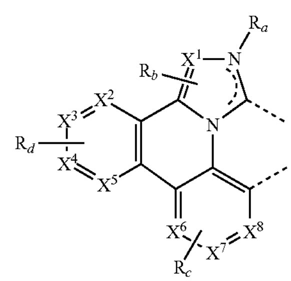
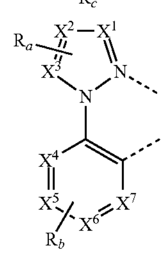
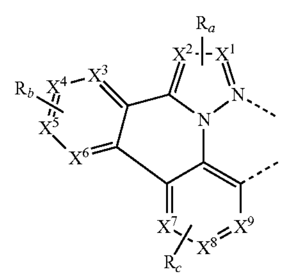
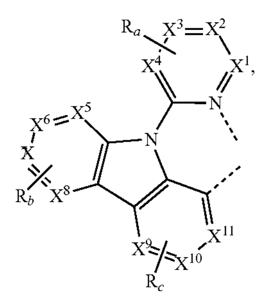
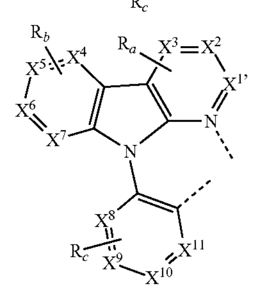

and

-continued

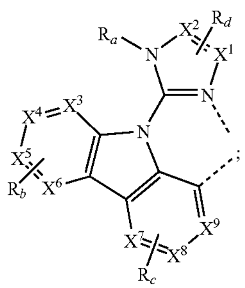

wherein $X^1$ to $X^{13}$ are each independently selected from the group consisting of carbon and nitrogen;

wherein X is selected from the group consisting of BR', NR', PR', O, S, Se, C—O, S—O, $SO_2$, CR'R", SiR'R", and GeR'R";

wherein R' and R" are optionally fused or joined to form a ring;

wherein $R_a$, $R_b$, $R_c$, and $R_c$ each represents from mono substitution to the maximum possible number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two substitutents among $R_a$, $R_b$, $R_c$, and $R_d$ are optionally fused or joined to form a ring.

9. The compound of claim 8, wherein the bidentate ligands A-B and C-D are each independently selected from the group consisting of:

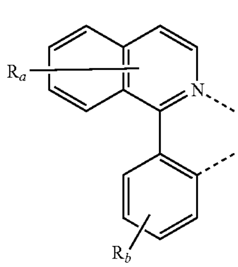

,

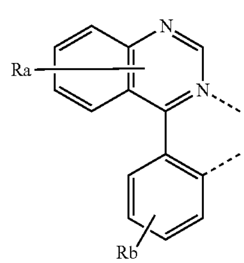

,

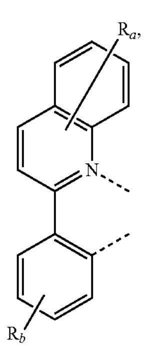

,

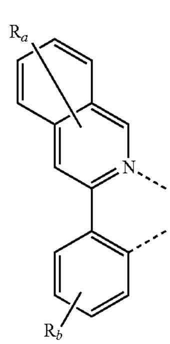

,

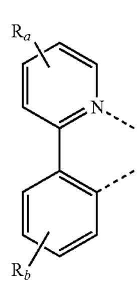

-continued

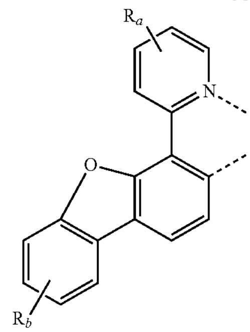

,

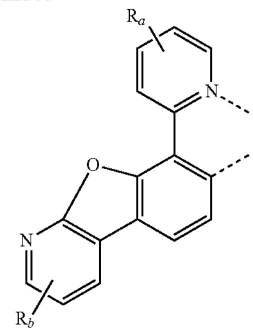

,

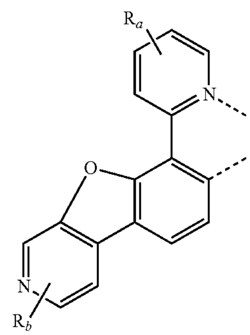

,

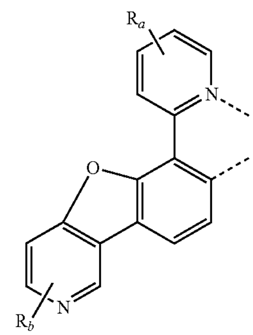

,

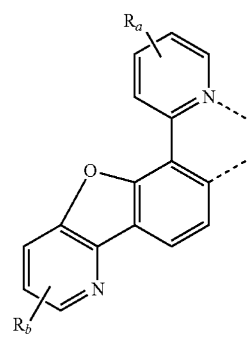

,

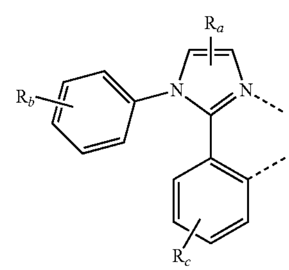

,

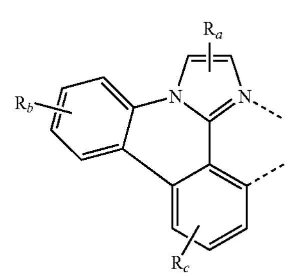

,

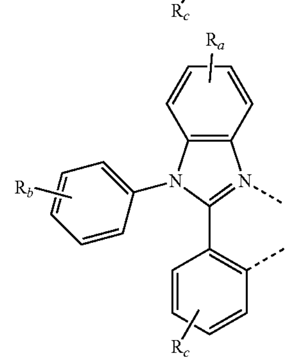

,

-continued
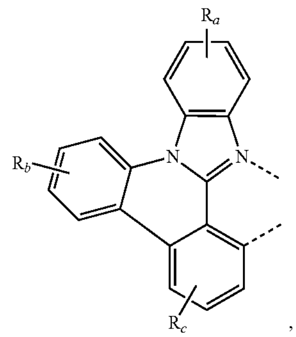
,
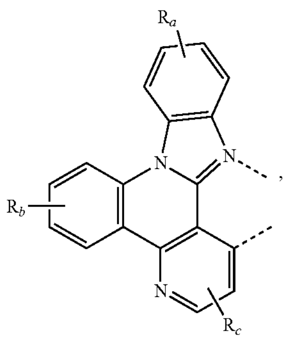
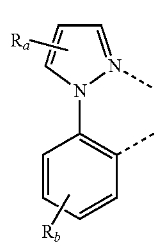
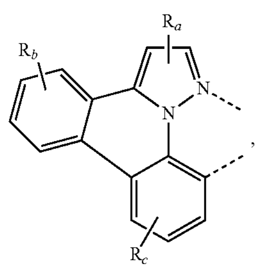
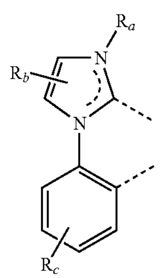
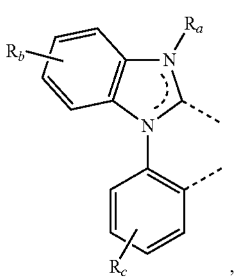
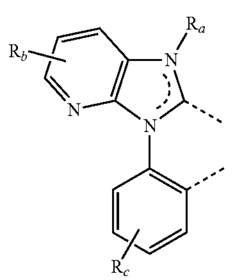
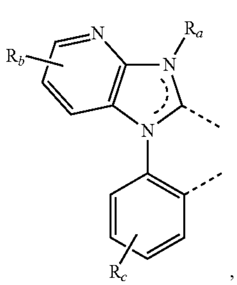
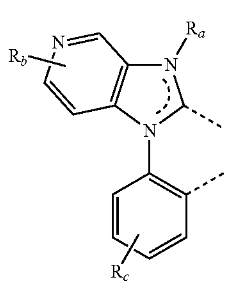
-continued
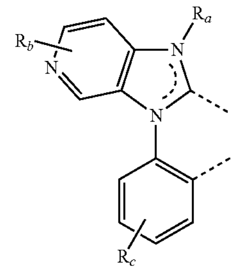
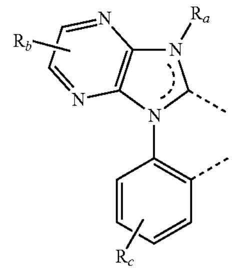
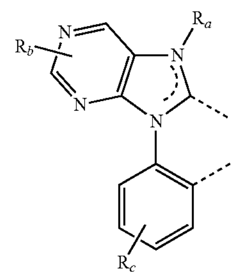
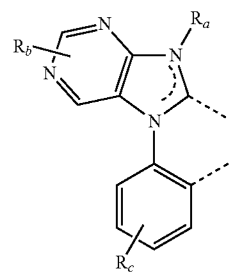
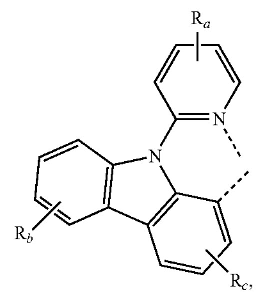
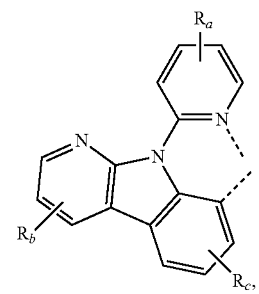
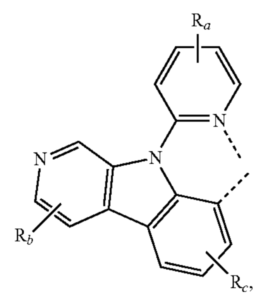
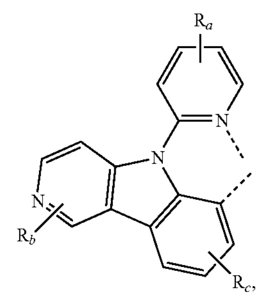
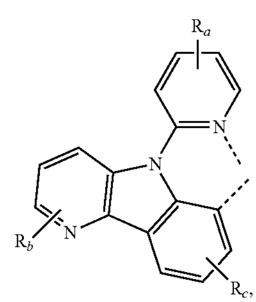
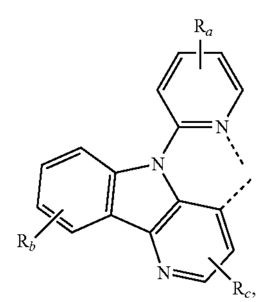
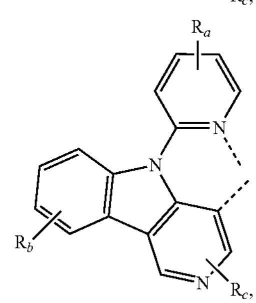
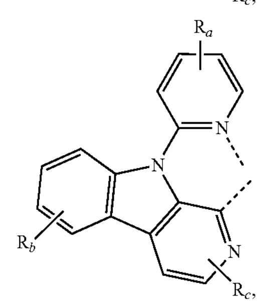

-continued

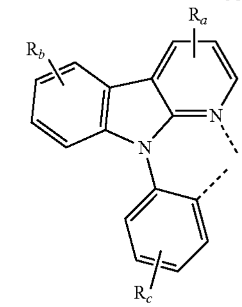
,
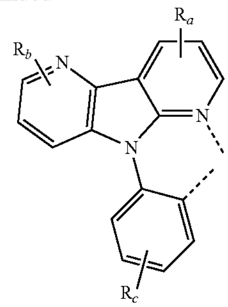
,
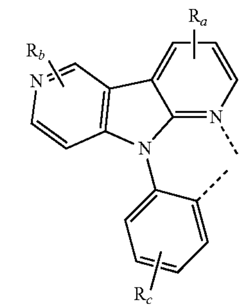
,
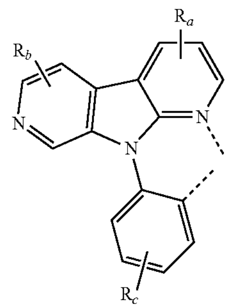
,
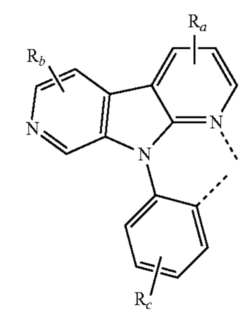
,
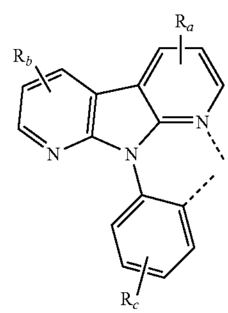
,
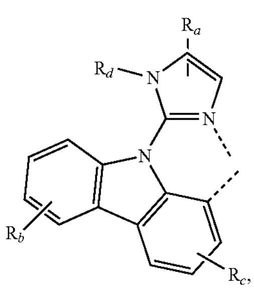
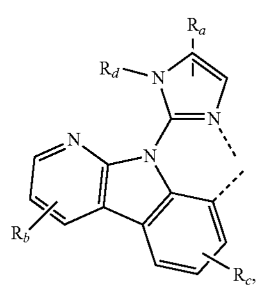
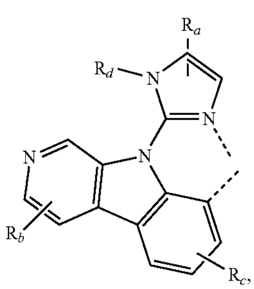
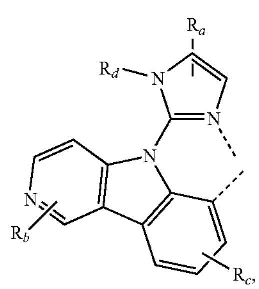

-continued

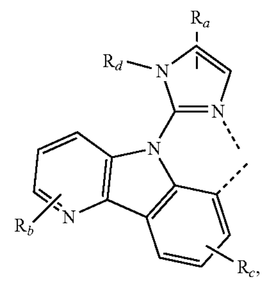
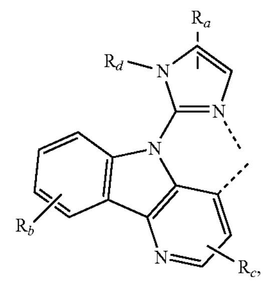
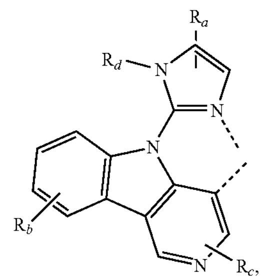
and
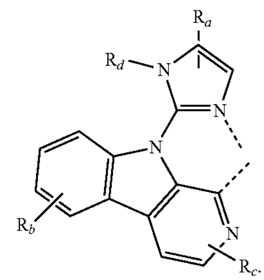

10. The compound of claim 1, wherein each of $Q^1$, $Q^2$, $Q^3$, and $Q^4$ is a direct bond.

11. The compound of claim 1, wherein two of $Z^1$, $Z^2$, $Z^3$, and $Z^4$ are carbon atoms, and the remaining two of $Z^1$, $Z^2$, $Z^3$, and $Z^4$ are nitrogen atoms;

wherein three of $Z^1$, $Z^2$, $Z^3$, and $Z^4$ are carbon atoms, and the remaining one of $Z^1$, $Z^2$, $Z^3$, and $Z^4$ is a nitrogen atom; or wherein each of $Z^1$, $Z^2$, $Z^3$, and $Z^4$ are carbon atoms.

12. The compound of claim 1, wherein the compound is selected from the group consisting of:

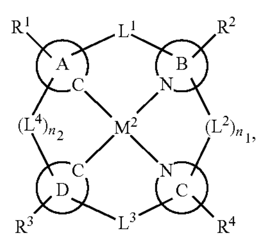
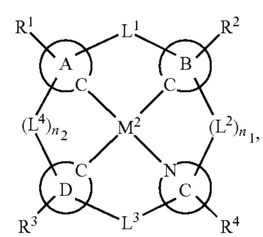
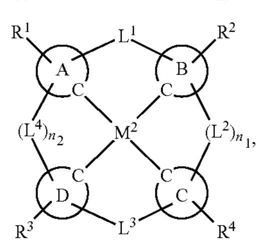
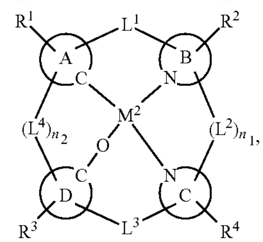
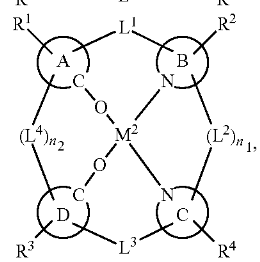
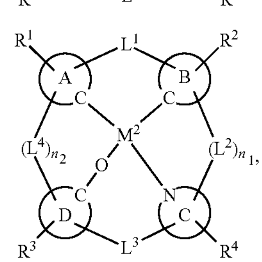

-continued

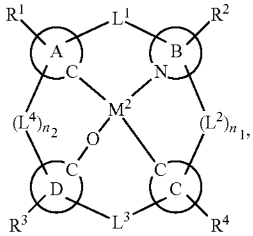

and

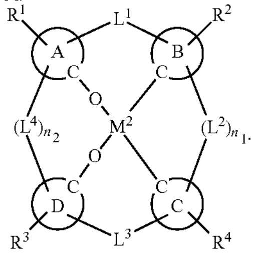

13. The compound of claim 1, wherein the compound is selected from the group consisting of:

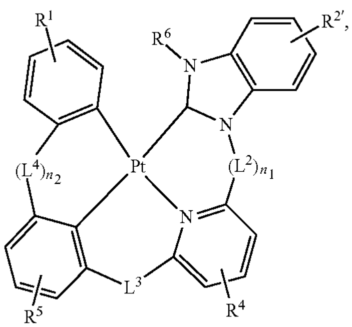

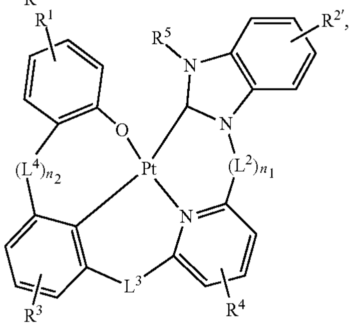

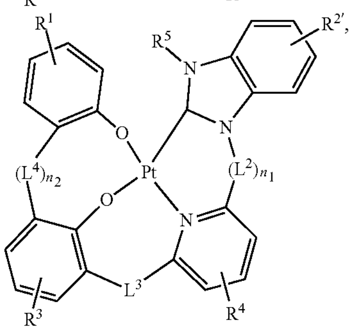

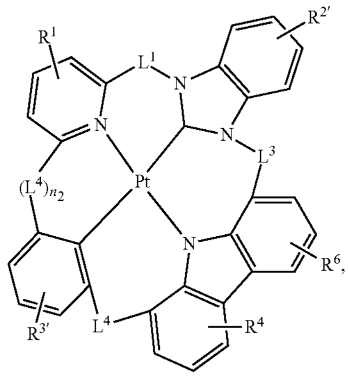

-continued

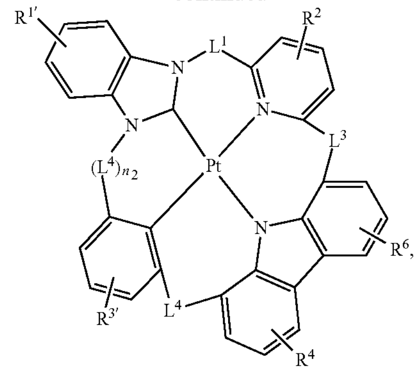

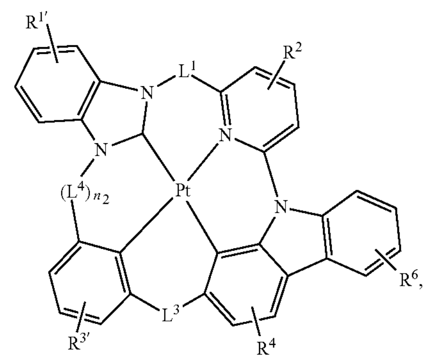

and

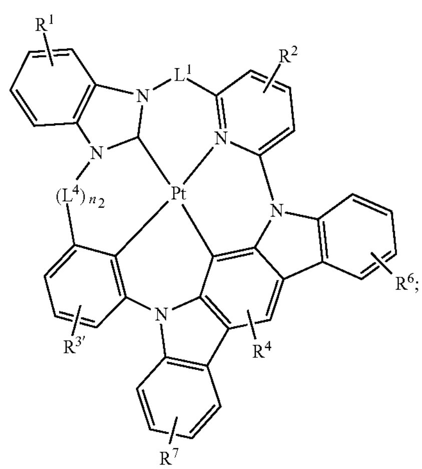

wherein $R^5$, $R^6$, $R^7$, $R^{2'}$, and $R^{3'}$ each represents mono to the maximum possible number of substitution, or no substitution;

wherein $R^5$, $R^6$, $R^7$, $R^{2'}$, and $R^{3'}$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two substituents among R, R', $R^1$, $R^2$, $R^3$, $R^4$, $R^5$, $R^6$, and $R^7$ are optionally joined or fused into a ring.

14. The compound of claim 13, wherein at least one $R^1$ and at least one $R^4$ is selected from the group consisting of:

Substituent 1

----$CH_3$,

Substituent 2

----$CD_3$,

Substituent 3

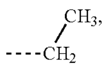

Substituent 4

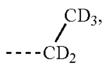

Substituent 5

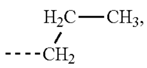

Substituent 6

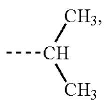

Substituent 7

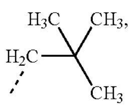

Substituent 8

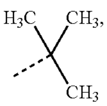

Substituent 9

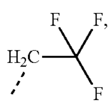

Substituent 10

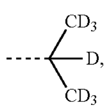

Substituent 11

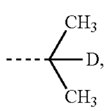

Substituent 12

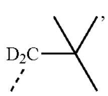

Substituent 13

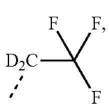

Substituent 14

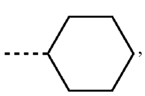

Substituent 15

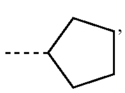

Substituent 16

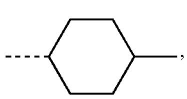

-continued

Substituent 17

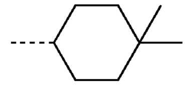

Substituent 18

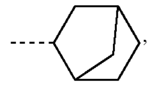

Substituent 19

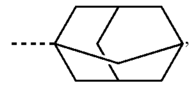

Substituent 20

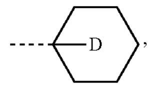

Substituent 21

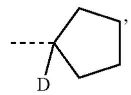

Substituent 22

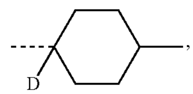

Substituent 23

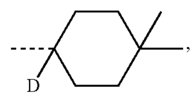

Substituent 24

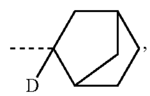

Substituent 25

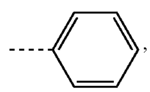

Substituent 26

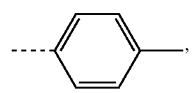

Substituent 27

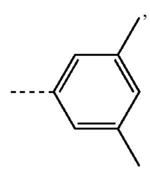

Substituent 28

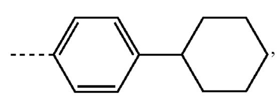

Substituent 29

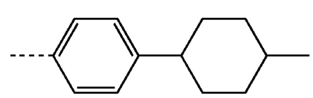

Substituent 30

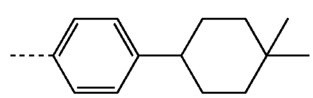

Substituent 31

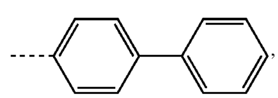

-continued
Substituent 32
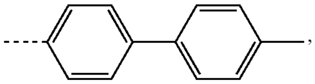
Substituent 33
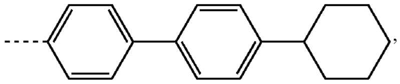
Substituent 34
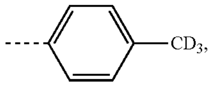
Substituent 35
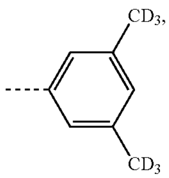
Substituent 36
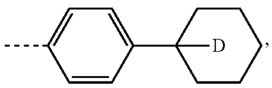
Substituent 37
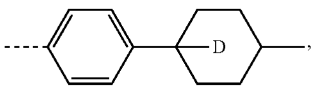
Substituent 38
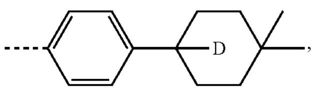
Substituent 39
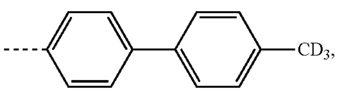
Substituent 40
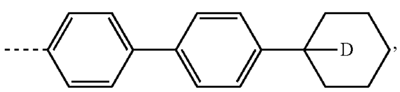
Substituent 41
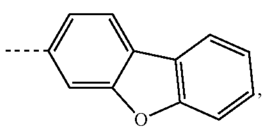
Substituent 42
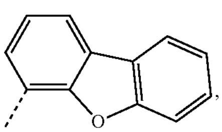
Substituent 43
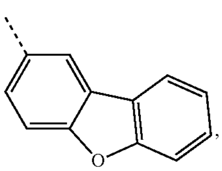
Substituent 44
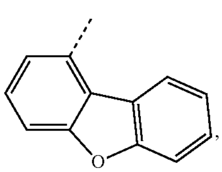
-continued
Substituent 45
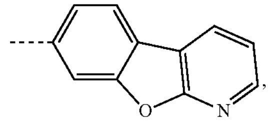
Substituent 46
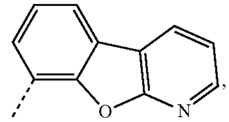
Substituent 47
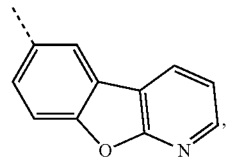
Substituent 48
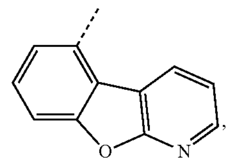
Substituent 49
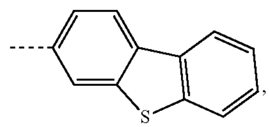
Substituent 50
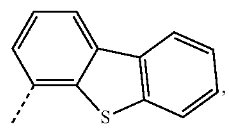
Substituent 51
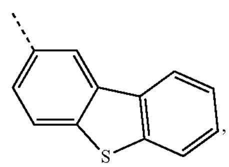
Substituent 52
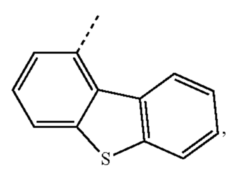
Substituent 53
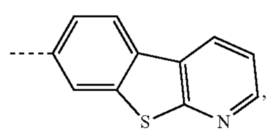
Substituent 54
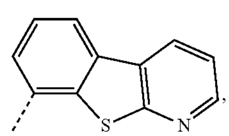

-continued
Substituent 55
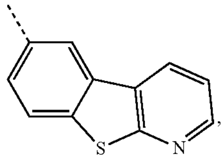
Substituent 56
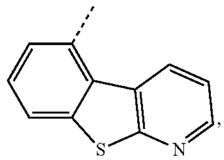
Substituent 57
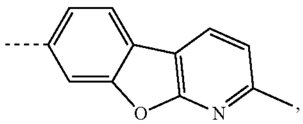
Substituent 58
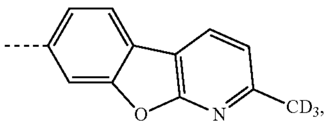
Substituent 59
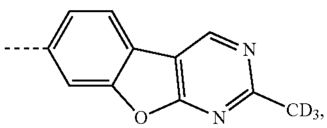
Substituent 60
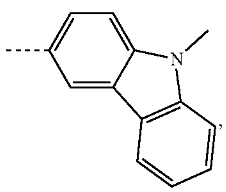
Substituent 61
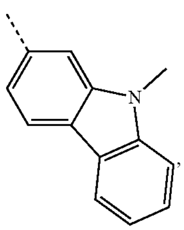
Substituent 62
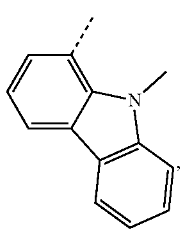
Substituent 63
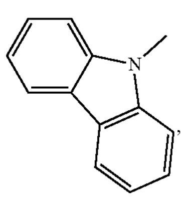
-continued
Substituent 64
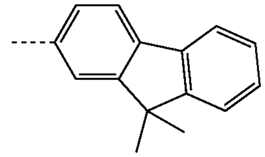
Substituent 65
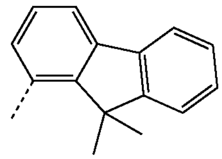
Substituent 66
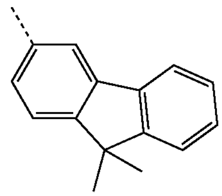
Substituent 67
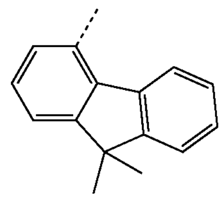
Substituent 68
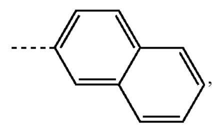
Substituent 69
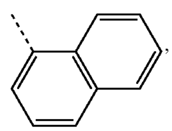
Substituent 70
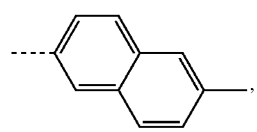
Substituent 71
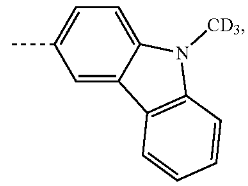
Substituent 72
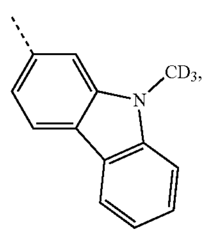

-continued
Substituent 73
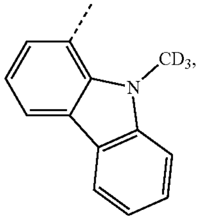
Substituent 74
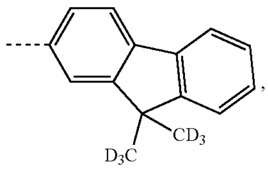
Substituent 75
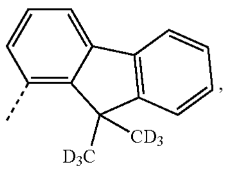
Substituent 76
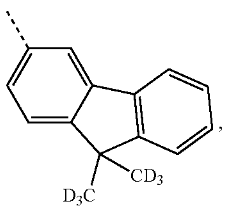
Substituent 77
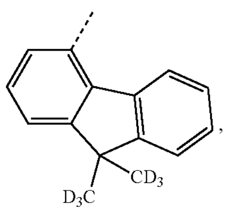
Substituent 78
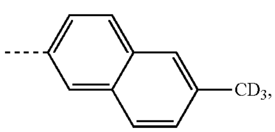
Substituent 79
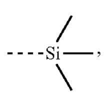
Substituent 80
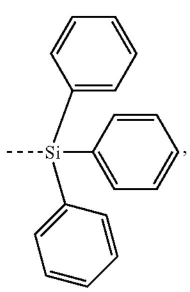
Substituent 81
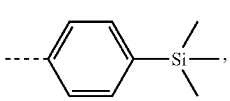
-continued
Substituent 82
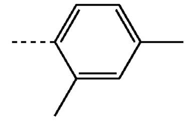
Substituent 83
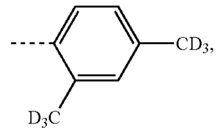
Substituent 84
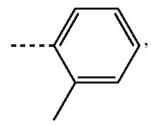
Substituent 85
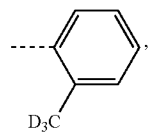
Substituent 86
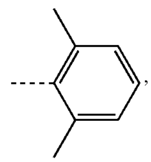
Substituent 87
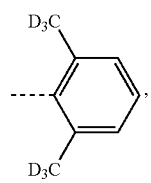
Substituent 88
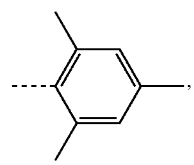
Substituent 89
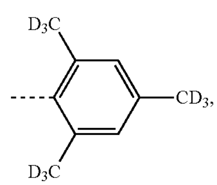
Substituent 90
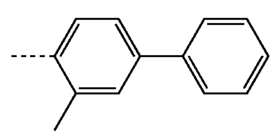
Substituent 91
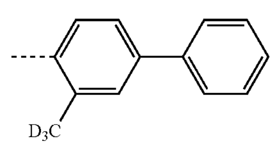

-continued

Substituent 92

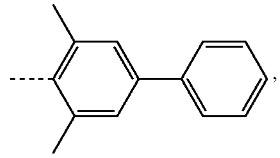

Substituent 93

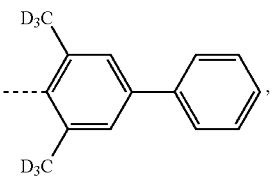

Substituent 94

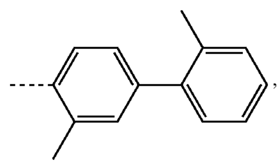

Substituent 95

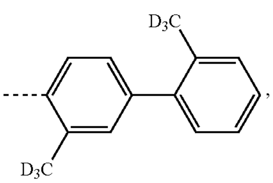

Substituent 96

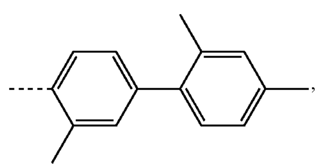

Substituent 97

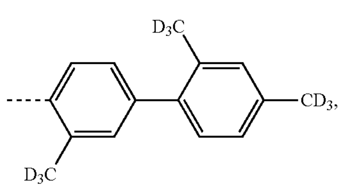

Substituent 98

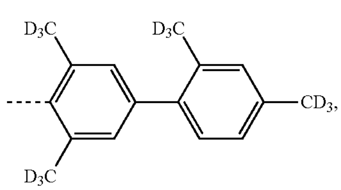

-continued

Substituent 99

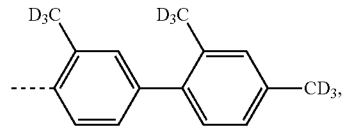

Substituent 100

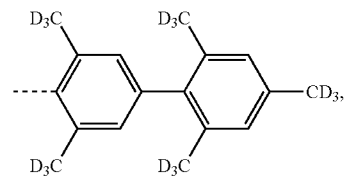

Substituent 101

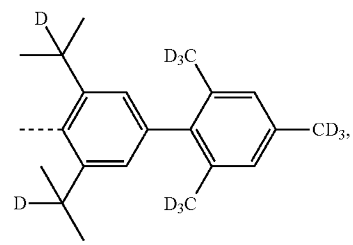

Substituent 102

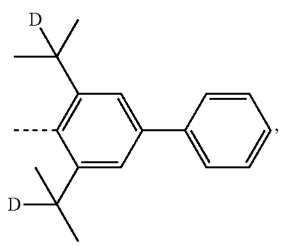

Substituent 103

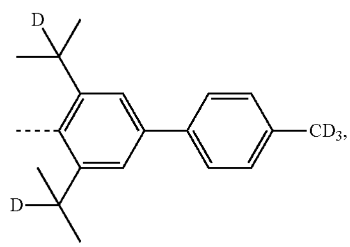

and

Substituent 104

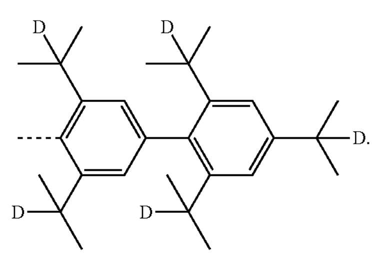

15. An organic light-emitting device (OLED) comprising:

an anode;

a cathode; and an organic layer, disposed between the anode and the cathode, comprising a compound having a formula of Formula III, Formula III

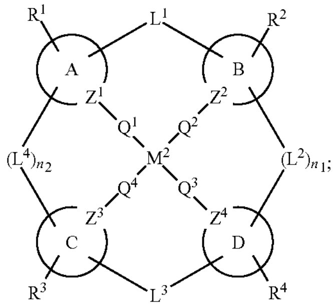

wherein rings A, B, C, and D are each a 5 or 6-membered carbocyclic or heterocyclic ring;

wherein $L^1$ and $L^3$ are each independently selected from the group consisting of a direct bond, BR, NR, PR, O, S, Se, C═O, S═O, $SO_2$, CRR', SiRR', GeRR', alkyl, and combinations thereof;

wherein $n_1$ and $n_2$ each independently is 0 or 1;

wherein, if $n_1$ or $n_2$ is 1, then $L^2$ or $L^4$ is selected from the group consisting of a direct bond, BR, NR, PR, O, S, Se, C═O, S═O, $SO_2$, CRR', SiRR', GeRR', alkyl, and combinations thereof; and wherein, if $n_1$ or $n_2$ is 0, $L^2$ or $L^4$ is not present;

$Q^1$, $Q^2$, $Q^3$ and $Q^4$ are each independently selected from the group consisting of direct bond and oxygen;

wherein $Z^1$, $Z^2$, $Z^3$, and $Z^4$ are each independently carbon or nitrogen;

when any of $Z^1$, $Z^2$, $Z^3$ and $Z^4$ is nitrogen, the $Q^1$, $Q^2$, $Q^3$ and $Q^4$ attached thereto is a direct bond;

ring A is trans to ring D, ring B is trans to ring C in a square-planar coordination configuration;

wherein $R^1$, $R^2$, $R^3$, and $R^4$ each represents mono to the maximum possible number of substitution, or no substitution;

wherein $M^2$ is Pt, and the compound comprises at least one Pt-carbene bond;

wherein a fourth distance is the distance between the atom in $R^1$ that is the farthest away from $M^2$ to the atom in $R^4$ that is the farthest away from $M^2$;

wherein a fifth distance is the distance between the atom in $R^2$ that is the farthest away from $M^2$ to the atom in $R^3$ that is the farthest away from $M^2$;

wherein the fourth distance is longer than the fifth distance by at least 1.5 Å;

wherein R, R', $R^1$, $R^2$, $R^3$, and $R^4$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents among R, R', $R^1$, $R^2$, $R^3$, and $R^4$ are optionally joined or fused into a ring; and wherein at least one of the following is true:

(i) at least one of $L^1$ to $L^3$ is a C—C direct bond;

(ii) each of $Q^1$ to $Q^4$ is a direct bond; or (iii) at least two of $Q^1$ to $Q^4$ are O.

16. A consumer product comprising an organic light-emitting device comprising:

an anode;

a cathode; and an organic layer, disposed between the anode and the cathode, comprising a compound having a formula of Formula III, Formula III

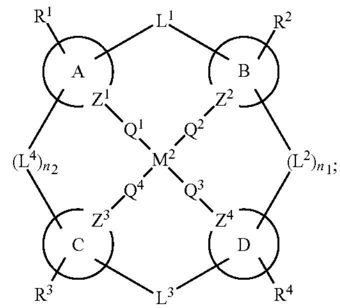

wherein rings A, B, C, and D are each a 5 or 6-membered carbocyclic or heterocyclic ring;

wherein $L^1$ and $L^3$ are each independently selected from the group consisting of a direct bond, BR, NR, PR, O, S, Se, C═O, S═O, $SO_2$, CRR', SiRR', GeRR', alkyl, and combinations thereof;

wherein $n_1$ and $n_2$ each independently is 0 or 1;

wherein, if $n_1$ or $n_2$ is 1, then $L^2$ or $L^4$ is selected from the group consisting of a direct bond, BR, NR, PR, O, S, Se, C═O, S═O, $SO_2$, CRR', SiRR', GeRR', alkyl, and combinations thereof; and wherein, if $n_1$ or $n_2$ is 0, $L^2$ or $L^4$ is not present;

$Q^1$, $Q^2$, $Q^3$ and $Q^4$ are each independently selected from the group consisting of direct bond and oxygen;

wherein $Z^1$, $Z^2$, $Z^3$, and $Z^4$ are each independently carbon or nitrogen;

when any of $Z^1$, $Z^2$, $Z^3$ and $Z^4$ is nitrogen, the $Q^1$, $Q^2$, $Q^3$ and $Q^4$ attached thereto is a direct bond;

ring A is trans to ring D, ring B is trans to ring C in a square-planar coordination configuration;

wherein $R^1$, $R^2$, $R^3$, and $R^4$ each represents mono to the maximum possible number of substitution, or no substitution;

wherein $M^2$ is Pt, and the compound comprises at least one Pt-carbene bond;

wherein a fourth distance is the distance between the atom in $R^1$ that is the farthest away from $M^2$ to the atom in $R^4$ that is the farthest away from $M^2$;

wherein a fifth distance is the distance between the atom in $R^2$ that is the farthest away from $M^2$ to the atom in $R^3$ that is the farthest away from $M^2$;

wherein the fourth distance is longer than the fifth distance by at least 1.5 Å;

wherein R, R', $R^1$, $R^2$, $R^3$, and $R^4$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two substituents among R, R', $R^1$, $R^2$, $R^3$, and $R^4$ are optionally joined or fused into a ring; and wherein at least one of the following is true:

(i) at least one of $L^1$ to $L^3$ is a C—C direct bond;

(ii) each of $Q^1$ to $Q^4$ is a direct bond; or (iii) at least two of $Q^1$ to $Q^4$ are O.

17. A formulation comprising a compound of claim 1.

18. The compound of claim 1, wherein at least one of $L^1$ to $L^3$ is a C—C direct bond.

19. The compound of claim 1, wherein at least two of $Q^1$ to $Q^4$ are O.

20. The compound of claim 1, wherein the compound is

Compound 270

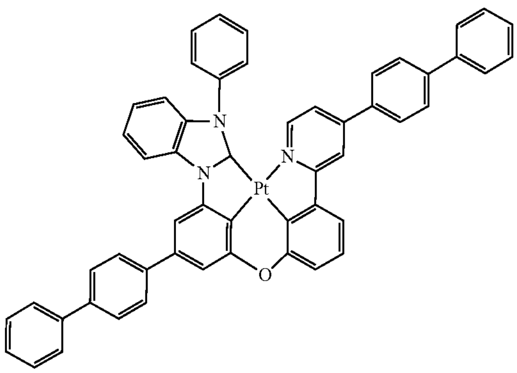

or

-continued

Compound 296

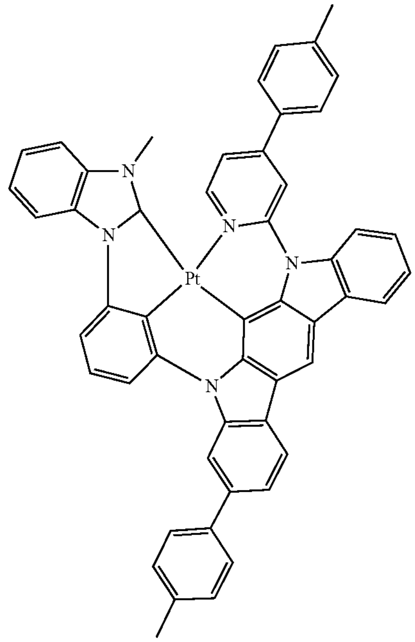

* * * * *